US012813154B2

(12) United States Patent
Kim et al.

(10) Patent No.: US 12,813,154 B2
(45) Date of Patent: Nov. 24, 2026

(54) LIGHT-EMITTING DEVICE, ELECTRONIC APPARATUS INCLUDING THE LIGHT-EMITTING DEVICE, AND ELECTRONIC DEVICE INCLUDING THE LIGHT-EMITTING DEVICE

(71) Applicant: Samsung Display Co., Ltd., Yongin-si (KR)

(72) Inventors: Sohae Kim, Yongin-si (KR); Donguk Kang, Yongin-si (KR); Gyeongheon Kim, Yongin-si (KR); Hochul Song, Yongin-si (KR); Sangho Jeon, Yongin-si (KR); Sunmi Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 745 days.

(21) Appl. No.: 18/339,045

(22) Filed: Jun. 21, 2023

(65) Prior Publication Data

US 2023/0422597 A1 Dec. 28, 2023

(30) Foreign Application Priority Data

Jun. 24, 2022 (KR) ........................ 10-2022-0077803
Jun. 19, 2023 (KR) ........................ 10-2023-0078414

(51) Int. Cl.
*H10K 85/30* (2023.01)
*C09K 11/06* (2006.01)
(Continued)

(52) U.S. Cl.
CPC ............ *H10K 85/342* (2023.02); *C09K 11/06* (2013.01); *H10K 85/636* (2023.02);
(Continued)

(58) Field of Classification Search
CPC ...................................................... H10K 50/12
See application file for complete search history.

(56) References Cited

U.S. PATENT DOCUMENTS 10,144,867 B2 12/2018 Ma et al.
10,367,156 B2 7/2019 Kamatani et al.
(Continued)

FOREIGN PATENT DOCUMENTS

CN 116419589 A * 7/2023 ........... H10K 59/873
CN 116419590 A * 7/2023 ........... H10K 59/873
(Continued)

*Primary Examiner* — Chanceity N Robinson

(74) *Attorney, Agent, or Firm* — Womble Bond Dickinson (US) LLP

(57) ABSTRACT

A light-emitting device includes a first electrode, a second electrode facing the first electrode, an interlayer arranged between the first electrode and the second electrode and including an emission layer, and a capping layer, wherein the emission layer includes a first emitter, the first emitter is configured to emit first light having a first emission spectrum, the capping layer is arranged in a path on which the first light is configured to travel, an emission peak wavelength of the first light is in a range of about 610 nm to about 720 nm, the first emitter includes iridium, the capping layer includes an amine-containing compound, a value of ratio of reflective index to full width at half maximum of the first light configured to be extracted to the outside through the capping layer is 2.0 or more, and the RRF value is calculated by Equation 1.

20 Claims, 8 Drawing Sheets

(51) Int. Cl.

| | |
|---|---|
| ***H10K 50/12*** | (2023.01) |
| ***H10K 85/60*** | (2023.01) |
| ***H10K 101/30*** | (2023.01) |

(52) U.S. Cl.

CPC ................ *C09K 2211/1029* (2013.01); *C09K 2211/1044* (2013.01); *C09K 2211/185* (2013.01); *H10K 50/12* (2023.02); *H10K 85/657* (2023.02); *H10K 2101/30* (2023.02)

(56) References Cited

U.S. PATENT DOCUMENTS

| | | | |
|---|---|---|---|
| 10,615,350 | B2 | 4/2020 | Kamatani et al. |
| 10,937,973 | B2 | 3/2021 | Lee et al. |
| 2020/0212319 | A1 | 7/2020 | Choi et al. |
| 2020/0308202 | A1 | 10/2020 | Cho et al. |
| 2021/0078989 | A1 | 3/2021 | Du et al. |
| 2021/0242431 | A1 | 8/2021 | Syn |
| 2022/0017503 | A1 | 1/2022 | Seok et al. |

FOREIGN PATENT DOCUMENTS

| | | | |
|---|---|---|---|
| KR | 10-2046983 | B1 | 11/2019 |
| KR | 10-2059550 | B1 | 12/2019 |
| KR | 10-2020-0083198 | A | 7/2020 |
| KR | 10-2020-0115008 | A | 10/2020 |
| KR | 10-2021-0032274 | A | 3/2021 |

* cited by examiner

LIGHT-EMITTING DEVICE, ELECTRONIC APPARATUS INCLUDING THE LIGHT-EMITTING DEVICE, AND ELECTRONIC DEVICE INCLUDING THE LIGHT-EMITTING DEVICE

CROSS-REFERENCE TO RELATED APPLICATION

This application claims priority to and the benefit of Korean Patent Application No. 10-2022-0077803, filed on Jun. 24, 2022, and Application No. 10-2023-0078414, filed on Jun. 19, 2023, in the Korean Intellectual Property Office, the entire content of both of which is incorporated herein by reference.

BACKGROUND

1. Field

One or more aspects of embodiments of the present disclosure relate to a light-emitting device, an electronic apparatus including the light-emitting device, and an electronic device including the light-emitting device.

2. Description of the Related Art

From among light-emitting devices, self-emissive devices (for example, organic light-emitting devices) have wide viewing angles, excellent contrast ratios, fast response time, and excellent characteristics in terms of luminance, driving voltage, and/or response speed.

In a light-emitting device, a first electrode is arranged on a substrate, and a hole transport region, an emission layer, an electron transport region, and a second electrode are sequentially arranged on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons transition from an excited state to a ground state, thereby generating light.

SUMMARY

One or more aspects of embodiments of the present disclosure are directed toward a light-emitting device having excellent (or improved) color purity, an electronic apparatus including the light-emitting device, and an electronic device including the light-emitting device.

Additional aspects will be set forth in part in the description which follows and, in part, will be apparent from the description, or may be learned by practice of the presented embodiments of the disclosure.

According to one or more embodiments, a light-emitting device may include:

a first electrode, a second electrode facing the first electrode, an interlayer arranged between the first electrode and the second electrode and including an emission layer, and a capping layer, wherein the emission layer may include a first emitter, the first emitter may be configured to emit first light having a first emission spectrum, the capping layer may be arranged in a path on which the first light may be configured to travel, an emission peak wavelength of the first light may be in a range of about 610 nm to about 720 nm, the first emitter may include iridium, the capping layer may include an amine-containing compound, a value of ratio of reflective index to full width at half maximum (FWHM) (RRF value) of the first light configured to be extracted to the outside through the capping layer may be 2.0 or more, and the RRF value is calculated by Equation 1:

$$R(\text{cap})/\text{FWHM}(D)\times 100, \qquad \text{Equation 1}$$

wherein, in Equation 1,

R(cap) is a refractive index of the amine-containing compound with respect to second light having a wavelength of the emission peak wavelength of the first light ±33 nm, and FWHM(D) is an FWHM of a main peak in an electroluminescence (EL) spectrum of the first light configured to be extracted to the outside through the capping layer, and a unit of the FWHM(D) is nm.

According to one or more embodiments, a light-emitting device may include:

a first electrode, a second electrode facing the first electrode, an interlayer arranged between the first electrode and the second electrode and including an emission layer, and a capping layer, wherein the emission layer may include a first emitter, the first emitter may be configured to emit first light having a first emission spectrum, the capping layer may be arranged in a path on which the first light is configured to travel, the first emitter may include a first ligand, a second ligand, and a third ligand, each of the first ligand, the second ligand, and the third ligand being bonded to iridium, the first ligand is a bidentate ligand including $Y_1$-containing ring $B_1$ and $Y_2$-containing ring $B_2$, the second ligand is a bidentate ligand bonded to the iridium through each of $Y_3$ and $Y_4$, the third ligand is a bidentate ligand including $Y_5$-containing ring $B_5$ and $Y_6$-containing ring $B_6$, $Y_1$ and $Y_5$ may each independently be nitrogen (N), $Y_2$ and $Y_6$ may each independently be carbon (C), $Y_3$ and $Y_4$ may each independently be oxygen (O), at least one of the $Y_1$-containing ring $B_1$ and/or the $Y_5$-containing ring $B_5$ may be a polycyclic group in which three or more cyclic groups are condensed with each other, the capping layer may include an amine-containing compound, and the amine-containing compound may include a benzoxazole group, a benzothiazole group, a naphthooxazole group, a naphthothiazole group, or any combination thereof.

According to one or more embodiments, an electronic apparatus may include the light-emitting device.

According to one or more embodiments, an electronic device may include the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
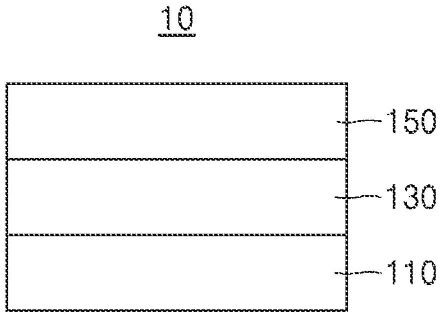
FIG. 1 is a schematic view of a light-emitting device according to one or more embodiments.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. As used herein, expressions such as "at least one of", "one of", and "selected from", when preceding a list of elements, modify the entire list of elements and do not modify the individual elements of the list. For example, the expression "at least one of a, b or c", "at least one of a, b, and/or c", etc., indicates only a, only b, only c, both a and b, both a and c, both b and c, all of a, b, and c, or variations thereof. Further, the use of "may" when describing embodiments of the present disclosure refers to "one or more embodiments of the present disclosure."

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic apparatus, device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the apparatus may be formed on one integrated circuit (IC) chip or on separate IC chips. Further, the various components of the apparatus may be implemented on a flexible printed circuit film, a tape carrier package (TCP), a printed circuit board (PCB), or formed on one substrate. Further, the various components of the apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

As used herein, the singular forms "a", "an" and "the" are intended to include the plural forms as well, unless the context clearly indicates otherwise.

A light-emitting device according to one or more embodiments of the disclosure may include: a first electrode; a second electrode facing the first electrode; an interlayer arranged between the first electrode and the second electrode and including an emission layer; and a capping layer.

The emission layer may include a first emitter. The first emitter may emit first light having a first emission spectrum, and the capping layer may be arranged in a path on which the first light travels.

An emission peak wavelength (maximum emission wavelength, or maximum emission peak wavelength) of the first light may be in a range of about 610 nm to about 720 nm.

For example, the emission peak wavelength of the first light may be in a range of about 610 nm to about 680 nm, about 610 nm to about 675 nm, about 610 nm to about 670 nm, about 610 nm to about 665 nm, about 613 nm to about 680 nm, about 613 nm to about 675 nm, about 613 nm to about 670 nm, about 613 nm to about 665 nm, about 615 nm to about 680 nm, about 615 nm to about 675 nm, about 615 nm to about 670 nm, about 615 nm to about 665 nm, or about 615 nm to about 664 nm.

A full width at half maximum (FWHM) of the first light may be in a range of about 15 nm to about 90 nm.

For example, the FWHM of the first light may be in a range of about 20 nm to about 90 nm, about 20 nm to about 85 nm, about 20 nm to about 80 nm, about 25 nm to about 90 nm, about 25 nm to about 85 nm, about 25 nm to about 80 nm, about 30 nm to about 90 nm, about 30 nm to about 85 nm, about 30 nm to about 80 nm, about 33 nm to about 90 nm, about 33 nm to about 85 nm, about 33 nm to about 80 nm, or about 33 nm to about 79 nm.

The emission peak wavelength (or maximum emission wavelength) and FWHM of the first light described in the present specification may be evaluated from the emission spectrum of a film including the first emitter (for example, see Evaluation Example 2). The emission peak wavelength in the present specification refers to the peak wavelength having the maximum emission intensity in the emission spectrum or electroluminescence (EL) spectrum.

The first light having the emission peak wavelength and FWHM as described above may be red light.

The first emitter may include iridium.

In one or more embodiments, the first emitter may be an organometallic compound including iridium. The first emitter may be neutral (e.g., may have a neutral electrical charge), may include one iridium, and may not include transition metals other than iridium.

In one or more embodiments, the first emitter may include, in addition to the iridium, a first ligand, a second ligand, and a third ligand, each of the first ligand, the second ligand, and the third ligand being bonded to the iridium. In this regard, the first ligand may be a bidentate ligand including $Y_1$-containing ring $B_1$ and $Y_2$-containing ring $B_2$, the second ligand may be a bidentate ligand bonded to the iridium through each of $Y_3$ and $Y_4$, the third ligand may be a bidentate ligand including $Y_5$-containing ring $B_5$ and $Y_6$-containing ring $B_6$, $Y_1$ and $Y_5$ may each independently be nitrogen (N), $Y_2$ and $Y_6$ may each independently be carbon (C), $Y_3$ and $Y_4$ may each independently be oxygen (O), and at least one of $Y_1$-containing ring $B_1$ and/or $Y_5$-containing ring $B_5$ (for example, each of $Y_1$-containing ring $B_1$ and $Y_5$-containing ring $B_5$) may be a polycyclic group in which three or more cyclic groups are condensed with each other.

In one or more embodiments, at least one of $Y_1$-containing ring $B_1$ and/or $Y_5$-containing ring $B_5$ (for example, each of $Y_1$-containing ring $B_1$ and $Y_5$-containing ring $B_5$) may be a benzoquinoline group, a benzoisoquinoline group, a naphthoquinoline group, or a naphthoisoquinoline group.

In one or more embodiments, $Y_2$-containing ring $B_2$ and $Y_6$-containing ring $B_6$ may each independently be a benzene group, a naphthalene group, a phenanthrene group, a furan group, a thiophene group, a selenophene group, a pyrrole group, a cyclopentadiene group, a silole group, a benzofuran group, a benzothiophene group, a benzoselenophene group, an indole group, an indene group, a benzosilole group, a dibenzofuran group, a dibenzothiophene group, a dibenzoselenophene group, a carbazole group, a fluorene group, or a dibenzosilole group.

In one or more embodiments, the first emitter may be a heteroleptic complex.

In one or more embodiments, the third ligand may be identical to the first ligand.

In one or more embodiments, the third ligand may be different from the first ligand.

More details for the first emitter are as described in the present specification.

The capping layer may be arranged in a path on which the first light travels and is extracted to the outside of the light-emitting device, thereby increasing the external extraction rate of the first light.

The capping layer may include an amine-containing compound. The "amine" in the amine-containing compound refers to a group represented by

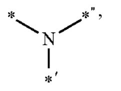

wherein *, *', and *" indicate binding sites to neighboring atoms $A_1$, $A_2$, and $A_3$, respectively, and each of $A_1$, $A_2$, and $A_3$ refers to a group that is not linked via a single bond or any atom group therebetween. $A_1$, $A_2$, and $A_3$ may each independently be any suitable atom, for example, carbon, hydrogen, and/or the like. For example, CBP and Compounds B11 to B23 below do not belong to the amine-containing compound described herein.

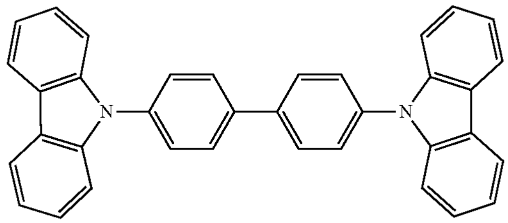

CBP

In one or more embodiments, the capping layer may include a monoamine-containing compound. That is, the number of "amine" groups in the amine-containing compound included in the capping layer may be 1.

In one or more embodiments, the amine-containing compound included in the capping layer may include a benzoxazole group, a benzothiazole group, a naphthooxazole group, a naphthothiazole group, or any combination thereof.

More details for the amine-containing compound are as described in the present specification.

A value of ratio of reflective index to FWHM (RRF value) of the first light extracted to the outside through the capping layer may be 2.0 or more. In this regard, the RRF value may be calculated by Equation 1:

$$R(\text{cap})/\text{FWHM}(D)\times 100, \qquad \text{Equation 1}$$

wherein, in Equation 1,

R(cap) is a refractive index of the amine-containing compound with respect to second light having a wavelength of the emission peak wavelength of the first light ±33 nm, and FWHM(D) is an FWHM of a main peak in an EL spectrum of the first light extracted to the outside through the capping layer, wherein the unit of FWHM(D) is nm.

In one or more embodiments, the RRF value of the first light extracted to the outside through the capping layer may be 2.0 or more.

In one or more embodiments, the RRF value of the first light extracted to the outside through the capping layer may be in a range of about 2.0 to about 4.0, about 2.0 to about 3.9, about 2.0 to about 3.8, about 2.0 to about 3.7, about 2.1 to about 4.0, about 2.1 to about 3.9, about 2.1 to about 3.8, about 2.1 to about 3.7, or about 2.16 to about 3.66.

When the emission peak wavelength of the first light is from about 610 nm to about 720 nm, and the RRF value of the first light extracted to the outside through the capping layer is within the range described above, the light-emitting device may emit red light while having excellent (or improved) color purity (for example, a relatively large CIEx coordinate and/or a relatively small CIEy coordinate). Accordingly, by using the light-emitting device of the present embodiments, a high-quality electronic device and a high-quality electronic device may be manufactured. For example, the light-emitting device may have a CIEx coordinate in a range of about 0.65 to about 0.71 or about 0.66 to about 0.70, and/or a CIEy coordinate in a range of about 0.29 to about 0.35 or about 0.30 to about 0.34.

FWHM(D) may be in a range of about 15 nm to about 90 nm, about 15 nm to about 85 nm, about 15 nm to about 80 nm, about 20 nm to about 90 nm, about 20 nm to about 85 nm, about 20 nm to about 80 nm, about 25 nm to about 90 nm, about 25 nm to about 85 nm, about 25 nm to about 80 nm, about 30 nm to about 90 nm, about 30 nm to about 85 nm, about 30 nm to about 80 nm, about 33 nm to about 90 nm, about 33 nm to about 85 nm, or about 33 nm to about 80 nm.

R(cap) may be evaluated by actually measuring the refractive index of a film including (e.g., consisting of) the amine-containing compound (for example, see Evaluation Example 3).

In one or more embodiments, R(cap) may be the refractive index of the amine-containing compound with respect to the second light having a wavelength of about 633 nm.

In one or more embodiments, R(cap) may be in a range of about 1.6 to about 2.0, about 1.6 to about 1.9, or about 1.6 to about 1.8.

A light-emitting device according to one or more other embodiments of the disclosure may include: a first electrode; a second electrode facing the first electrode; an interlayer arranged between the first electrode and the second electrode and including an emission layer; and a capping layer, wherein the emission layer may include a first emitter, the first emitter may emit first light having a first emission spectrum, the capping layer may be arranged in a path on which the first light travels, the first emitter may include a first ligand, a second ligand, and a third ligand, each of the first ligand, the second ligand, and the third ligand being bonded to iridium, the first ligand may be a bidentate ligand including $Y_1$-containing ring $B_1$ and $Y_2$-containing ring $B_2$, the second ligand may be a bidentate ligand bonded to the iridium through each of $Y_3$ and $Y_4$, the third ligand may be a bidentate ligand including $Y_5$-containing ring $B_5$ and $Y_6$-containing ring $B_6$, $Y_1$ and $Y_5$ may each independently be nitrogen (N), $Y_2$ and $Y_6$ may each independently be carbon (C), $Y_3$ and $Y_4$ may each independently be oxygen (O), at least one of $Y_1$-containing ring $B_1$ and/or $Y_5$-containing ring $B_5$ (for example, each of $Y_1$-containing ring $B_1$ and $Y_5$-containing ring $B_5$) may be a polycyclic group in which three or more cyclic groups are condensed with each other, the capping layer may include an amine-containing compound, and the amine-containing compound may include a benzoxazole group, a benzothiazole group, a naphthooxazole group, a naphthothiazole group, or any combination thereof.

The first light, the first emitter, and the amine-containing compound are the same as described in the present specification.

In one or more embodiments, an emission peak wavelength of the first light may be in a range of about 610 nm to about 680 nm, about 610 nm to about 675 nm, about 610 nm to about 670 nm, about 613 nm to about 680 nm, about 613 nm to about 675 nm, or about 613 nm to about 670 nm.

In one or more embodiments, an FWHM of a main peak in an EL spectrum of the first light extracted to the outside through the capping layer may be in a range of about 15 nm to about 90 nm, about 15 nm to about 85 nm, about 15 nm to about 80 nm, about 20 nm to about 90 nm, about 20 nm to about 85 nm, about 20 nm to about 80 nm, about 25 nm to about 90 nm, about 25 nm to about 85 nm, about 25 nm to about 80 nm, about 30 nm to about 90 nm, about 30 nm to about 85 nm, about 30 nm to about 80 nm, about 33 nm to about 90 nm, about 33 nm to about 85 nm, or about 33 nm to about 80 nm.

The first light having the emission peak wavelength and FWHM as described above may be red light.

In one or more embodiments, a refractive index of the amine-containing compound with respect to second light having a wavelength of the emission peak wavelength of the first light ±33 nm may be in a range of about 1.6 to about 2.0, about 1.6 to about 1.9, or about 1.6 to about 1.8.

As described above, a light-emitting device simultaneously (or concurrently) including i) an emission layer including iridium and a first emitter including a first ligand, a second ligand, and a third ligand, each of the first ligand, the second ligand, and the third ligand being bonded to the iridium, and ii) a capping layer including an amine-containing compound, the amine-containing compound including a benzoxazole group, a benzothiazole group, a naphthooxazole group, a naphthothiazole group, or any combination thereof, may emit red light having excellent (or improved) color purity (for example, a relatively large CIEx coordinate and/or a relatively small CIEy coordinate), and may have excellent (or improved) frontal luminescence efficiency and excellent (or improved) lateral luminescence efficiency at the same time. Accordingly, by using the light-emitting device, a high-quality electronic apparatus may be manufactured. For example, the light-emitting device may have a CIEx coordinate in a range of about 0.65 to about 0.71 or about 0.66 to about 0.70, and/or a CIEy coordinate in a range of about 0.29 to about 0.35 or about 0.30 to about 0.34.

In one or more embodiments, the first emitter may include at least one fluoro group (—F).

In one or more embodiments, the first emitter may include at least one deuterium.

In one or more embodiments, the first emitter may include a deuterated $C_1$-$C_{20}$ alkyl group, a deuterated $C_3$-$C_{10}$ cycloalkyl group, or any combination thereof.

In one or more embodiments, at least one of the first ligand, the second ligand, and/or the third ligand may include at least one fluoro group (—F).

In one or more embodiments, each of the first ligand and the third ligand may include at least one fluoro group (—F).

In one or more embodiments, at least one of the first ligand, the second ligand, and/or the third ligand may include at least one deuterium.

In one or more embodiments, at least one of the first ligand, the second ligand, and/or the third ligand may include a deuterated $C_1$-$C_{20}$ alkyl group, a deuterated $C_3$-$C_{10}$ cycloalkyl group, or any combination thereof.

In one or more embodiments, a highest occupied molecular orbital (HOMO) energy level of the first emitter may be in a range of about −5.30 eV to about −4.70 eV or about −5.25 eV to about −4.86 eV.

In one or more embodiments, a lowest unoccupied molecular orbital (LUMO) energy level of the first emitter may be in a range of about −2.40 eV to about −1.90 eV or about −2.29 eV to about −2.01 eV.

The HOMO and LUMO energy levels may be evaluated via cyclic voltammetry analysis (see for example, Evaluation Example 1) for the organometallic compound.

In one or more embodiments, triplet ($T_1$) energy of the first emitter may be in a range of about 1.30 eV to about 2.30 eV or about 1.47 eV to about 2.10 eV.

The evaluation method for the triplet energy of the first emitter may be understood by referring to, for example, Evaluation Example 1.

The emission layer may further include, in addition to the first emitter, a host, an auxiliary dopant, a sensitizer, a delayed fluorescence material, or any combination thereof. The host, the auxiliary dopant, the sensitizer, the delayed fluorescence material, or any combination thereof may each independently include at least one deuterium.

For example, the emission layer may include the first emitter and the host. The host may be different from the first emitter, and the host may include an electron-transporting compound, a hole-transporting compound, a bipolar compound, or any combination thereof. The host may not include a metal. In some embodiments, the electron-transporting compound, the hole-transporting compound, and the bipolar compound are different from each other.

In one or more embodiments, the emission layer may include the first emitter and a host, and the host may include an electron-transporting compound and a hole-transporting compound. The electron-transporting compound and the hole-transporting compound may form an exciplex.

For example, the electron-transporting compound may include at least one π electron-deficient nitrogen-containing $C_1$-$C_{60}$ cyclic group. For example, the electron-transporting compound may include a pyridine group, a pyrimidine group, a pyrazine group, a pyridazine group, a triazine group, or any combination thereof.

In one or more embodiments, the hole-transporting compound may include at least one π electron-rich $C_3$-$C_{60}$ cyclic group, a pyridine group, or a combination thereof, and may not include an electron-transporting group (for example, may not include a π electron-deficient nitrogen-containing $C_1$-$C_{60}$ cyclic group except a pyridine group, a cyano group, a sulfoxide group, and/or a phosphine oxide group).

In one or more embodiments, the following compounds may be excluded from the hole-transporting compound:

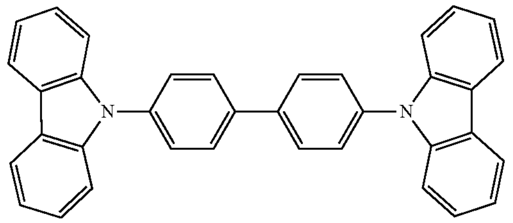

CBP

-continued

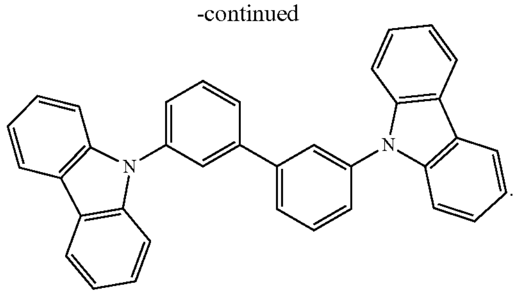

mCBP

In one or more embodiments, the electron-transporting compound may include a compound represented by Formula 2-1 or a compound represented by Formula 2-2:

Formula 2-1

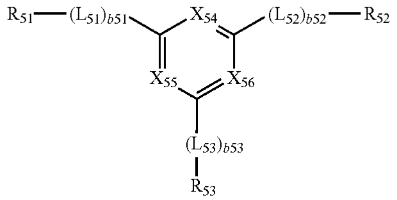

Formula 2-2

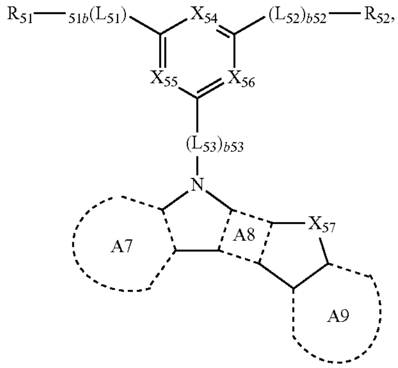

wherein, in Formulae 2-1 and 2-2, $L_{51}$ to $L_{53}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b51 to b53 may each independently be an integer from 1 to 5, A7 to A9 may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$ (for example, a benzene group or a naphthalene group, each independently unsubstituted or substituted with at least one $R_{10a}$), $X_{54}$ may be N or C($R_{54}$), $X_{55}$ may be N or C($R_{55}$), $X_{56}$ may be N or C($R_{56}$), and at least one of $X_{54}$ to $X_{56}$ may be N, $X_{57}$ may be O, S, N($R_{57}$), C($R_{57a}$)($R_{57b}$), or Si($R_{57a}$)($R_{57b}$), and $R_{51}$ to $R_{57}$, $R_{57a}$, $R_{57b}$, and $R_{10a}$ are each respectively the same as described in the present specification.

In one or more embodiments, the hole-transporting compound may include a compound represented by Formula 3-1, a compound represented by Formula 3-2, a compound represented by Formula 3-3, a compound represented by Formula 3-4, a compound represented by Formula 3-5, or any combination thereof:
Formula 3-1
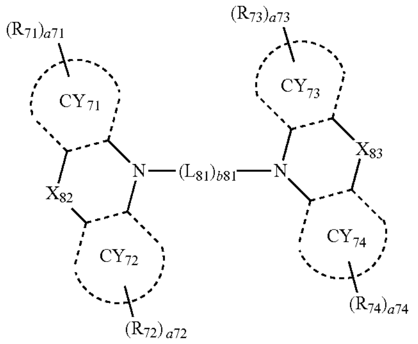
Formula 3-2
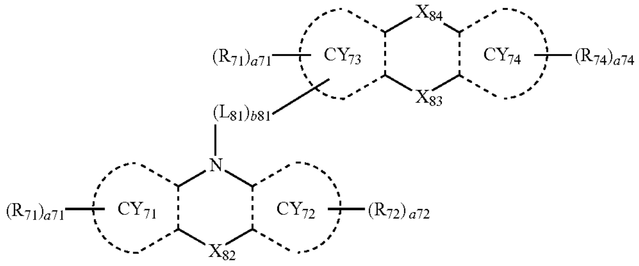
Formula 3-3
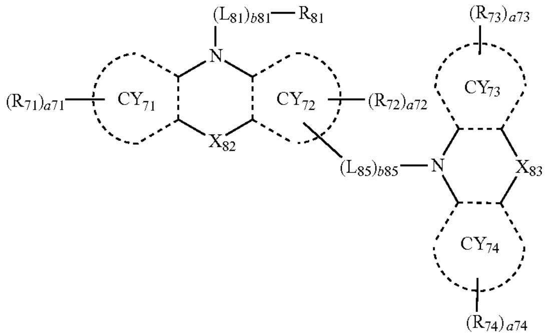
Formula 3-4
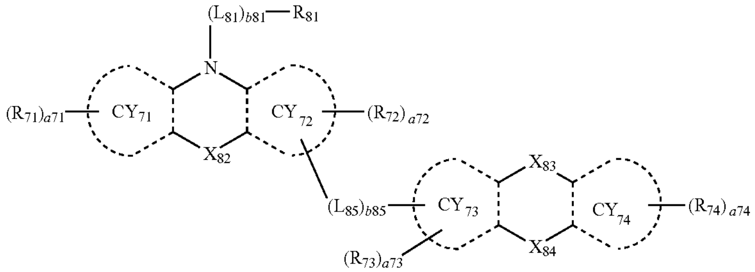

-continued

Formula 3-5

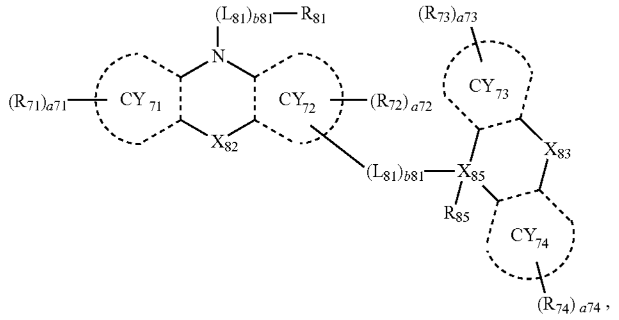

wherein, in Formulae 3-1 to 3-5, ring $CY_{71}$ to ring $CY_{74}$ may each independently be a π electron-rich $C_3$-$C_{60}$ cyclic group (for example, a benzene group, a naphthalene group, a fluorene group, an anthracene group, a carbazole group, a dibenzofuran group, or a dibenzothiophene group), or a pyridine group, $X_{82}$ may be a single bond, O, S, N-[$(L_{82})_{b82}$-$R_{82}$], C($R_{82a}$)($R_{82b}$), or Si($R_{82a}$)($R_{82b}$), $X_{83}$ may be a single bond, O, S, N-[$(L_{83})_{b83}$-$R_{83}$], C($R_{83a}$)($R_{83b}$), or Si($R_{83a}$)($R_{83b}$), $X_{84}$ may be O, S, N—[$(L_{84})_{b84}$-$R_{84}$], C($R_{84a}$)($R_{84b}$), or Si($R_{84a}$)($R_{84b}$), $X_{85}$ may be C or Si, $L_{81}$ to $L_{85}$ may each independently be a single bond, *—C($Q_4$)($Q_5$)-*', *—Si($Q_4$)($Q_5$)-*', a π electron-rich $C_3$-$C_{60}$ cyclic group unsubstituted or substituted with at least one $R_{10a}$ (for example, a benzene group, a naphthalene group, a fluorene group, an anthracene group, a carbazole group, a dibenzofuran group, or a dibenzothiophene group, each independently unsubstituted or substituted with at least one $R_{10a}$), or a pyridine group unsubstituted or substituted with at least one $R_{10a}$, wherein $Q_4$ and $Q_5$ are each independently the same as described in connection with $Q_1$, b81 to b85 may each independently be an integer from 1 to 5, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ are each respectively the same as described in the present specification, a71 to a74 may each independently be an integer from 0 to 20, and $R_{10a}$ is the same as described in the present specification.

The capping layer of the light-emitting device may be arranged outside the first electrode and/or outside the second electrode.

In one or more embodiments, the light-emitting device may further include at least one of a first capping layer arranged outside the first electrode and/or a second capping layer arranged outside the second electrode, and at least one of the first capping layer and/or the second capping layer may include the amine-containing compound described in the present specification.

In one or more embodiments, the light-emitting device may further include:

a first capping layer arranged outside the first electrode and including the amine-containing compound described in the present specification;

a second capping layer arranged outside the second electrode and including the amine-containing compound described in the present specification; or the first capping layer and the second capping layer.

In one or more embodiments, the light-emitting device may further include a third capping layer, and the third capping layer may include a compound different from the amine-containing compound described in the present specification. The third capping layer may be arranged in a path on which the first light emitted from the first emitter travels.

In one or more embodiments, the third capping layer may include a material having a refractive index (at 589 nm) of 1.6 or more.

In one or more embodiments, the third capping layer may be an organic capping layer including an organic material, an inorganic capping layer including an inorganic material, or an organic-inorganic composite capping layer including an organic material and an inorganic material.

For example, the third capping layer may include a carbocyclic compound, a heterocyclic compound, an amine group-containing compound, a porphine derivative, a phthalocyanine derivative, a naphthalocyanine derivative, an alkali metal complex, an alkaline earth-metal complex, or any combination thereof. The carbocyclic compound, the heterocyclic compound, and/or the amine group-containing compound may optionally be substituted with a substituent including O, N, S, Se, Si, F, Cl, Br, I, or any combination thereof.

For example, the third capping layer may include a compound represented by Formula 201, a compound represented by Formula 202, or any combination thereof.

In one or more embodiments, the third capping layer may include one or more of Compounds HT28 to HT33 (as described in more detail below), one or more of Compounds CP1 to CP6, β-NPB, or any compound thereof:

CP1

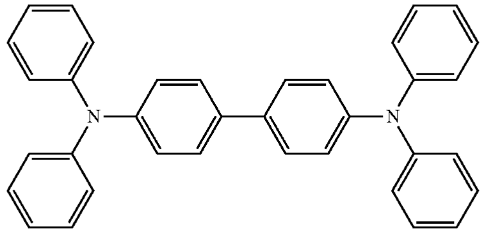

-continued

CP2

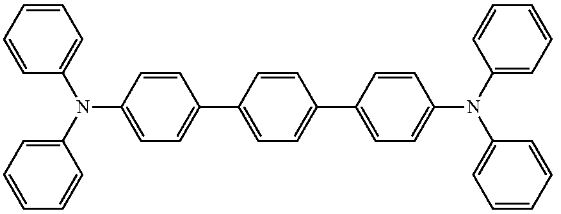

CP3

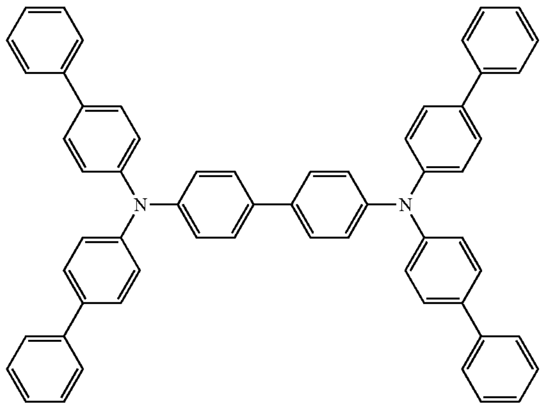

CP4

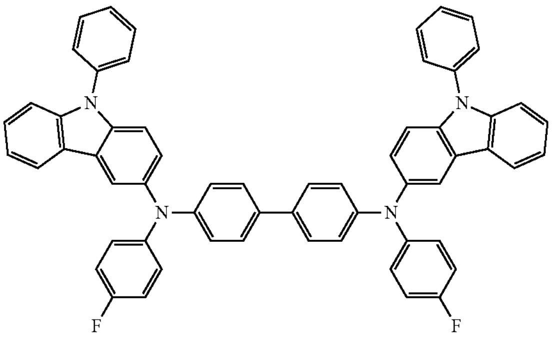

CP5

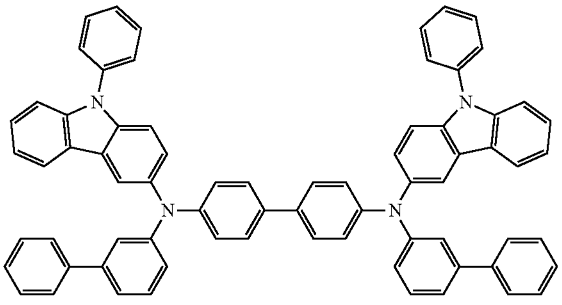

-continued

CP6

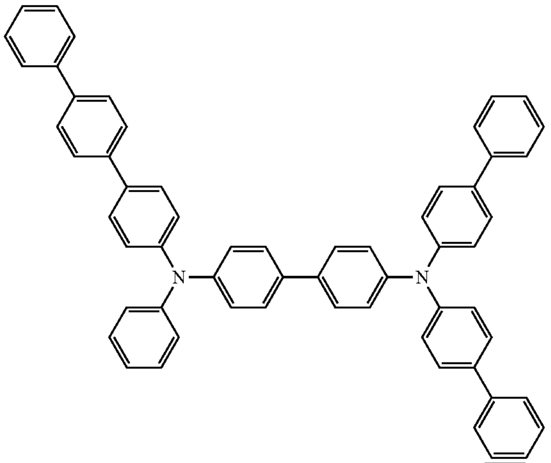

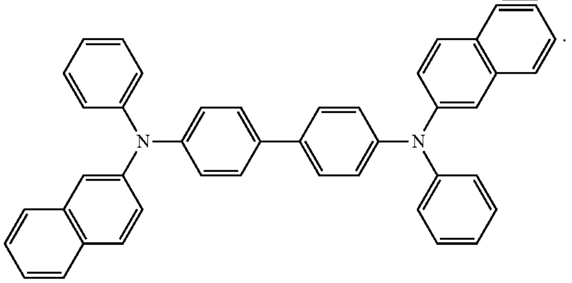

β-NPB

In one or more embodiments, the light-emitting device may have:

i) a structure in which the first electrode, the interlayer, the second electrode, and the second capping layer (including the amine-containing compound described in the present specification) are sequentially stacked;

ii) a structure in which the first electrode, the interlayer, the second electrode, the third capping layer (including a compound different from the amine-containing compound described in the present specification), and the second capping layer (including the amine-containing compound described in the present specification) are sequentially stacked; or iii) a structure in which the first electrode, the interlayer, the second electrode, the second capping layer (including the amine-containing compound described in the present specification), and the third capping layer (including a compound different from the amine-containing compound described in the present specification) are sequentially stacked.

In this regard, the first light emitted from the first emitter of the emission layer included in the interlayer may be extracted to the outside of the light-emitting device through the second electrode, and then the second capping layer (or the second capping layer and the third capping layer), and the second electrode may be a semi-transmissive electrode or a transmissive electrode.

The expression "an interlayer (or a capping layer) includes a first emitter (or an amine-containing compound)" as used herein may be understood as "an interlayer (or a capping layer) may include one kind of compound belonging to the category of a first emitter or two or more kinds of different compounds belonging to the category of a first emitter (or one kind of compound belonging to the category of an amine-containing compound or two or more kinds of different compounds belonging to the category of an amine-containing compound).

The term "interlayer" as used herein refers to a single layer and/or multilayers arranged between the first electrode and the second electrode of the light-emitting device.

One or more embodiments of the disclosure provide an electronic apparatus including the light-emitting device. The electronic apparatus may further include a thin-film transistor. For example, the electronic apparatus may further include a thin-film transistor including a source electrode and a drain electrode, and the first electrode of the light-emitting device may be electrically connected to the source electrode or the drain electrode. The electronic apparatus may further include a color filter, a color conversion layer, a touch screen layer, a polarizing layer, or any combination thereof. More details for the electronic apparatus are as described in the present specification.

One or more other embodiments of the disclosure provide an electronic device including the light-emitting device.

For example, the electronic device may be a flat panel display, a curved display, a computer monitor, a medical monitor, a television, a billboard, an indoor or outdoor lighting and/or signal light, a head-up display, a fully or partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a microdisplay, a three-dimensional (3D) display, a virtual or augmented reality display, a vehicle, a video wall including multiple displays tiled together, a theater or stadium screen, a phototherapy device, and/or a signboard.

Description of Formula

The first emitter may be, for example, an organometallic compound represented by Formula 1. In some embodiments, the amine-containing compound may be, for example, a compound represented by Formula 8:

Formula 1

$Ir(L_1)(L_2)(L_3)$

Formula 8

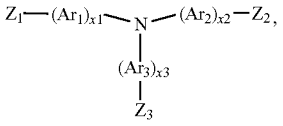

wherein, in Formula 1, $L_1$ may be a first ligand which is bonded to Ir of Formula 1 and represented by Formula 1-1, $L_2$ may be a second ligand which is bonded to Ir of Formula 1 and represented by Formula 1-2, and $L_3$ may be a third ligand which is bonded to Ir of Formula 1 and represented by Formula 1-3:

Formula 1-1

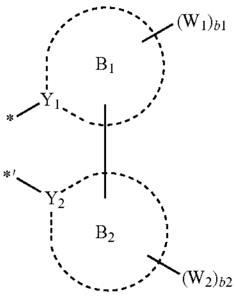

Formula 1-2

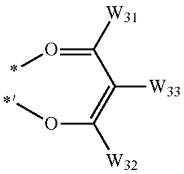

Formula 1-3

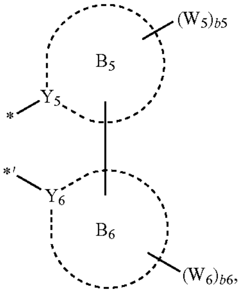

wherein, in Formulae 1-1 to 1-3 and 8, $Y_1$ and $Y_5$ may each independently be nitrogen (N), $Y_2$ and $Y_6$ may each independently be carbon (C), ring $B_1$, ring $B_2$, ring $B_5$, and ring $B_6$ may each independently be a $C_3$-$C_{60}$ carbocyclic group or a $C_1$-$C_{60}$ heterocyclic group, and at least one of $Y_1$-containing ring $B_1$ of Formula 1-1 and/or $Y_5$-containing ring $B_5$ of Formula 1-3 (for example, each of $Y_1$-containing ring $B_1$ of Formula 1-1 and $Y_5$-containing ring $B_5$ of Formula 1-3) may be a polycyclic group in which three or more cyclic groups (for example, a benzene group, a pyridine group, and/or a pyrimidine group) are condensed with each other, $Ar_1$ to $Ar_3$ and $Z_1$ to $Z_3$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, x1 to x3 may each independently be an integer from 0 to 10, i) when x1 is 0, $*-(Ar_1)_{x1}-*'$ may be a single bond, ii) when x2 is 0, $*-(Ar_2)_{x2}-*'$ may be a single bond, and iii) when x3 is 0, $*-(Ar_3)_{x3}-*'$ may be a single bond, wherein * and *' each indicate a binding site to a neighboring atom, $W_1$, $W_2$, $W_{31}$, $W_{32}$, $W_{33}$, $W_5$, and $W_6$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$) heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, $-C(Q_1)(Q_2)(Q_3)$, $-Si(Q_1)(Q_2)(Q_3)$, $-N(Q_1)(Q_2)$, $-B(Q_1)(Q_2)$, $-C(=O)(Q_1)$, $-S(=O)_2(Q_1)$, or $-P(=O)(Q_1)(Q_2)$, b1, b2, b5, and b6 may each independently be an integer from 0 to 20,

* and *' in Formulae 1-1 to 1-3 each indicate a binding site to Ir in Formula 1, i) two groups of $W_1$(s) in the number of b1, ii) two groups of $W_2$(s) in the number of b2, iii) two groups of $W_{31}$ to $W_{33}$, iv) two groups of $W_5$(s) in the number of b5, and v) two groups of $W_6$(s) in the number of b6 may each independently be optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$ (for example, i) two groups of $W_1$(s) in the number of b1 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, ii) two groups of $W_2$(s) in the number of b2 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, iii) two groups of $W_{31}$ to $W_{33}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, iv) two groups of $W_5$(s) in the number of b5 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and/or v) two groups of $W_6$(s) in the number of b6 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$), $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each independently unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $-Si(Q_{11})(Q_{12})(Q_{13})$, $-N(Q_{11})(Q_{12})$, $-B(Q_{11})(Q_{12})$, $-C(=O)(Q_{11})$, $-S(=O)_2(Q_{11})$, $-P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each independently unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $-Si(Q_{21})(Q_{22})(Q_{23})$, $-N(Q_{21})(Q_{22})$, $-B(Q_{21})(Q_{22})$, $-C(=O)(Q_{21})$, $-S(=O)_2(Q_{21})$, $-P(=O)(Q_{21})(Q_{22})$, or any combination thereof; or $-Si(Q_{31})(Q_{32})(Q_{33})$, $-N(Q_{31})(Q_{32})$, $-B(Q_{31})(Q_{32})$, $-C(=O)(Q_{31})$, $-S(=O)_2(Q_{31})$, or $-P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In one or more embodiments, the organometallic compound represented by Formula 1 may be a heteroleptic complex.

In one or more embodiments, in Formula 1, $L_3$ may be identical to $L_1$.

In one or more embodiments, in Formula 1, $L_3$ and $L_1$ may be different from each other.

In one or more embodiments, at least one of ring $B_1$ and/or ring $B_5$ may be a benzoquinoline group, a benzoisoquinoline group, a naphthoquinoline group, or a naphthoisoquinoline group.

In one or more embodiments, ring $B_1$ and ring $B_5$ may each independently be a benzoquinoline group, a benzoisoquinoline group, a naphthoquinoline group, or a naphthoisoquinoline group.

In one or more embodiments, ring $B_2$ and ring $B_6$ may each independently be a benzene group, a naphthalene group, a phenanthrene group, a furan group, a thiophene group, a selenophene group, a pyrrole group, a cyclopentadiene group, a silole group, a benzofuran group, a benzothiophene group, a benzoselenophene group, an indole group, an indene group, a benzosilole group, a dibenzofuran group, a dibenzothiophene group, a dibenzoselenophene group, a carbazole group, a fluorene group, or a dibenzosilole group.

In one or more embodiments, $Ar_1$ to $Ar_3$ and $Z_1$ to $Z_3$ in Formula 8 may each independently be a benzene group, a pyridine group, a pyrimidine group, a pyrazine group, a pyridazine group, a triazine group, a benzoxazole group, a benzthiazole group, a naphthooxazole group, or a naphthothiazole group, each independently unsubstituted or substituted with at least one $R_{10a}$. For example, at least one of $Z_1$ to $Z_3$ in Formula 8 may each independently be a benzoxazole group, a benzthiazole group, a naphthooxazole group, or a naphthothiazole group, each independently unsubstituted or substituted with at least one $R_{10a}$. In this regard, $R_{10a}$ may be: deuterium; a $C_1$-$C_{20}$ alkyl group substituted or unsubstituted with at least one deuterium; or a $C_3$-$C_{20}$ carbocyclic group or a $C_1$-$C_{20}$ heterocyclic group, each independently unsubstituted or substituted with deuterium, a $C_1$-$C_{20}$ alkyl group, a $C_3$-$C_{20}$ carbocyclic group, a $C_1$-$C_{20}$ heterocyclic group, or any combination thereof.

x1, x2, and x3 in Formula 8 respectively indicate the number of $Ar_1$(s), the number of $Ar_2$(s), and the number of $Ar_3$(s), and, for example, may each independently be 0, 1, 2, or 3.

In one or more embodiments, $W_1$, $W_2$, $W_{31}$, $W_{32}$, $W_{33}$, $W_5$, and $W_6$ in Formula 1 may each independently be:

hydrogen, deuterium, —F, or a cyano group;

a $C_1$-$C_{20}$ alkyl group or a $C_3$-$C_{10}$ cycloalkyl group, each independently unsubstituted or substituted with deuterium, —F, a cyano group, or any combination thereof;

a phenyl group, a biphenyl group, a naphthyl group, a dibenzofuranyl group, or a dibenzothiophenyl group (or a thienyl group), each independently unsubstituted or substituted with deuterium, —F, cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, or any combination thereof; or —$Si(Q_1)(Q_2)(Q_3)$.

In this regard, $Q_1$ to $Q_3$ are each the same as described in the present specification.

In one or more embodiments, at least one of $W_1$, $W_2$, $W_{31}$, $W_{32}$, $W_{33}$, $W_5$, and/or $W_6$ may include at least one deuterium.

In one or more embodiments, at least one of $W_1$, $W_2$, $W_{31}$, $W_{32}$, $W_{33}$, $W_5$, and/or $W_6$ may be deuterium, a deuterated $C_1$-$C_{20}$ alkyl group, or a deuterated $C_3$-$C_{10}$ cycloalkyl group.

In one or more embodiments, at least one of $W_1$, $W_2$, $W_5$, and/or $W_6$ may include at least one deuterium.

In one or more embodiments, at least one of $W_1$, $W_2$, $W_5$, and/or $W_6$ may include at least one fluoro group (—F).

In one or more embodiments, at least one of $W_1$ and/or $W_5$ may include at least one fluoro group (—F).

In one or more embodiments, at least one of $W_1$(s) in the number of b1 and at least one of $W_5$(s) in the number of b5 may each be a fluoro group (—F).

In one or more embodiments, at least one of $W_{31}$ and/or $W_{32}$ in Formula 1-2 may include two or more carbons.

In one or more embodiments, each of $W_{31}$ and $W_{32}$ in Formula 1-2 may include two or more carbons.

In one or more embodiments, each of $W_{31}$ and $W_{32}$ in Formula 1-2 may not be a methyl group at the same time.

In one or more embodiments, each of $W_{31}$ and $W_{32}$ in Formula 1-2 may not be a tert-butyl group at the same time.

The term "biphenyl group" as used herein refers to a monovalent substituent having a structure in which two benzene groups are linked to each other through a single bond.

Examples of the $C_3$-$C_{10}$ cycloalkyl group as used herein may include a cyclopentyl group, a cyclohexyl group, a cycloheptyl group, an adamantanyl group, and a norbornanyl group.

The term "deuterated" as used herein includes both fully deuterated and partially deuterated.

The term "fluorinated" as used herein includes both fully fluorinated and partially fluorinated.

b1, b2, b5, and b6 in Formula 1 respectively indicate the number of $W_1$(s), the number of $W_2$(s), the number of $W_5$(s), and the number of $W_6$(s), and, for example, may each independently be 0, 1, 2, 3, or 4. When b1 is 2 or more, two or more of $W_1$(s) may be identical to or different from each other, when b2 is 2 or more, two or more of $W_2$(s) may be identical to or different from each other, when b5 is 2 or more, two or more of $W_5$(s) may be identical to or different from each other, and when b6 is 2 or more, two or more of $W_6$(s) may be identical to or different from each other.

In one or more embodiments, the first emitter may be an organometallic compound represented by Formula 1A:

Formula 1A

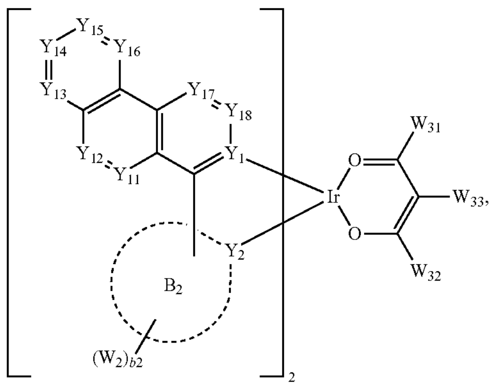

wherein, in Formula 1A, $Y_1$ may be N, $Y_2$ may be C, ring $B_2$, $W_2$, $W_{31}$, $W_{32}$, $W_{33}$, and b2 are each respectively the same as described in the present specification, $Y_{11}$ may be $C(W_{11})$ or N, $Y_{12}$ may be $C(W_{12})$ or N, $Y_{13}$ may be $C(W_{13})$ or N, $Y_{14}$ may be $C(W_{14})$ or N, $Y_{15}$ may be $C(W_{15})$ or N, $Y_{16}$ may be $C(W_{16})$ or N, $Y_{17}$ may be $C(W_{17})$ or N, and $Y_{18}$ may be $C(W_{18})$ or N, $W_{11}$ to $W_{18}$ are each the same as described in connection with $W_1$, two or more of $W_{11}$ to $W_{18}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $W_2$(s) in the number of b2 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and two or more of $W_{31}$ to $W_{33}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

Formula 1A may correspond to an organometallic compound in which the third ligand in Formula 1 is identical to the first ligand.

In one or more embodiments, in Formula 1A, $Y_{11}$ may be $C(W_{11})$, $Y_{12}$ may be $C(W_{12})$, $Y_{13}$ may be $C(W_{13})$, $Y_{14}$ may be $C(W_{14})$, $Y_{15}$ may be $C(W_{15})$, $Y_{16}$ may be $C(W_{16})$, $Y_{17}$ may be $C(W_{17})$, and $Y_{18}$ may be $C(W_{18})$. In this regard, at least one of $W_{11}$ to $W_{18}$ i) may include a fluoro group (—F), or ii) may be a fluoro group (—F). For example, at least one of $W_{11}$ to $W_{18}$ may be a fluorinated $C_1$-$C_{20}$ alkyl group (for example, —$CF_3$, —$CHF_2$, and/or —$CH_2F$) or —F.

In one or more embodiments, in Formula 1A, $Y_{11}$ may be $C(W_{11})$, $Y_{12}$ may be $C(W_{12})$, $Y_{13}$ may be $C(W_{13})$, $Y_{14}$ may be $C(W_{14})$, $Y_{15}$ may be $C(W_{15})$, $Y_{16}$ may be $C(W_{16})$, $Y_{17}$ may be $C(W_{17})$, and $Y_{18}$ may be $C(W_{18})$. In this regard, at least one of $W_{11}$ to $W_{18}$ i) may include deuterium, or ii) may be deuterium. For example, at least one of $W_{11}$ to $W_{18}$ may be a deuterated $C_1$-$C_{20}$ alkyl group (for example, —$CD_3$, —$CHD_2$, and/or —$CH_2D$) or deuterium.

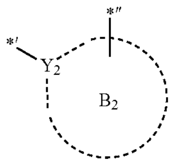
In one or more embodiments, a group represented by in Formulae 1-1 and 1A and a group represented by
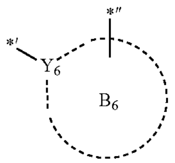
in Formula 1-3 may each independently be a group represented by one of Formulae BC-1 to BC-16:
BC-1
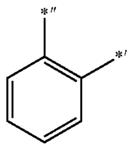
BC-2
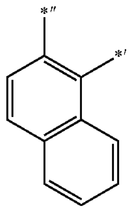
BC-3
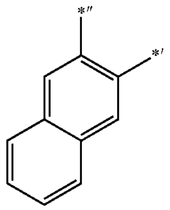
BC-4
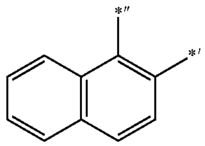
BC-5
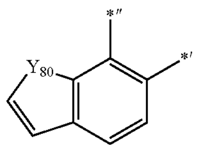
BC-6
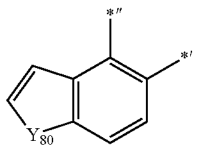
-continued
BC-7
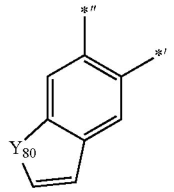
BC-8
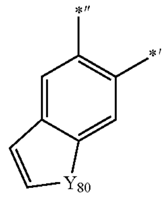
BC-9
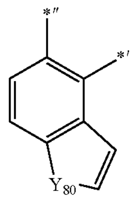
BC-10
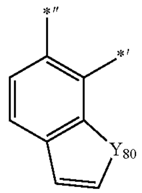
BC-11
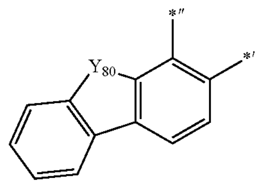
BC-12
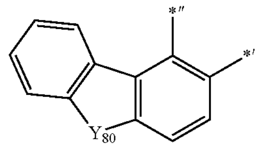
BC-13
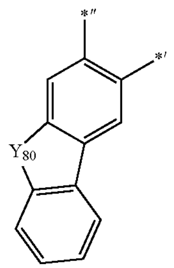

-continued

BC-14

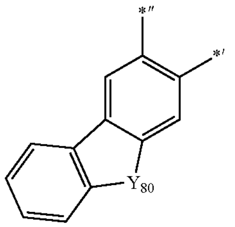

BC-15

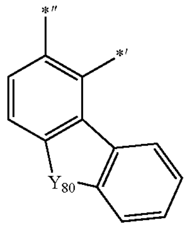

BC-16

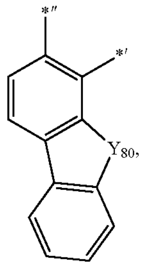

wherein, in Formulae BC-1 to BC-16, $Y_{80}$ may be 0, S, Se, $N(W_{80})$, $C(W_{80a})(W_{80b})$, or $Si(W_{80a})(W_{80b})$, $W_{80}$, $W_{80a}$, and $W_{80b}$ are each the same as described in connection with $W_2$ or $W_6$,

*' indicates a binding site to iridium in Formula 1, and

*" indicates a binding site to a neighboring atom in Formula 1.

Formulae BC-1 to BC-16 may be substituted or unsubstituted with $W_2$ or $W_6$ as described in the present specification, and may be easily understood with reference to the structures of Formulae 1-1, 1-A, and 1-3.

In one or more embodiments, when ring $B_2$ in Formula 1A is a naphthalene group, at least one of $W_{31}$ and/or $W_{32}$ may not be a methyl group.

In one or more embodiments, the amine-containing compound may be a compound represented by Formula 8-1:

Formula 8-1

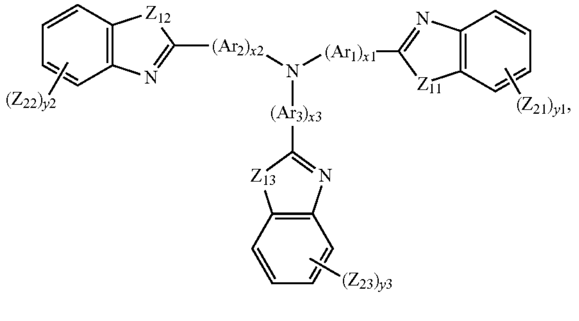

wherein, in Formula 8-1, $Ar_1$ to $Ar_3$ and x1 to x3 are each respectively the same as described in the present specification, $Z_{11}$ to $Z_{13}$ may each independently be O or S, $Z_{21}$ to $Z_{23}$ are each the same as described in connection with $R_{10a}$, and y1 to y3 may each independently be an integer from 0 to 4.

b51 to b53 in Formulae 2-1 and 2-2 respectively indicate the number of $L_{51}$(s) to the number of $L_{53}$(s), and may each independently be an integer from 1 to 5. When b51 is 2 or more, two or more of $L_{51}$(s) may be identical to or different from each other, when b52 is 2 or more, two or more of $L_{52}$(s) may be identical to or different from each other, and when b53 is 2 or more, two or more of $L_{53}$(s) may be identical to or different from each other. For example, b51 to b53 may each independently be 1 or 2.

$L_{51}$ to $L_{53}$ in Formulae 2-1 and 2-2 may each independently be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a dibenzooxasiline group, a dibenzothiasiline group, a dibenzodihydroazasiline group, a dibenzodihydrodisiline group, a dibenzodihydrosiline group, a dibenzodioxine group, a dibenzooxathiine group, a dibenzooxazine group, a dibenzopyran group, a dibenzodithiine group, a dibenzothiazine group, a dibenzothiopyran group, a dibenzocyclohexadiene group, a dibenzodihydropyridine group, a dibenzodihydropyrazine group, an indolocarbazole group, an indolodibenzofuran group, or an indolodibenzothiophene group, each independently unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, $-O(Q_{31})$, $-S(Q_{31})$, $-Si(Q_{31})(Q_{32})(Q_{33})$, $-N(Q_{31})(Q_{32})$, $-B(Q_{31})(Q_{32})$, $-P(Q_{31})(Q_{32})$, $-C(=O)(Q_{31})$, $-S(=O)_2(Q_{31})$, $-P(=O)(Q_{31})(Q_{32})$, or any combination thereof, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In Formulae 2-1 and 2-2, $X_{54}$ may be N or C($R_{54}$), $X_{55}$ may be N or C($R_{55}$), $X_{56}$ may be N or C($R_{56}$), and at least one of $X_{54}$ to $X_{56}$ may be N. $R_{54}$ to $R_{56}$ are each respectively the same as described in the present specification. For example, two or three of $X_{54}$ to $X_{56}$ may each be N.

$R_{51}$ to $R_{57}$, $R_{57a}$, $R_{57b}$, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$). $Q_1$ to $Q_3$ are the same as described in the present specification.

For example, i) $W_1$, $W_2$, $W_{31}$, $W_{32}$, $W_{33}$, $W_5$, $W_6$, $W_{11}$ to $W_{18}$, $W_{80}$, $W_{80a}$, and $W_{80b}$ in Formulae 1 and 1A, ii) $R_{51}$ to $R_{57}$, $R_{57a}$, $R_{57b}$, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ in Formulae 2-1, 2-2, and 3-1 to 3-5, and iii) $R_{10a}$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each independently substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each independently unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzothiazolyl group, a benzoisoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)$_2$($Q_{31}$), —P(=O)($Q_{31}$)($Q_{32}$), or any combination thereof; or —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and $Q_1$ to $Q_3$ and $Q_{31}$ to $Q_{33}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each independently unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof:

Formula 91

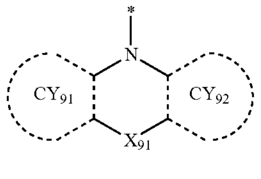

, wherein, in Formula 91, ring $CY_{91}$ and ring $CY_{92}$ may each independently be a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $X_{91}$ may be a single bond, O, S, $N(R_{91})$, $B(R_{91})$, $C(R_{91a})(R_{91b})$, or $Si(R_{91a})(R_{91b})$, $R_{91}$, $R_{91a}$, and $R_{91b}$ are respectively the same as described in connection with $R_{82}$, $R_{82a}$, and $R_{82b}$, $R_{10a}$ is the same as described in the present specification, and

* may indicate a binding site to a neighboring atom.

For example, in Formula 91, ring $CY_{91}$ and ring $CY_{92}$ may each independently be a benzene group, a pyridine group, a pyrimidine group, a pyrazine group, a pyridazine group, or a triazine group, each independently unsubstituted or substituted with at least one $R_{10a}$, and $R_{91}$, $R_{91a}$, and $R_{91b}$ may each independently be:

hydrogen or a $C_1$-$C_{10}$ alkyl group; or a phenyl group, a pyridinyl group, a pyrimidinyl group, a pyridazinyl group, a pyrazinyl group, or a triazinyl group, each independently unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof.

In one or more embodiments, i) $W_1$, $W_2$, $W_{31}$, $W_{32}$, $W_{33}$, $W_5$, $W_6$, $W_{11}$ to $W_{18}$, $W_{80}$, $W_{80a}$, and $W_{80b}$ in Formulae 1 and 1A, ii) $R_{51}$ to $R_{57}$, $R_{57a}$, $R_{57b}$, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ in Formulae 2-1, 2-2, 3-1 to 3-5, 502, and 503, and iii) $R_{10a}$ may each independently be hydrogen, deuterium, —F, a cyano group, a nitro group, $—CH_3$, $—CD_3$, $—CD_2H$, $—CDH_2$, $—CF_3$, $—CF_2H$, $—CFH_2$, a group represented by one of Formulae 9-1 to 9-19, a group represented by one of Formulae 10-1 to 10-246, $—C(Q_1)(Q_2)(Q_3)$, $—Si(Q_1)(Q_2)(Q_3)$, or $—P(=O)(Q_1)(Q_2)$ (where $Q_1$ to $Q_3$ are each independently the same as described in the present specification) (where $R_{10a}$ is not hydrogen):

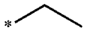
9-1

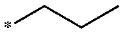
9-2

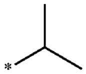
9-3

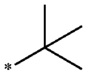
9-4

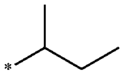
9-5

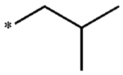
9-6

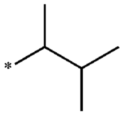
9-7

-continued

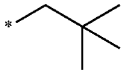
9-8

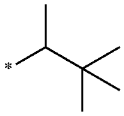
9-9

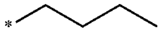
9-10

9-11

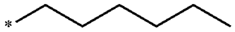
9-12

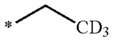
9-13

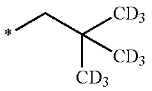
9-14

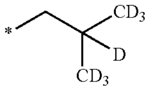
9-15

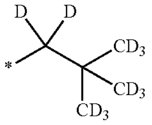
9-16

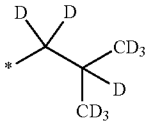
9-17

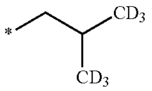
9-18

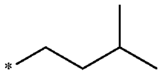
9-19

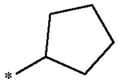
10-1

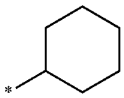
10-2

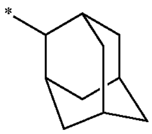
10-3

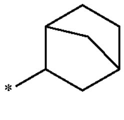
10-4

-continued
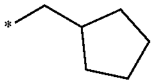
10-5
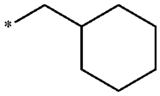
10-6
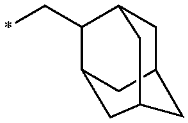
10-7
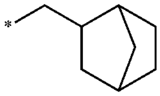
10-8
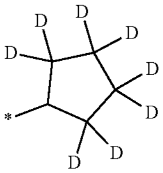
10-9
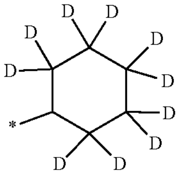
10-10
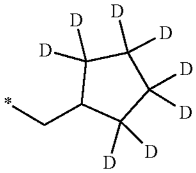
10-11
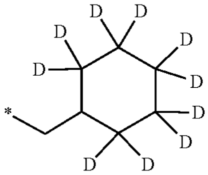
10-12
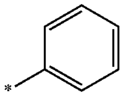
10-13
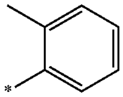
10-14
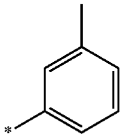
10-15
-continued
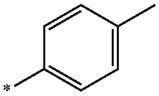
10-16
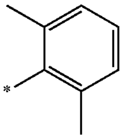
10-17
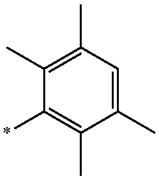
10-18
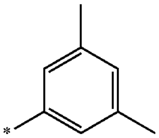
10-19
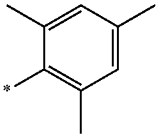
10-20
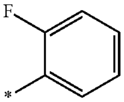
10-21
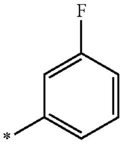
10-22
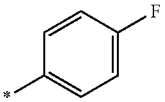
10-23
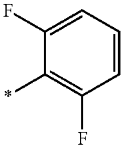
10-24
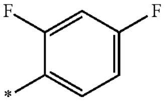
10-25
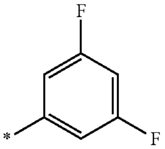
10-26

-continued
10-27
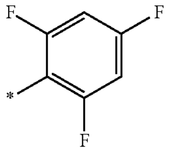
10-28
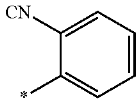
10-29
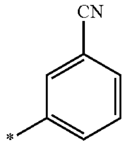
10-30
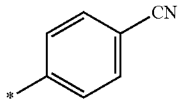
10-31
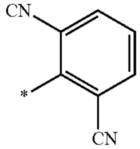
10-32
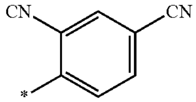
10-33
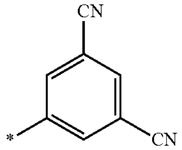
10-34
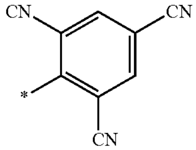
10-35
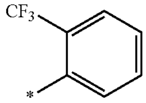
10-36
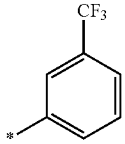
10-37
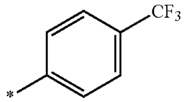
-continued
10-38
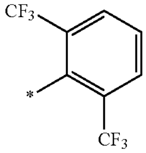
10-39
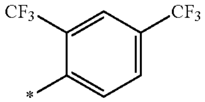
10-40
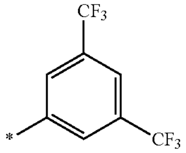
10-41
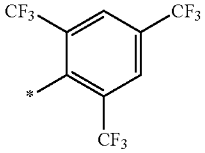
10-42
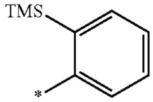
10-43
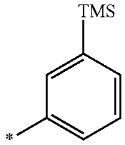
10-44
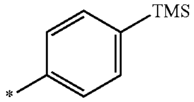
10-45
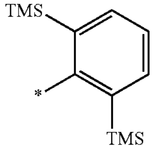
10-46
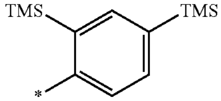
10-47
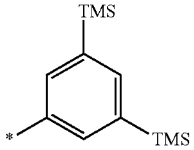
10-48
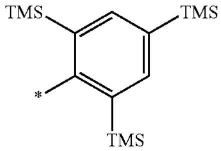

-continued
10-49
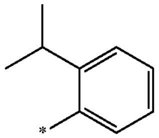
10-50
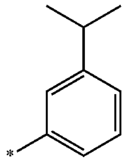
10-51
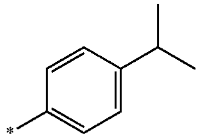
10-52
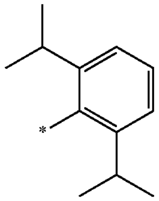
10-53
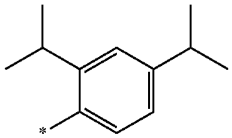
10-54
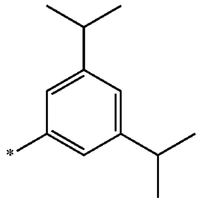
10-55
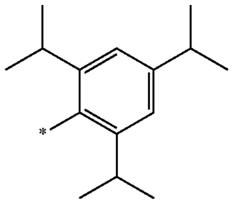
10-56
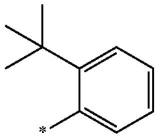
10-57
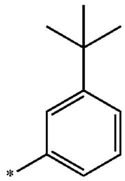
-continued
10-58
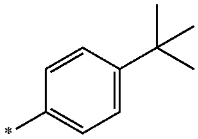
10-59
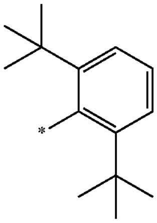
10-60
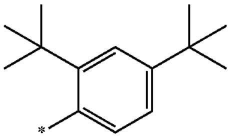
10-61
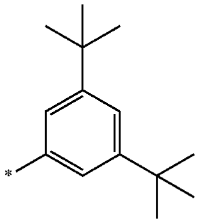
10-62
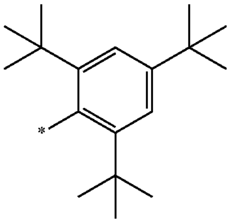
10-63
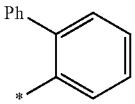
10-64
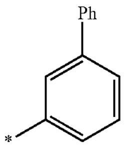
10-65
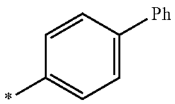
10-66
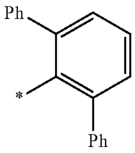

-continued
10-67
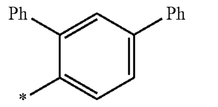
10-68
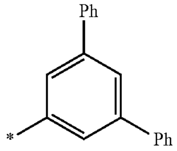
10-69
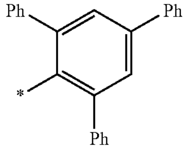
10-70
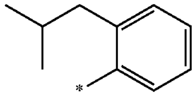
10-71
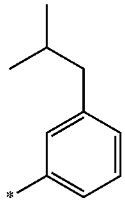
10-72
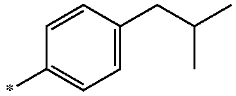
10-73
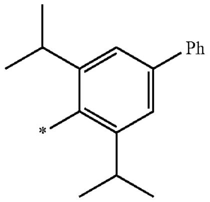
10-74
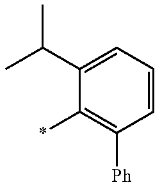
10-75
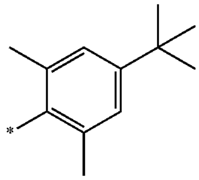
-continued
10-76
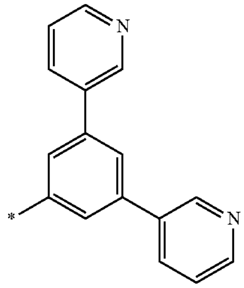
10-77
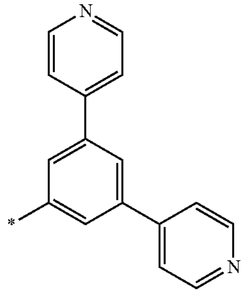
10-78
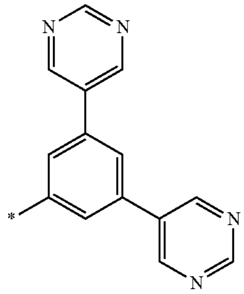
10-79
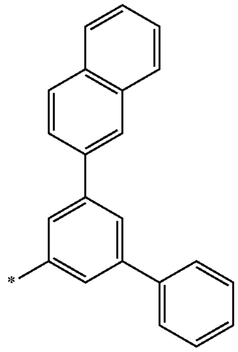
10-80
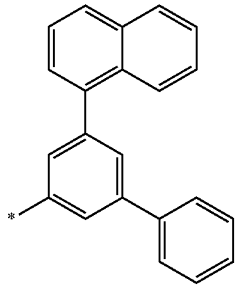

-continued
10-81
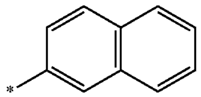
10-82
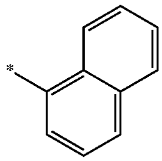
10-83
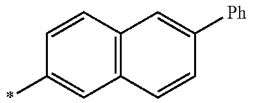
10-84
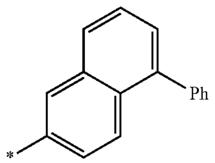
10-85
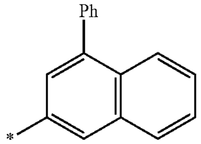
10-86
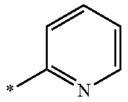
10-87
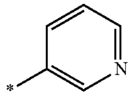
10-88
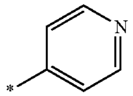
10-89
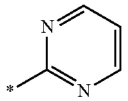
10-90
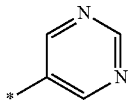
10-91
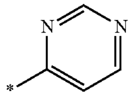
10-92
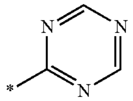
-continued
10-93
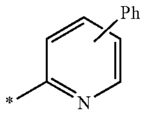
10-94
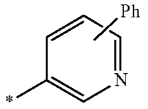
10-95
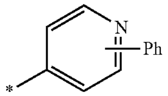
10-96
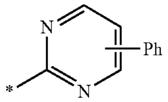
10-97
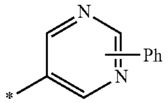
10-98
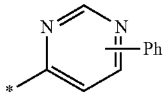
10-99
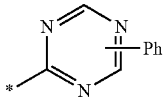
10-100
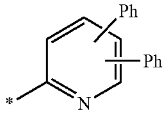
10-101
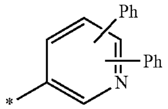
10-102
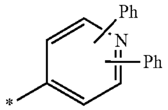
10-103
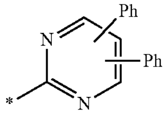
10-104
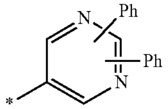
10-105
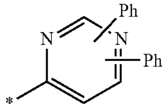

-continued
10-106
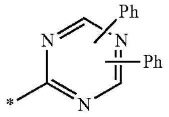
10-107
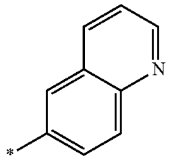
10-108
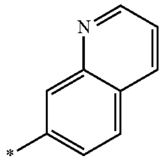
10-109
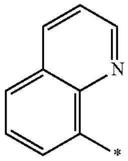
10-110
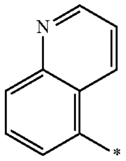
10-111
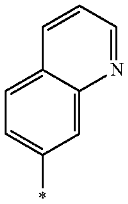
10-112
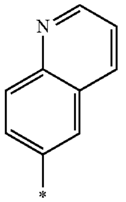
10-113
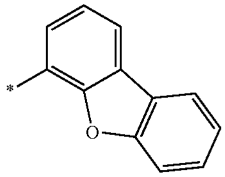
10-114
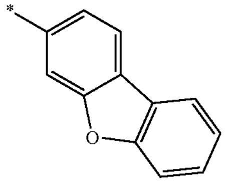
-continued
10-115
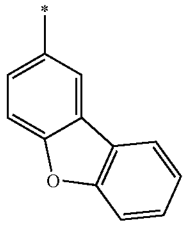
10-116
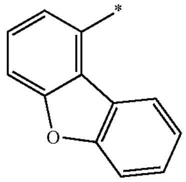
10-117
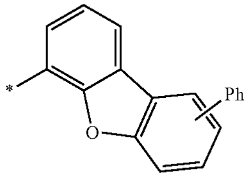
10-118
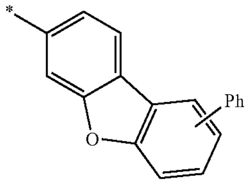
10-119
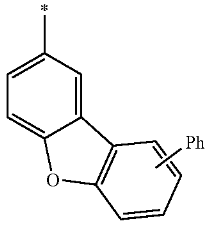
10-120
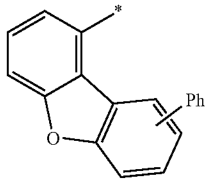
10-121
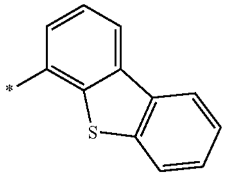
10-122
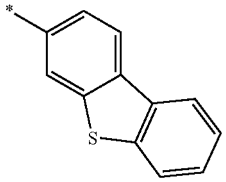

-continued
10-123
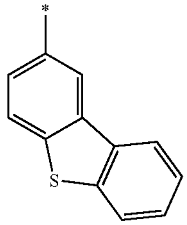
10-124
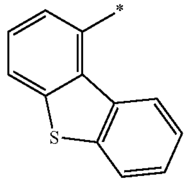
10-125
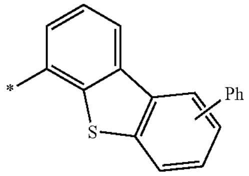
10-126
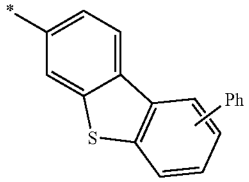
10-127
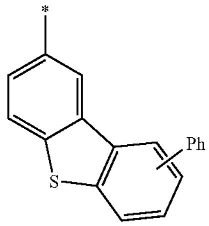
10-128
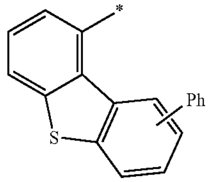
10-129
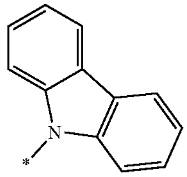
10-130
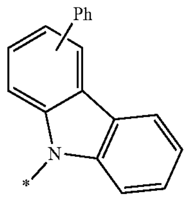
-continued
10-131
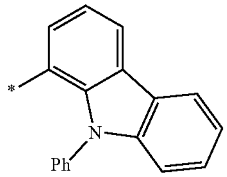
10-132
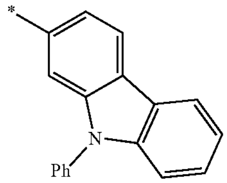
10-133
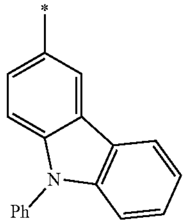
10-134
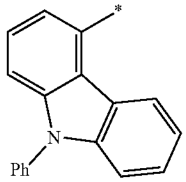
10-135
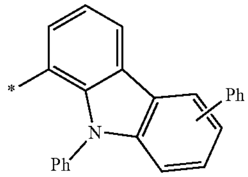
10-136
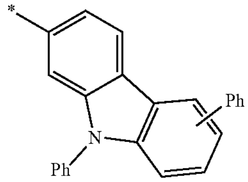
10-137
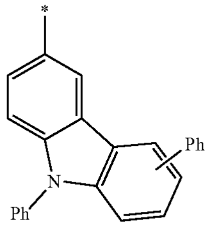
10-138
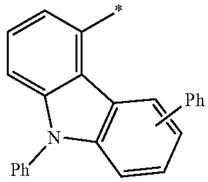

-continued
10-139
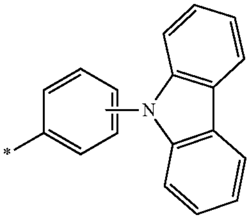
10-140
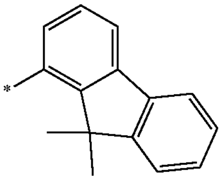
10-141
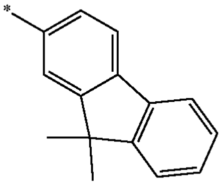
10-142
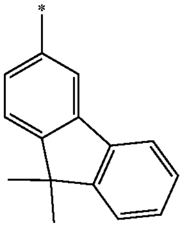
10-143
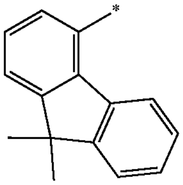
10-144
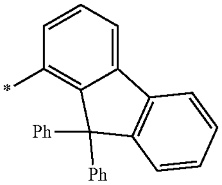
10-145
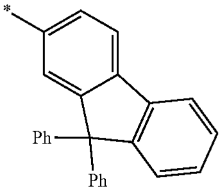
-continued
10-146
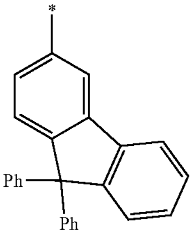
10-147
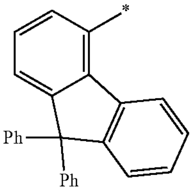
10-148
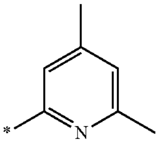
10-149
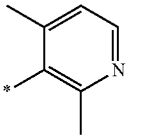
10-150
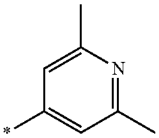
10-151
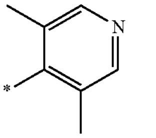
10-152
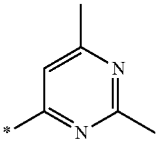
10-153
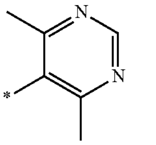
10-154
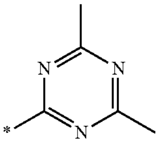
10-155
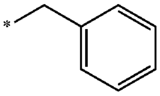

10-156
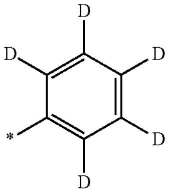
10-157
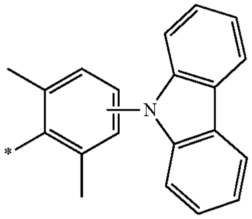
10-158
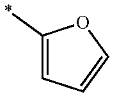
10-159
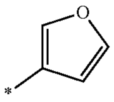
10-160
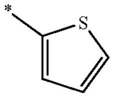
10-161
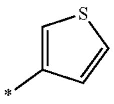
10-162
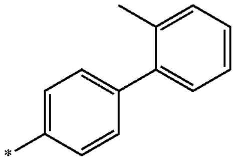
10-163
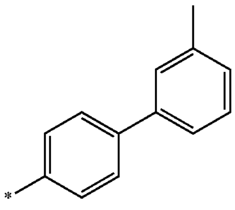
10-164
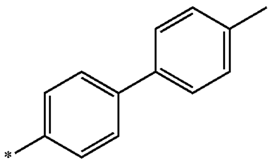
10-165
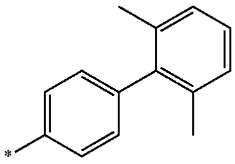
10-166
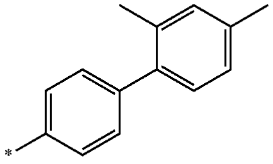
10-167
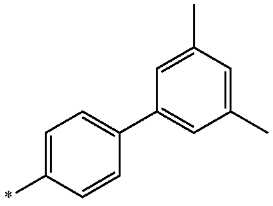
10-168
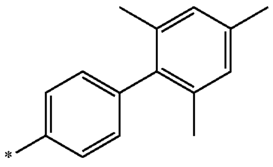
10-169
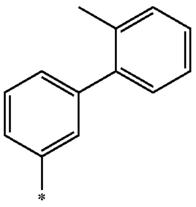
10-170
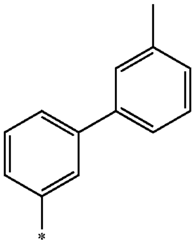
10-171
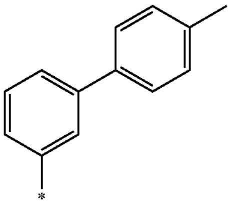
10-172
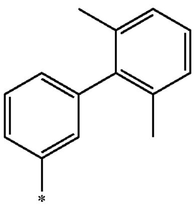

-continued
10-173
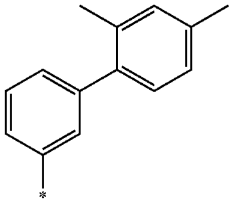
10-174
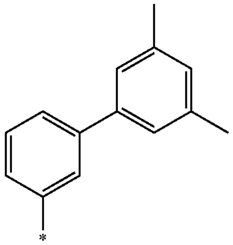
10-175
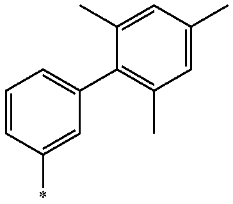
10-176
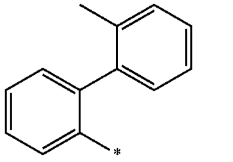
10-177
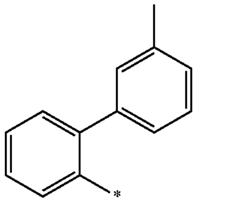
10-178
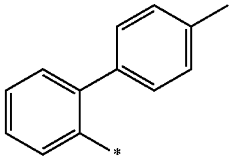
10-179
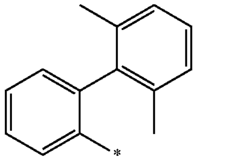
10-180
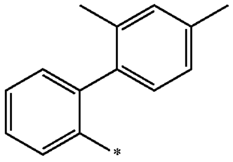
-continued
10-181
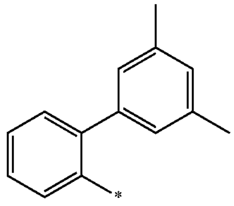
10-182
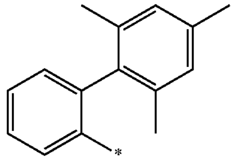
10-183
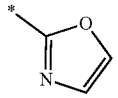
10-184
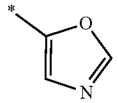
10-185
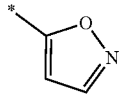
10-186
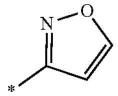
10-187
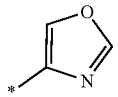
10-188
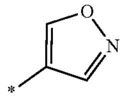
10-189
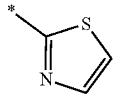
10-190
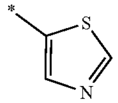
10-191
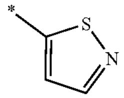
10-192
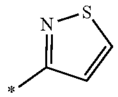
10-193
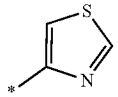

-continued
10-194
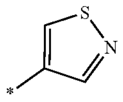
10-195
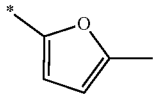
10-196
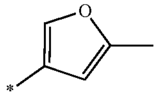
10-197
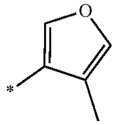
10-198
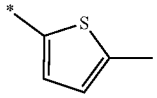
10-199
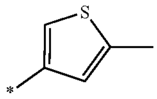
10-200
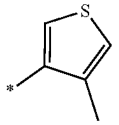
10-201
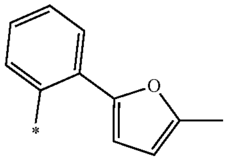
10-202
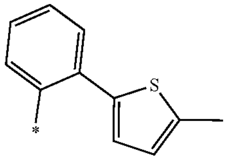
10-203
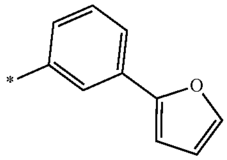
10-204
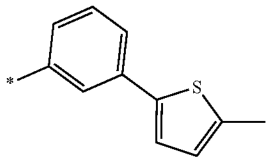
-continued
10-205
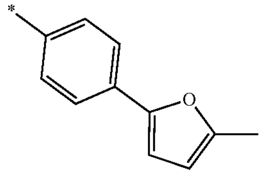
10-206
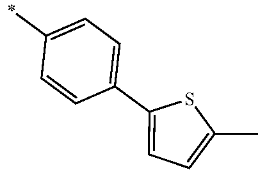
10-207
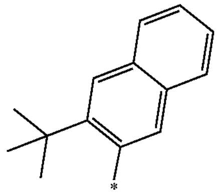
10-208
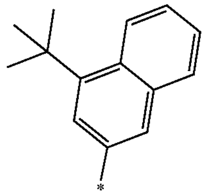
10-209
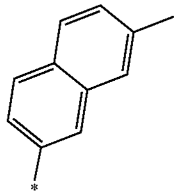
10-210
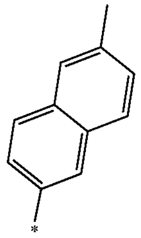
10-211
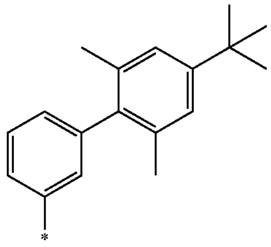

-continued
10-212
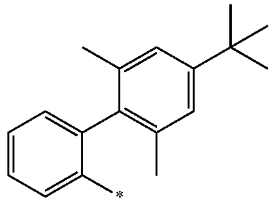
10-213
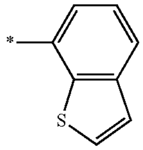
10-214
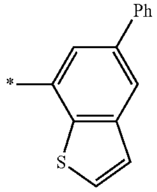
10-215
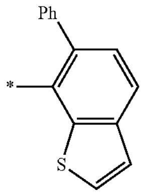
10-216
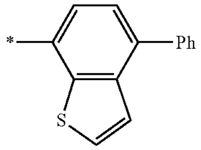
10-217
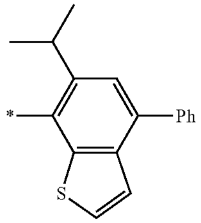
10-218
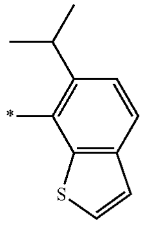
10-219
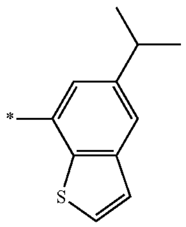
-continued
10-220
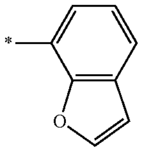
10-221
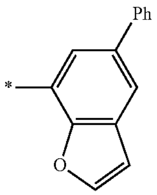
10-222
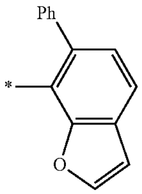
10-223
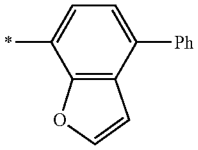
10-224
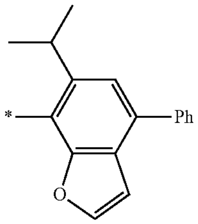
10-225
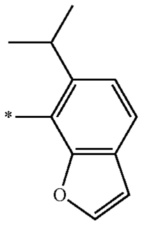
10-226
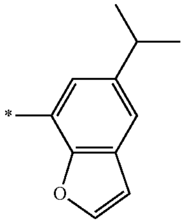
10-227
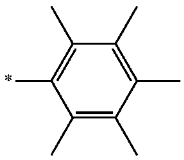

-continued
10-228
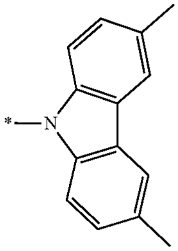
10-229
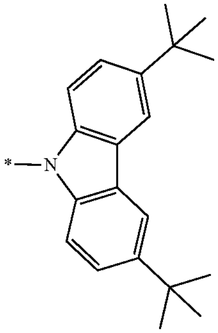
10-230
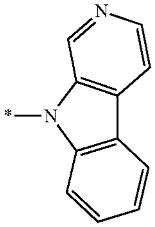
10-231
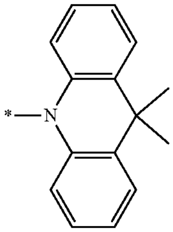
10-232
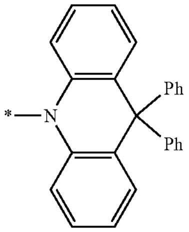
10-233
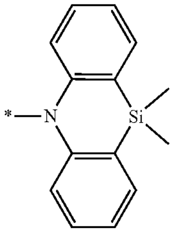
-continued
10-234
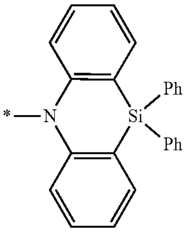
10-235
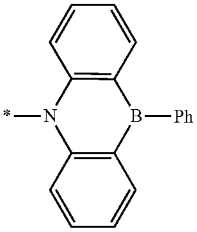
10-236
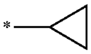
10-237
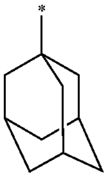
10-238
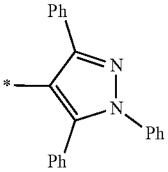
10-239
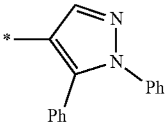
10-240
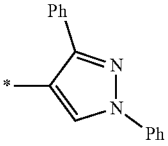
10-241
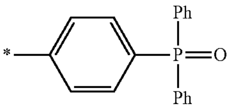
10-242
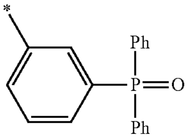
10-243
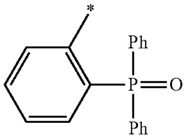

-continued 10-244

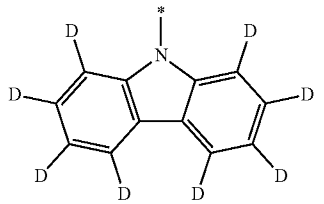

10-245

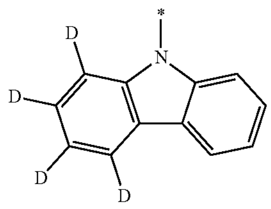

10-246

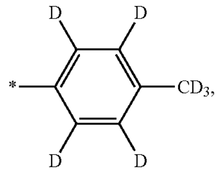

wherein, in Formulae 9-1 to 9-19 and 10-1 to 10-246, * indicates a binding site to a neighboring atom, "Ph" represents a phenyl group, and "TMS" represents a trimethylsilyl group.

a71 to a74 in Formulae 3-1 to 3-5 respectively indicate the number of $R_{71}$(s) to the number of $R_{74}$(s), and may each independently be an integer from 0 to 20. When a71 is 2 or more, two or more of $R_{71}$(s) may be identical to or different from each other, when a72 is 2 or more, two or more of $R_{72}$(s) may be identical to or different from each other, when a73 is 2 or more, two or more of $R_{73}$(s) may be identical to or different from each other, and when a74 is 2 or more, two or more of $R_{74}$(s) may be identical to or different from each other. A71 to a74 may each independently be an integer from 0 to 8.

In Formula 1, i) two or more of $W_1$(s) in the number of b1 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, ii) two or more of $W_2$(s) in the number of b2 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, iii) two or more of $W_{31}$ to $W_{33}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, vi) two or more of $W_5$(s) in the number of b5 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and/or v) two or more of $W_6$(s) in the number of b6 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

$L_{81}$ to $L_{85}$ in Formulae 3-1 to 3-5 may each independently be:

a single bond;

$*$—$C(Q_4)(Q_5)$-*' or *—$Si(Q_4)(Q_5)$-*'; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each independently unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, —$P(=O)(Q_{31})(Q_{32})$, or any combination thereof, and $Q_4$, $Q_5$, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In one or more embodiments, a group represented by

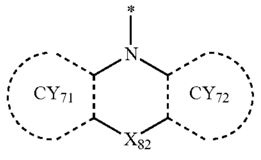

in Formulae 3-1 and 3-2 may be a group represented by one of Formulae CY71-1(1 to CY71-1(8), a group represented by

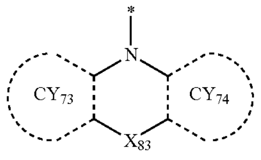

in Formulae 3-1 and 3-3 may be a group represented by one of Formulae CY71-2(1) to CY71-2(8), a group represented by

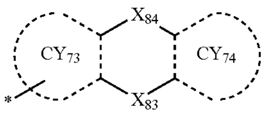

in Formulae 3-2 and 3-4 may be a group represented by one of Formulae CY71-3(1) to CY71-3(32), a group represented by

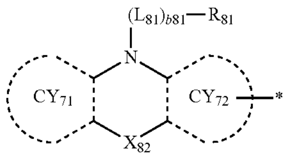

in Formulae 3-3 to 3-5 may be a group represented by one of Formulae CY71-4(1) to CY71-4(32), and/or a group represented by

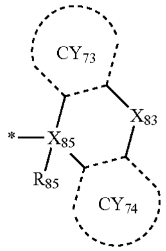

in Formula 3-5 may be a group represented by one of Formulae CY71-5(1) to CY71-5(8):

CY71-1(1)

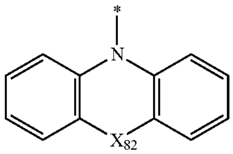

CY71-1(2)

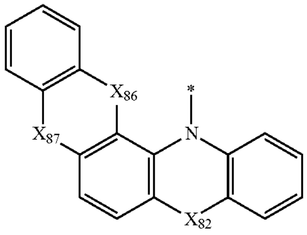

CY71-1(3)

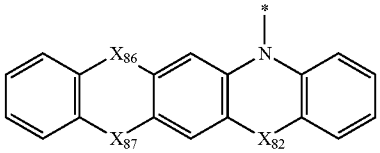

-continued

CY71-1(4)

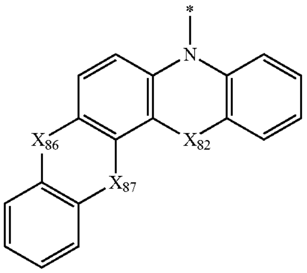

CY71-1(5)

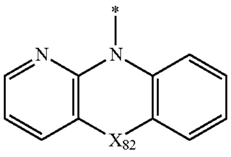

CY71-1(6)

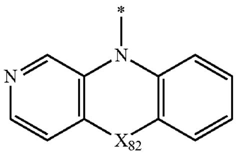

CY71-1(7)

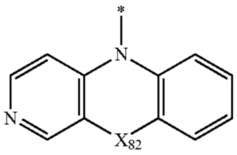

CY71-1(8)

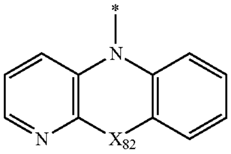

CY71-2(1)

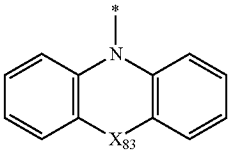

CY71-2(2)

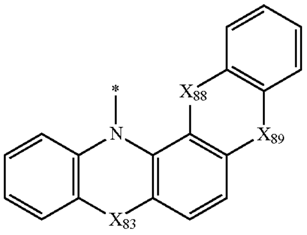

CY71-2(3)

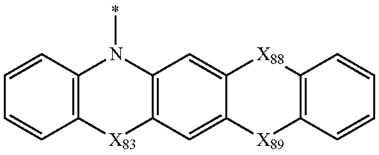

-continued
CY71-2(4)
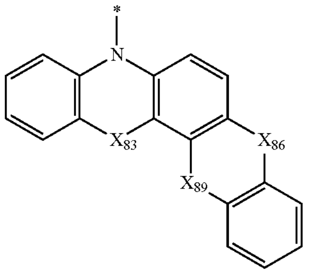
CY71-2(5)
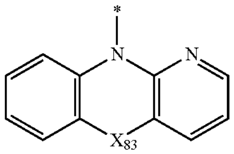
CY71-2(6)
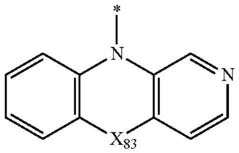
CY71-2(7)
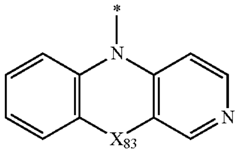
CY71-2(8)
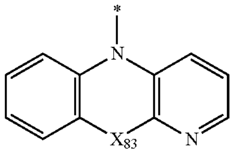
CY71-3(1)
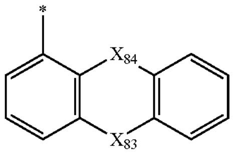
CY71-3(2)
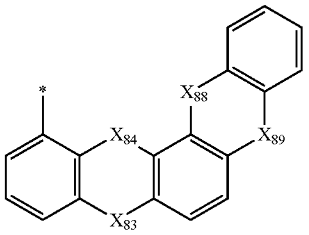
CY71-3(3)
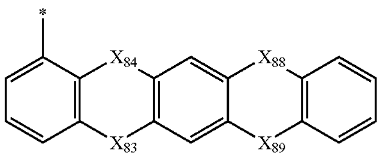
-continued
CY71-3(4)
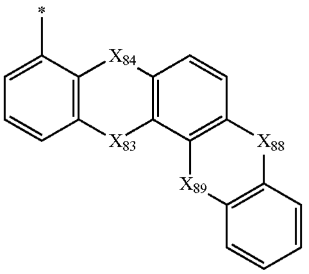
CY71-3(5)
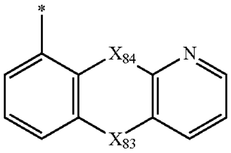
CY71-3(6)
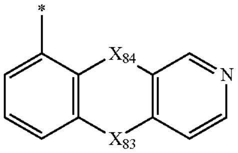
CY71-3(7)
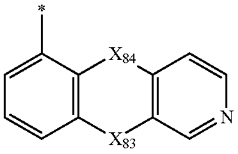
CY71-3(8)
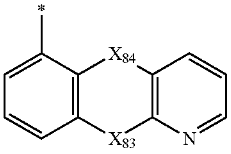
CY71-3(9)
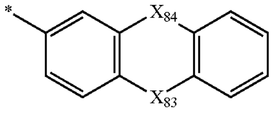
CY71-3(10)
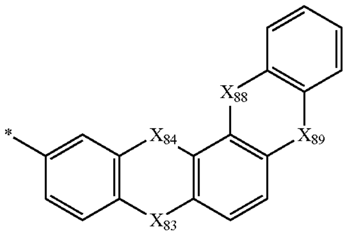
CY71-3(11)
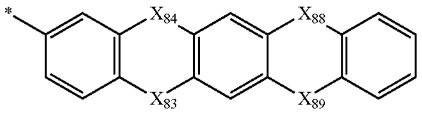

-continued
CY71-3(12)
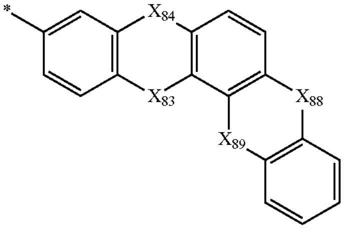
CY71-3(13)
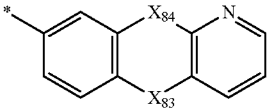
CY71-3(14)
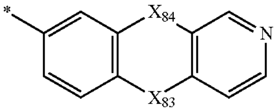
CY71-3(15)
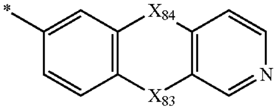
CY71-3(16)
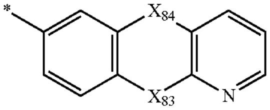
CY71-3(17)
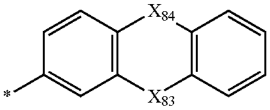
CY71-3(18)
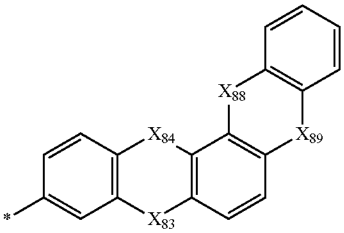
CY71-3(19)
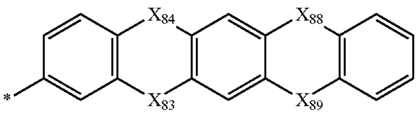
CY71-3(20)
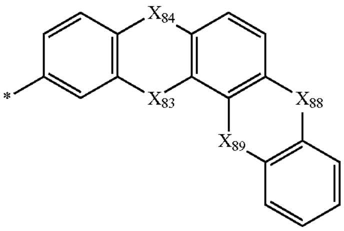
CY71-3(21)
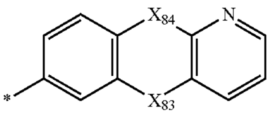
-continued
CY71-3(22)
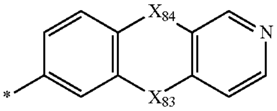
CY71-3(23)
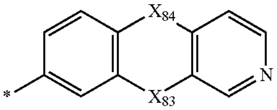
CY71-3(24)
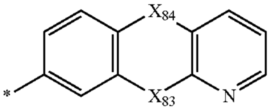
CY71-3(25)
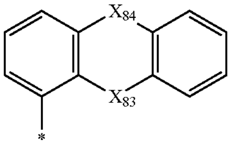
CY71-3(26)
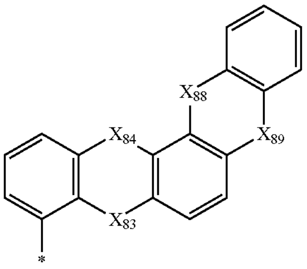
CY71-3(27)
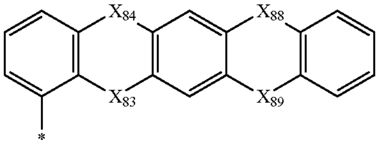
CY71-3(28)
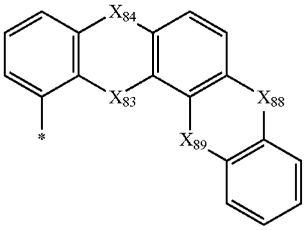
CY71-3(29)
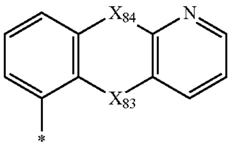
CY71-3(30)
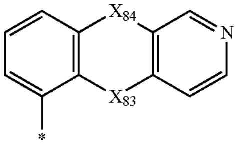

-continued
CY71-3(31)
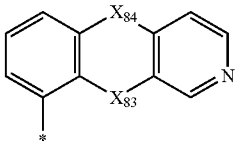
CY71-3(32)
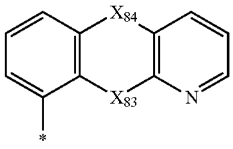
CY71-4(1)
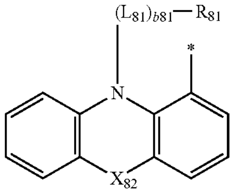
CY71-4(2)
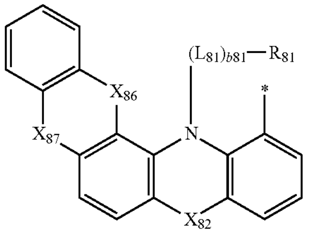
CY71-4(3)
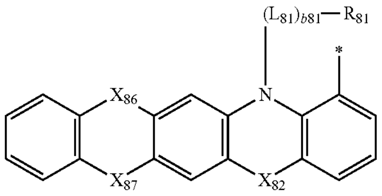
CY71-4(4)
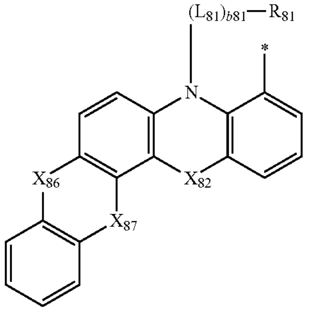
CY71-4(5)
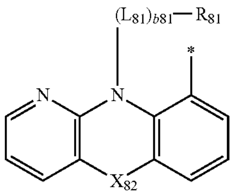
-continued
CY71-4(6)
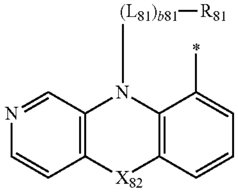
CY71-4(7)
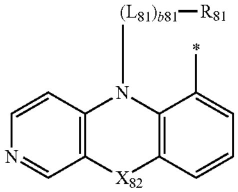
CY71-4(8)
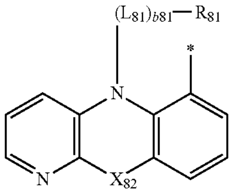
CY71-4(9)
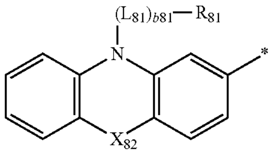
CY71-4(10)
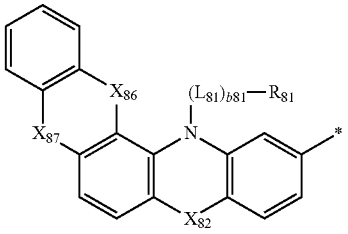
CY71-4(11)
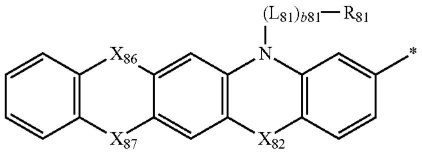
CY71-4(12)
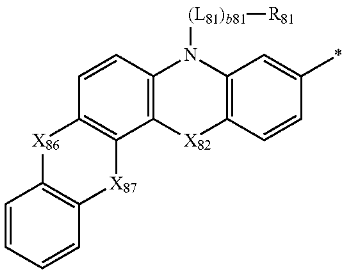
CY71-4(13)
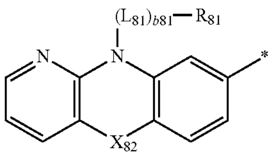

-continued
CY71-4(14)
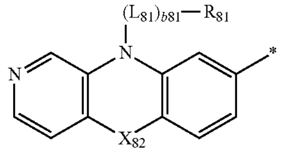
CY71-4(15)
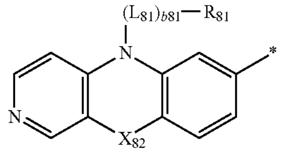
CY71-4(16)
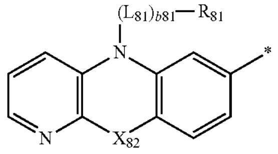
CY71-4(17)
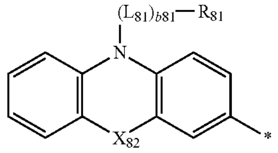
CY71-4(18)
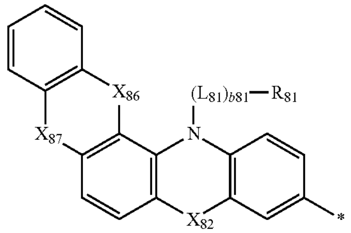
CY71-4(19)
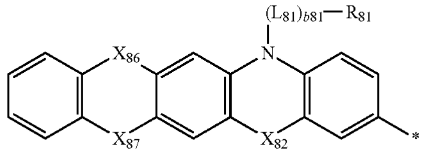
CY71-4(20)
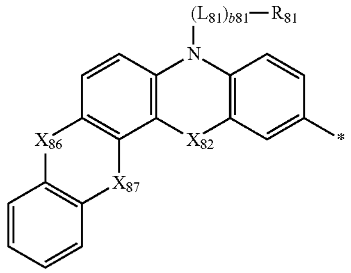
CY71-4(21)
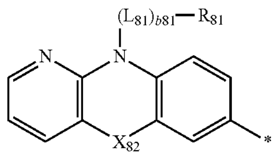
-continued
CY71-4(22)
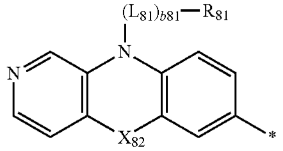
CY71-4(23)
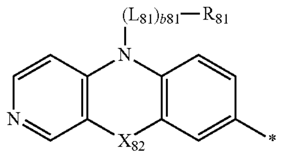
CY71-4(24)
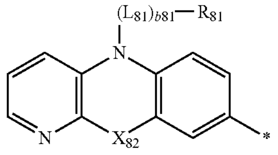
CY71-4(25)
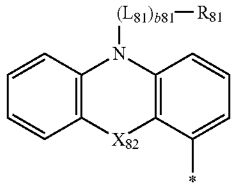
CY71-4(26)
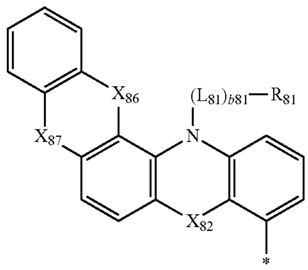
CY71-4(27)
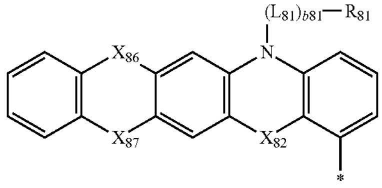
CY71-4(28)
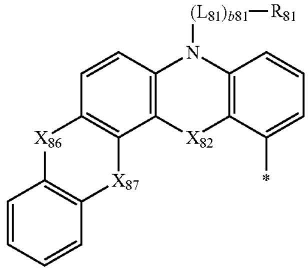
CY71-4(29)
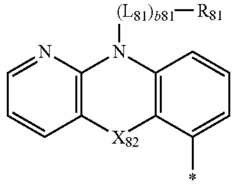

-continued

CY71-4(30)

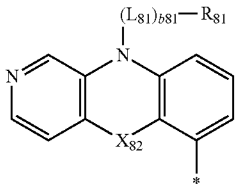

CY71-4(31)

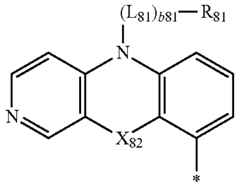

CY71-4(32)

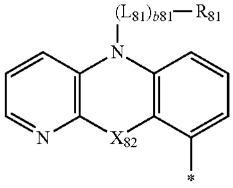

CY71-5(1)

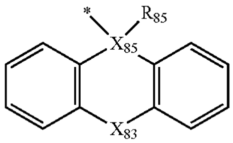

CY71-5(2)

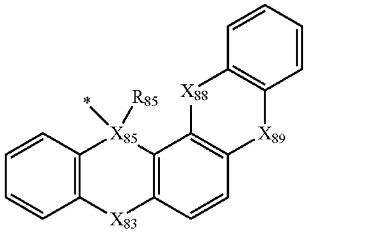

CY71-5(3)

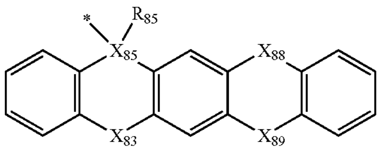

CY71-5(4)

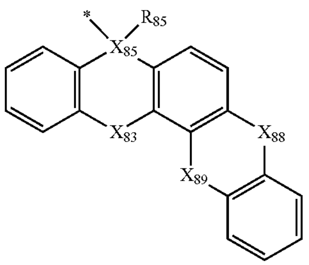

CY71-5(5)

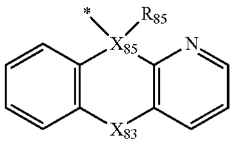

-continued

CY71-5(6)

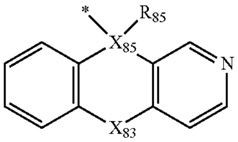

CY71-5(7)

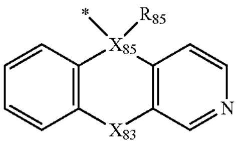

CY71-5(8)

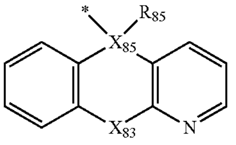

, wherein, in Formulae CY71-1(1) to CY71-1(8), CY71-2(1) to CY71-2(8), CY71-3(1) to CY71-3(32), CY71-4(1) to CY71-4(32), and CY71-5(1) to CY71-5(8), $X_{81}$ to $X_{85}$, $L_{81}$, b81, $R_{81}$, and $R_{85}$ are each the same as described in the present specification, $X_{86}$ may be a single bond, O, S, $N(R_{86})$, $B(R_{86})$, $C(R_{86a})(R_{86b})$, or $Si(R_{86a})(R_{86b})$, $X_{87}$ may be a single bond, O, S, $N(R_{87})$, $B(R_{87})$, $C(R_{87a})(R_{87b})$, or $Si(R_{87a})(R_{87b})$, in Formulae CY71-1(1) to CY71-1(8) and CY71-4(1) to CY71-4(32), each of $X_{86}$ and $X_{87}$ may not be a single bond at the same time, $X_{88}$ may be a single bond, O, S, $N(R_{88})$, $B(R_{88})$, $C(R_{88a})(R_{88b})$, or $Si(R_{88a})(R_{88b})$, $X_{89}$ may be a single bond, O, S, $N(R_{89})$, $B(R_{89})$, $C(R_{89a})(R_{89b})$, or $Si(R_{89a})(R_{89b})$, in Formulae CY71-2(1) to CY71-2(8), CY71-3(1) to CY71-3(32), and CY71-5(1) to CY71-5(8), each of $X_{88}$ and $X_{89}$ may not be a single bond at the same time, and $R_{86}$ to $R_{89}$, $R_{86a}$, $R_{86b}$, $R_{87a}$, $R_{87b}$, $R_{88a}$, $R_{88b}$, $R_{89a}$, and $R_{89b}$ are each the same as described in connection with $R_{81}$.

Examples of Compounds

In one or more embodiments, the first emitter or the organometallic compound represented by Formula 1, 1A, or 1A-1 may be one of Compounds D1 to D16:

D1

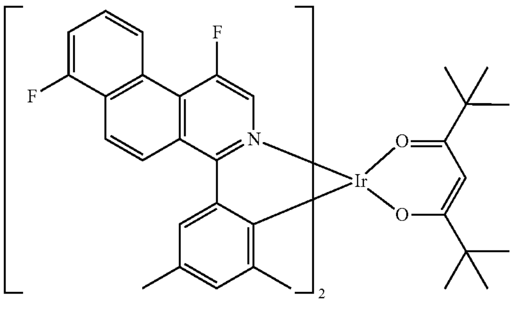

-continued
D2
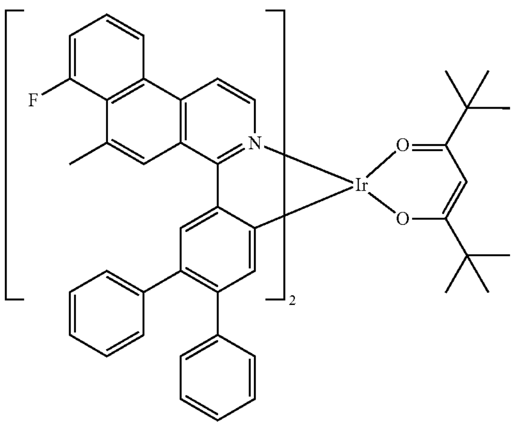
D3
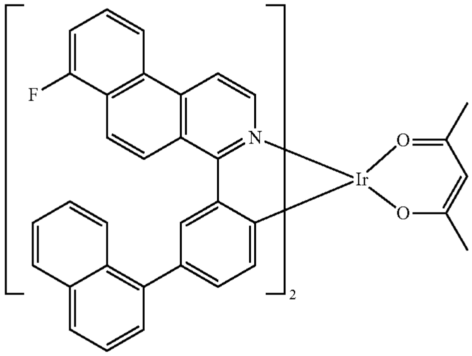
D4
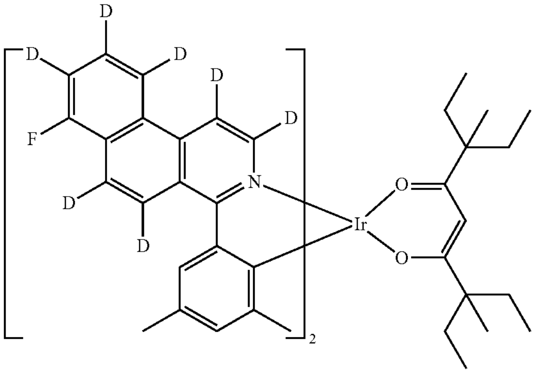
D5
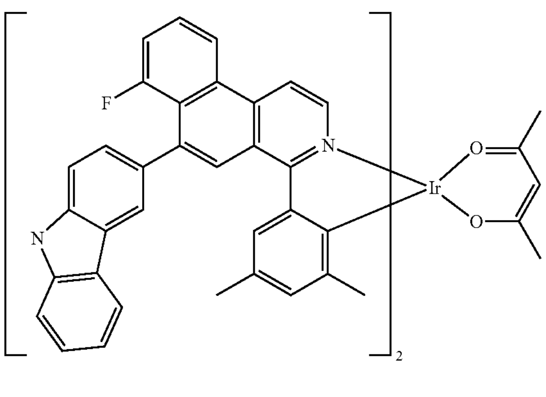
-continued
D6
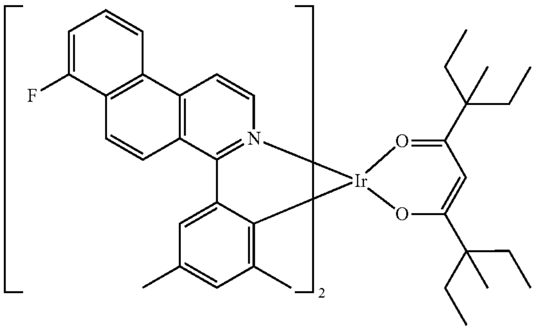
D7
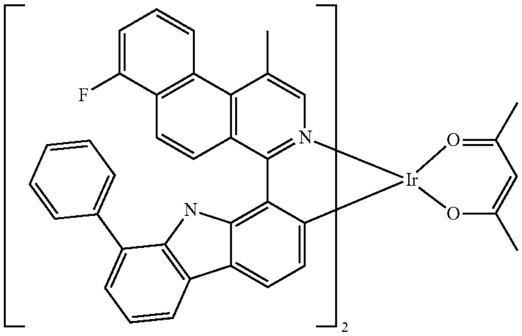
D8
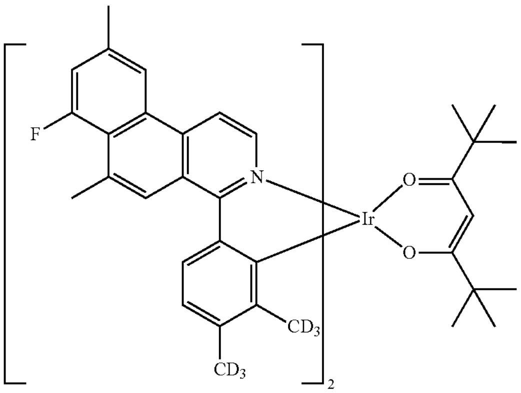
D9
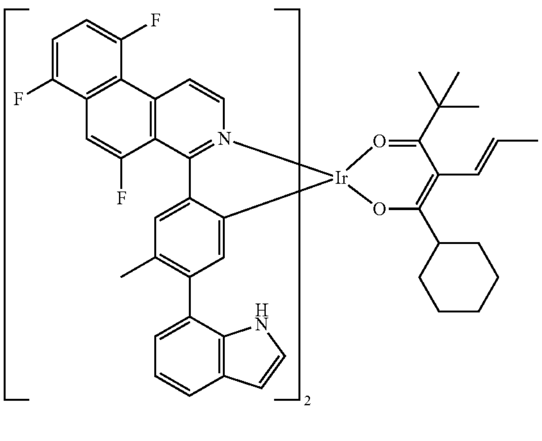

-continued
D10
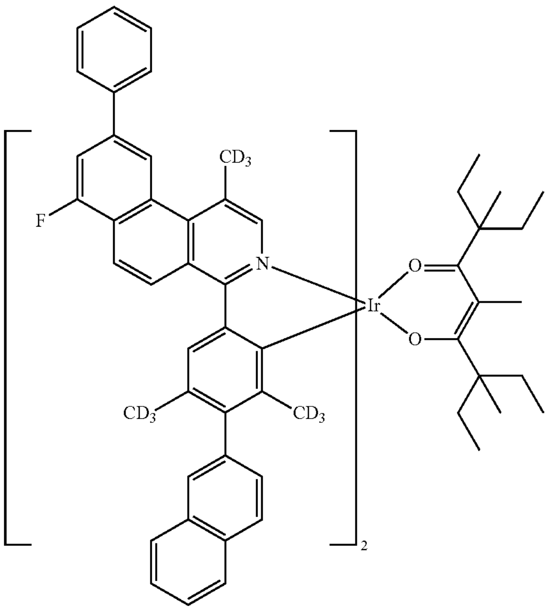
D11
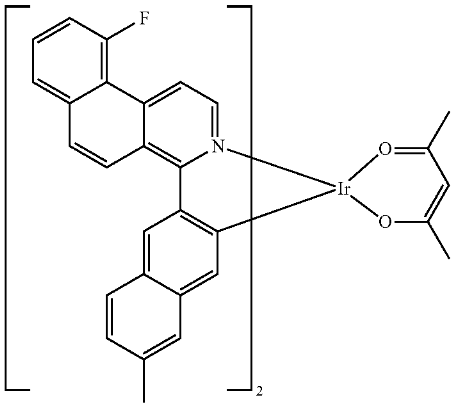
D12
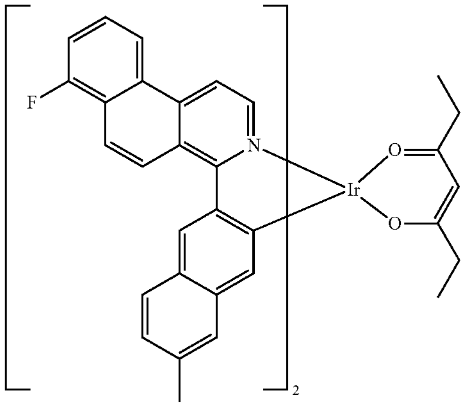
-continued
D13
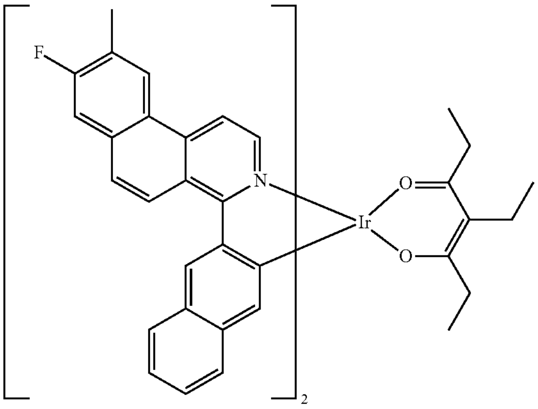
D14
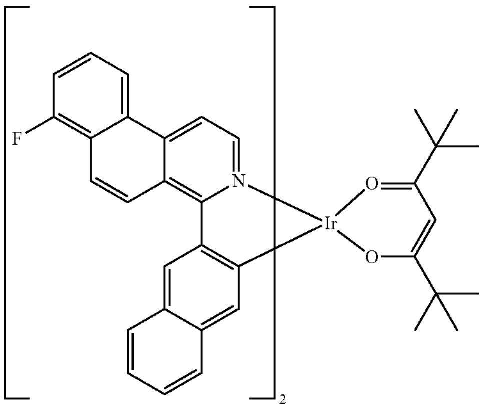
D15
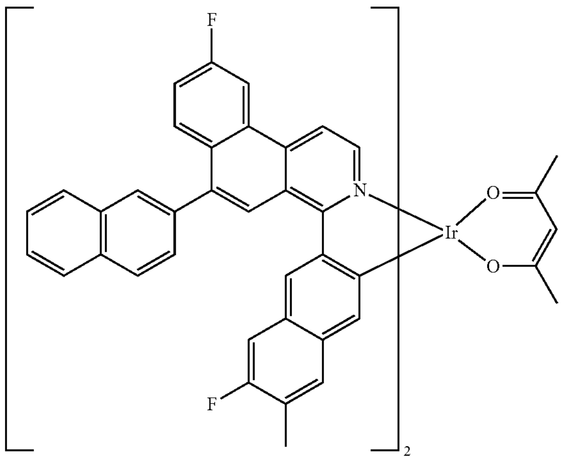

-continued
D16
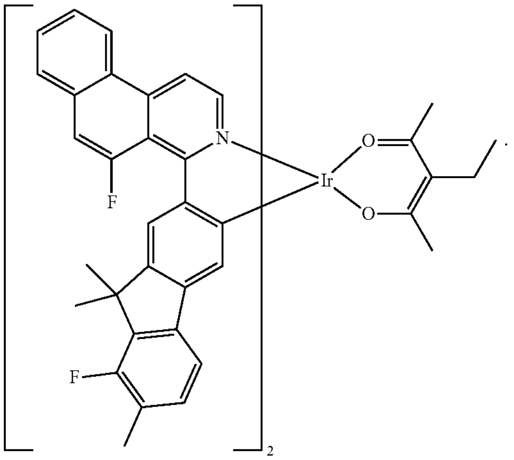
In one or more embodiments, the amine-containing compound may be one of Compounds C1 to C14:
C1
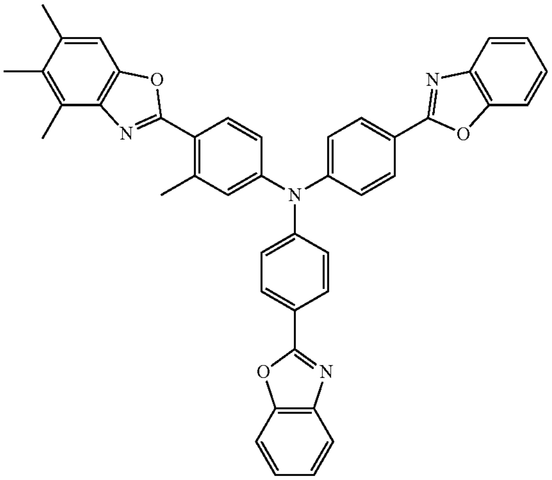
C2
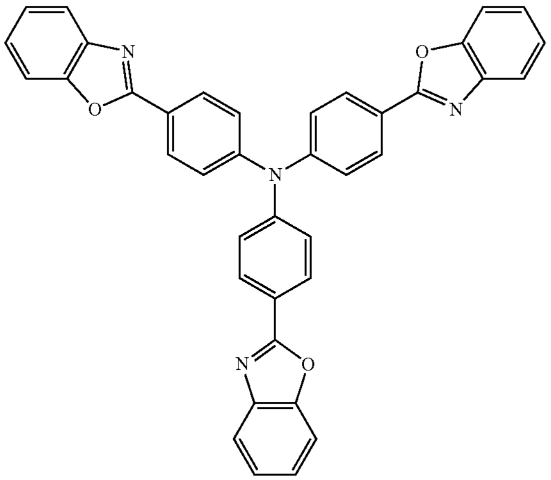
-continued
C3
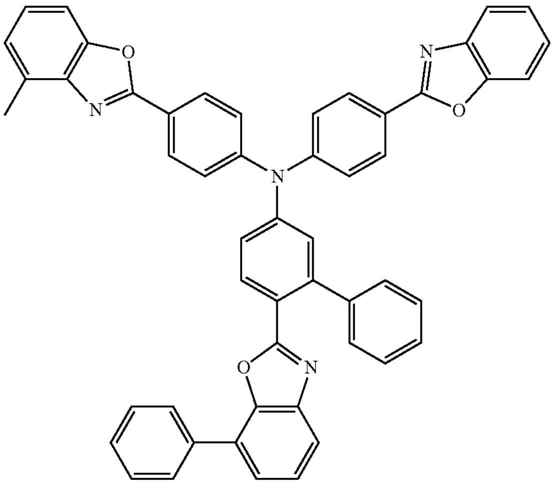
C4
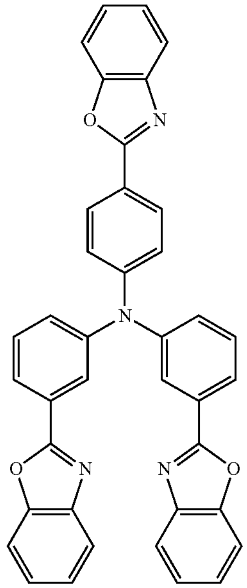
C5
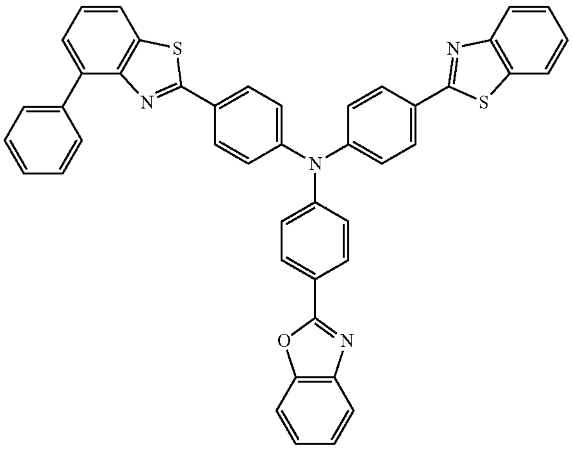

-continued
C6
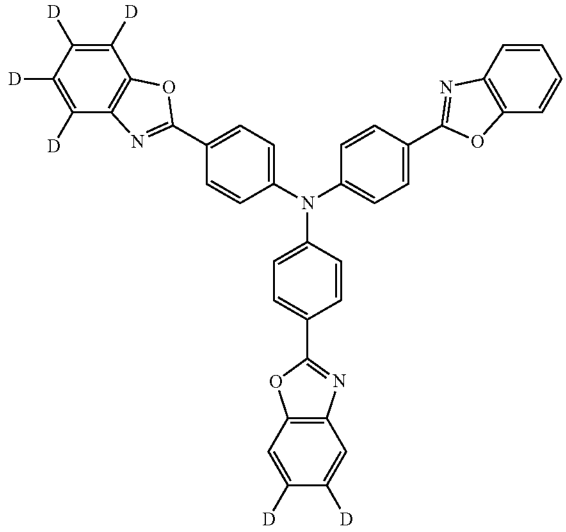
C7
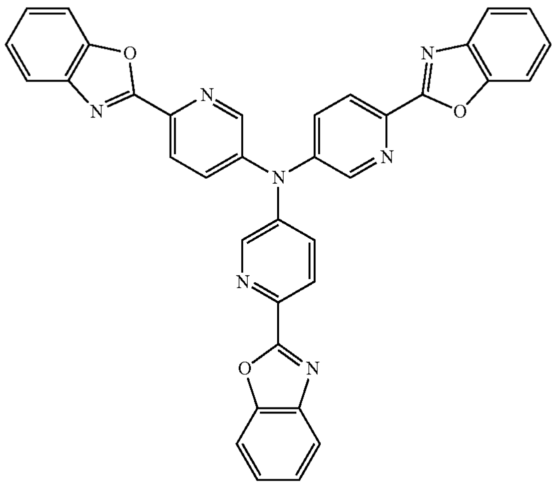
C8
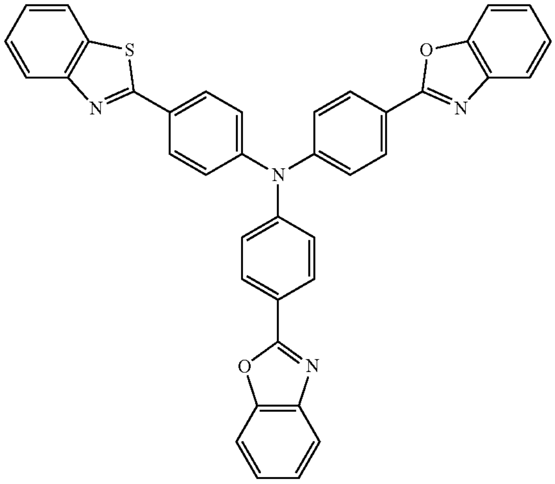
-continued
C9
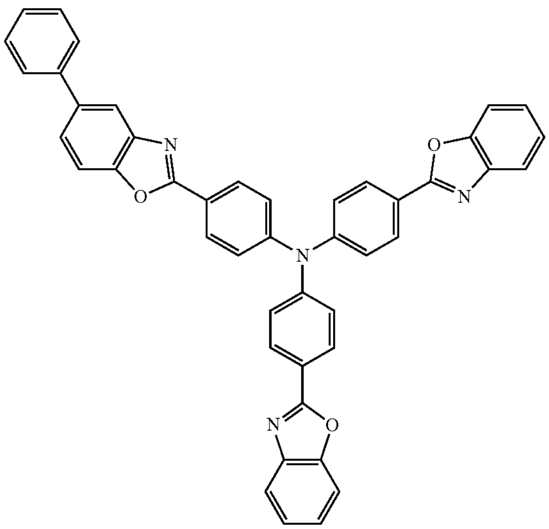
C10
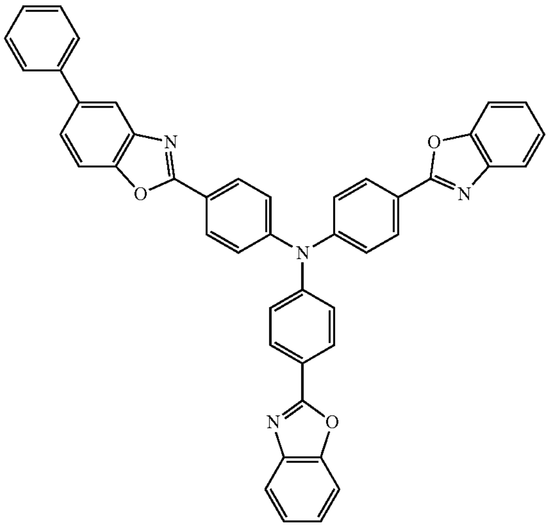
C11
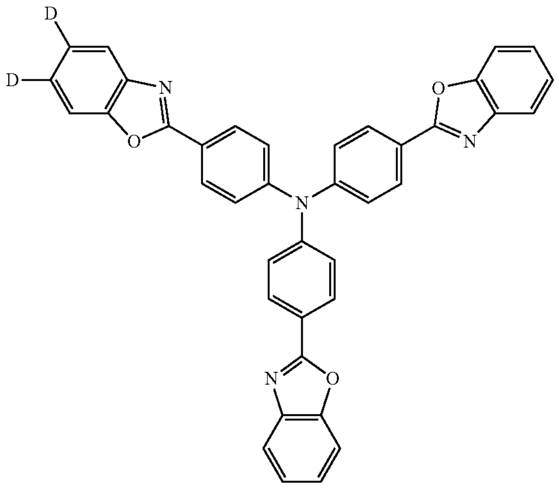

-continued

C12

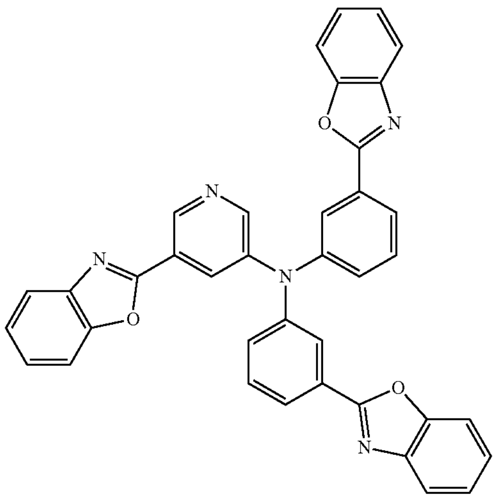

C13

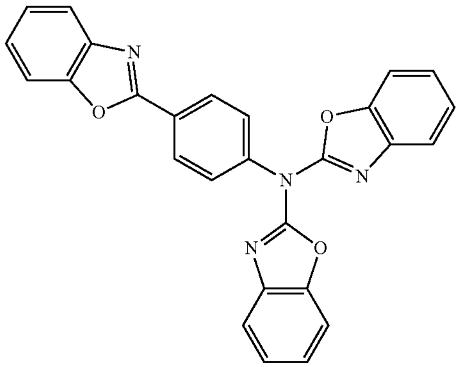

C14

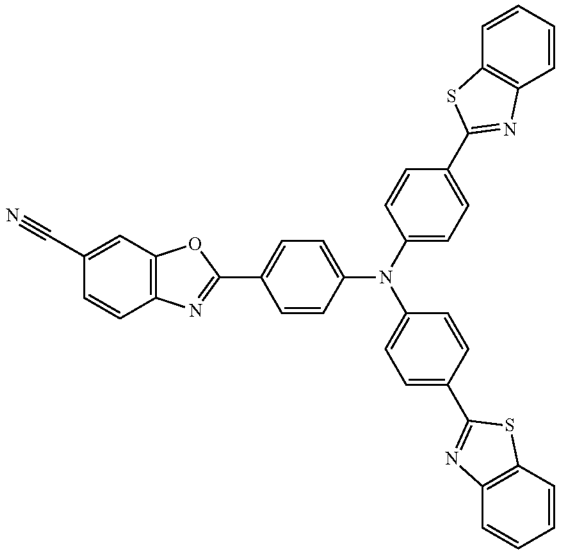

.

Description of FIG. 1

FIG. 1 is a schematic cross-sectional view of a light-emitting device 10 according to one or more embodiments. The light-emitting device 10 includes a first electrode 110, an interlayer 130, a second electrode 150, and a second capping layer 170.

Hereinafter, the structure of the light-emitting device 10 according to one or more embodiments and a method of manufacturing the light-emitting device 10 will be described with reference to FIG. 1.

First Electrode 110

Referring to FIG. 1, a substrate may be additionally arranged under the first electrode 110 or above the second capping layer 170. As the substrate, a glass substrate and/or a plastic substrate may be used. In one or more embodiments, the substrate may be a flexible substrate, and may include plastics with excellent (or suitable) heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure consisting of a single layer or a multi-layered structure including a plurality of layers. For example, the first electrode 110 may have a three-layered structure of ITO/Ag/ITO.

Interlayer 130

The interlayer 130 is arranged on the first electrode 110. The interlayer 130 includes an emission layer.

The interlayer 130 may further include a hole transport region arranged between the first electrode 110 and the emission layer, and an electron transport region arranged between the emission layer and the second electrode 150.

The interlayer 130 may further include, in addition to one or more organic materials, a metal-containing compound (such as an organometallic compound), an inorganic material (such as a quantum dot), and/or the like.

The interlayer 130 may include i) two or more emitting units sequentially stacked between the first electrode 110 and the second electrode 150 and ii) a charge generation layer arranged between two neighboring emitting units. When the interlayer 130 includes emitting units and a charge generation layer as described above, the light-emitting device 10 may be a tandem light-emitting device.

Hole Transport Region in Interlayer 130

The hole transport region may have i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, the layers of each structure being stacked sequentially from the first electrode 110.

The hole transport region may include a compound represented by Formula 201, a compound represented by Formula 202, or any combination thereof:

Formula 201

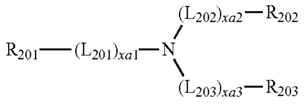

Formula 202

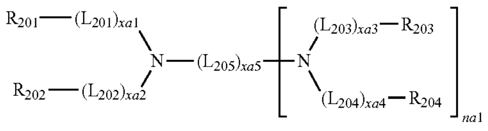

, wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (for example, a carbazole group and/or the like) unsubstituted or substituted with at least one $R_{10a}$ (for example, see Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

For example, each of Formulae 201 and 202 may include at least one of groups represented by Formulae CY201 to CY217:

CY201

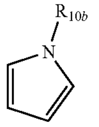

CY202

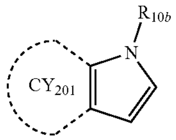

CY203

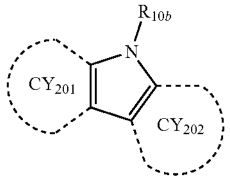

CY204

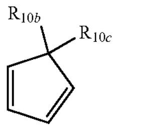

CY205

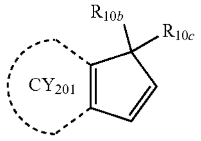

CY206

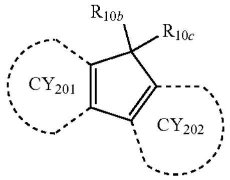

CY207

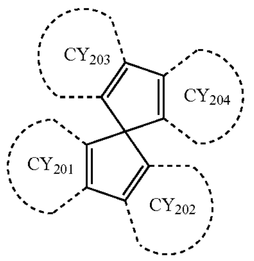

-continued

CY208

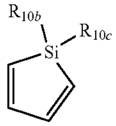

CY209

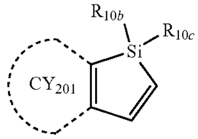

CY210

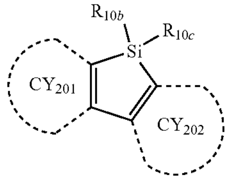

CY211

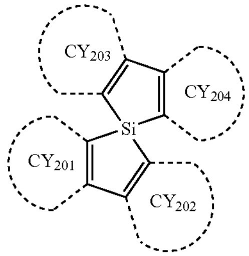

CY212

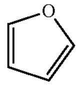

CY213

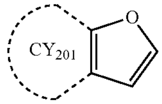

CY214

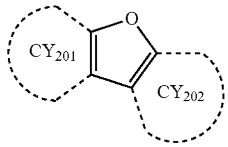

CY215

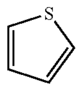

-continued

CY216

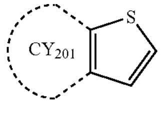

CY217

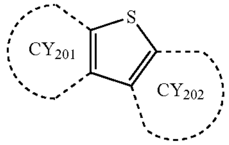

, wherein, in Formulae CY201 to CY217, $R_{10b}$ and $R_{10c}$ are each the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In one or more embodiments, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one of groups represented by Formulae CY201 to CY203.

In one or more embodiments, Formula 201 may include at least one of groups represented by Formulae CY201 to CY203 and at least one of groups represented by Formulae CY204 to CY217.

In one or more embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include (e.g., may exclude) a group represented by one of Formulae CY201 to CY203.

In one or more embodiments, each of Formulae 201 and 202 may not include (e.g., may exclude) a group represented by one of Formulae CY201 to CY203, and may include at least one of groups represented by Formulae CY204 to CY217.

In one or more embodiments, each of Formulae 201 and 202 may not include (e.g., may exclude) a group represented by one of Formulae CY201 to CY217.

For example, the hole transport region may include one or more of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANT/CSA), polyaniline/poly(4-styrenesulfonate) (PANI/PSS), or any combination thereof:

HT1
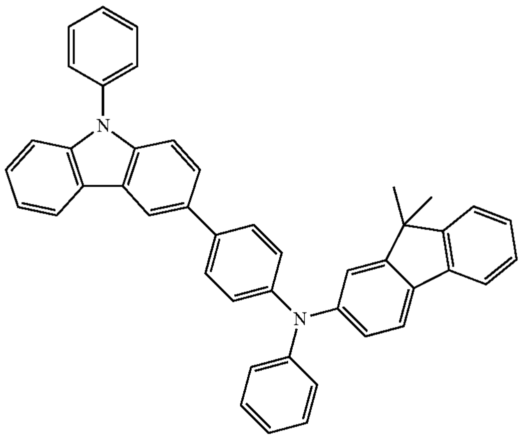
HT2
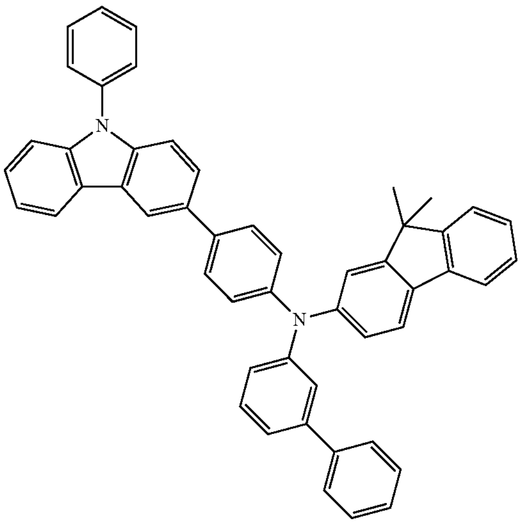
HT3
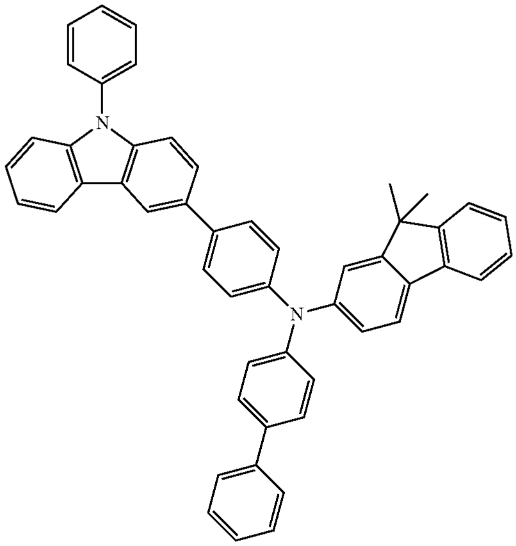
HT4
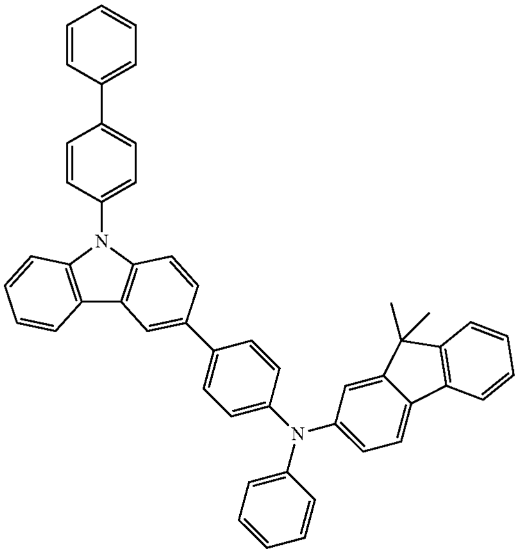
HT5
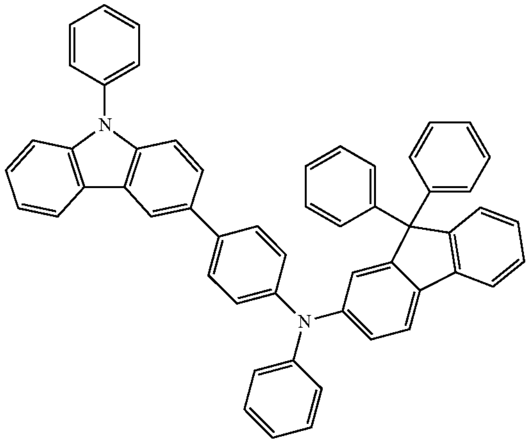
HT6
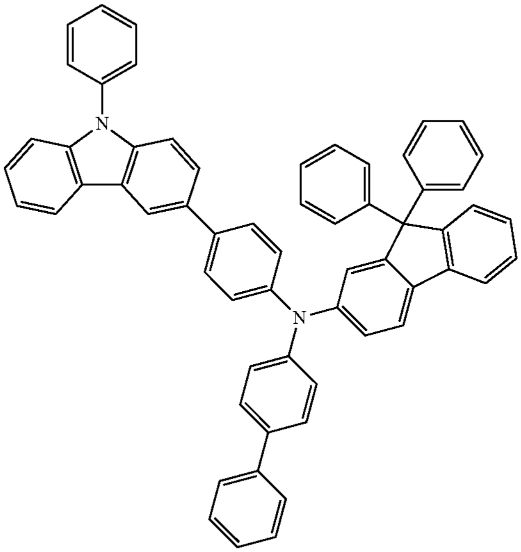

-continued
HT7
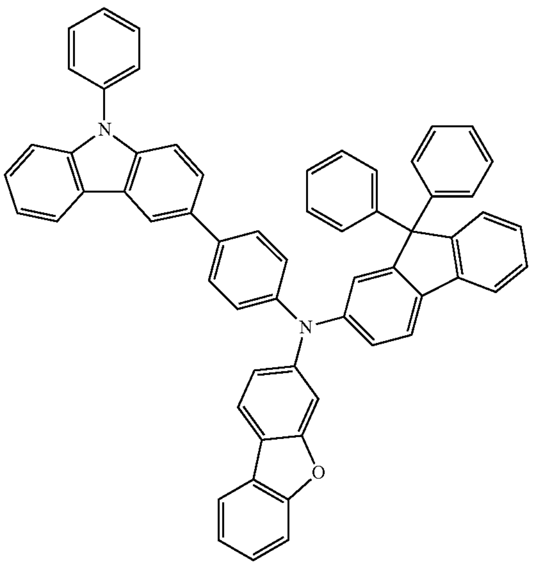
HT8
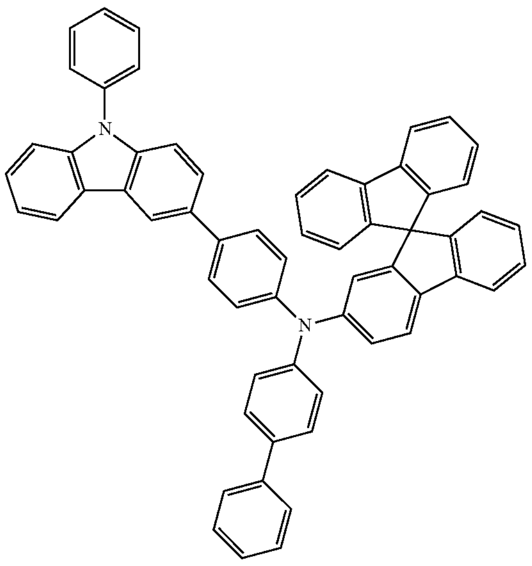
HT9
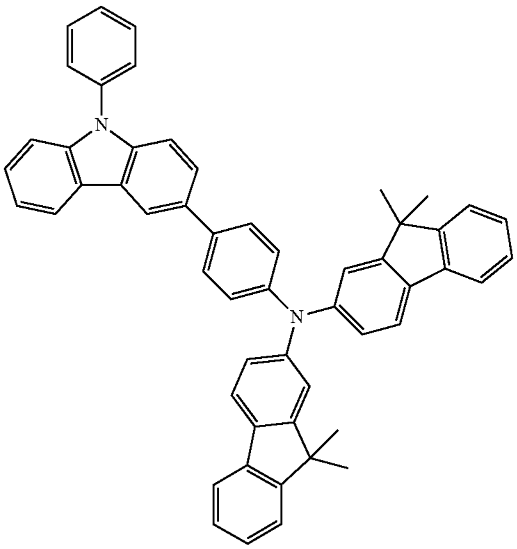
HT10
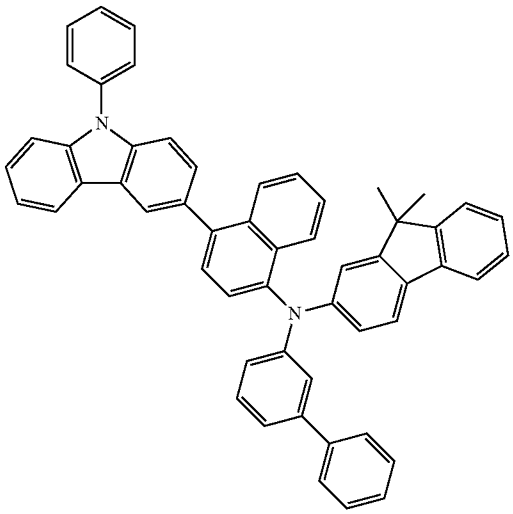
HT11
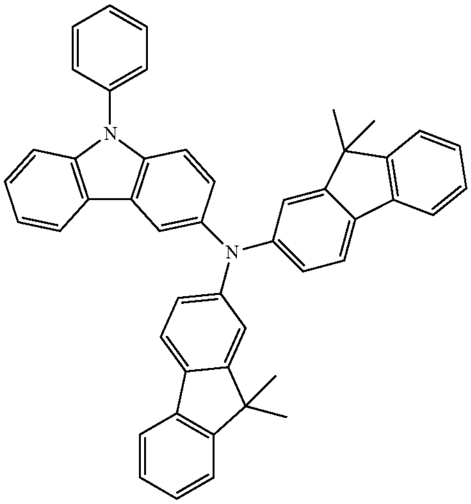
HT12
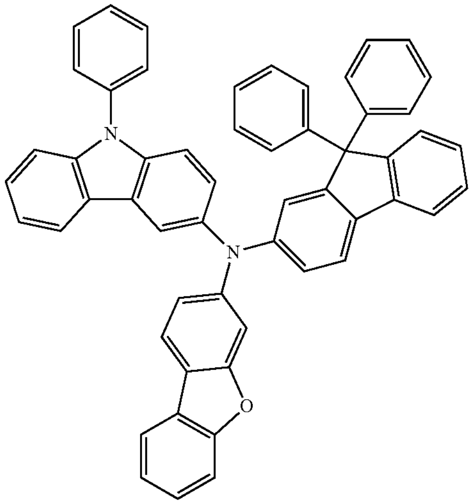

-continued
HT13
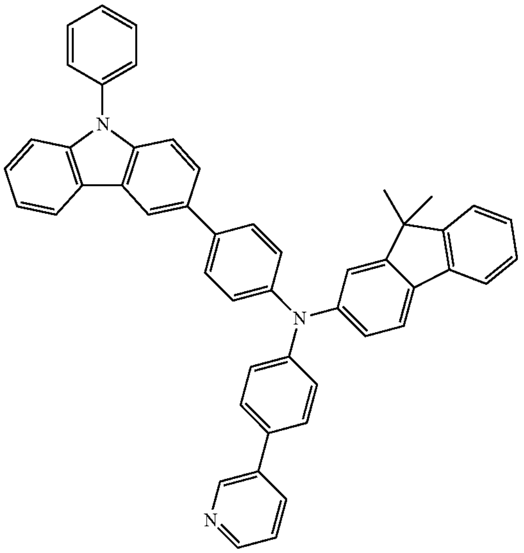
HT14
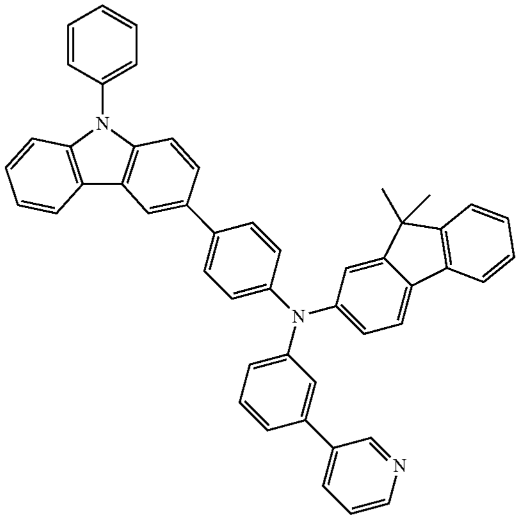
HT15
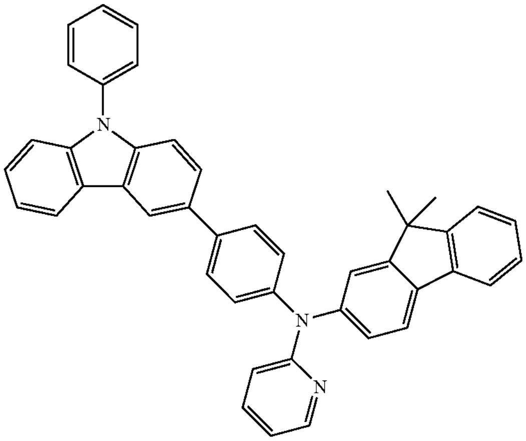
HT16
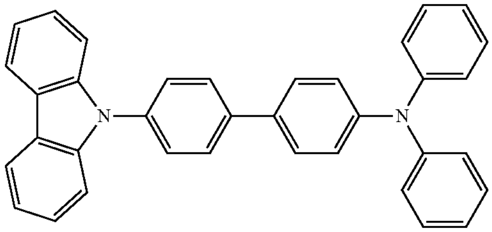
HT17
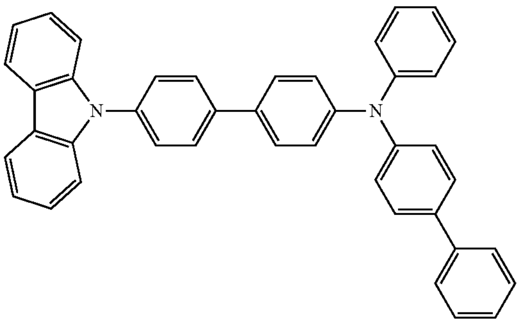
HT18
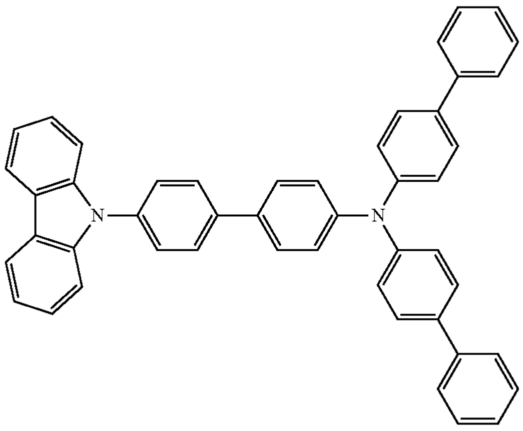

-continued
HT19
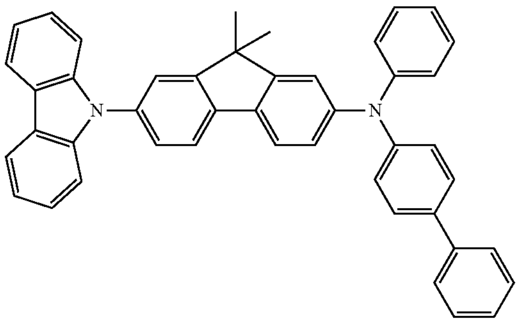
HT20
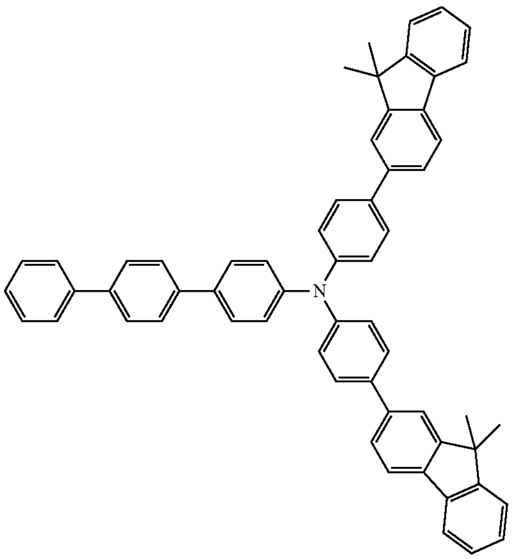
HT21
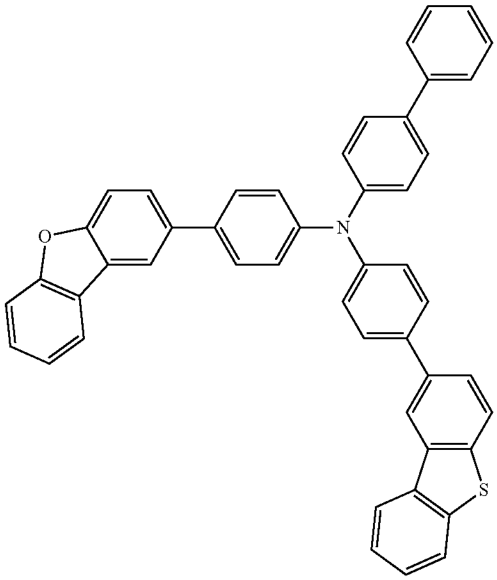
HT22
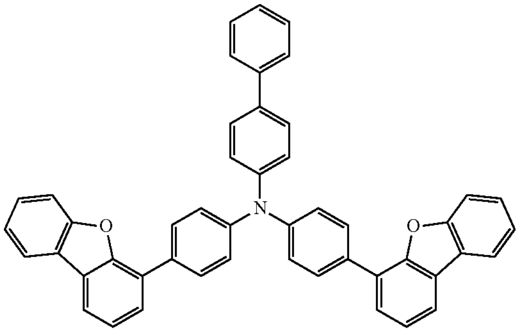
HT23
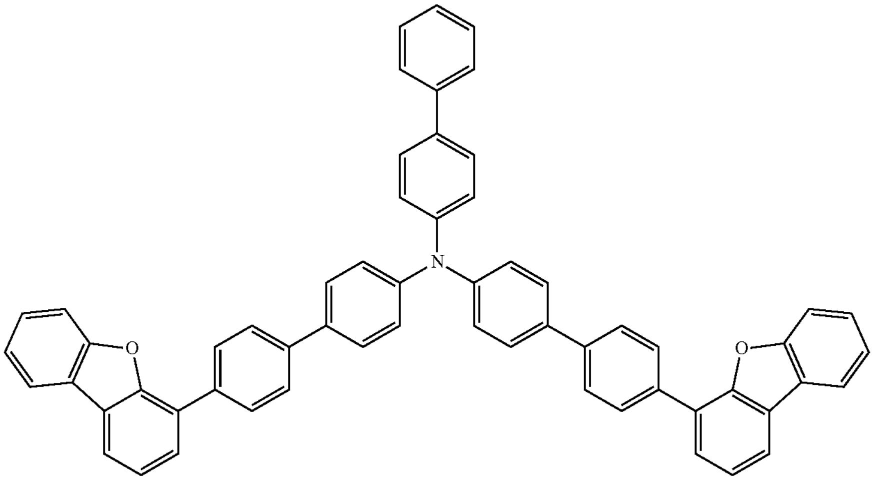

-continued
HT24
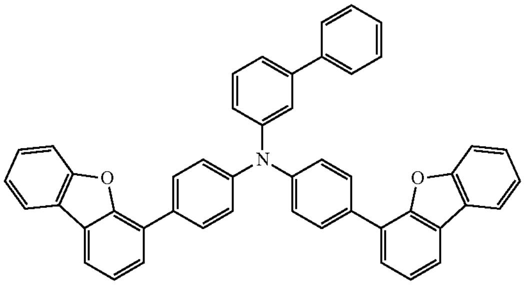
HT25
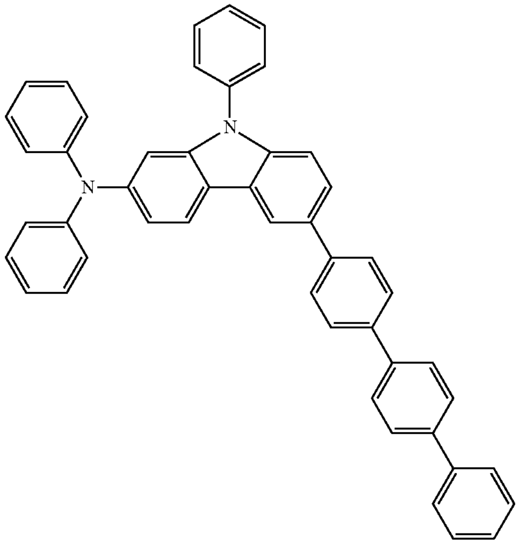
HT26
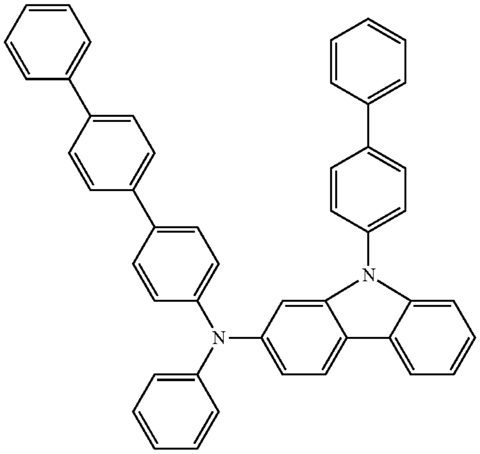
HT27
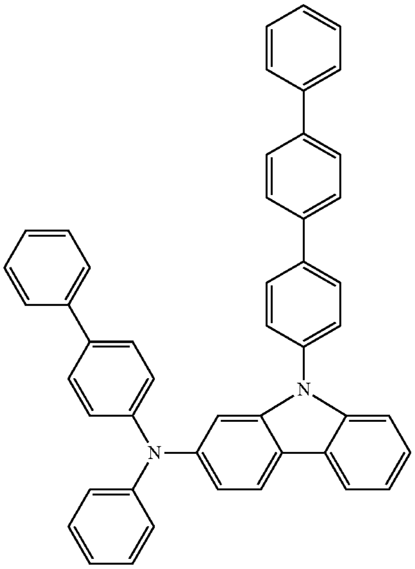
HT28
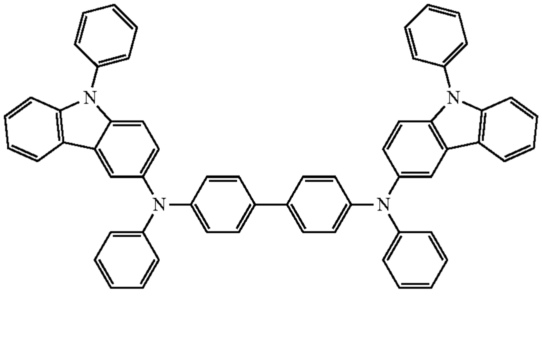
HT29
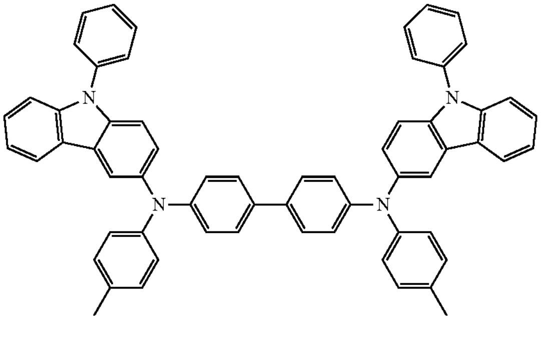

-continued
HT30
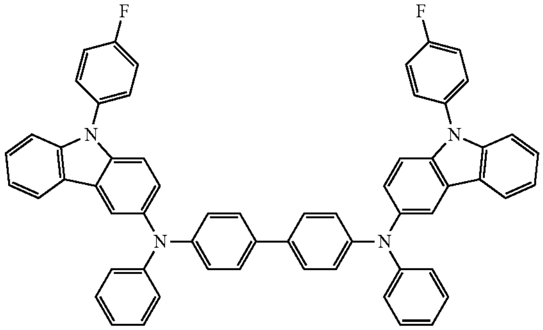
HT31
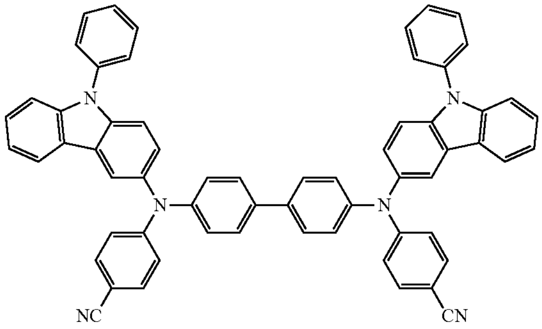
HT32
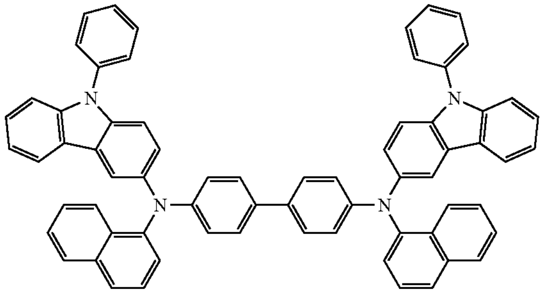
HT33
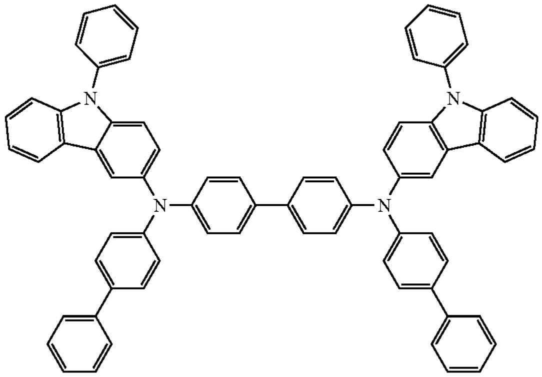
HT34
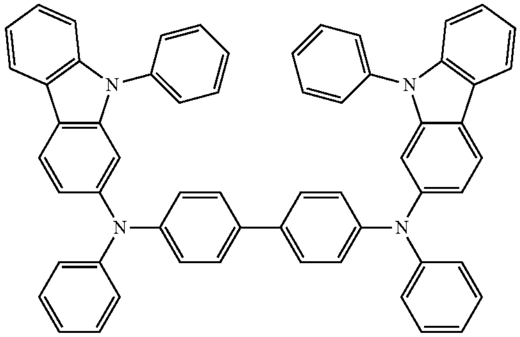
HT35
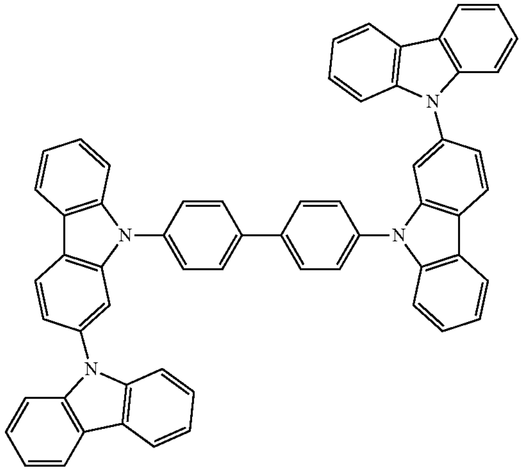

-continued
HT36
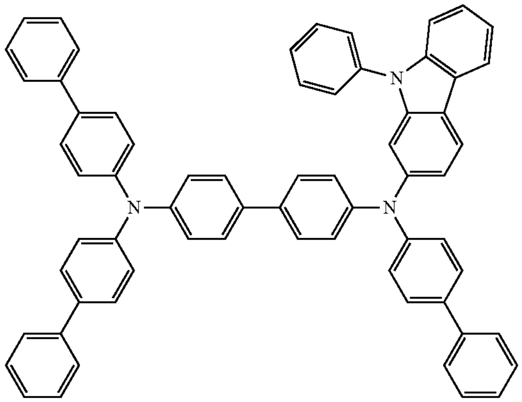
HT37
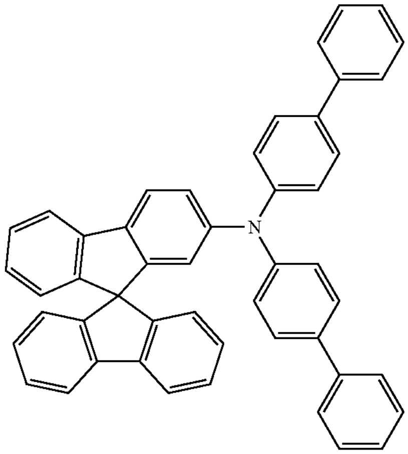
HT38
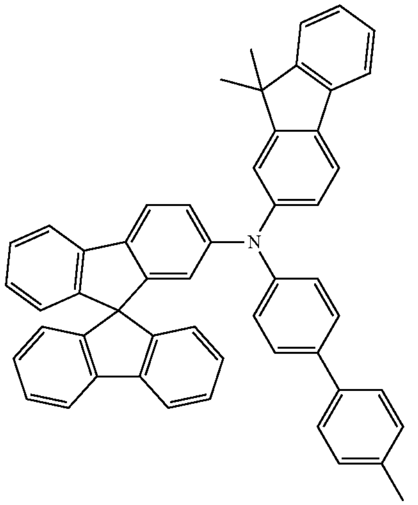
HT39
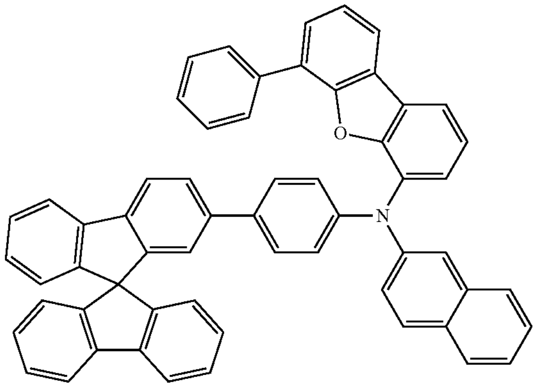
HT40
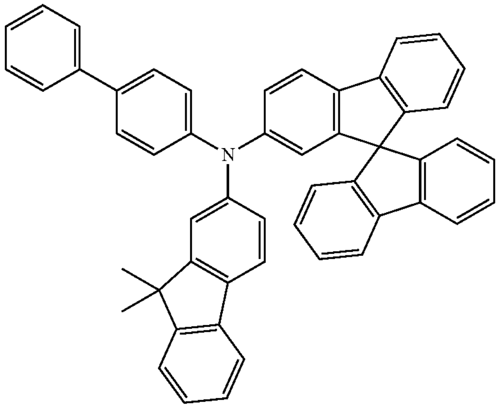
HT41
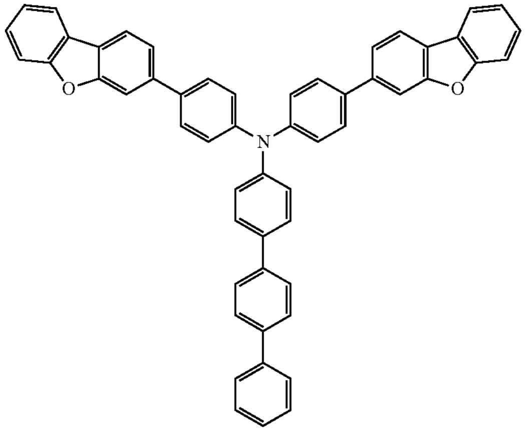

-continued
HT42
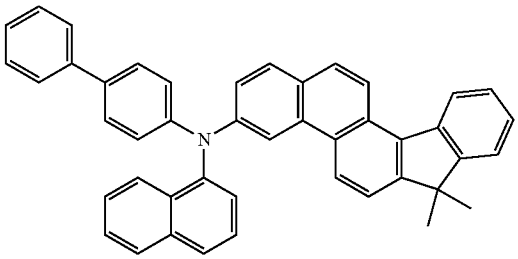
HT43
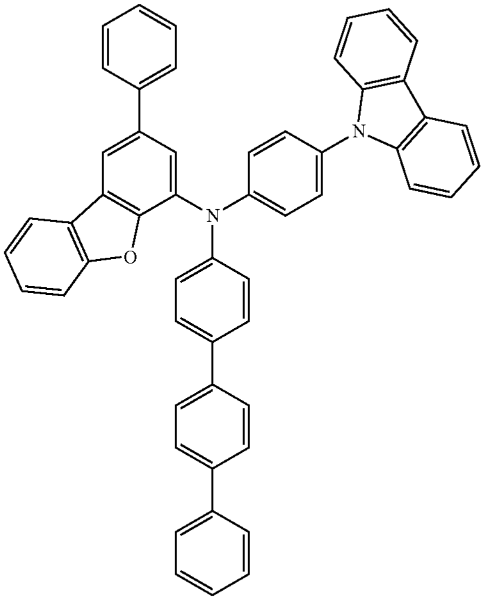
HT44
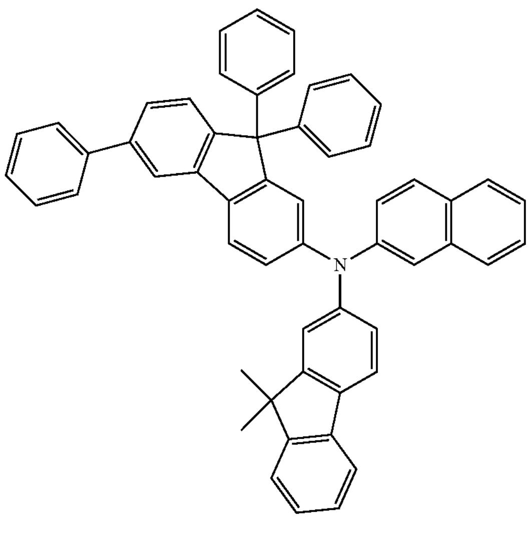
HT45
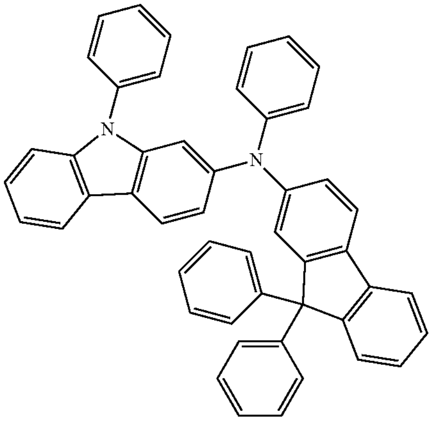
HT46
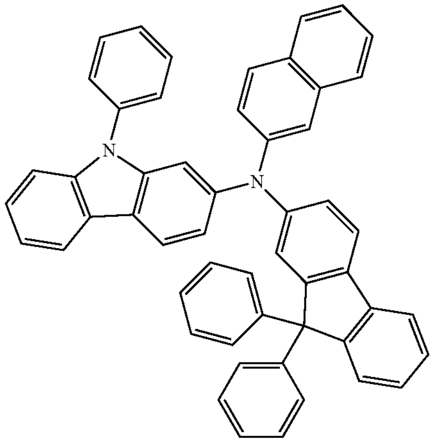

-continued
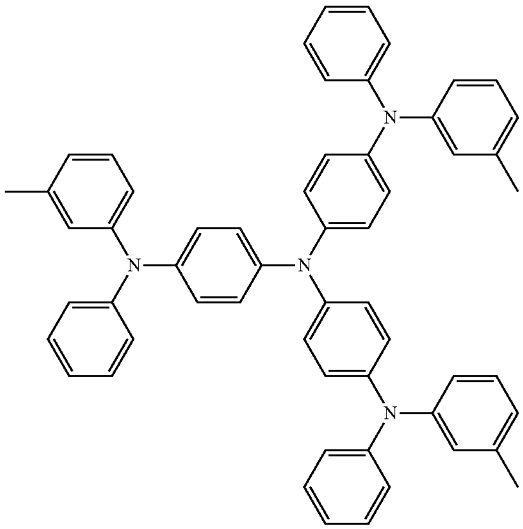
m-MTDATA
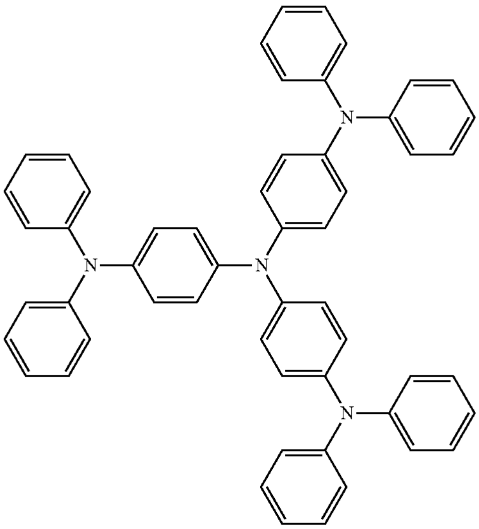
TDATA
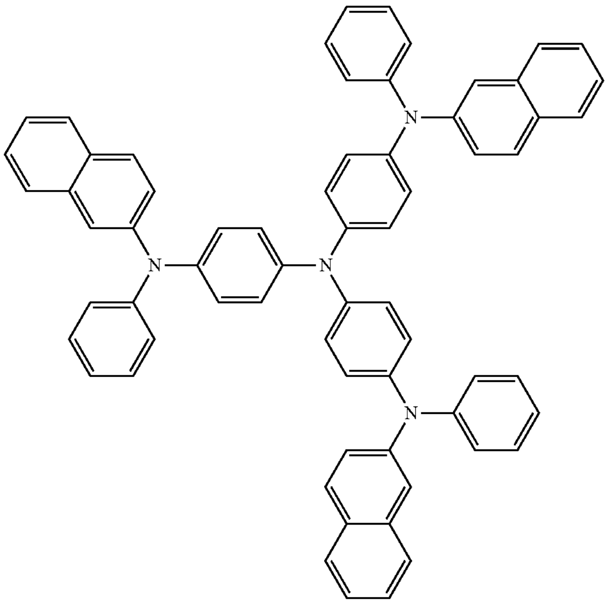
2-TNATA
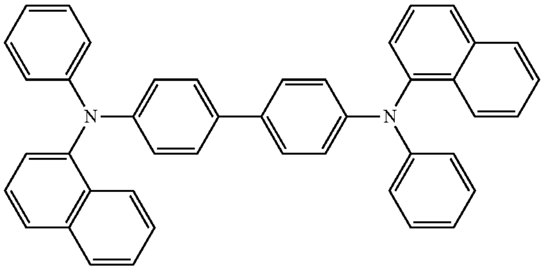
NPB -continued
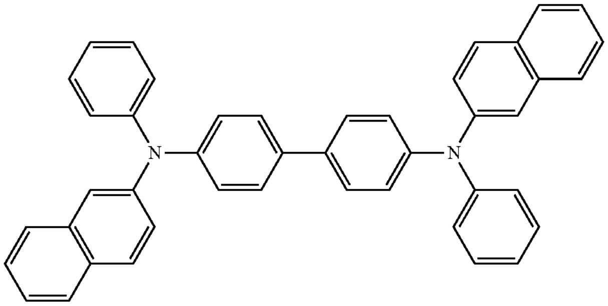
β-NPB
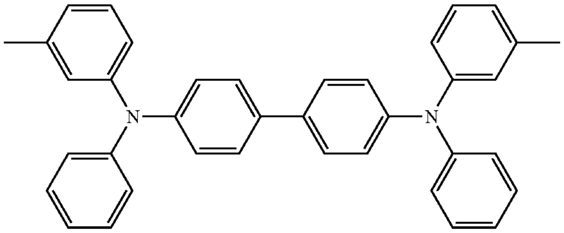
TPD
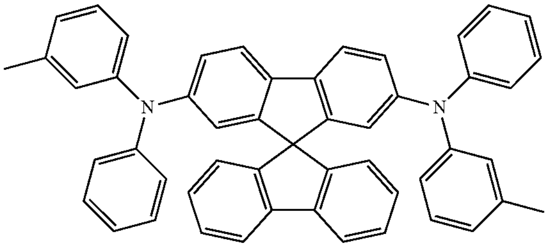
Spiro-TPD
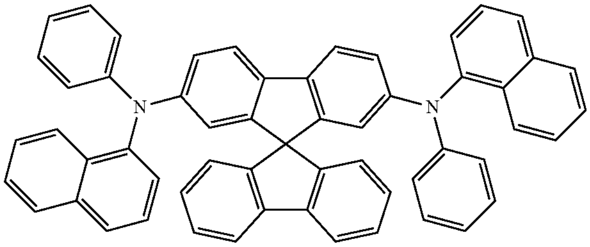
Spiro-NPB
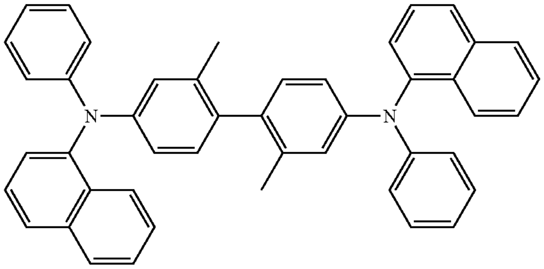
methylated-NPB
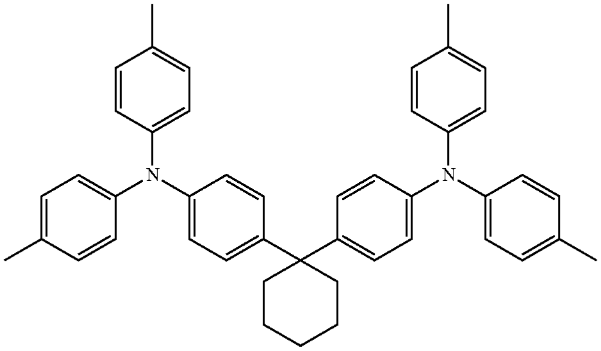
TAPC
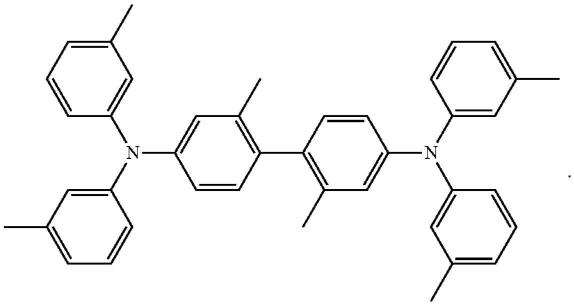
HMTPD A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within any of their respective ranges, satisfactory (or suitable) hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the leakage of electrons from an emission layer to a hole transport region. Materials that may be included in the hole transport region may be included in the emission auxiliary layer and/or the electron blocking layer.

P-Dopant

The hole transport region may further include, in addition to the materials described above, a charge-generation material for the improvement of conductive properties. The charge-generation material may be substantially uniformly or substantially non-uniformly dispersed in the hole transport region (for example, in the form of a single layer including (e.g., consisting of) a charge-generation material).

The charge-generation material may be, for example, a p-dopant.

For example, a LUMO energy level of the p-dopant may be −3.5 eV or less.

In one or more embodiments, the p-dopant may include a quinone derivative, a cyano group-containing compound, a compound containing element EL1 and element EL2, or any combination thereof.

Examples of the quinone derivative may include TCNQ, F4-TCNQ, and the like.

Examples of the cyano group-containing compound may include HAT-CN, a compound represented by Formula 221, and the like:

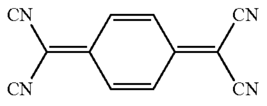

TCNQ

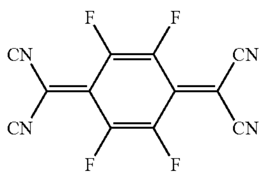

F4-TCNQ

-continued

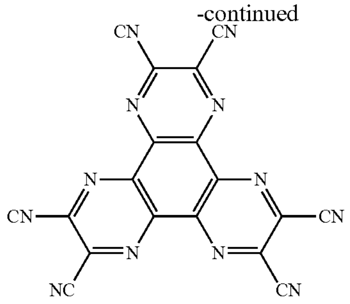

HAT-CN

Formula 221

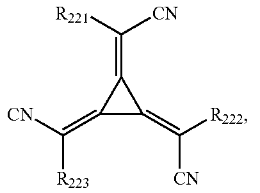

wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each independently substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be metal, metalloid, or any combination thereof, and element EL2 may be non-metal, metalloid, or any combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and halogen (for example, F, Cl, Br, I, etc.).

For example, the compound containing element EL1 and element EL2 may include metal oxide, metal halide (for example, metal fluoride, metal chloride, metal bromide, metal iodide, etc.), metalloid halide (for example, metalloid fluoride, metalloid chloride, metalloid bromide, metalloid iodide, etc.), metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include alkali metal halide, alkaline earth metal halide, transition metal halide, post-transition metal halide, and lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, Lil, Nal, Kl, Rbl, and Csl.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $Bel_2$, $Mgl_2$, $Cal_2$, $Srl_2$, and $Bal_2$.

Examples of the transition metal halide may include titanium halide (for example, $TiF_4$, $TiCl_4$, $TiBr_4$, $Til_4$, etc.), zirconium halide (for example, $ZrF_4$, $ZrCl_4$, $ZrBr_4$, $Zrl_4$, etc.), hafnium halide (for example, $HfF_4$, $HfCl_4$, $HfBr_4$, $Hfl_4$, etc.), vanadium halide (for example, $VF_3$, $VCl_3$, $VBr_3$, $Vl_3$, etc.), niobium halide (for example, $NbF_3$, $NbCl_3$, $NbBr_3$, $Nbl_3$, etc.), tantalum halide (for example, $TaF_3$, $TaCl_3$, $TaBr_3$, $Tal_3$, etc.), chromium halide (for example, $CrF_3$, $CrCl_3$, $CrBr_3$, $Crl_3$, etc.), molybdenum halide (for example, $MoF_3$, $MoCl_3$, $MoBr_3$, $Mol_3$, etc.), tungsten halide (for example, $WF_3$, $WCl_3$, $WBr_3$, WlG, etc.), manganese halide (for example, $MnF_2$, $MnCl_2$, $MnBr_2$, $Mnl_2$, etc.), technetium halide (for example, $TcF_2$, $TcCl_2$, $TcBr_2$, $Tcl_2$, etc.), rhenium halide (for example, $ReF_2$, $ReCl_2$, $ReBr_2$, $Rel_2$, etc.), iron halide (for example, $FeF_2$, $FeCl_2$, $FeBr_2$, $Fel_2$, etc.), ruthenium halide (for example, $RuF_2$, $RuCl_2$, $RuBr_2$, $Rul_2$, etc.), osmium halide (for example, $OsF_2$, $OsCl_2$, $OsBr_2$, $OsCl_2$, etc.), cobalt halide (for example, $CoF_2$, $CoCl_2$, $CoBr_2$, $Col_2$, etc.), rhodium halide (for example, $RhF_2$, $RhCl_2$, $RhBr_2$, $Rhl_2$, etc.), iridium halide (for example, $IrF_2$, $IrCl_2$, $IrBr_2$, $Irl_2$, etc.), nickel halide (for example, $NiF_2$, $NiCl_2$, $NiBr_2$, $Nil_2$, etc.), palladium halide (for example, $PdF_2$, $PdCl_2$, $PdBr_2$, $Pdl_2$, etc.), platinum halide (for example, $PtF_2$, $PtCl_2$, $PtBr_2$, $Ptl_2$, etc.), copper halide (for example, CuF, CuCl, CuBr, Cul, etc.), silver halide (for example, AgF, AgCl, AgBr, Agl, etc.), and gold halide (for example, AuF, AuCl, AuBr, Aul, etc.).

Examples of the post-transition metal halide may include zinc halide (for example, $ZnF_2$, $ZnCl_2$, $ZnBr_2$, $Znl_2$, etc.), indium halide (for example, $Inl_3$, etc.), and tin halide (for example, $Snl_2$, etc.).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, Ybl, $Ybl_2$, $Ybl_3$, and $Sml_3$.

Examples of the metalloid halide may include antimony halide (for example, $SbCl_5$, etc.).

Examples of the metal telluride may include alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a subpixel. In one or more embodiments, the emission layer may have a stacked structure of two or more layers of a red emission layer, a green emission layer, and/or a blue emission layer, in which the two or more layers contact each other or are separated from each other to emit white light. In one or more embodiments, the emission layer may have a structure in which two or more materials of a red light-emitting material, a green light-emitting material, and a blue light-emitting material are mixed with each other in a single layer, and thus emit white light.

In one or more embodiments, the emission layer may further include a host, an auxiliary dopant, a sensitizer, a delayed fluorescence material, or any combination thereof, in addition to the first emitter as described in the present specification.

When the emission layer further includes a host in addition to the first emitter, an amount of the first emitter may be about 0.01 part by weight to about 15 parts by weight based on 100 parts by weight of the host.

A thickness of the emission layer may be in a range of about 100 Å to about 1,000 Å, for example, about 200 Å to about 600 Å. When the thickness of the emission layer is within any of these ranges, excellent (or improved) luminescence characteristics may be obtained without a substantial increase in driving voltage.

Host

The host in the emission layer may include an electron-transporting compound described in the present specification (for example, see the compound represented by Formula 2-1 or 2-2), a hole-transporting compound described in the present specification (for example, see the compound represented by one of Formulae 3-1 to 3-5), or a combination thereof.

In one or more embodiments, the host may include an alkali earth metal complex, a post-transition metal complex, or any combination thereof. For example, the host may include a Be complex (for example, Compound H55), an Mg complex, a Zn complex, or any combination thereof.

In one or more embodiments, the host may include one or more of Compounds H1 to H130, 9,10-di(2-naphthyl)anthracene (ADN), 2-methyl-9,10-bis(naphthalen-2-yl)anthracene (MADN), 9,10-di(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

H1
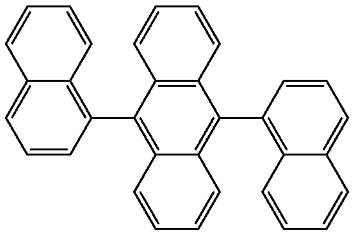
H2
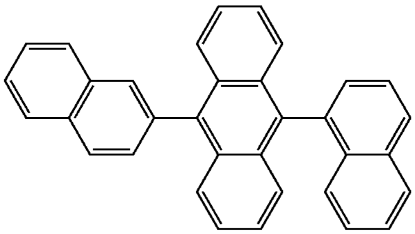
H3
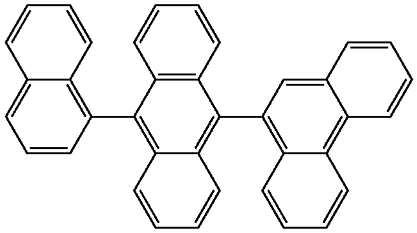
H4
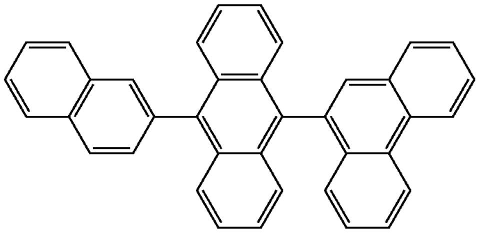
H5
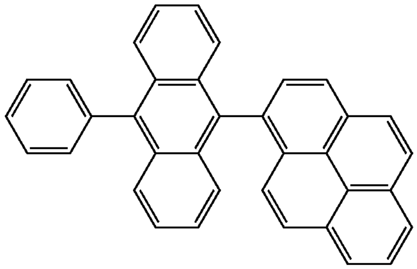
H6
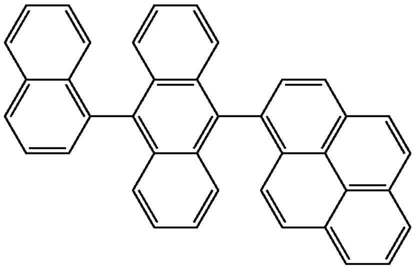
H7
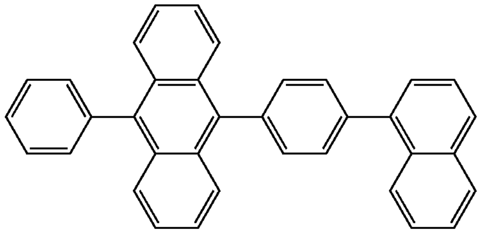
H8
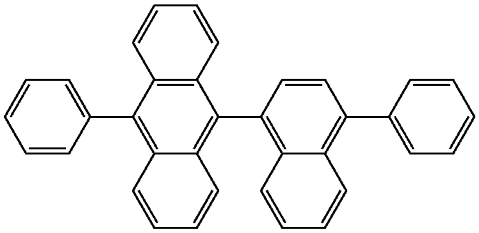
H9
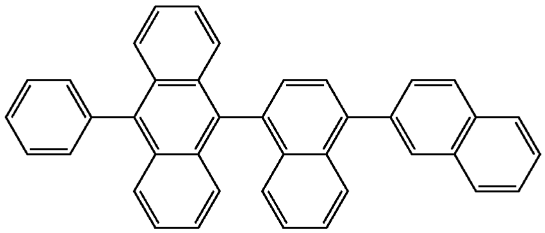
H10
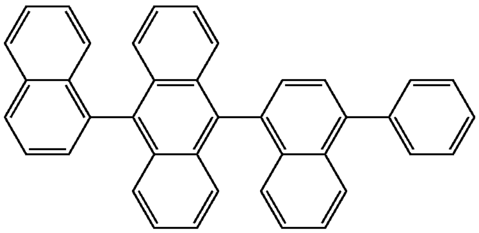
H11
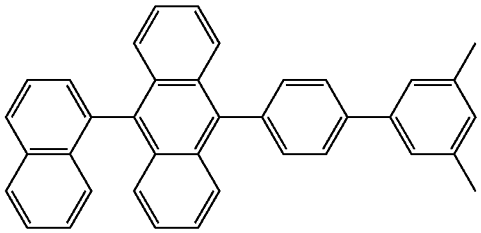
H12
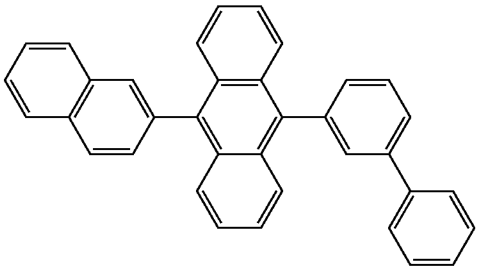

-continued
H13
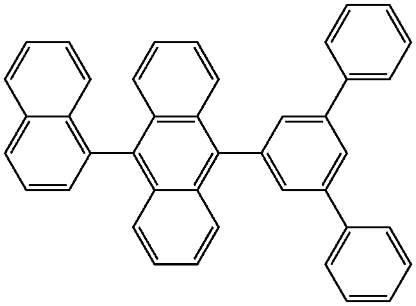
H14
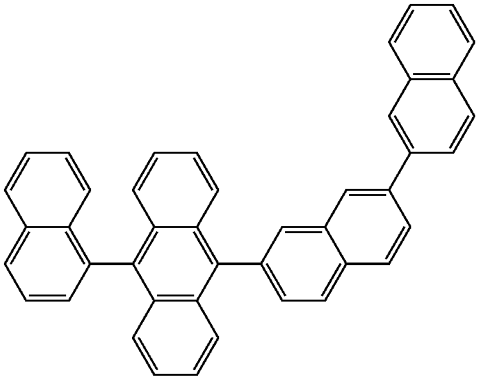
H15
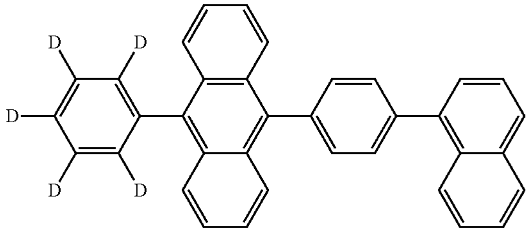
H16
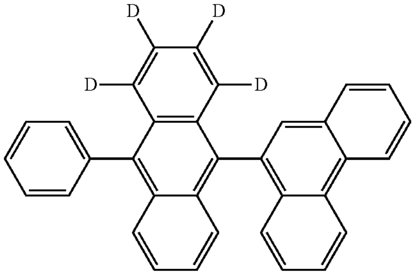
H17
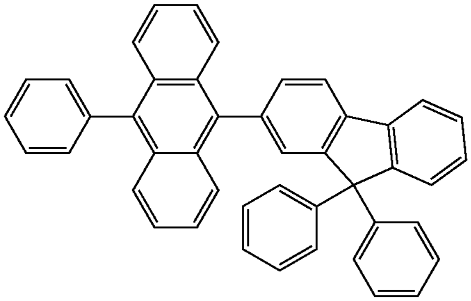
H18
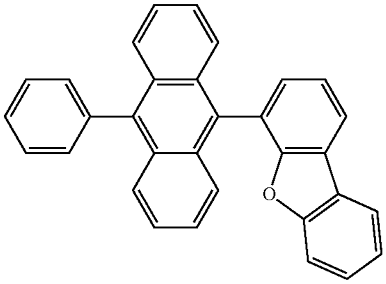
H19
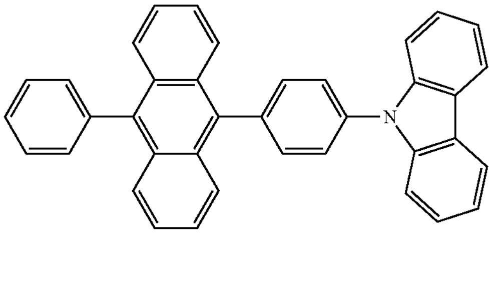
H20
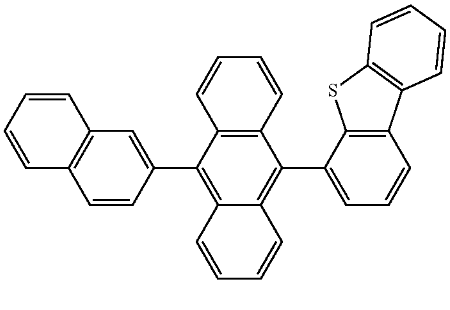

-continued
H21
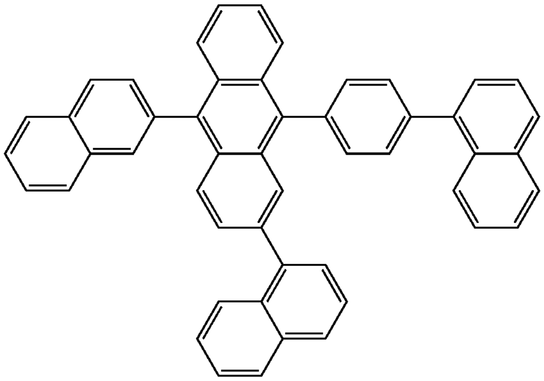
H22
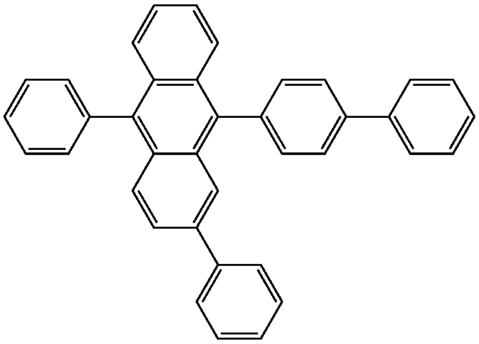
H23
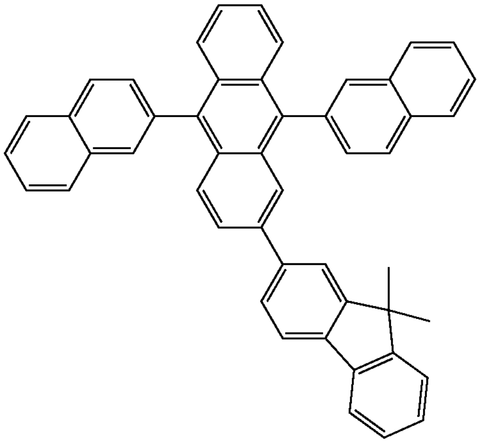
H24
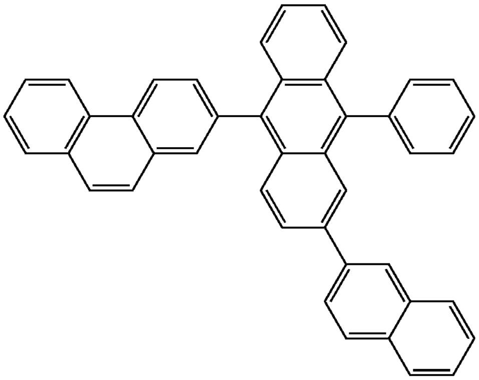
H25
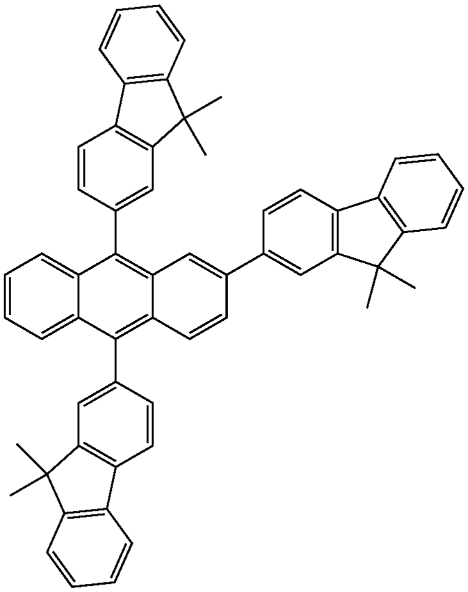
H26
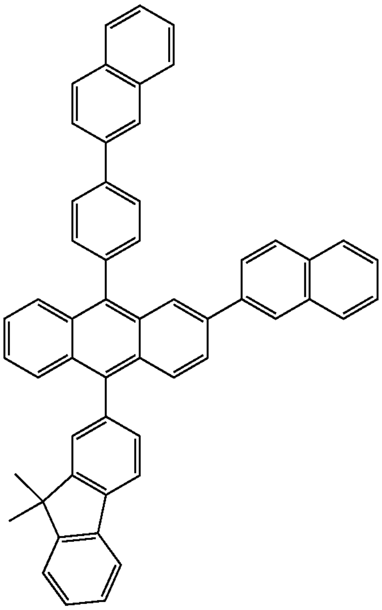

-continued
H27
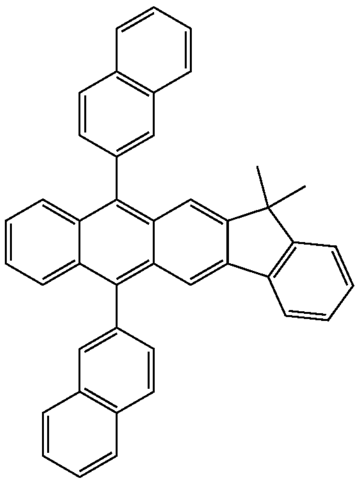
H28
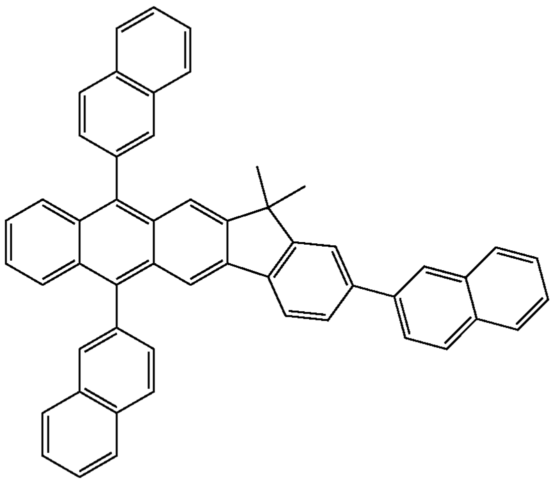
H29
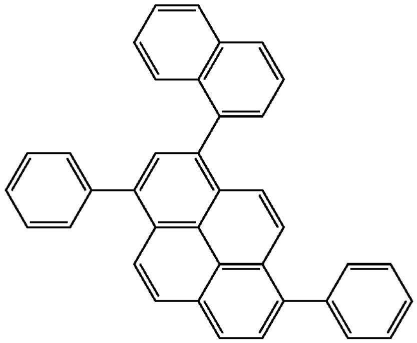
H30
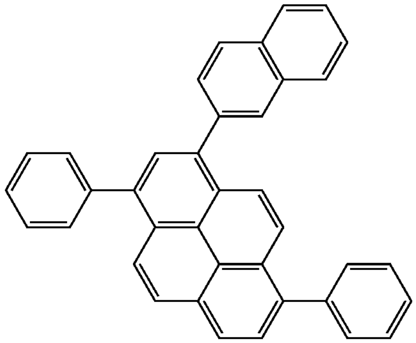
H31
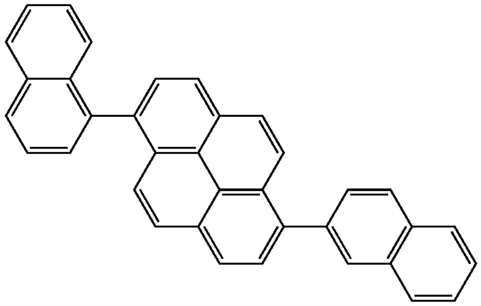
H32
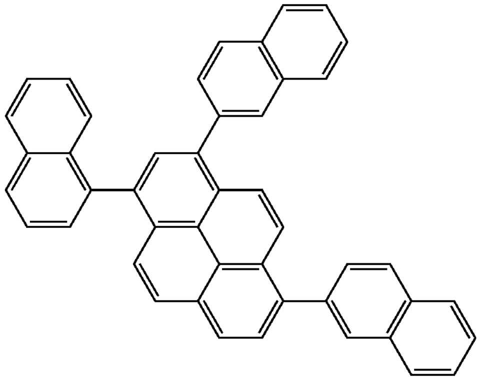
H33
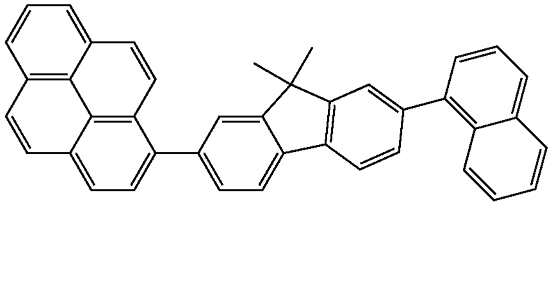
H34
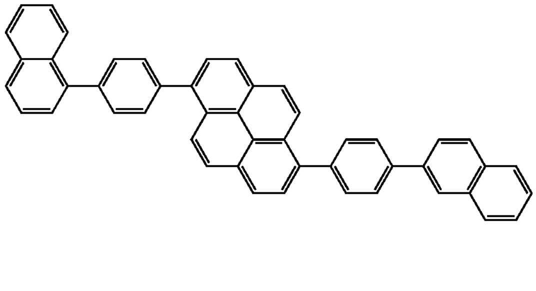

-continued
H35
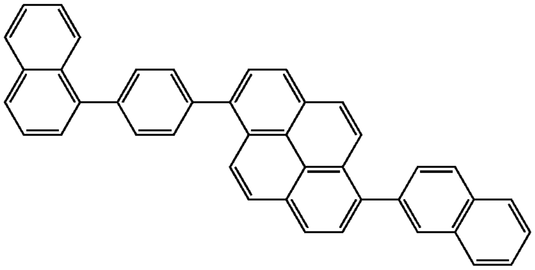
H36
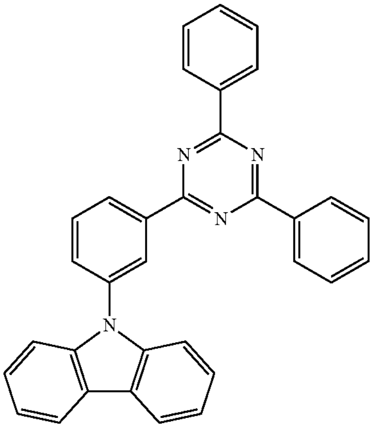
H37
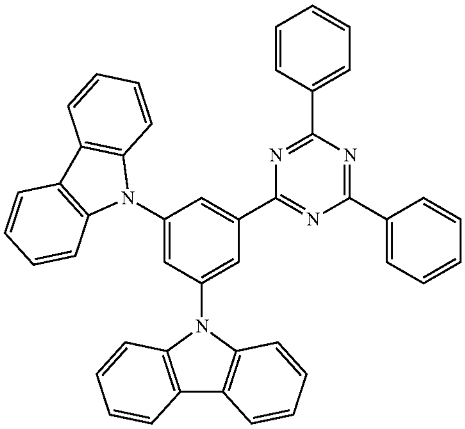
H38
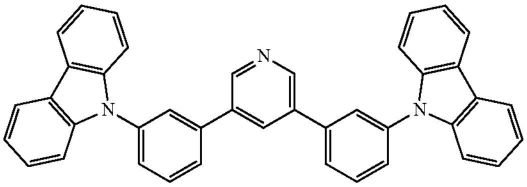
H39
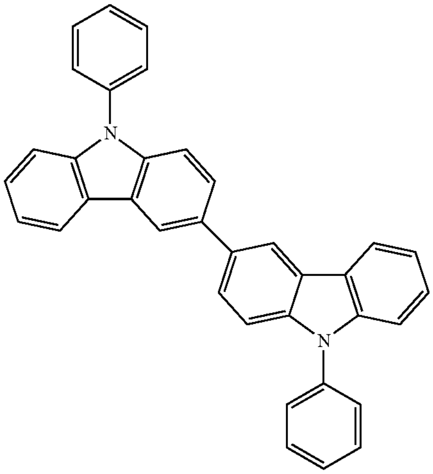
H40
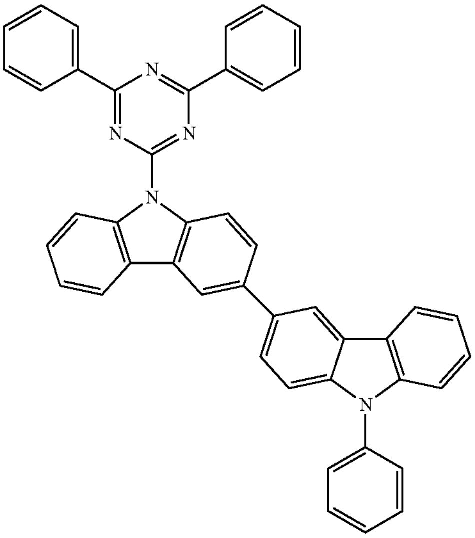

-continued
H41
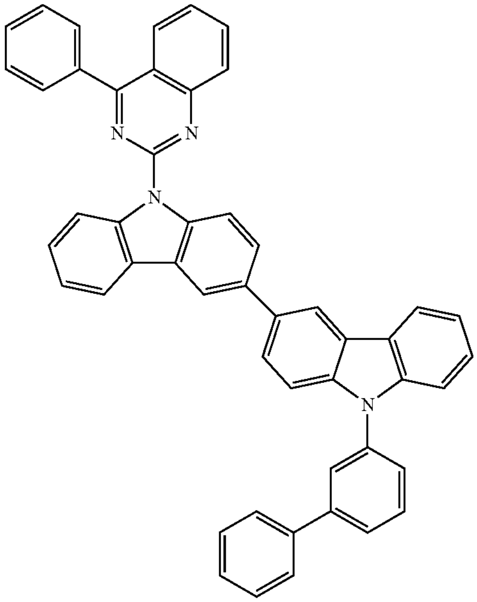
H42
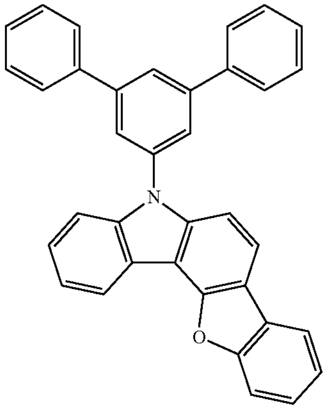
H43
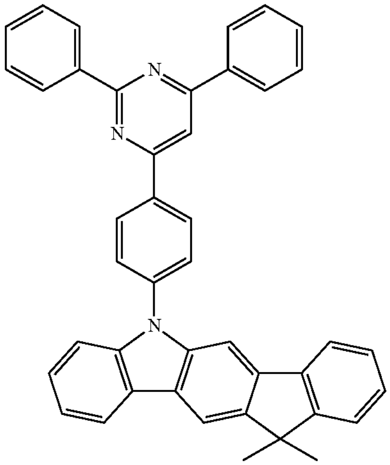
H44
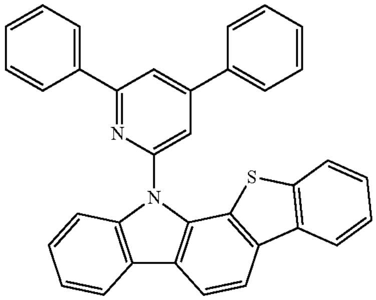
H45
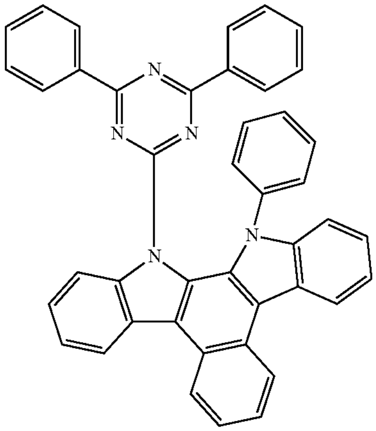
H46
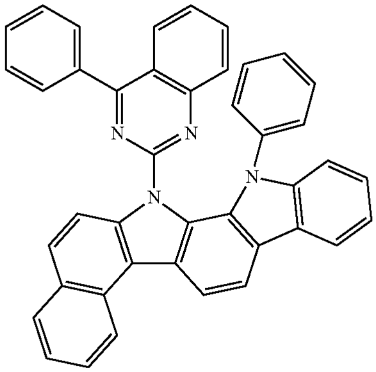

-continued
H47
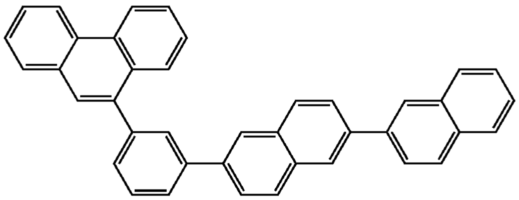
H48
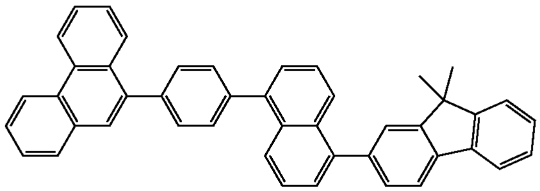
H49
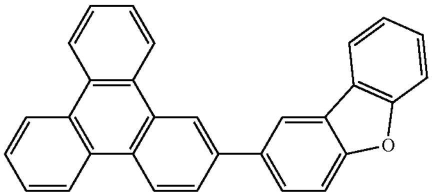
H50
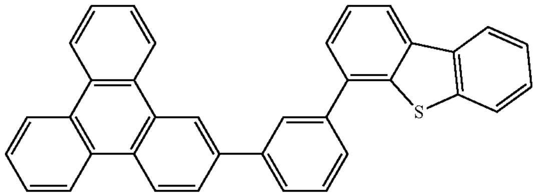
H51
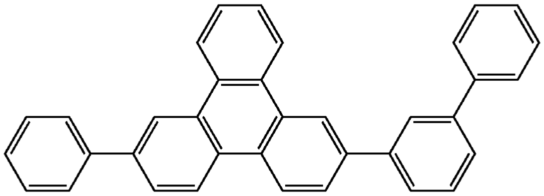
H52
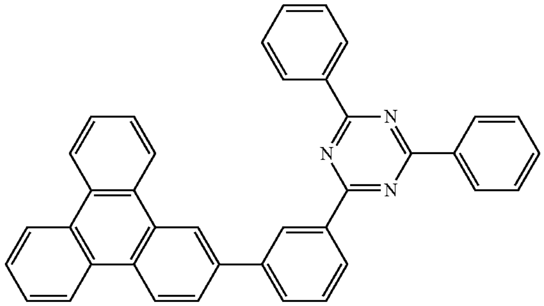
H53
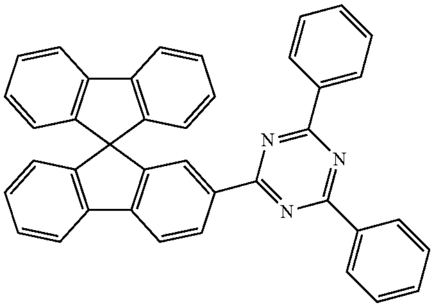
H54
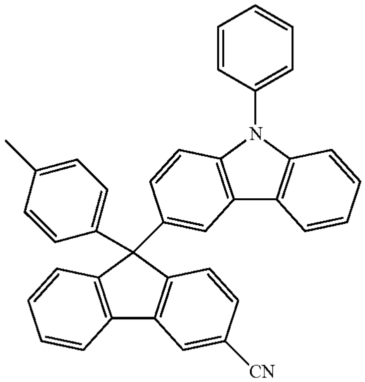
H55
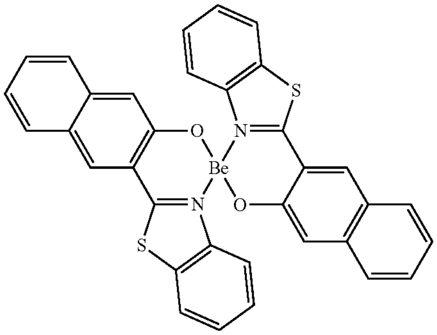
H56
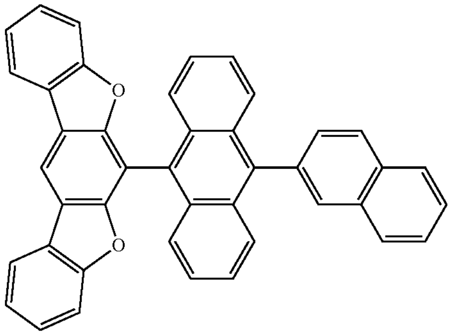

-continued
H57
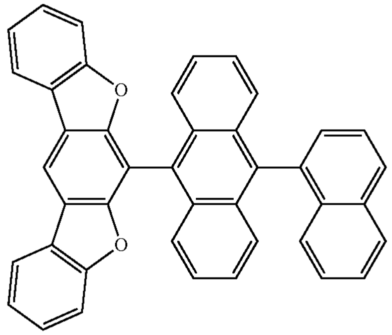
H58
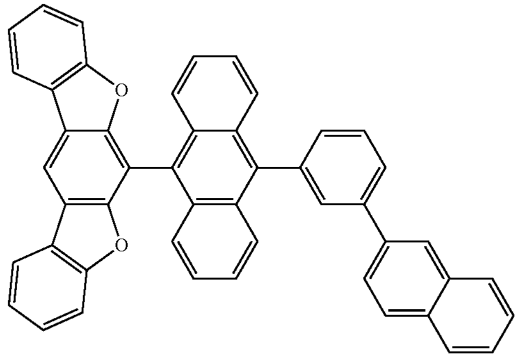
H59
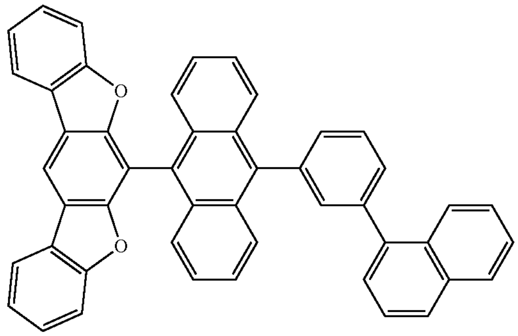
H60
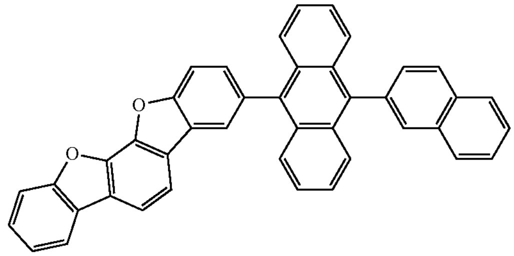
H61
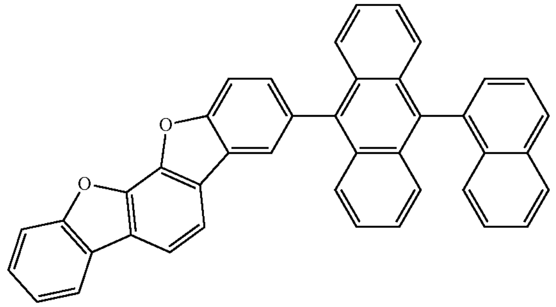
H62
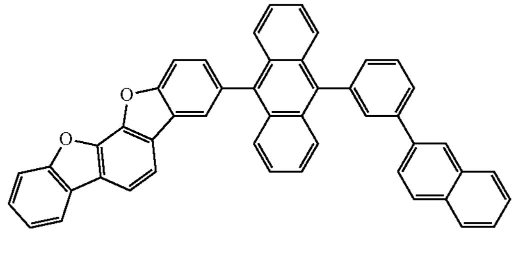
H63
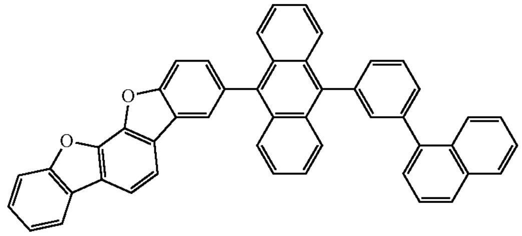
H64
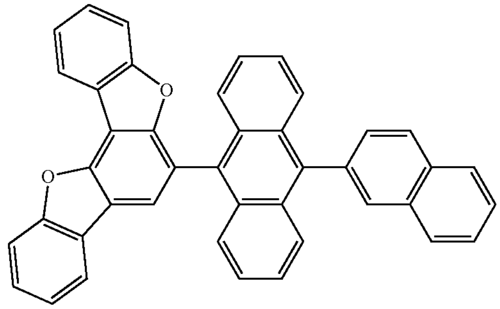

-continued
H65
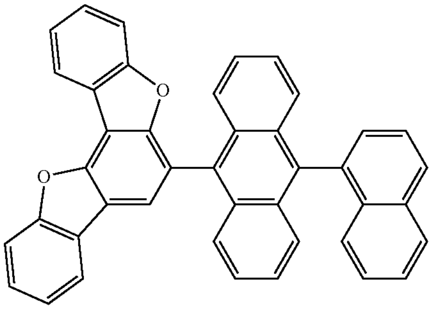
H66
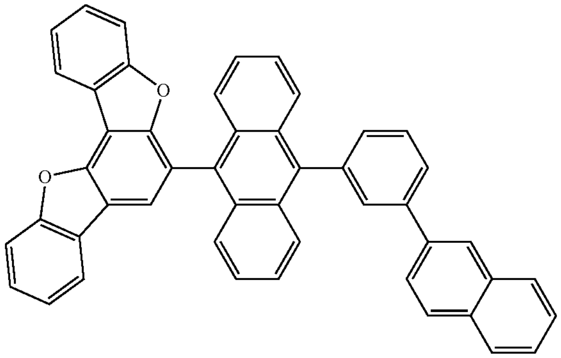
H67
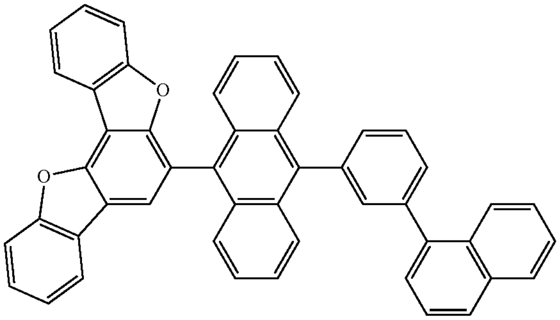
H68
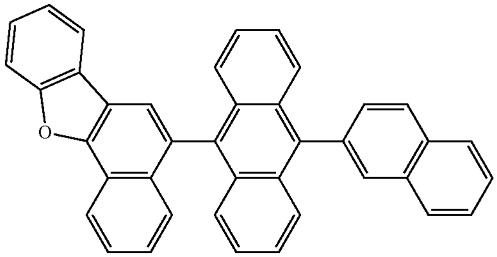
H69
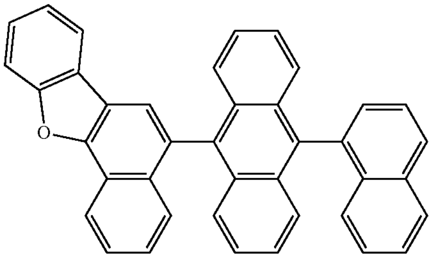
H70
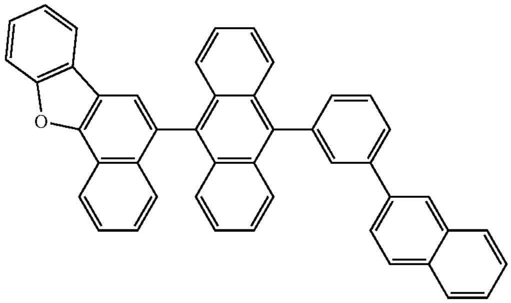
H71
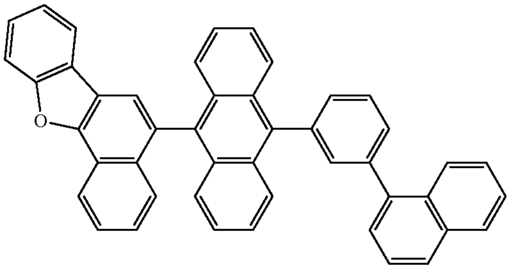
H72
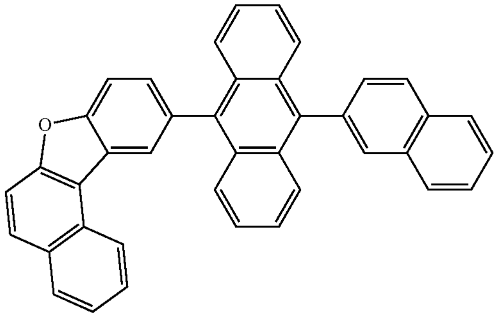

-continued
H73
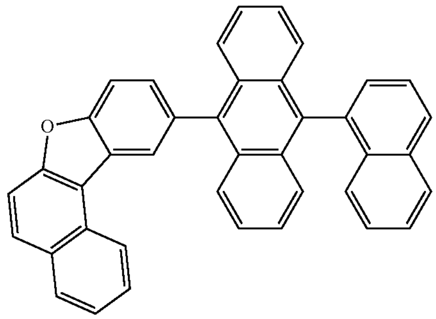
H74
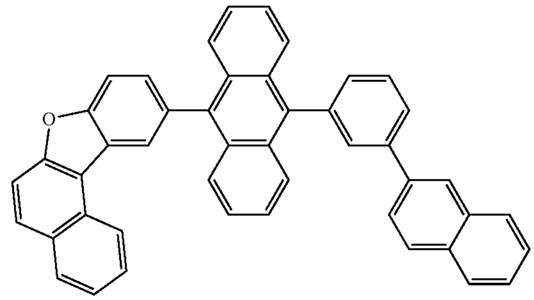
H75
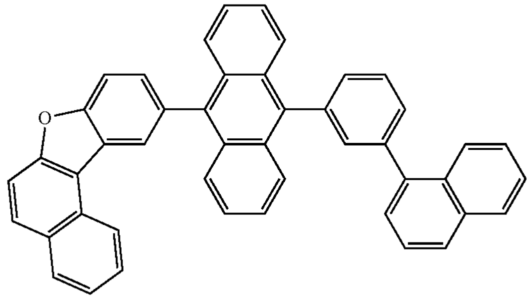
H76
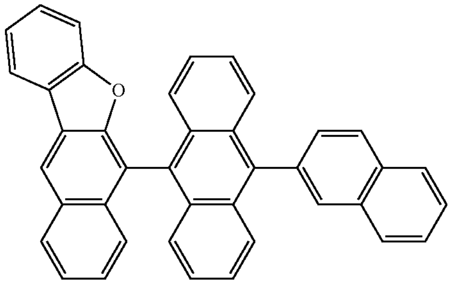
H77
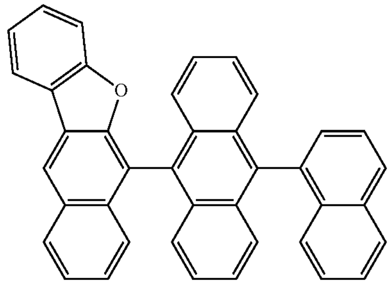
H78
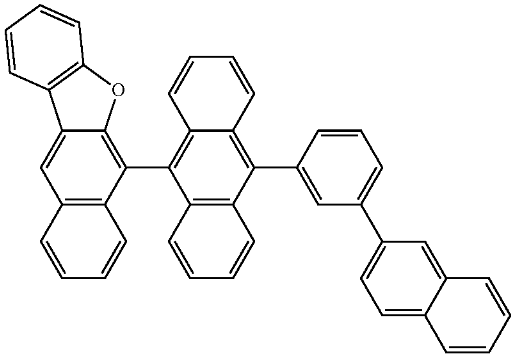
H79
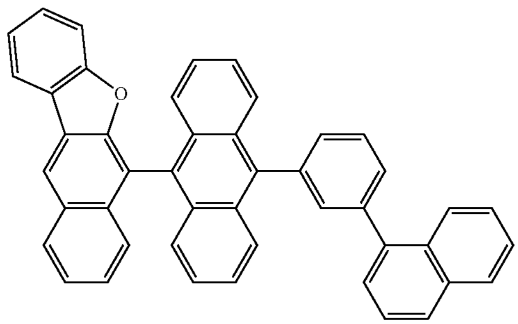
H80
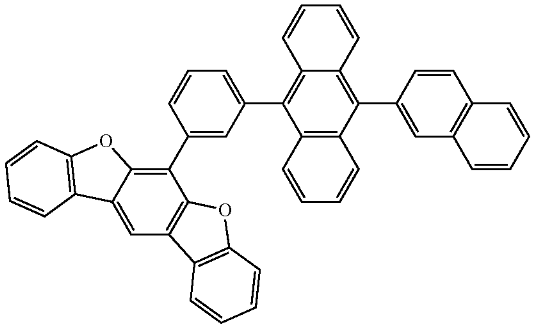

-continued
H81
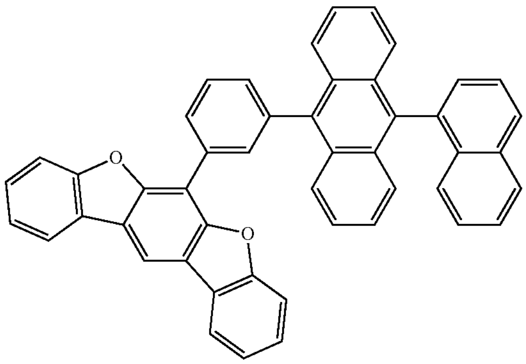
H82
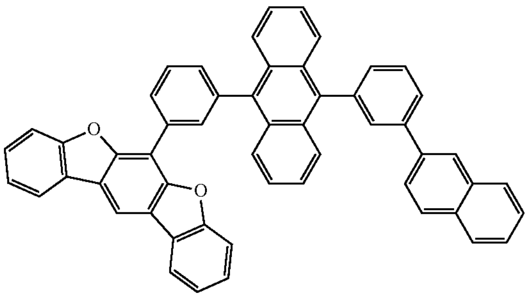
H83
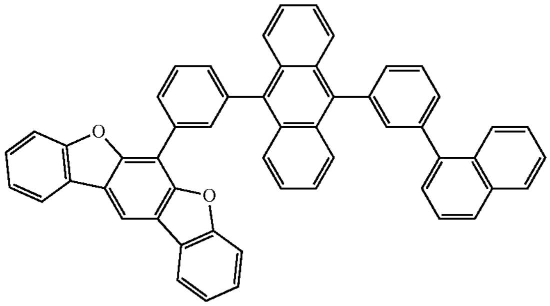
H84
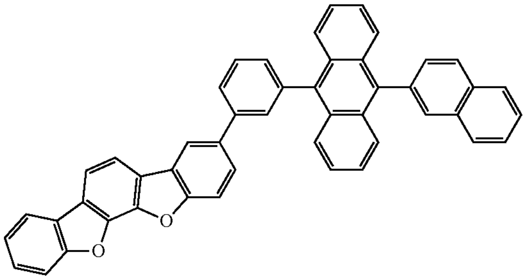
H85
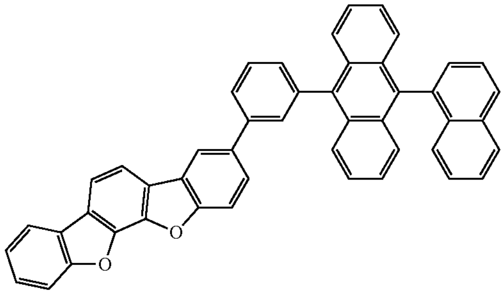
H86
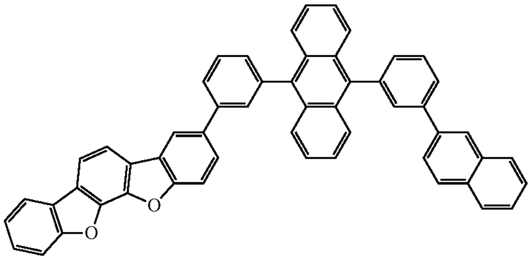
H87
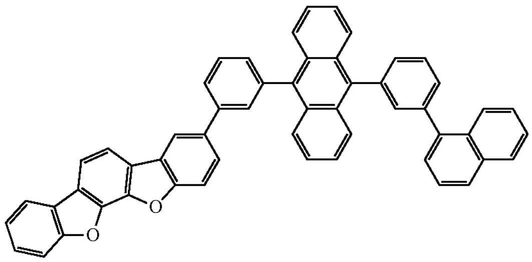
H88
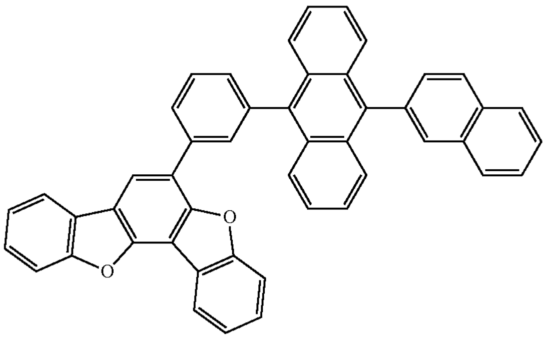

-continued
H89
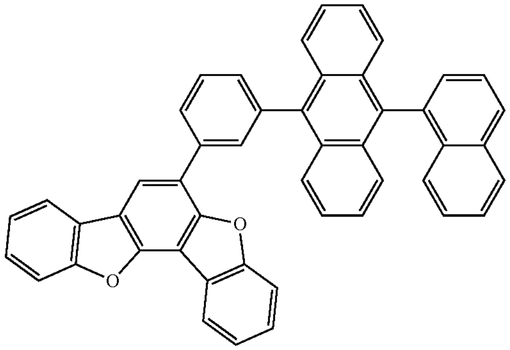
H90
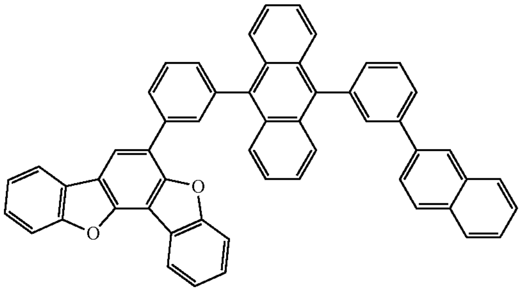
H91
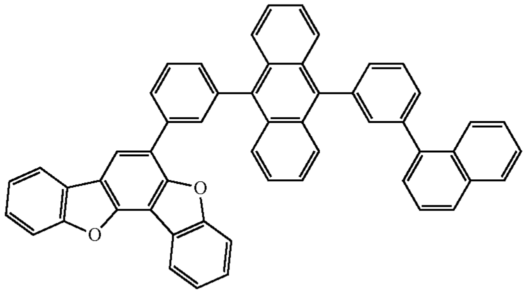
H92
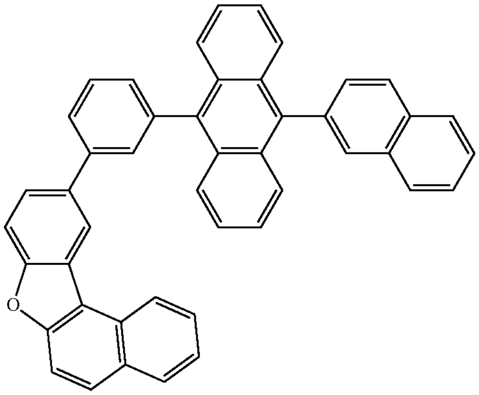
H93
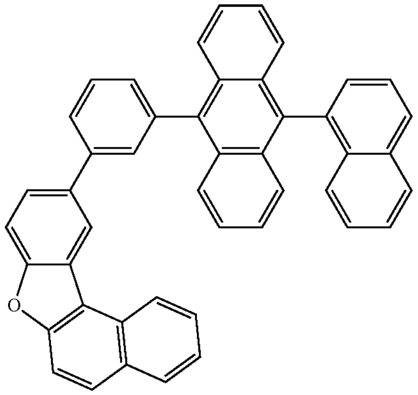
H94
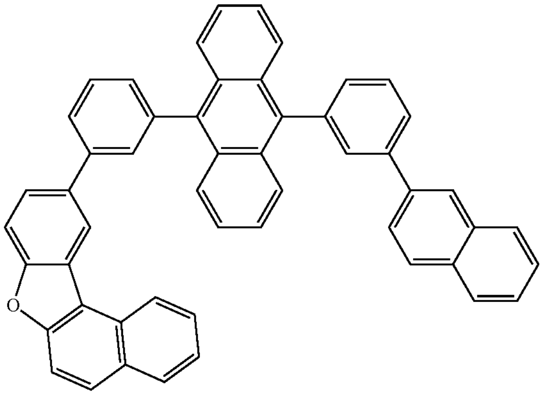
H95
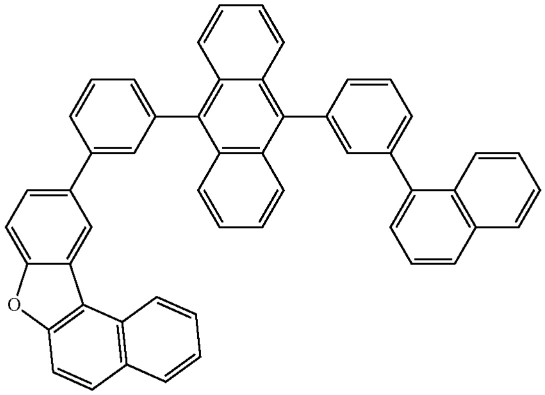
H96
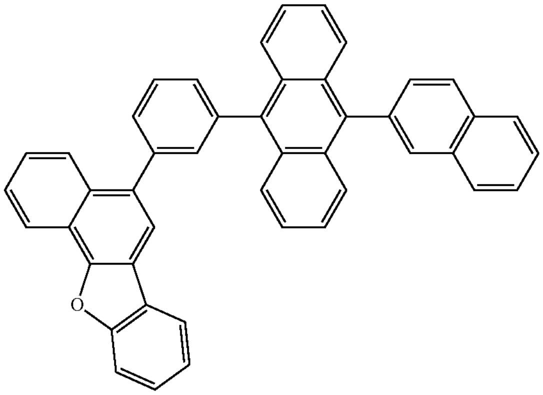

-continued
H97
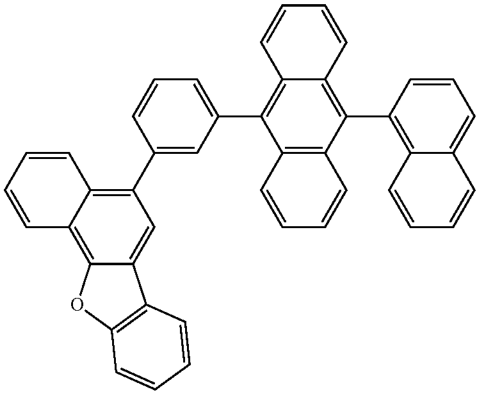
H98
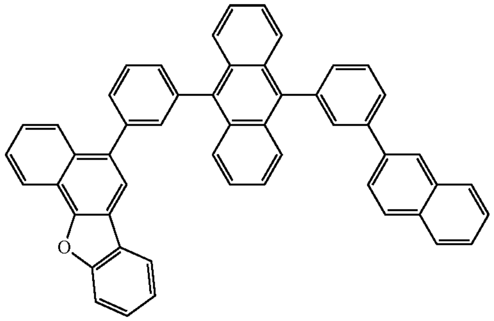
H99
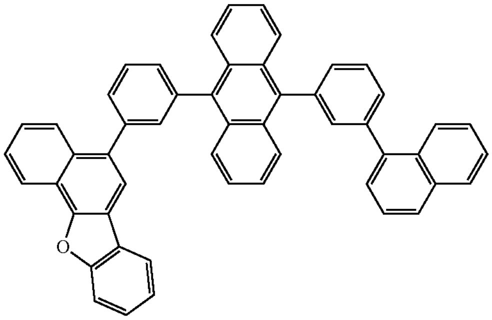
H100
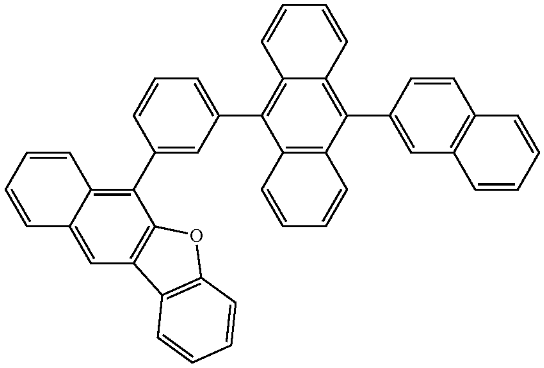
H101
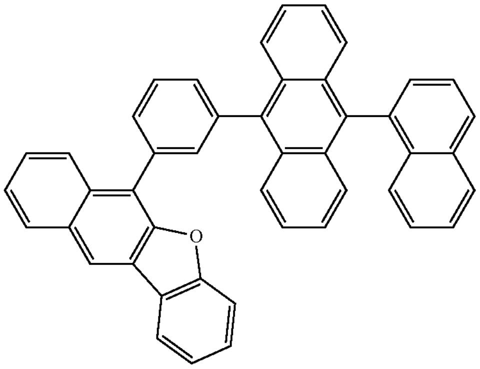
H102
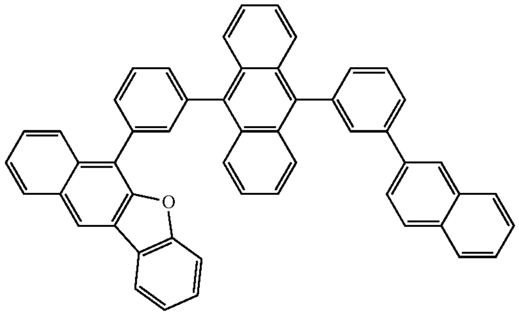
H103
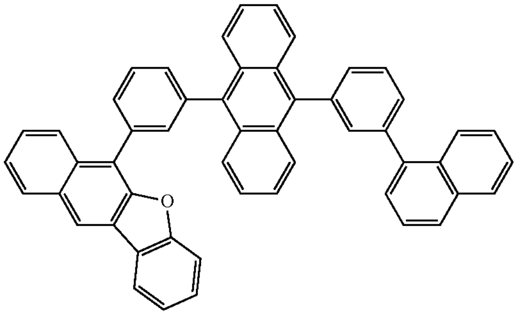
H104
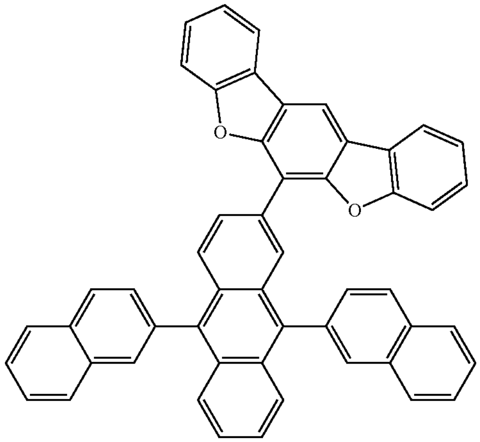

-continued
H105
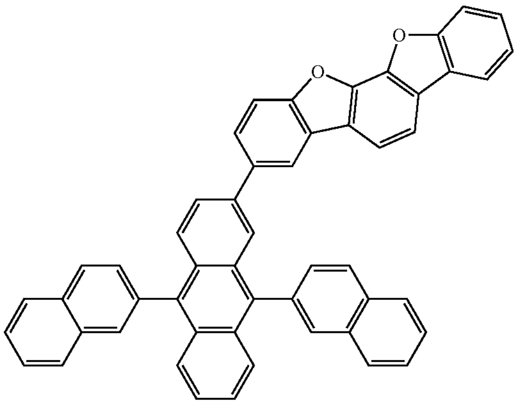
H106
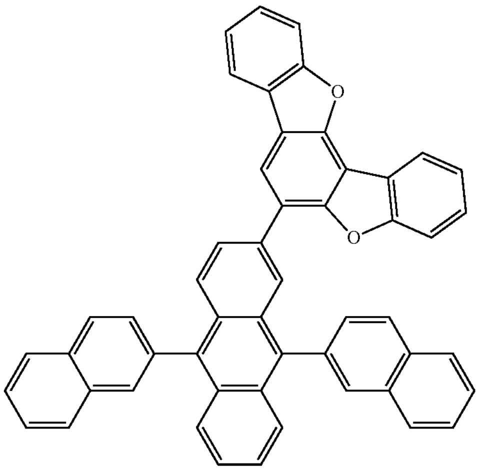
H107
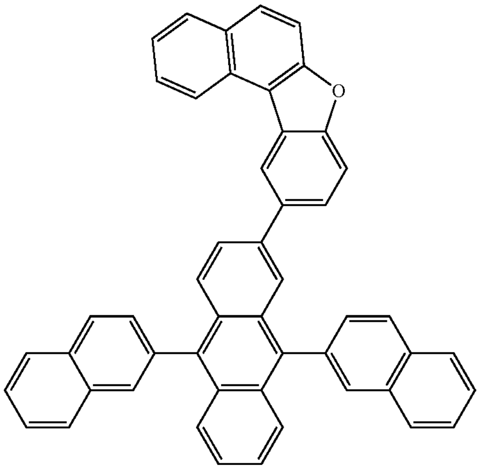
H108
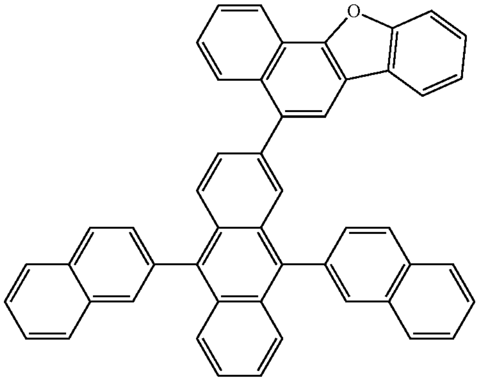
H109
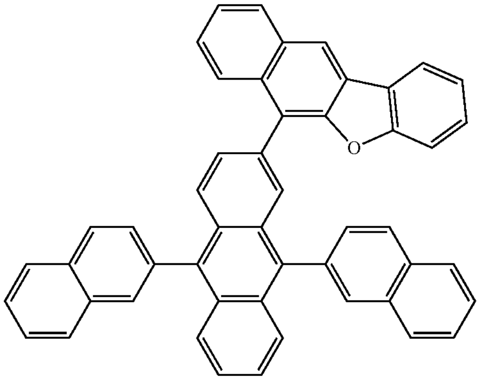
H110
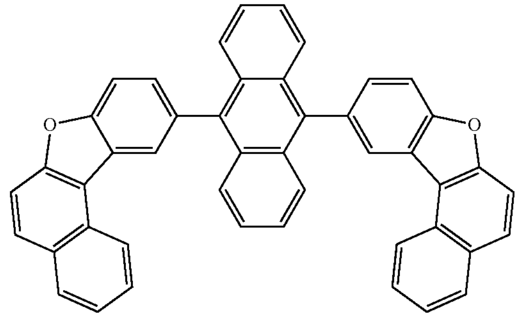
H111
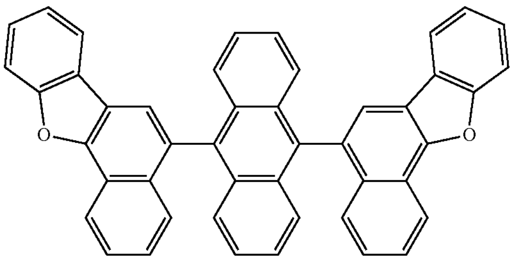
H112
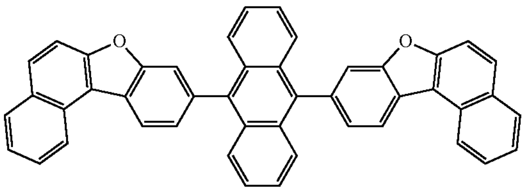

-continued
H113
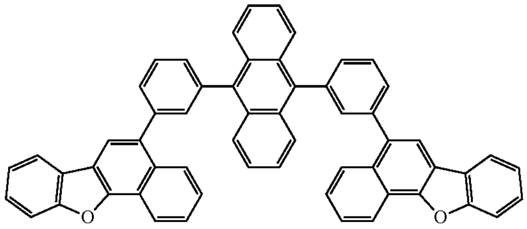
H114
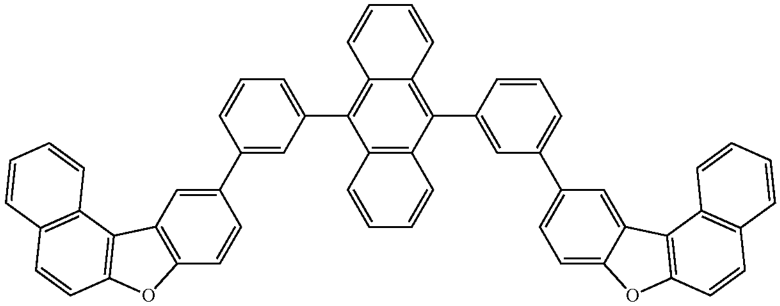
H115
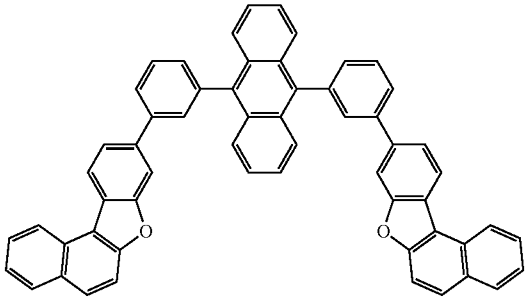
H116
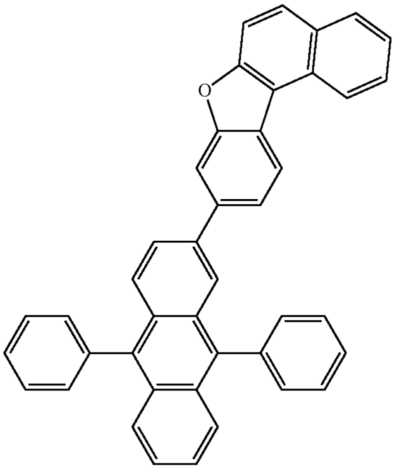
H117
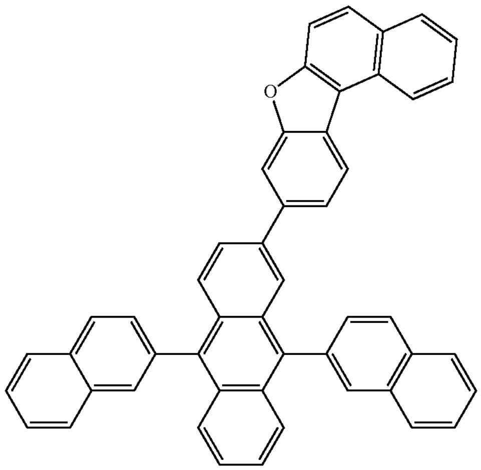
H118
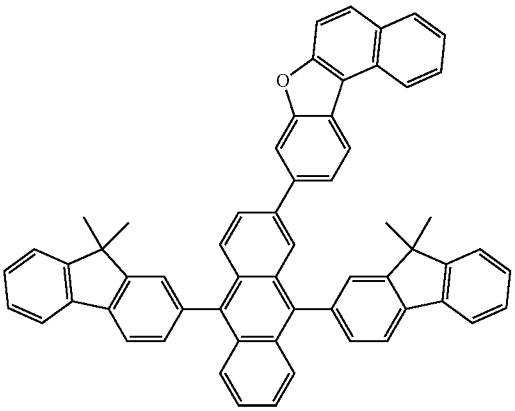

-continued
H119
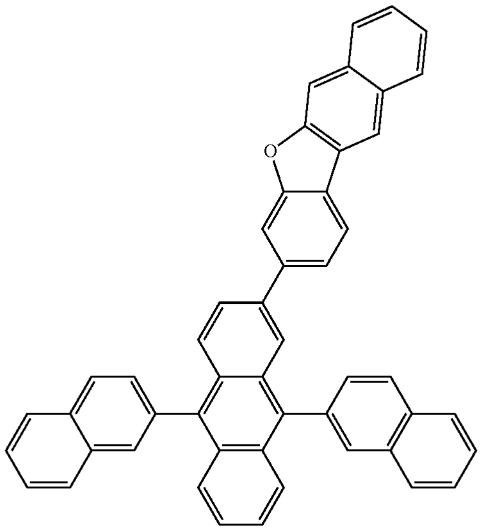
H120
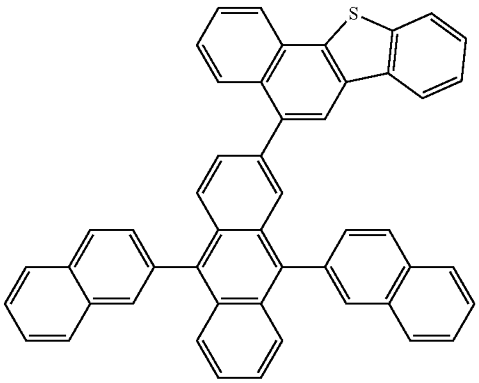
H121
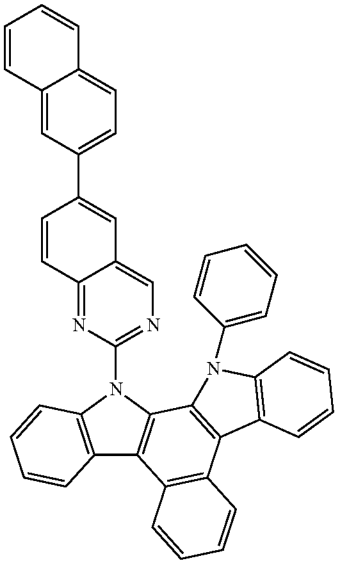
H122
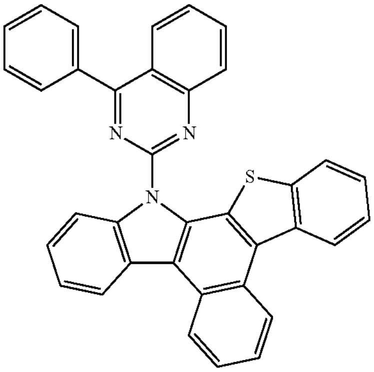
H123
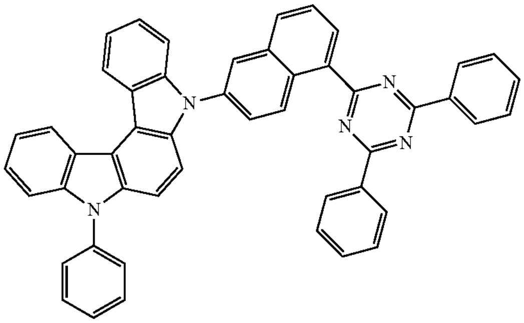
H124
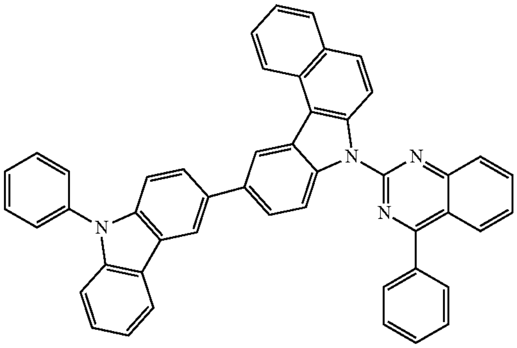
.

-continued
H125
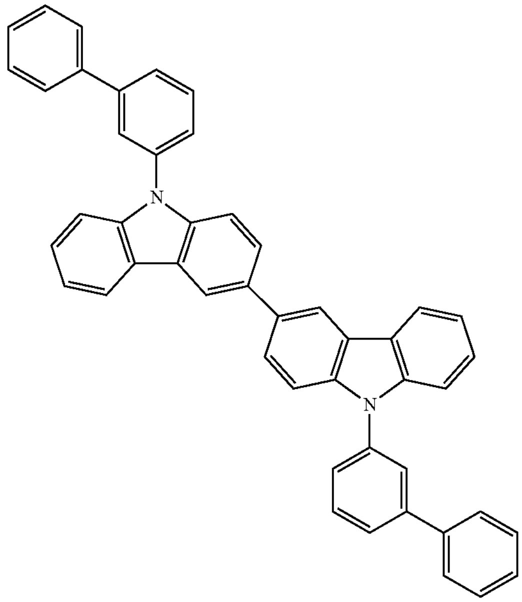
H126
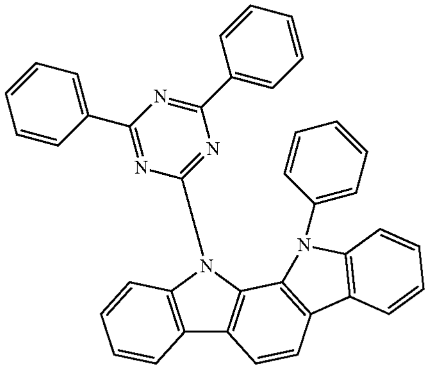
H127
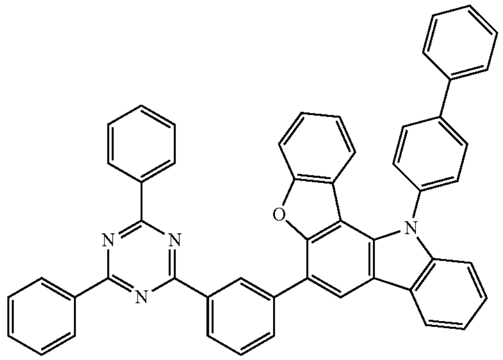
H128
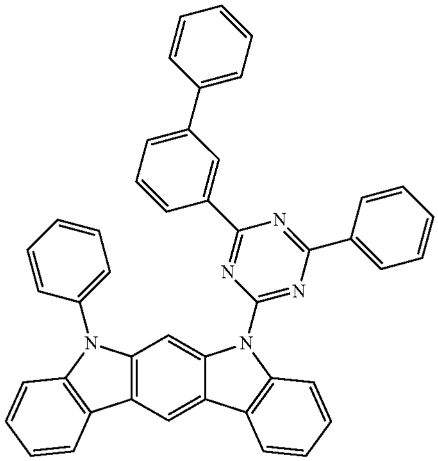
H129
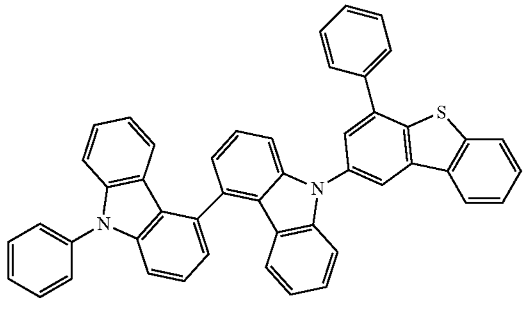
H130
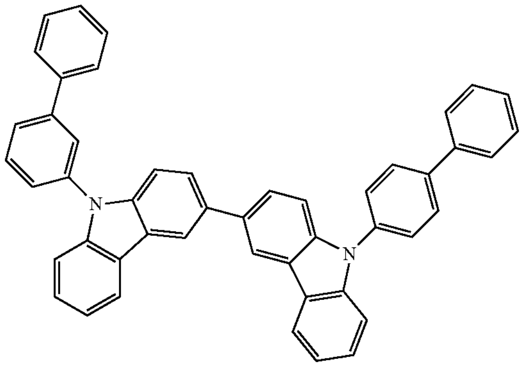
In one or more embodiments, the host may include a silicon-containing compound, a phosphine oxide-containing compound, or any combination thereof.
The host may have various suitable modifications. For example, the host may include only one kind of compound, or may include two or more kinds of different compounds.

Phosphorescent Dopant

The emission layer may include, as a phosphorescent dopant, the first emitter as described in the present specification.

In one or more embodiments, the emission layer may further include, in addition to the first emitter as described in the present specification, an organometallic compound represented by Formula 401:

Formula 401

$M(L_{401})_{xc1}(L_{402})_{xc2}$

Formula 402

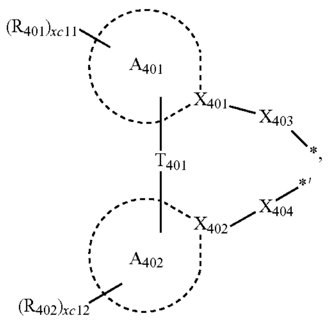

wherein, in Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)-*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are each the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are each the same as described in connection with $Q_1$, xc11 and xc12 may each independently be an integer from 0 to 10, and

* and *' in Formula 402 each indicate a binding site to M in Formula 401.

For example, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two ring A401(s) in two or more of $L_{401}$(s) may be optionally linked to each other via $T_{402}$, which is a linking group, and/or two ring $A_{402}$(s) may be optionally linked to each other via $T_{403}$, which is a linking group (see e.g., Compounds PD1 to PD4 and PD7). $T_{402}$ and $T_{403}$ are each the same as described in connection with $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(=O), an isonitrile group, a —CN group, a phosphorus group (for example, a phosphine group, a phosphite group, etc.), or any combination thereof.

Fluorescent Dopant

The emission layer may further include a fluorescent dopant, in addition to the first emitter as described in the present specification.

The fluorescent dopant may include an arylamine compound, a styrylamine compound, a boron-containing compound, or any combination thereof.

For example, the fluorescent dopant may include a compound represented by Formula 501:

Formula 501

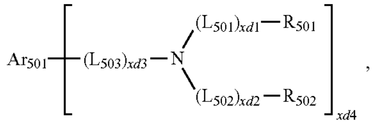

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{501}$ in Formula 501 may be a condensed cyclic group (for example, an anthracene group, a chrysene group, a pyrene group, etc.) in which three or more monocyclic groups are condensed with each other.

In one or more embodiments, xd4 in Formula 501 may be 2.

For example, the fluorescent dopant may include one or more of Compounds FD1 to FD36, DPVBi, DPAVBi, or any combination thereof:

FD1
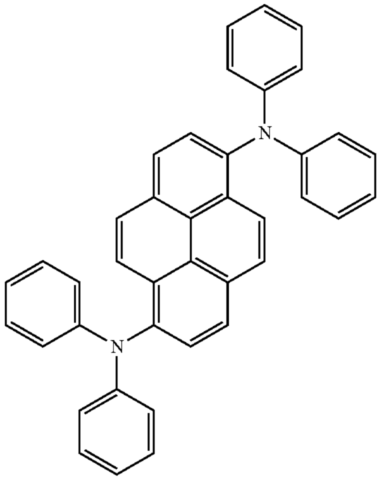
FD2
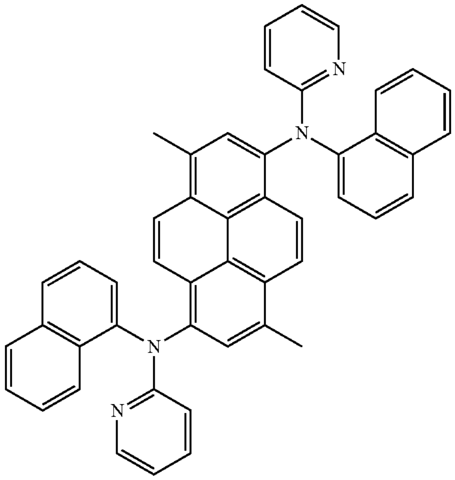
FD3
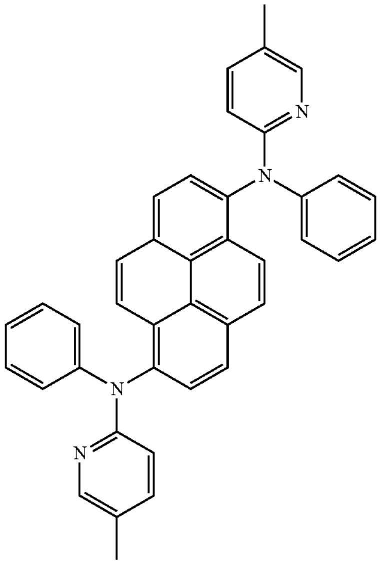
FD4
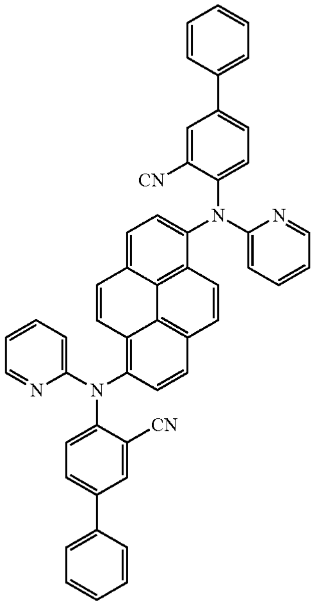
FD5
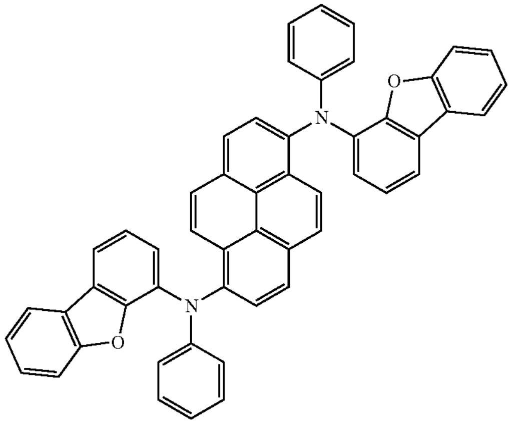
FD6
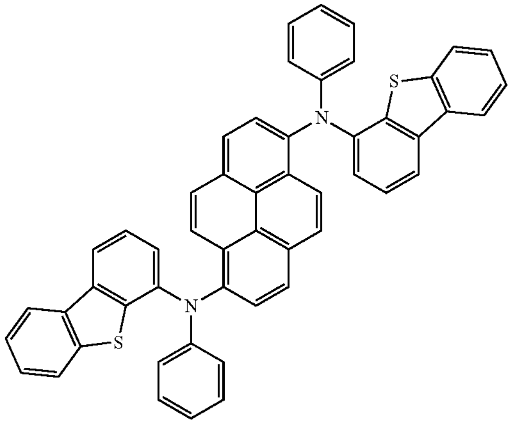

-continued
FD7
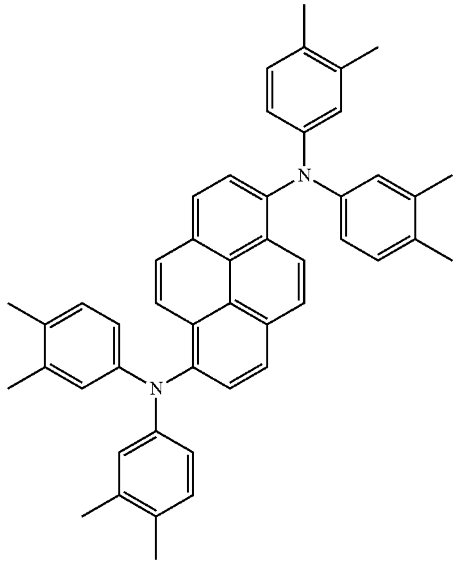
FD8
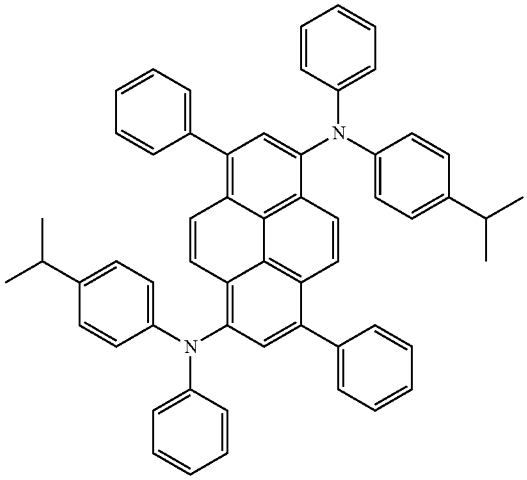
FD9
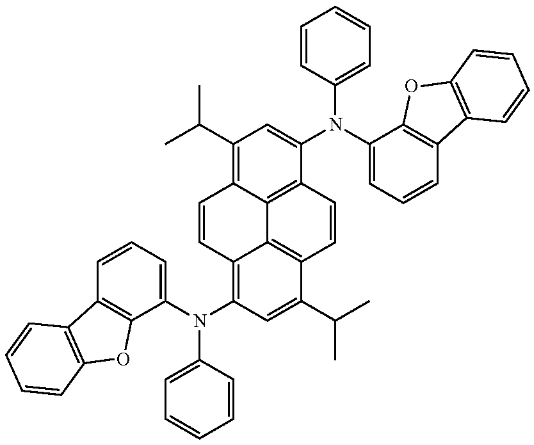
FD10
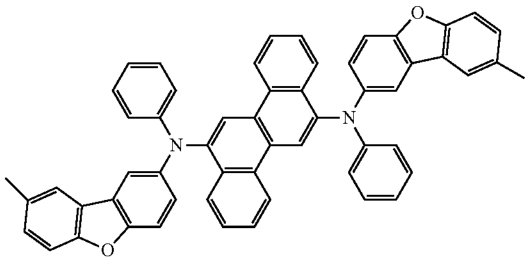
FD11
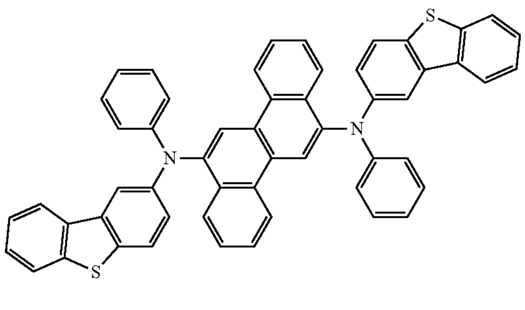
FD12
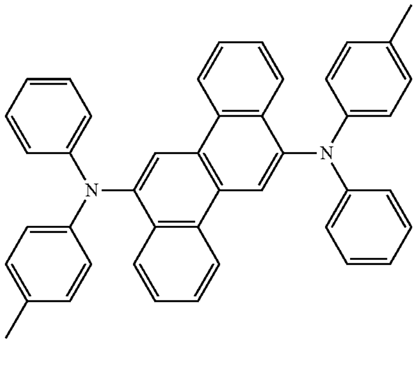

-continued
FD13
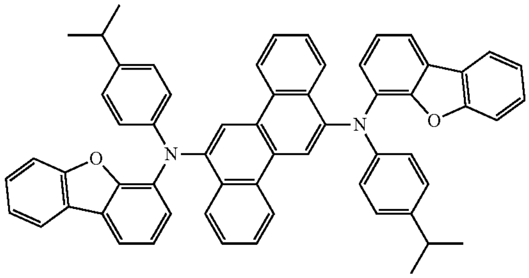
FD14
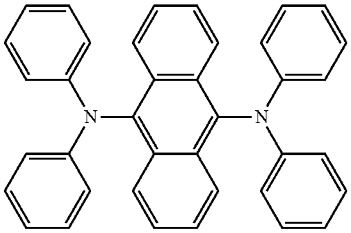
FD15
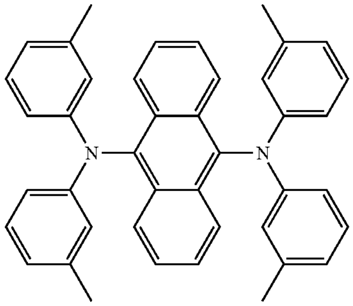
FD16
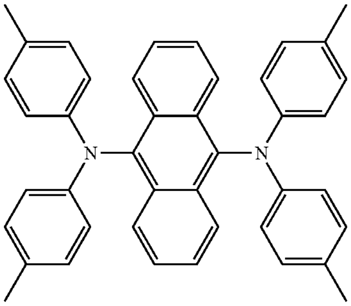
FD17
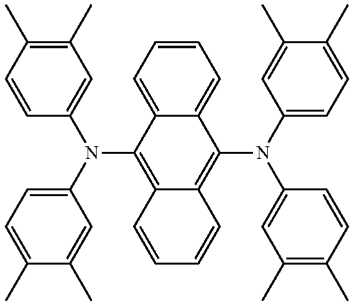
FD18
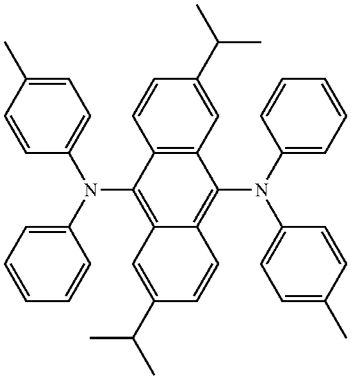
FD19
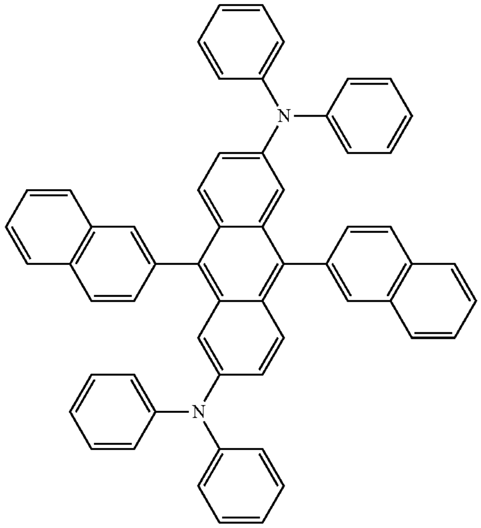
FD20
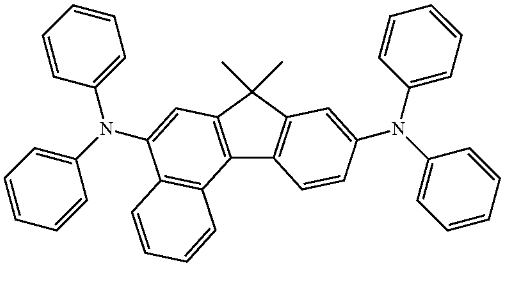

-continued
FD21
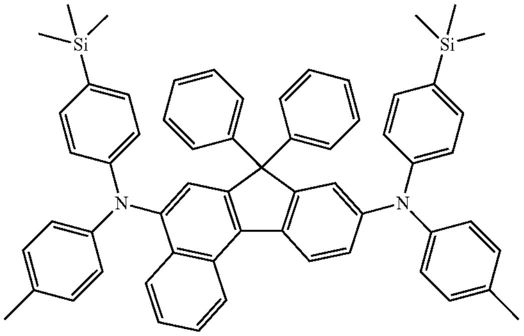
FD22
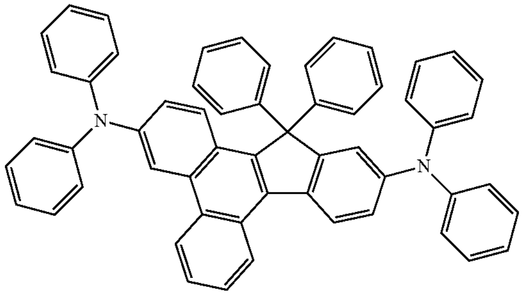
FD23
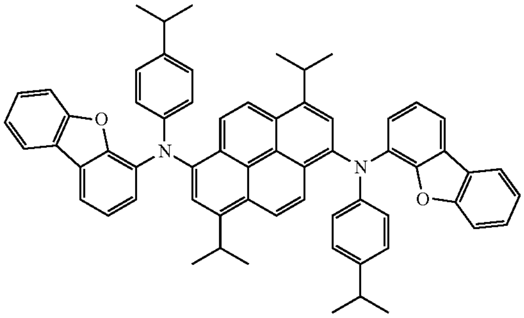
FD24
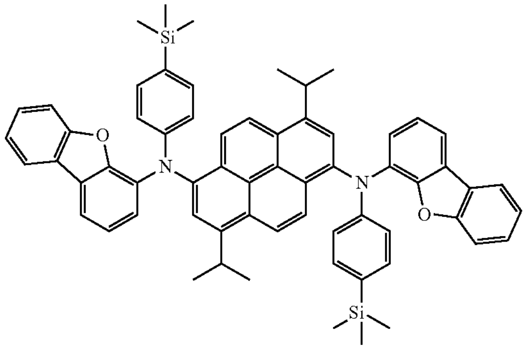
FD25
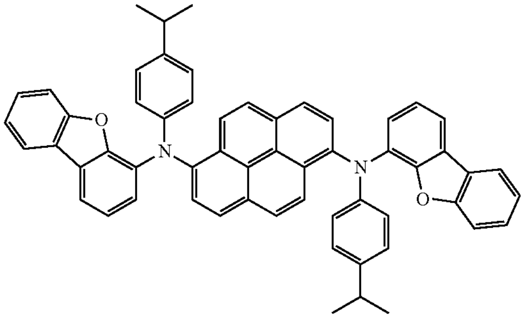
FD26
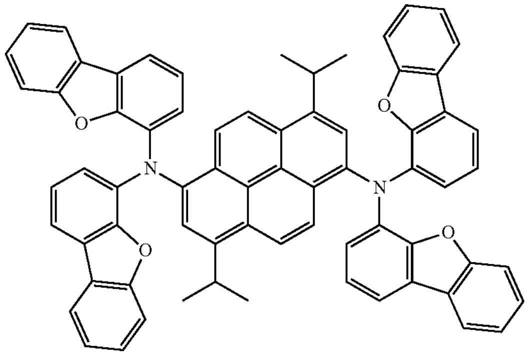
FD27
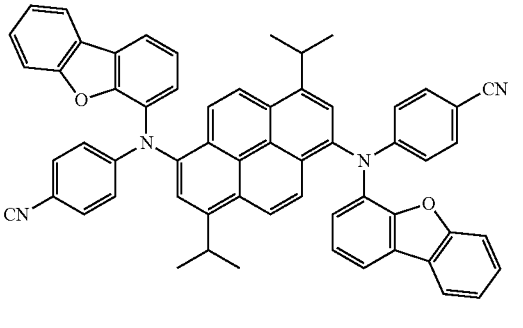
FD28
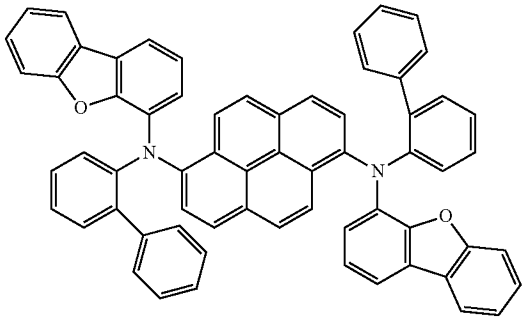

-continued
FD29
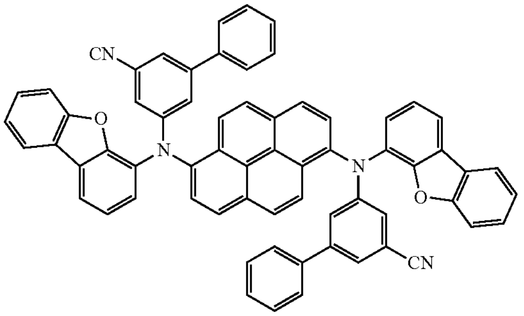
FD30
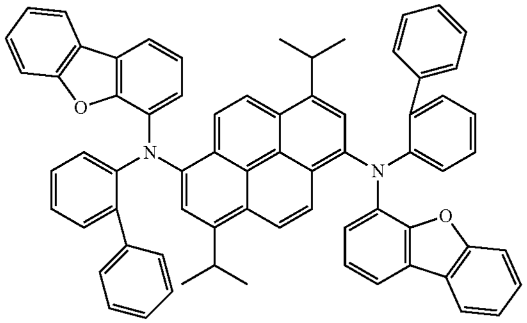
FD31
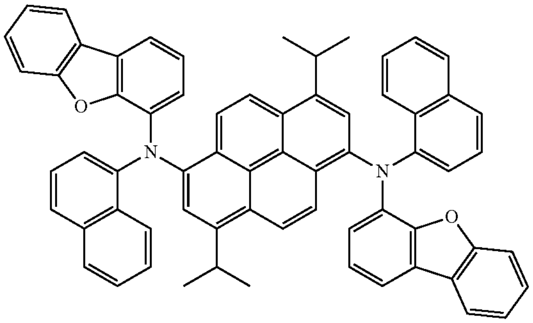
FD32
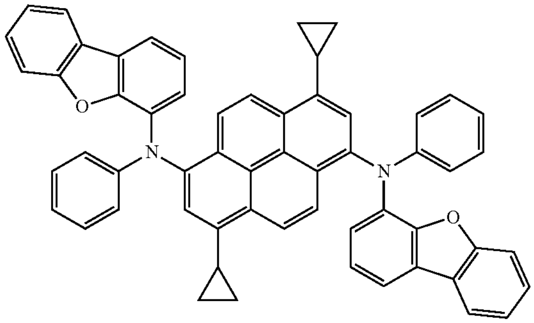
FD33
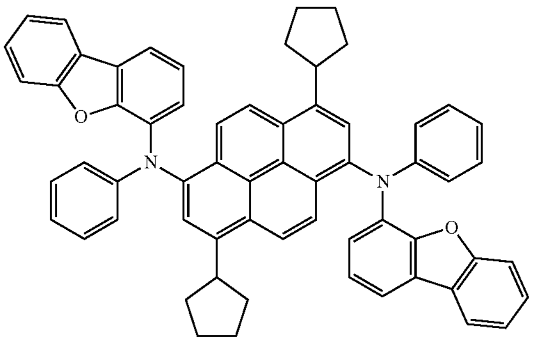
FD34
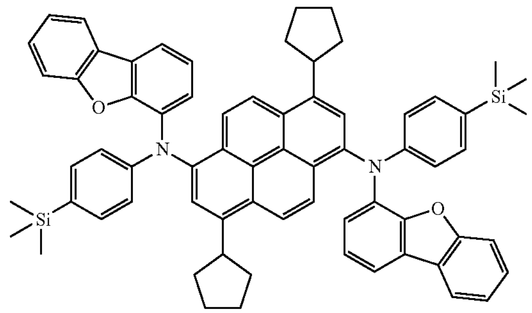
FD35
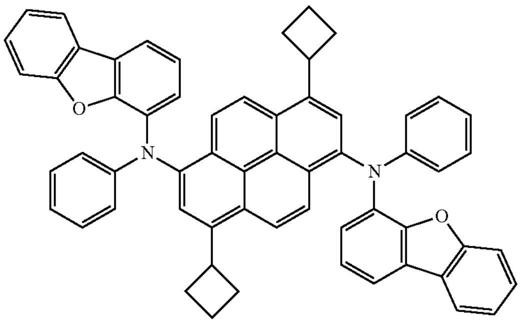
FD36
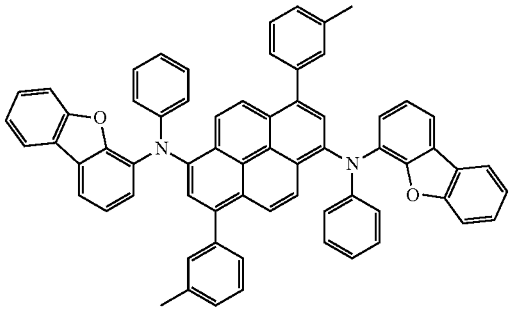

-continued

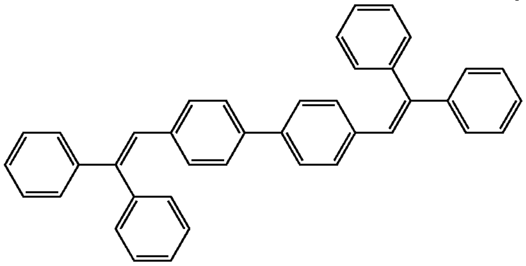

DPVBi

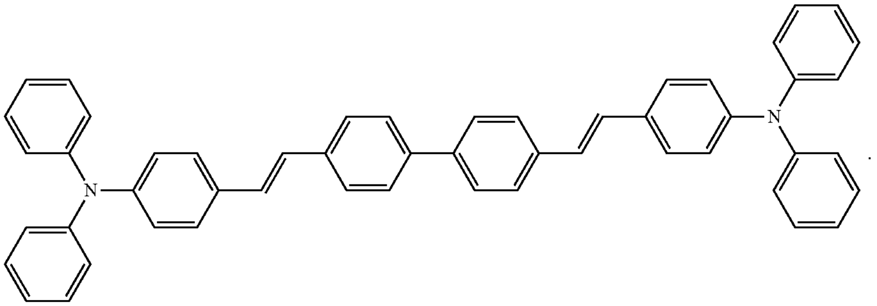

DPAVBi

Delayed Fluorescence Material

The emission layer may further include a delayed fluorescence material.

In the present specification, the delayed fluorescence material may be selected from compounds capable of emitting delayed fluorescent light based on a delayed fluorescence emission mechanism.

The delayed fluorescence material included in the emission layer may act as a host or a dopant depending on the type (or kind) of other materials included in the emission layer.

In one or more embodiments, a difference between a triplet energy level (eV) of the delayed fluorescence material and a singlet energy level (eV) of the delayed fluorescence material may be equal to or greater than 0 eV and equal to or less than 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively (or suitably) occur, and thus, the luminescence efficiency of the light-emitting device 10 may be improved.

For example, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, a π electron-deficient nitrogen-containing $C_1$-$C_{60}$ cyclic group, etc.), and ii) a material including a $C_8$-$C_{60}$ polycyclic group in which two or more cyclic groups are condensed while sharing boron (B).

Examples of the delayed fluorescence material may include Compounds DF1 to DF14:

DF1

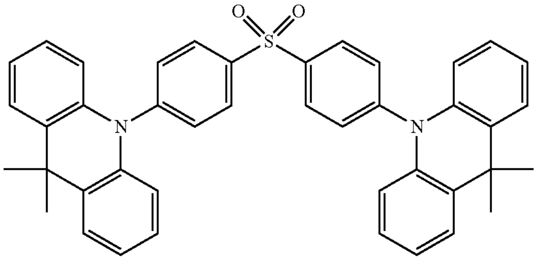

(DMAC-DPS)

DF2

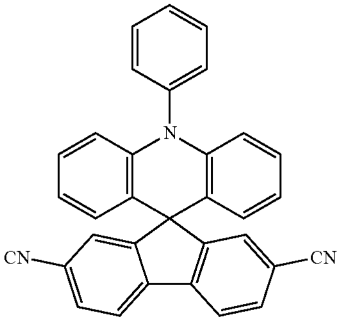

(ACRFLCN)

-continued
DF3
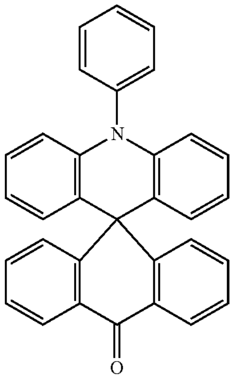
(ACRSA)
DF4
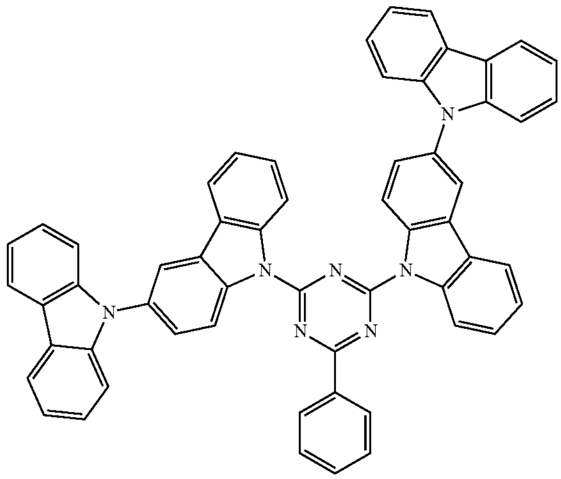
(CC2TA)
DF5
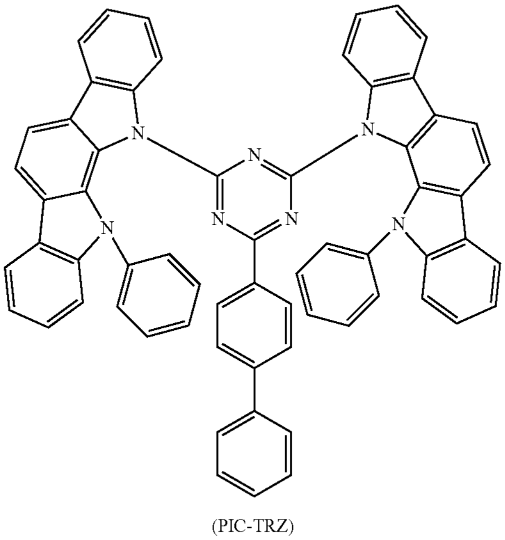
(PIC-TRZ)
-continued
DF6
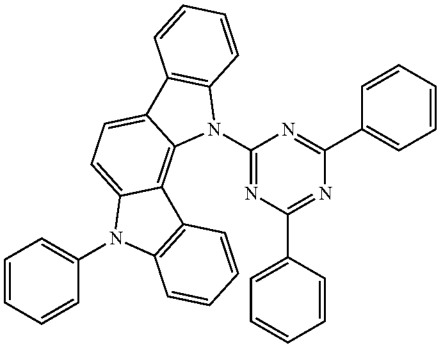
(PIC-TRZ2)
DF7
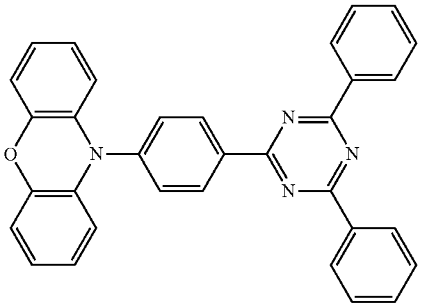
(PXZ-TRZ)
DF8
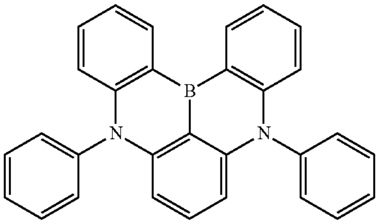
(DABNA-1)
DF9
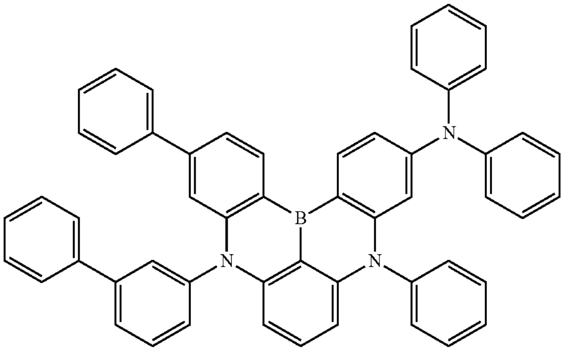
(DABNA-2)

-continued

DF10

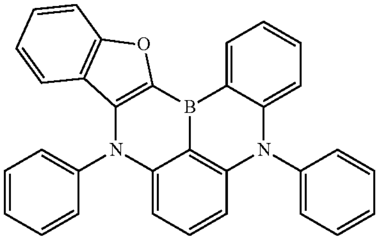

DF11

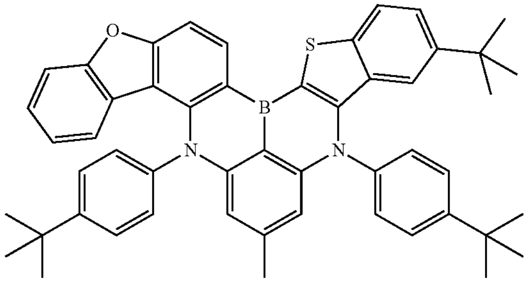

DF12

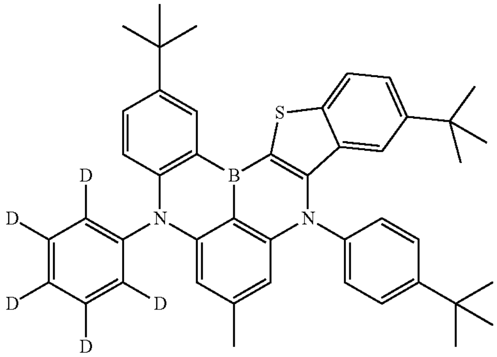

DF13

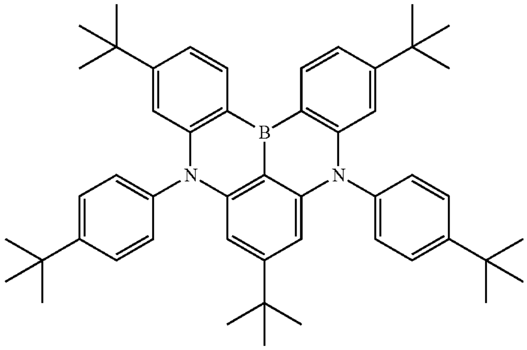

-continued

DF14

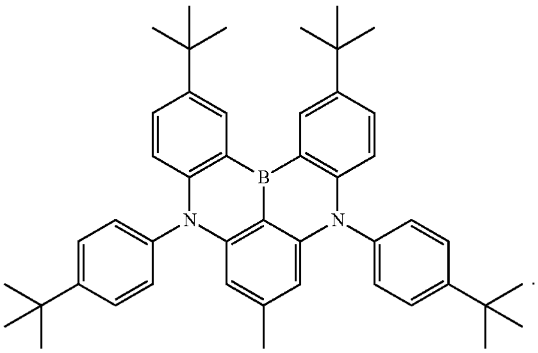

Electron Transport Region in Interlayer 130

The electron transport region may have i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole-blocking layer/electron transport layer/electron injection layer structure, an electron control layer/electron transport layer/electron injection layer structure, or a buffer layer/electron transport layer/electron injection layer structure, the constituting layers of each structure being sequentially stacked from an emission layer.

The electron transport region (for example, the buffer layer, the hole blocking layer, the electron control layer, and/or the electron transport layer in the electron transport region) may include a metal-free compound including at least one π electron-deficient nitrogen-containing $C_1$-$C_{60}$ cyclic group.

For example, the electron transport region may include a compound represented by Formula 601:

$$[Ar_{601}]_{xe11}\text{-}[(L_{601})_{xe1}\text{-}R_{601}]_{xe21},$$ Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ are each the same as described in connection with $Q_1$, xe21 may be 1, 2, 3, 4, or 5, and at least one of $Ar_{601}$, $L_{601}$, and $R_{601}$ may each independently be air electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked to each other via a single bond.

In one or more embodiments, $Ar_{601}$ in Formula 601 may be a substituted or unsubstituted anthracene group.

In one or more embodiments, the electron transport region may include a compound represented by Formula 601-1:

Formula 601-1

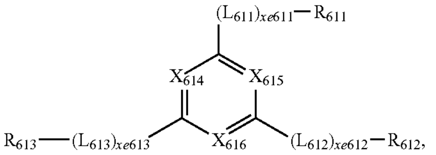

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ are each the same as described in connection with $L_{601}$, xe611 to xe613 are each the same as described in connection with xe1, $R_{611}$ to $R_{613}$ are each the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one or more of Compounds ET1 to ET46, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

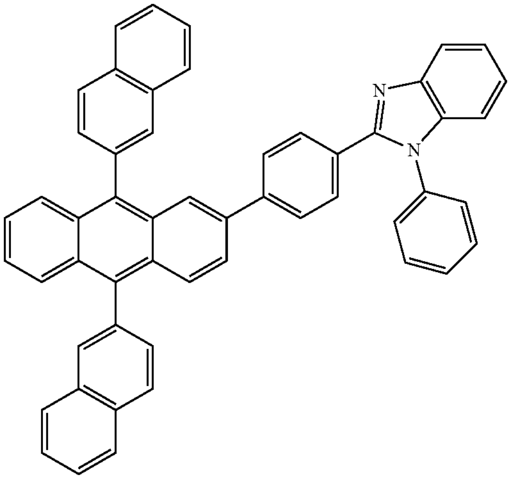

-continued

ET2

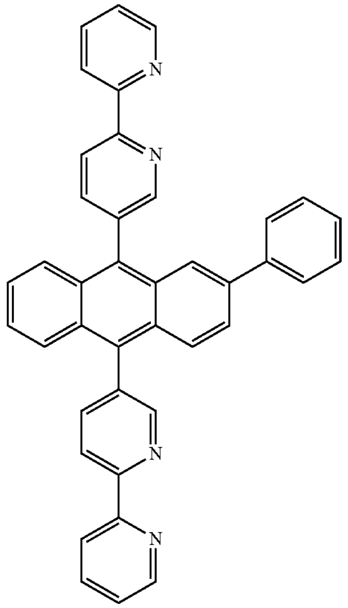

ET3

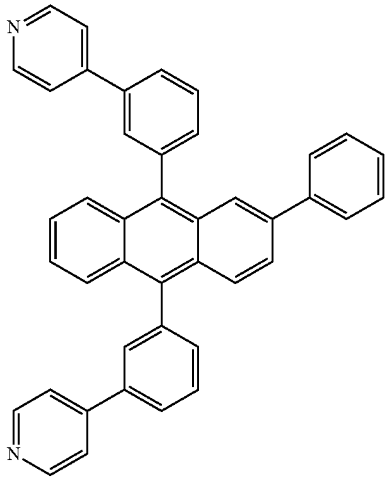

ET4

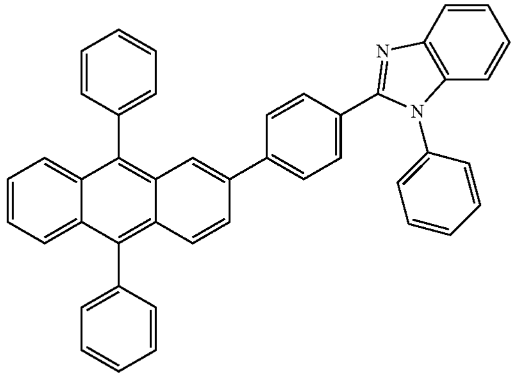

-continued
ET5
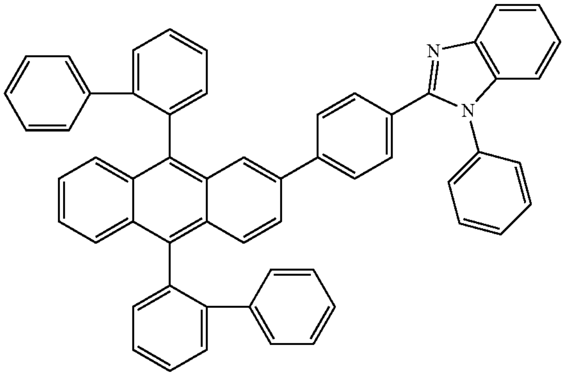
ET6
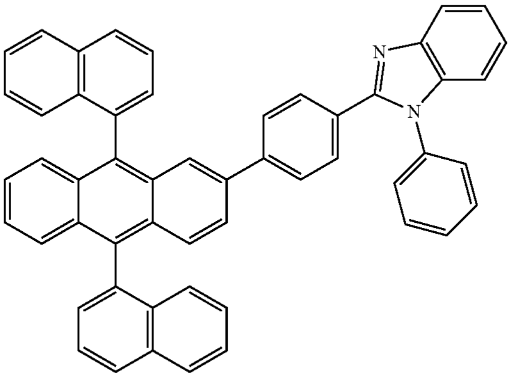
ET7
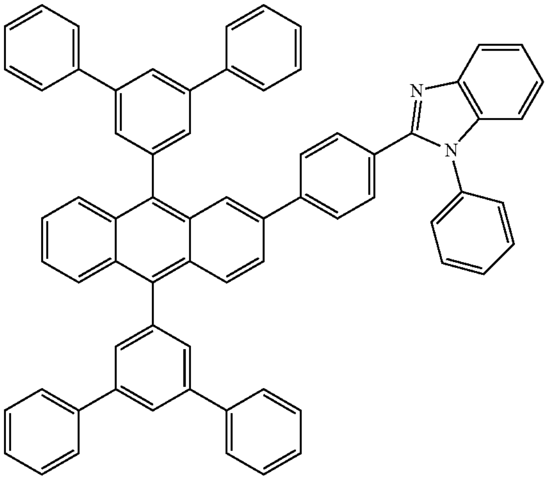
-continued
ET8
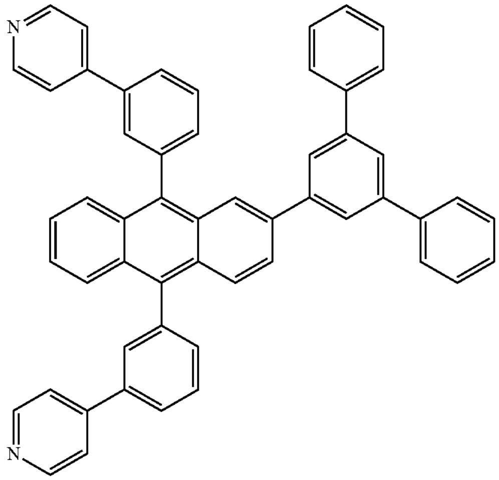
ET9
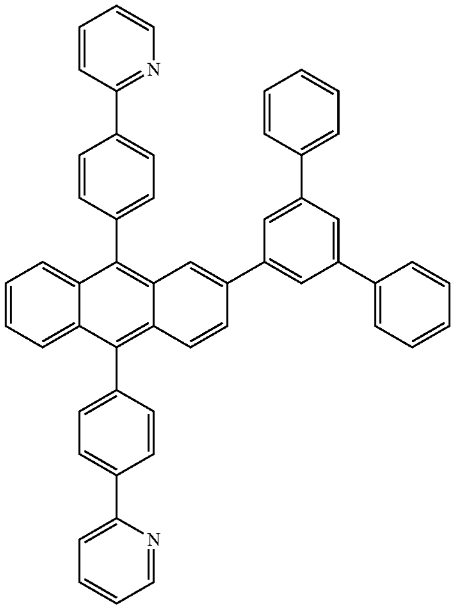

-continued
ET10
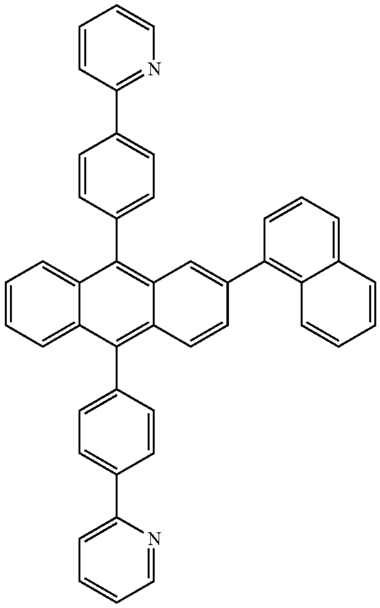
ET11
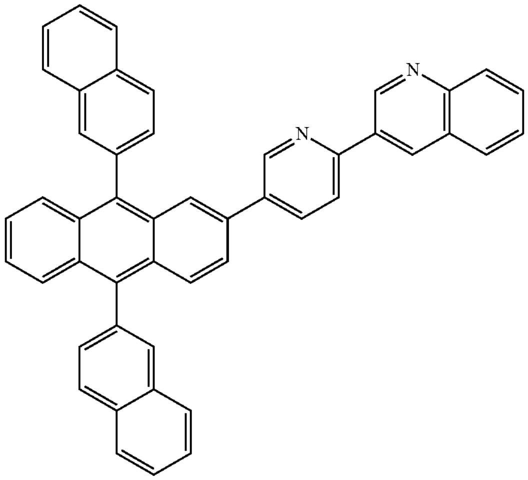
ET12
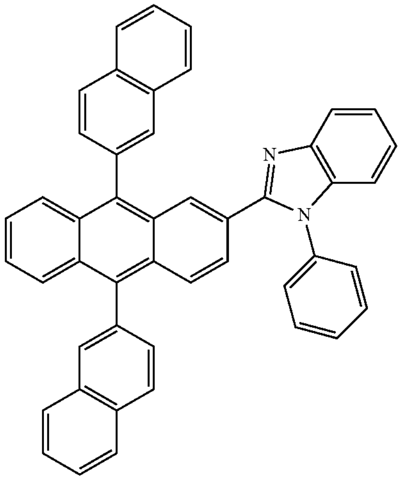
-continued
ET13
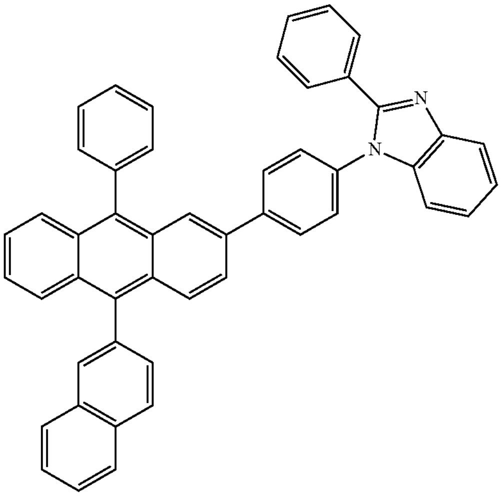
ET14
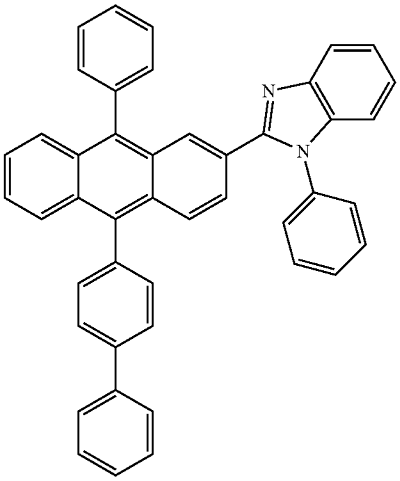
ET15
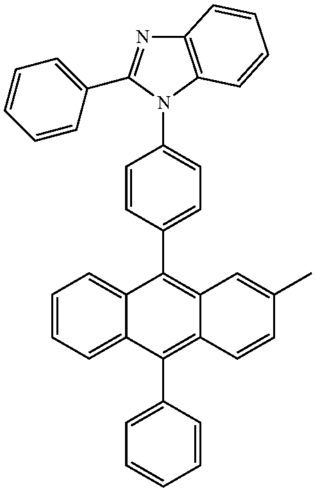

-continued
ET16
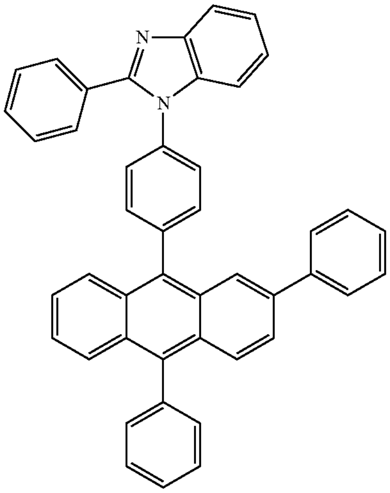
ET17
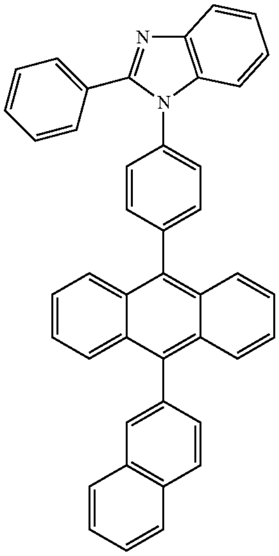
ET18
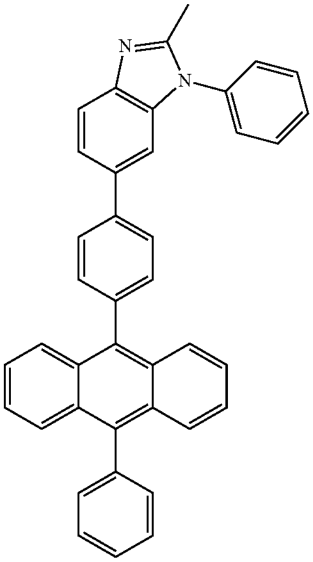
-continued
ET19
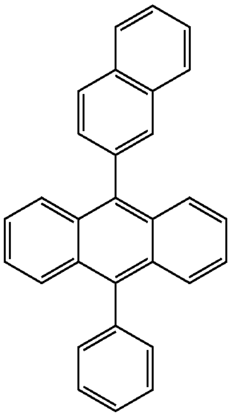
ET20
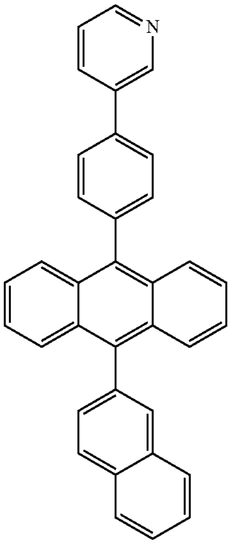
ET21
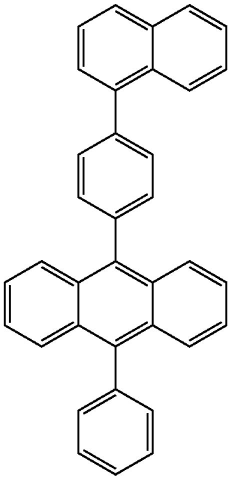

-continued
ET22
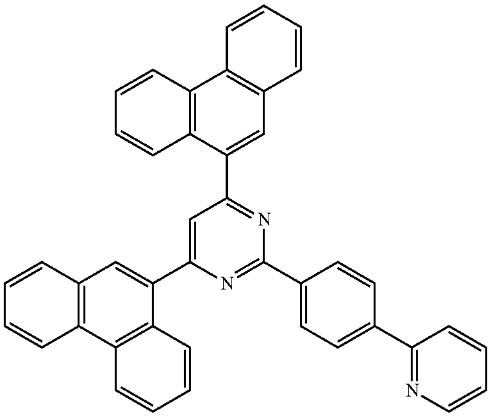
ET23
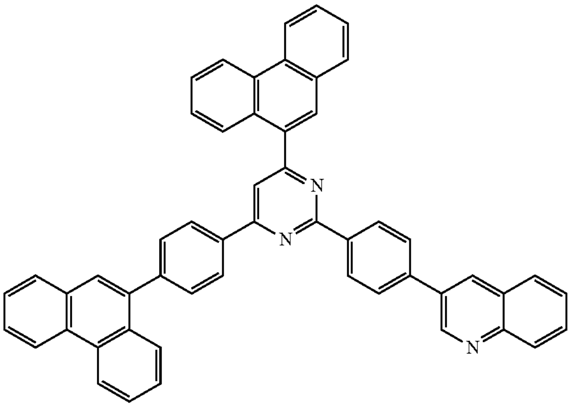
ET24
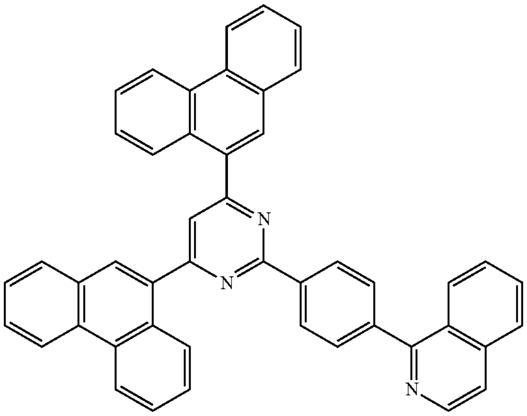
-continued
ET25
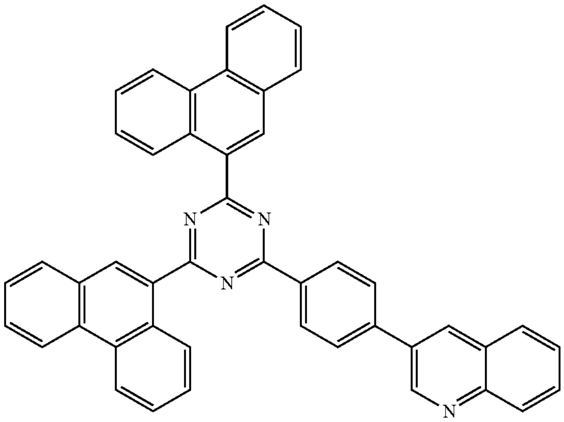
ET26
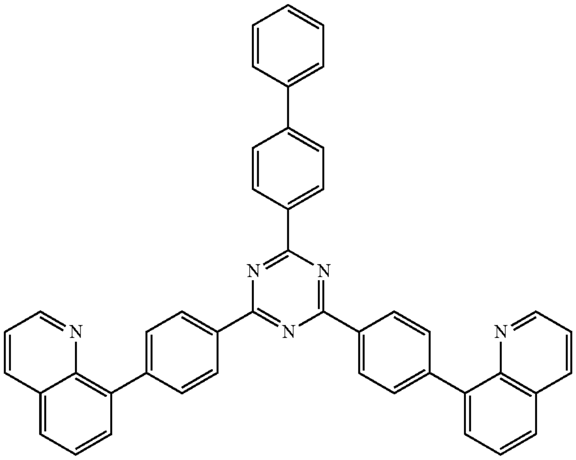
ET27
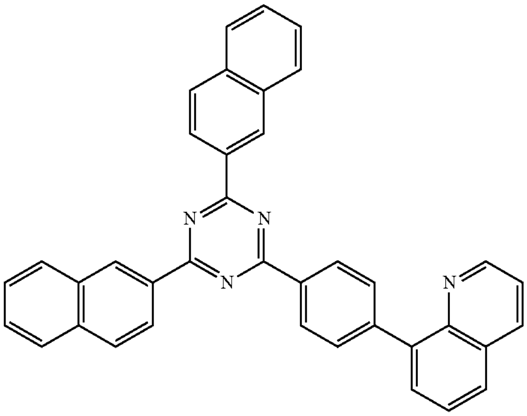

-continued
ET28
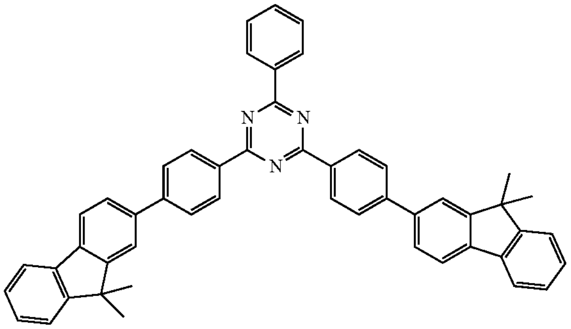
ET29
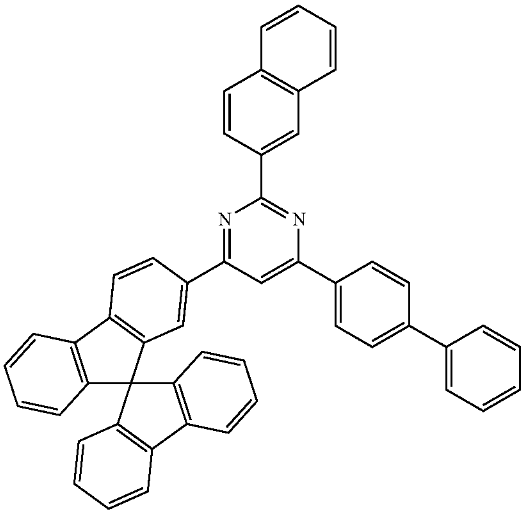
ET30
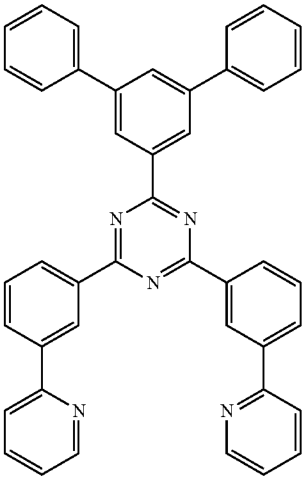
-continued
ET31
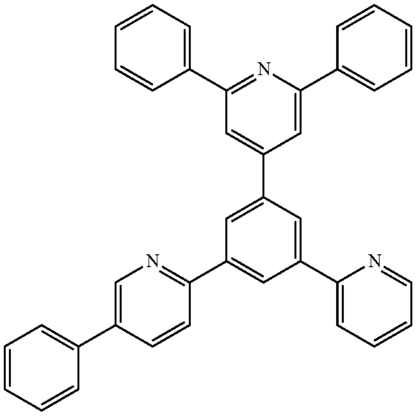
ET32
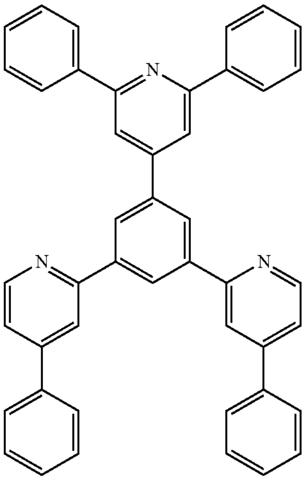
ET33
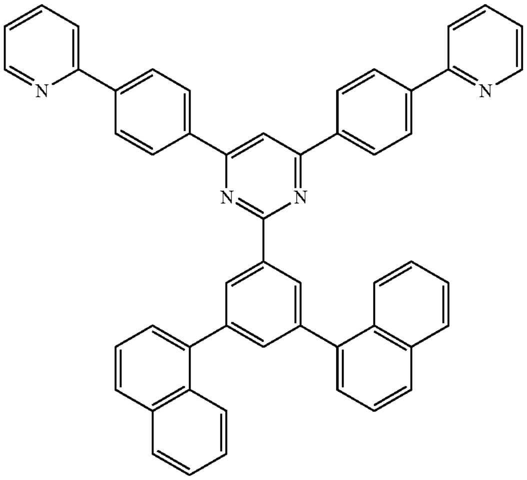

-continued
ET34
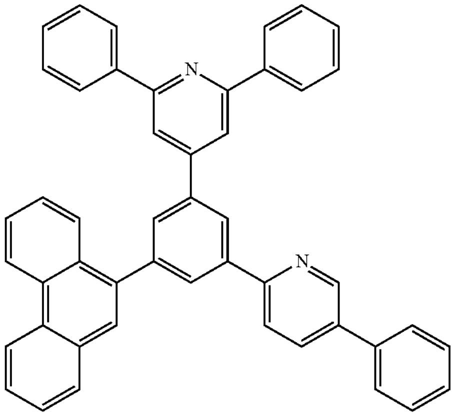
ET35
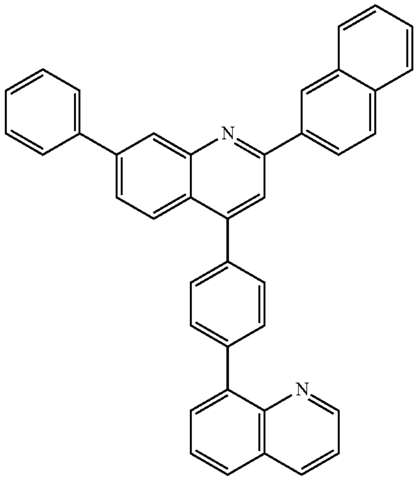
ET36
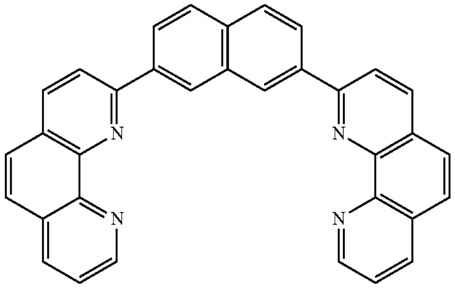
ET37
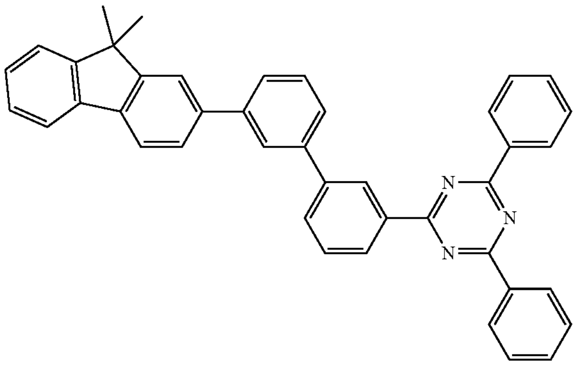
-continued
ET38
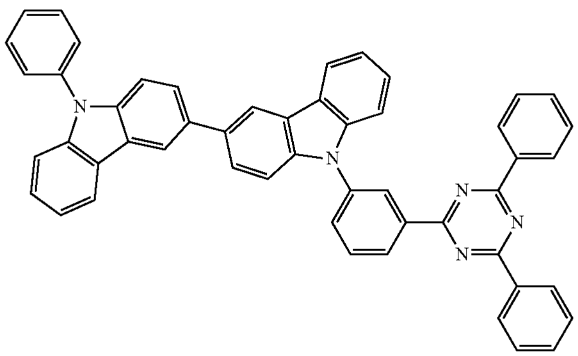
ET39
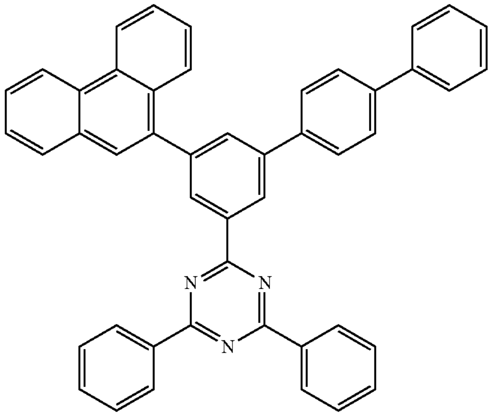
ET40
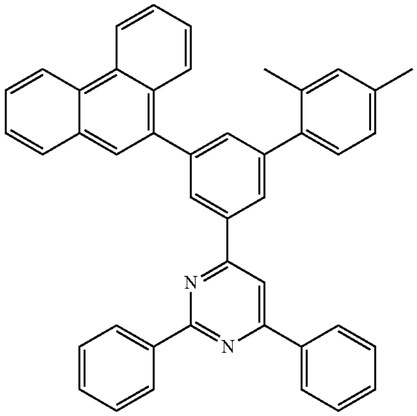

ET41
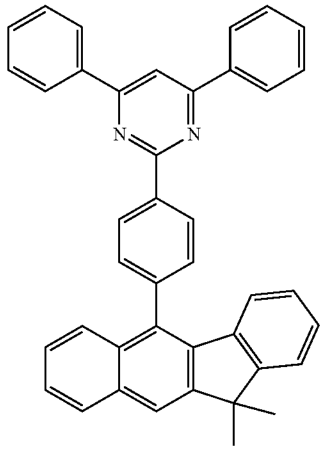
ET42
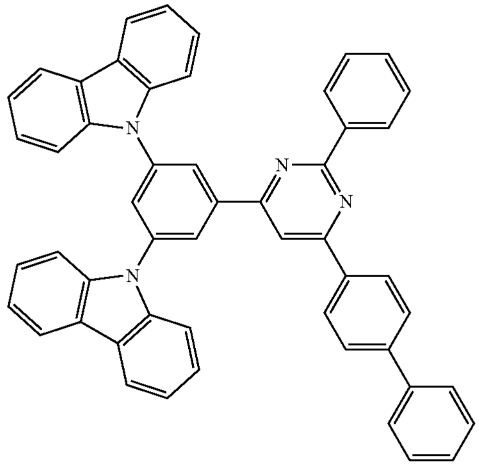
ET43
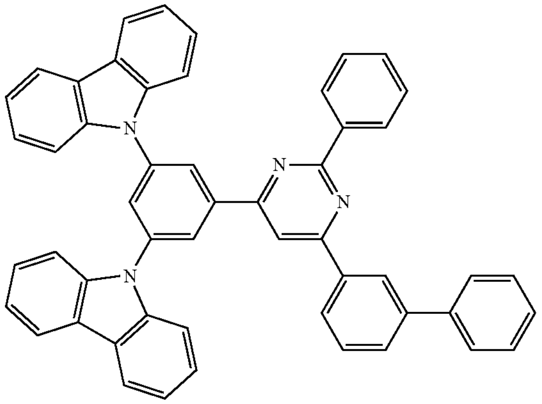
ET44
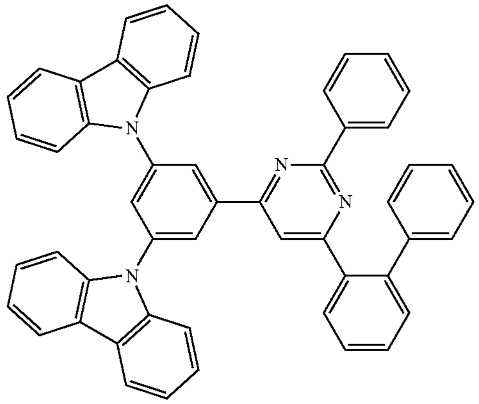
ET45
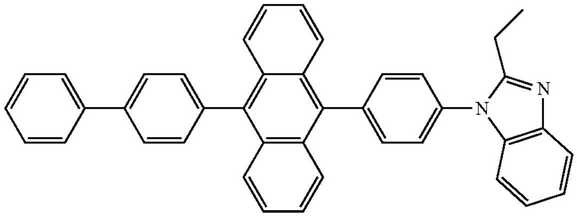
ET46
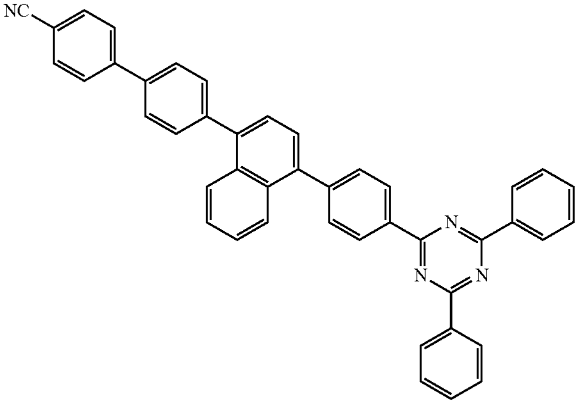
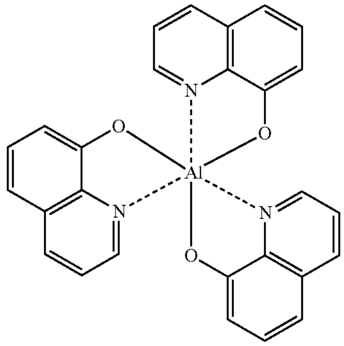
Alq3

-continued

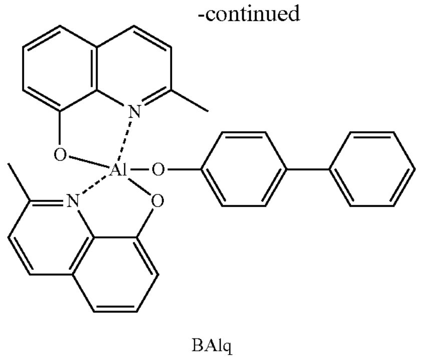

BAlq

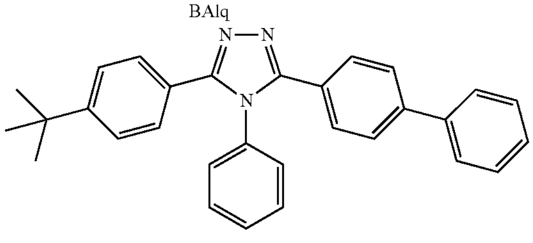

TAZ

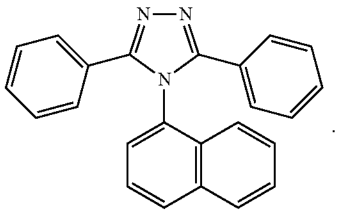

NTAZ

A thickness of the electron transport region may in a range of about 100 Å to about 5,000 Å, for example, about 160 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, for example, about 30 Å to about 300 Å, and a thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport layer are within any of their respective ranges, satisfactory (or suitable) electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, for example, Compound ET-D1 (LiQ) and/or Compound ET-D2:

ET-D1

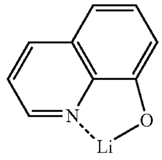

ET-D2

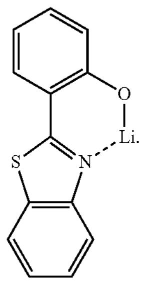

The electron transport region may include an electron injection layer that facilitates the injection of electrons from the second electrode 150. The electron injection layer may be in direct contact with the second electrode 150.

The electron injection layer may have i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may each independently be oxides, halides (for example, fluorides, chlorides, bromides, iodides, etc.), or tellurides of the alkali metal, the alkaline earth metal, and the rare earth metal, respectively, or any combination thereof.

The alkali metal-containing compound may include alkali metal oxide, such as $Li_2O$, $Cs_2O$, and/or $K_2O$; alkali metal halide, such as LiF, NaF, CsF, KF, LiI, NaI, CsI, KI, and/or RbI; or any combination thereof. The alkaline earth metal-containing compound may include an alkaline earth metal compound, such as BaO, SrO, CaO, $Ba_xSr_{1-x}O$ (wherein x is a real number satisfying the condition of $0<x<1$), and/or $Ba_xCa_{1-x}O$ (wherein x is a real number satisfying the condition of $0<x<1$). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of metal ions of the alkali metal, the alkaline earth metal, and the rare earth metal, respectively, and ii) as a ligand linked to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, the compound represented by Formula 601).

In one or more embodiments, the electron injection layer may include (e.g., consist of) i) an alkali metal-containing compound (for example, an alkali metal halide), or ii) a) an alkali metal-containing compound (for example, alkali metal halide); and b) an alkali metal, an alkaline earth metal, a rare earth metal, or any combination thereof. For example, the electron injection layer may be a KI:Yb co-deposited layer, a RbI:Yb co-deposited layer, a LiF:Yb co-deposited layer, or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be substantially uniformly or substantially non-uniformly dispersed in a matrix including the organic material.

A thickness of the electron injection layer may be in a range of about 1 Å to about 100 Å, for example, about 3 Å to about 90 Å. When the thickness of the electron injection layer is within any of these ranges, satisfactory (or suitable) electron injection characteristics may be obtained without a substantial increase in driving voltage.

Second Electrode 150

The second electrode 150 is arranged on the interlayer 130. The second electrode 150 may be a cathode, which is an electron injection electrode, and a material for forming the second electrode 150 may include a metal, an alloy, an electrically conductive compound, or any combination thereof, each having a low-work function.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including a plurality of layers.

Second Capping Layer 170

The second capping layer 170 includes the amine-containing compound as described in the present specification. The amine-containing compound is the same as described in the present specification.

Electronic Apparatus

The light-emitting device may be included in one or more suitable electronic apparatuses. For example, the electronic apparatus including the light-emitting device may be a light-emitting apparatus, an authentication apparatus, and/or the like.

The electronic apparatus (for example, a light-emitting apparatus) may further include, in addition to the light-emitting device, i) a color filter, ii) a color conversion layer, or iii) a color filter and a color conversion layer. The color filter and/or the color conversion layer may be arranged in at least one direction in which light emitted from the light-emitting device travels. For example, the light emitted from the light-emitting device may be blue light, green light, or white light. The light-emitting device is the same as described above. In one or more embodiments, the color conversion layer may include a quantum dot.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel defining film may be arranged among the subpixel areas to define each of the subpixel areas.

The color filter may further include a plurality of color filter areas and light-shielding patterns arranged among the color filter areas, and the color conversion layer may further include a plurality of color conversion areas and light-shielding patterns arranged among the color conversion areas.

The color filter areas (or the color conversion areas) may include a first area configured to emit first-color light, a second area configured to emit second-color light, and/or a third area configured to emit third-color light, and the first-color light, the second-color light, and/or the third-color light may have different maximum emission wavelengths. For example, the first-color light may be red light, the second-color light may be green light, and the third-color light may be blue light. For example, the color filter areas (or the color conversion areas) may include quantum dots. In some embodiments, the first area may include a red quantum dot, the second area may include a green quantum dot, and the third area may not include a quantum dot. Examples of the quantum dot should be those suitable in the art. The first area, the second area, and/or the third area may each independently further include a scatterer.

For example, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths. For example, the first light may be blue light, the first first-color light may be red light, the second first-color light may be green light, and the third first-color light may be blue light.

The electronic apparatus may further include a thin-film transistor, in addition to the light-emitting device as described above. The thin-film transistor may include a source electrode, a drain electrode, and an activation layer, and any one of the source electrode or the drain electrode may be electrically connected to any one of the first electrode or the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, and/or the like.

The electronic apparatus may further include a sealing portion for sealing the light-emitting device. The sealing portion may be arranged between the color filter and/or the color conversion layer and the light-emitting device. The sealing portion allows light from the light-emitting device to be extracted to the outside, and simultaneously (or concurrently) may prevent or reduce ambient air and/or moisture from penetrating into the light-emitting device. The sealing portion may be a sealing substrate including a transparent glass substrate and/or a plastic substrate. The sealing portion may be a thin-film encapsulation layer including at least one of an organic layer and/or an inorganic layer. When the sealing portion is a thin-film encapsulating layer, the electronic apparatus may be flexible.

One or more suitable functional layers may be additionally arranged on the sealing portion, in addition to the color filter and/or the color conversion layer, according to the use of the electronic apparatus. Examples of the functional layer may include a touch screen layer, a polarizing layer, and the like. The touch screen layer may be a pressure-sensitive touch screen layer, a capacitive touch screen layer, and/or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device as described above, a biometric information collector.

The electronic apparatus may be applied to one or more suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various measuring instruments, meters (for example, meters for a vehicle, an aircraft, and/or a vessel), projectors, and/or the like.

Figure 2:
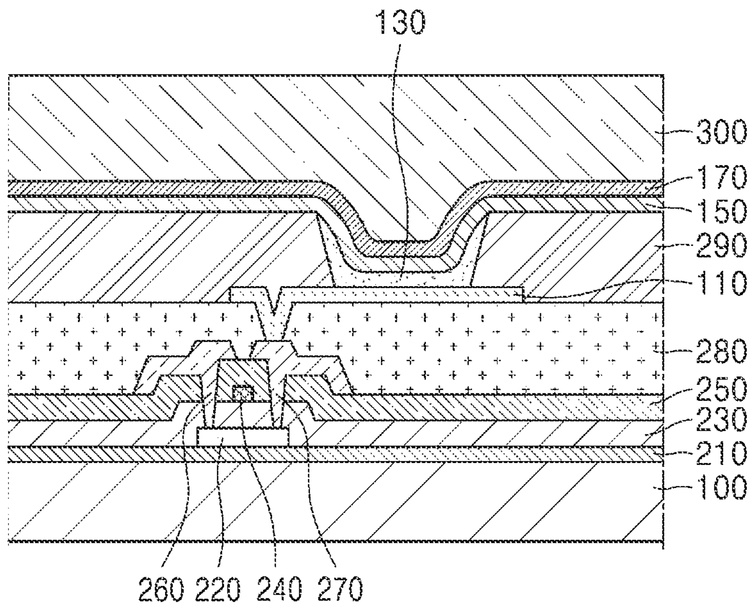
FIGS. 2 and 3 are each a schematic view of a light-emitting apparatus, which is one of electronic apparatuses according to one or more embodiments.
Figure 3:
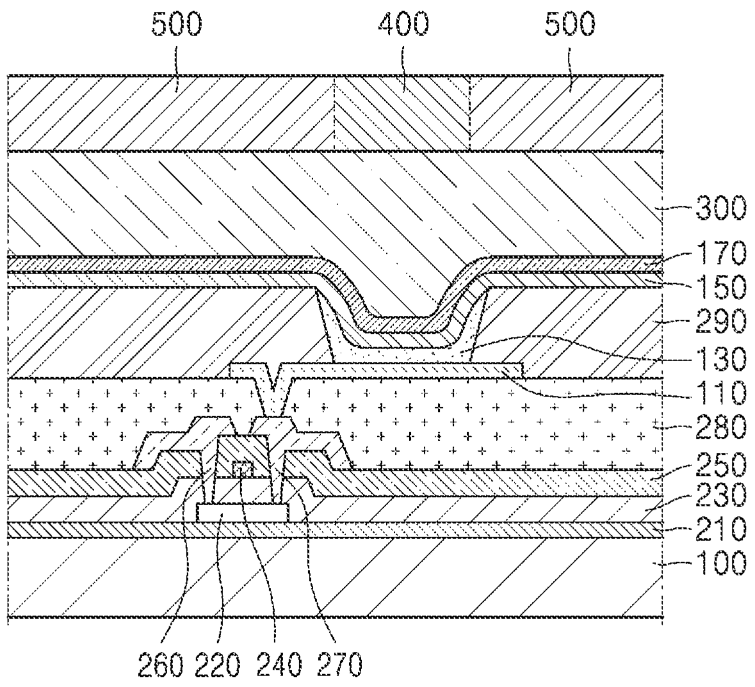

Description of FIGS. 2 and 3

FIG. 2 is a cross-sectional view of a light-emitting apparatus, which is one of electronic apparatuses according to one or more embodiments.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be arranged on the substrate 100. The buffer layer 210 may prevent or reduce penetration of impurities through the substrate 100, and may provide a substantially flat surface on the substrate 100.

The TFT may be arranged on the buffer layer 210. The TFT may include an activation layer 220, a gate electrode 240, a source electrode 260, and a drain electrode 270.

The activation layer 220 may include an inorganic semiconductor, such as silicon and/or polysilicon, an organic semiconductor, or an oxide semiconductor, and may include a source region, a drain region, and a channel region.

A gate insulating film 230 for insulating the activation layer 220 from the gate electrode 240 may be arranged on the activation layer 220, and the gate electrode 240 may be arranged on the gate insulating film 230.

An interlayer insulating film 250 may be arranged on the gate electrode 240. The interlayer insulating film 250 may be arranged between the gate electrode 240 and the source electrode 260, and between the gate electrode 240 and the drain electrode 270, to provide insulation therebetween.

The source electrode 260 and the drain electrode 270 may be arranged on the interlayer insulating film 250. The interlayer insulating film 250 and the gate insulating film 230 may be formed to expose the source region and the drain region of the activation layer 220, and the source electrode 260 and the drain electrode 270 may be arranged in contact with the exposed portions of the source region and the drain region of the activation layer 220.

The TFT may be electrically connected to a light-emitting device to drive the light-emitting device, and may be covered by a passivation layer 280. The passivation layer 280 may include an inorganic insulating film, an organic insulating film, or a combination thereof. A light-emitting device is provided on the passivation layer 280. The light-emitting device includes a first electrode 110, an interlayer 130, and a second electrode 150.

The first electrode 110 may be arranged on the passivation layer 280. The passivation layer 280 may be arranged to expose a portion of the drain electrode 270, not fully covering the drain electrode 270, and the first electrode 110 may be arranged to be connected to the exposed portion of the drain electrode 270.

A pixel defining layer 290 including an insulating material may be arranged on the first electrode 110. The pixel defining layer 290 may expose a portion of the first electrode 110, and the interlayer 130 may be formed in (e.g., on) the exposed portion of the first electrode 110. The pixel defining layer 290 may be a polyimide and/or polyacrylic organic film. In some embodiments, at least some layers of the interlayer 130 may extend beyond the upper portion of the pixel defining layer 290 to be arranged in the form of a common layer.

The second electrode 150 may be arranged on the interlayer 130, and a second capping layer 170 may be additionally formed on the second electrode 150. The second capping layer 170 may be formed to cover the second electrode 150.

The encapsulation portion 300 may be arranged on the second capping layer 170. The encapsulation portion 300 may be arranged on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, etc.), an epoxy-based resin (for example, aliphatic glycidyl ether (AGE), etc.), or any combination thereof; or a combination of the inorganic film and the organic film.

FIG. 3 is a cross-sectional view of a light-emitting apparatus, which is one of electronic apparatuses according to one or more other embodiments.

The light-emitting apparatus of FIG. 3 is the same as the light-emitting apparatus of FIG. 2, except that a light-shielding pattern 500 and a functional region 400 are additionally arranged on the encapsulation portion 300. The functional region 400 may be i) a color filter area, ii) a color conversion area, or iii) a combination of the color filter area and the color conversion area. In one or more embodiments, the light-emitting device included in the light-emitting apparatus of FIG. 3 may be a tandem light-emitting device.

Figure 4:
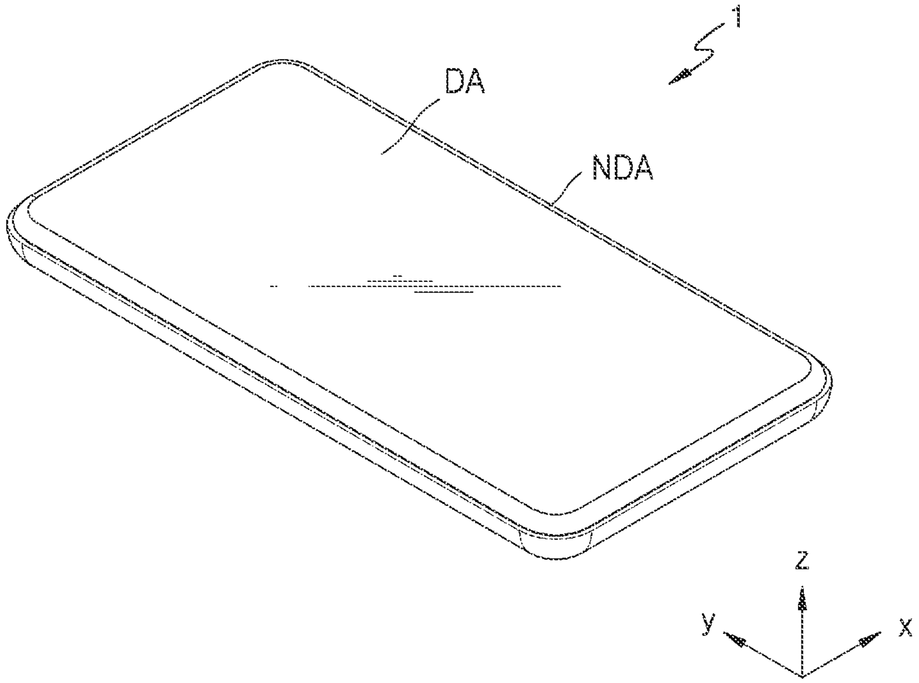
FIGS. 4, 5, 6A, 6B, and 6C are each a schematic view of an electronic device according to one or more embodiments.

Description of FIG. 4

FIG. 4 is a schematic perspective view of an electronic device 1 including the light-emitting device according to one or more embodiments. The electronic device 1 is an apparatus that displays (or is configured to display) a moving image and/or a still image, and may include a portable electronic device, such as a mobile phone, a smart phone, a tablet personal computer (PC), a mobile communication terminal, an electronic notebook, an electronic book, a portable multimedia player (PMP), a navigation device, and/or an ultra mobile PC (UMPC), as well as various suitable products, such as a television, a laptop, a monitor, a billboard, and/or an internet of things (IOT) device, or a part thereof. In some embodiments, the electronic device 1 may be a wearable device, such as a smart watch, a watch phone, a glasses-type display, and/or a head mounted display (HMD), or a part thereof. However, embodiments of the disclosure are not limited thereto. For example, the electronic device 1 may be an instrument panel of a vehicle, a center information display (CID) arranged on a center fascia and/or a dashboard of a vehicle, a room mirror display that replaces a side mirror of a vehicle, an entertainment display for a rear seat of a vehicle and/or a display arranged on a rear surface of a front seat, a head up display (HUD) installed at a front of a vehicle and/or projected on a front window glass, and/or a computer generated hologram augmented reality head up display (CGH AR HUD). For convenience of explanation, FIG. 4 shows a case in which the electronic device 1 is a smart phone.

The electronic device 1 may include a display area DA and a non-display area NDA outside the display area DA. The electronic device 1 may implement an image through an array of a plurality of pixels that are two-dimensionally arranged in the display area DA.

The non-display area NDA is an area in which an image is not displayed, and may entirely surround the display area DA. A driver for providing electrical signals and/or power to display devices arranged in the display area DA may be arranged in the non-display area NDA. A pad, which is an area to which an electronic element and/or a printed circuit board may be electrically connected, may be arranged in the non-display area NDA.

The electronic device 1 may have different lengths in the x-axis direction and in the y-axis direction. For example, as shown in FIG. 4, the length in the x-axis direction may be shorter than the length in the y-axis direction. In one or more embodiments, the length in the x-axis direction may be the same as the length in the y-axis direction. In one or more embodiments, the length in the x-axis direction may be longer than the length in the y-axis direction.

Descriptions of FIGS. 5 and 6A to 6C

Figure 5:
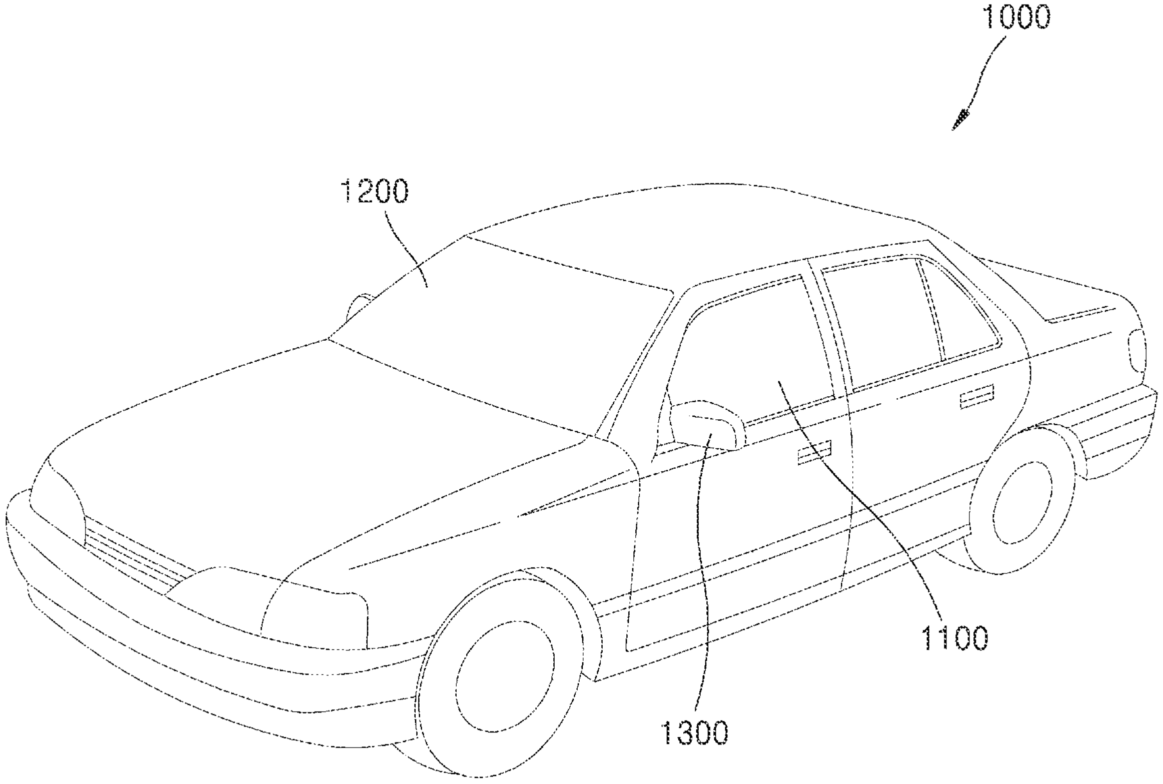
Figure 6A:
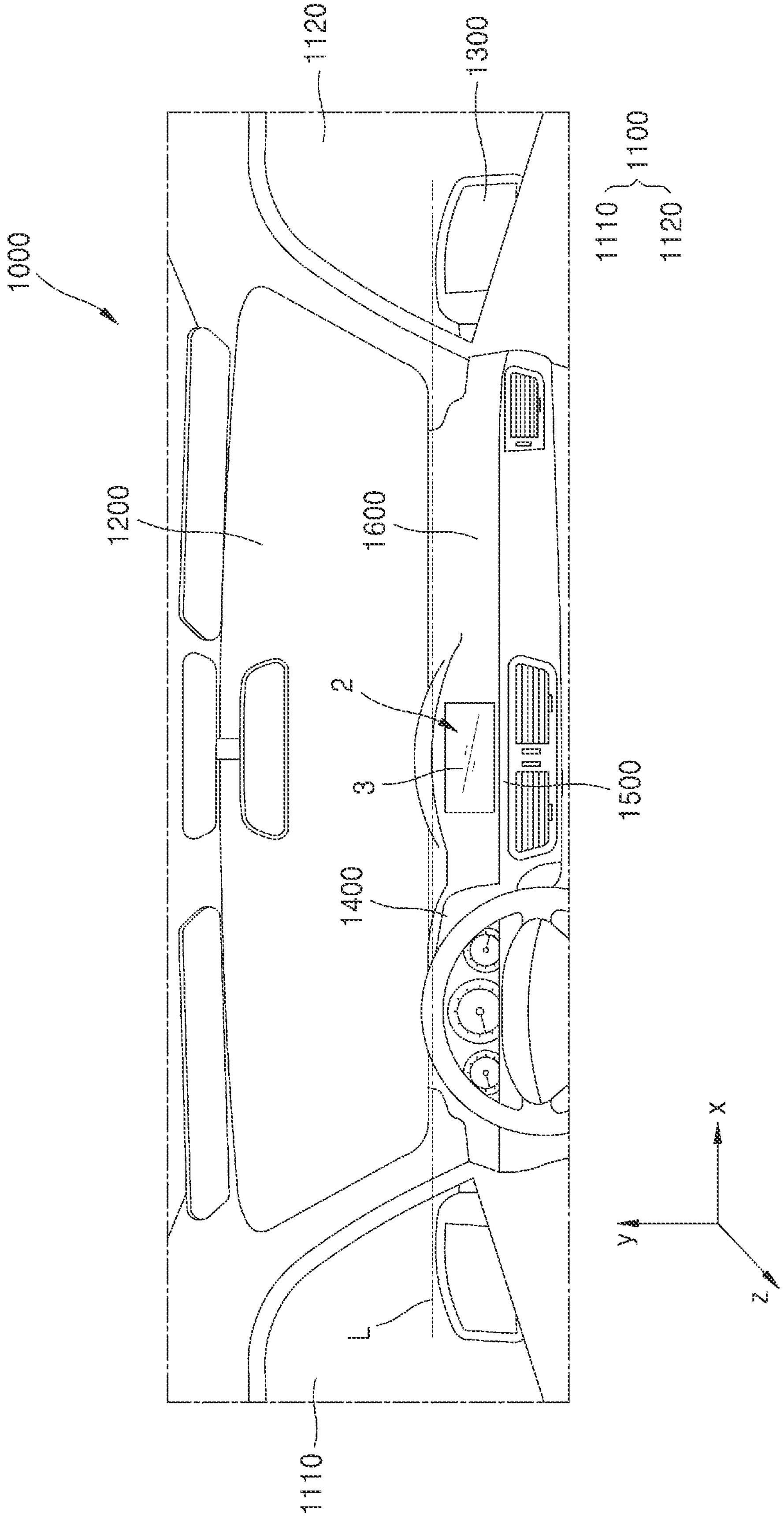
Figure 6B:
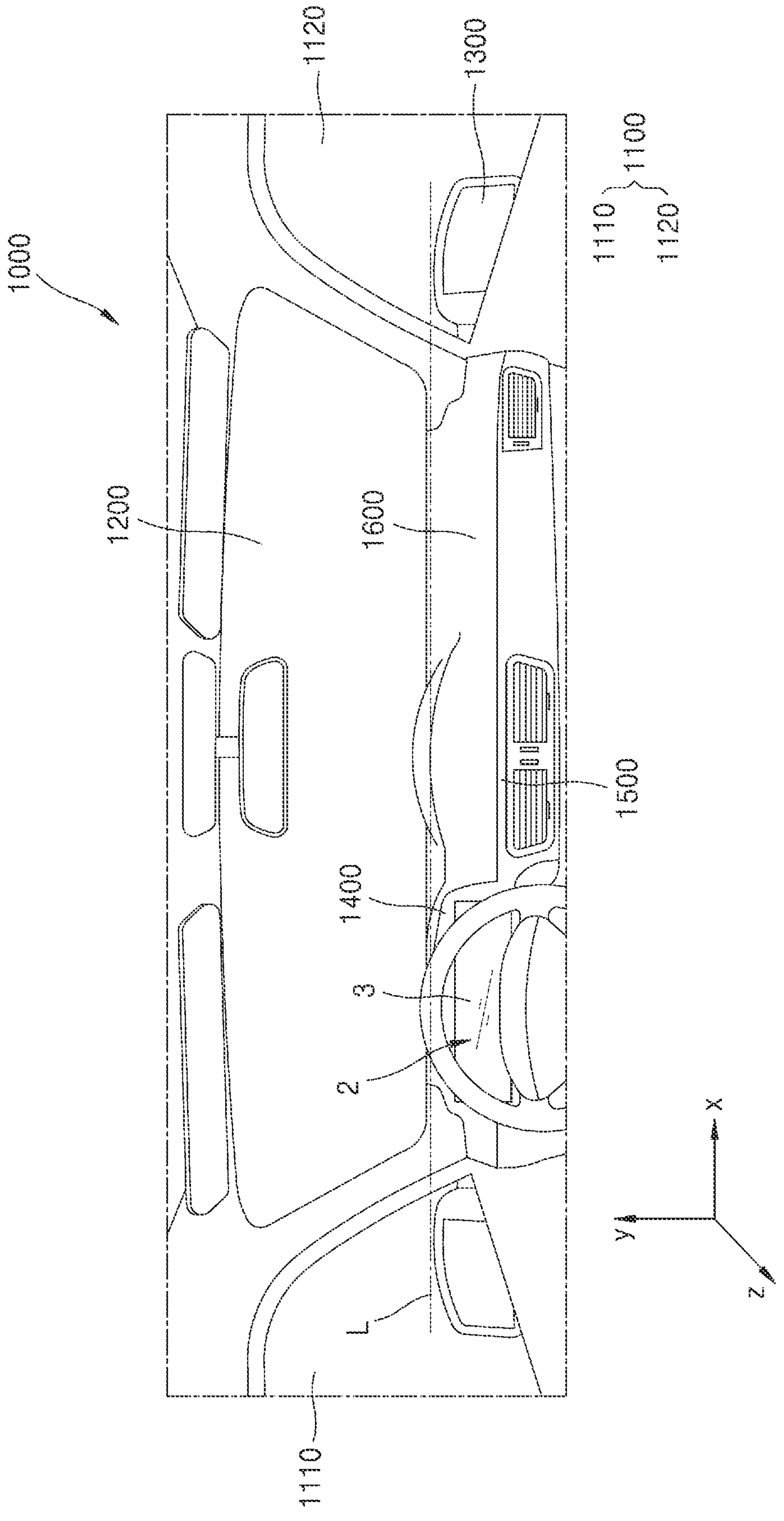
Figure 6C:
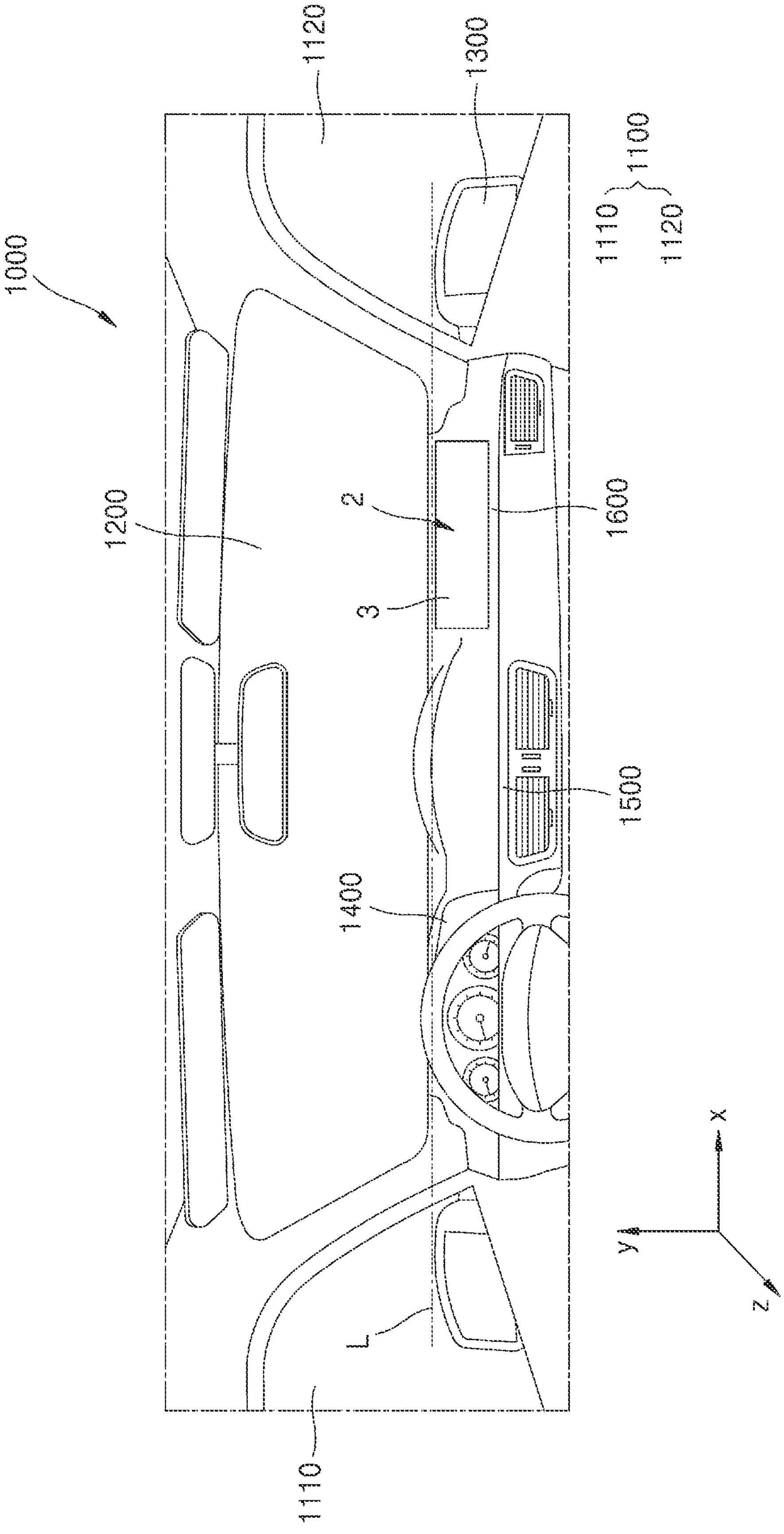

FIG. 5 is a schematic view of the exterior of a vehicle 1000 as an electronic device including the light-emitting device according to one or more embodiments. FIGS. 6A to 6C are each a schematic view of the interior of the vehicle 1000 according to one or more embodiments.

Referring to FIGS. 5 and 6A to 6C, the vehicle 1000 may refer to one or more suitable apparatuses for moving a subject to be transported, such as a human, an object, and/or an animal, from a departure point to a destination. The vehicle 1000 may include a vehicle traveling on a road or a track, a vessel moving over the sea or a river, and/or an airplane flying in the sky by using the action of air.

The vehicle 1000 may travel on a road or a track. The vehicle 1000 may move in a certain direction according to rotation of at least one wheel. For example, the vehicle 1000 may include a three-wheeled or four-wheeled vehicle, a construction machine, a two-wheeled vehicle, a motorbike, a bicycle, and/or a train running on a track.

The vehicle 1000 may include a body having an interior and an exterior, and a chassis in which mechanical apparatuses necessary for driving are installed as the remaining parts except for the body. The exterior of the body may include a front panel, a bonnet, a roof panel, a rear panel, a trunk, and a pillar provided at a boundary between doors. The chassis of the vehicle 1000 may include a power generating apparatus, a power transmitting apparatus, a driving apparatus, a steering apparatus, a braking apparatus, a suspension apparatus, a transmission apparatus, a fuel apparatus, front and rear wheels, left and right wheels, and/or the like.

The vehicle 1000 may include a side window glass 1100, a front window glass 1200, a side mirror 1300, a cluster 1400, a center fascia 1500, a passenger seat dashboard 1600, and a display apparatus 2.

The side window glass 1100 and the front window glass 1200 may be partitioned by a pillar arranged between the side window glass 1100 and the front window glass 1200.

The side window glass 1100 may be installed on a side surface of the vehicle 1000. In one or more embodiments, the side window glass 1100 may be installed on a door of the vehicle 1000. A plurality of side window glasses 1100 may be provided and may face each other. In one or more embodiments, the side window glass 1100 may include a first side window glass 1110 and a second side window glass 1120. In one or more embodiments, the first side window glass 1110 may be arranged adjacent to the cluster 1400. The second side window glass 1120 may be arranged adjacent to the passenger seat dashboard 1600.

In one or more embodiments, the side window glasses 1100 may be apart from each other in the x direction or the −x direction. For example, the first side window glass 1110 and the second side window glass 1120 may be apart from each other in the x direction or the −x direction. For example, an imaginary straight line L connecting the side window glasses 1100 to each other may extend in the x direction or the −x direction. For example, the imaginary straight line L connecting the first side window glass 1110 to the second side window glass 1120 may extend in the x direction or the −x direction.

The front window glass 1200 may be installed at the front of the vehicle 1000. The front window glass 1200 may be arranged between the side window glasses 1100 facing each other.

The side mirror 1300 may provide a rear view of the vehicle 1000. The side mirror 1300 may be installed on the exterior of the body. In one or more embodiments, a plurality of side mirrors 1300 may be provided. One of the plurality of side mirrors 1300 may be arranged outside the first side window glass 1110. Another one of the plurality of side mirrors 1300 may be arranged outside the second side window glass 1120.

The cluster 1400 may be arranged at the front of the steering wheel. The cluster 1400 may include a tachometer, a speedometer, a coolant thermometer, a fuel gauge, a direction change indicator light, a high beam indicator light, a warning light, a seat belt warning light, an odometer, a hodometer, an automatic transmission selection lever indicator light, a door open warning light, an engine oil warning light, and/or a low fuel warning light.

The center fascia 1500 may include a control panel on which a plurality of buttons for adjusting an audio apparatus, an air conditioning apparatus, and/or a heater of a seat are arranged. The center fascia 1500 may be arranged on one side of the cluster 1400.

The passenger seat dashboard 1600 may be apart from the cluster 1400 with the center fascia 1500 therebetween. In one or more embodiments, the cluster 1400 may be arranged to correspond to a driver seat, and the passenger seat dashboard 1600 may be arranged to correspond to a passenger seat. In one or more embodiments, the cluster 1400 may be adjacent to the first side window glass 1110, and the passenger seat dashboard 1600 may be adjacent to the second side window glass 1120.

In one or more embodiments, the display apparatus 2 may include a display panel 3, and the display panel 3 may display an image. The display apparatus 2 may be arranged inside the vehicle 1000. In one or more embodiments, the display apparatus 2 may be arranged between the side window glasses 1100 facing each other. The display apparatus 2 may be arranged on at least one of the cluster 1400, the center fascia 1500, and/or the passenger seat dashboard 1600.

The display apparatus 2 may include an organic light-emitting display apparatus, an inorganic EL display apparatus (or an inorganic light-emitting display apparatus), a quantum dot display apparatus, and/or the like. Hereinafter, an organic light-emitting display apparatus including the light-emitting device according to the disclosure will be described as an example of the display apparatus 2 according to one or more embodiments. However, one or more suitable types (or kinds) of display apparatuses as described above may be used in embodiments of the disclosure.

Referring to FIG. 6A, the display apparatus 2 may be arranged on the center fascia 1500. In one or more embodiments, the display apparatus 2 may display navigation information. In one or more embodiments, the display apparatus 2 may display audio, video, and/or information regarding vehicle settings.

Referring to FIG. 6B, the display apparatus 2 may be arranged on the cluster 1400. In this case, the cluster 1400 may display driving information and/or the like through the display apparatus 2. For example, the cluster 1400 may be digitally implemented. The digital cluster 1400 may display vehicle information and driving information as images. For example, a needle and a gauge of a tachometer and/or various warning light icons may be displayed by digital signals.

Referring to FIG. 6C, the display apparatus 2 may be arranged on the passenger seat dashboard 1600. The display apparatus 2 may be embedded in the passenger seat dashboard 1600 or arranged on the passenger seat dashboard 1600. In one or more embodiments, the display apparatus 2 arranged on the passenger seat dashboard 1600 may display an image related to information displayed on the cluster 1400 and/or information displayed on the center fascia 1500. In one or more embodiments, the display apparatus 2 arranged on the passenger seat dashboard 1600 may display information different from information displayed on the cluster 1400 and/or information displayed on the center fascia 1500.

Manufacturing Method

Respective layers included in the hole transport region, the emission layer, and respective layers included in the electron transport region may be formed in a certain region by using one or more suitable methods such as vacuum deposition, spin coating, casting, Langmuir-Blodgett (LB) deposition, ink-jet printing, laser-printing, laser-induced thermal imaging, and/or the like.

When respective layers included in the hole transport region, the emission layer, and respective layers included in the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "$C_3$-$C_{60}$ carbocyclic group" as used herein refers to a cyclic group consisting of carbon atoms only as ring-forming atoms and having 3 to 60 carbon atoms, and the term "$C_1$-$C_{60}$ heterocyclic group" as used herein refers to a cyclic group that has 1 to 60 carbon atoms and further has, in addition to carbon, at least one heteroatom as a ring-forming atom. Each of the $C_3$-$C_{60}$ carbocyclic group and the $C_1$-$C_{60}$ heterocyclic group may be a monocyclic group consisting of one ring or a polycyclic group consisting of two or more rings that are condensed together. For example, the $C_1$-$C_{60}$ heterocyclic group may have 3 to 61 ring-forming atoms.

The term "cyclic group" as used herein may include both the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has 3 to 60 carbon atoms and does not include *—N═*' as a ring-forming moiety. The term "π electron-deficient nitrogen-containing $C_1$-$C_{60}$ cyclic group" as used herein refers to a heterocyclic group that has 1 to 60 carbon atoms and includes *—N═*' as a ring-forming moiety.

For example, the $C_3$-$C_{60}$ carbocyclic group may be i) a T1 group or ii) a condensed cyclic group in which at least two T1 groups are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a condensed cyclic group in which at least two T2 groups are condensed with each other, or iii) a condensed cyclic group in which at least one T2 group and at least one T1 group are condensed with each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the $\pi$ electron-rich $C_3$-$C_{60}$ cyclic group may be i) a T1 group, ii) a condensed cyclic group in which at least two T1 groups are condensed with each other, iii) a T3 group, iv) a condensed cyclic group in which at least two T3 groups are condensed with each other, or v) a condensed cyclic group in which at least one T3 group and at least one T1 group are condensed with each other (for example, the $\pi$ electron-rich $C_3$-$C_{60}$ cyclic group may be the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the $\pi$ electron-deficient nitrogen-containing $C_1$-$C_{60}$ cyclic group may be i) a T4 group, ii) a condensed cyclic group in which at least two T4 groups are condensed with each other, iii) a condensed cyclic group in which at least one T4 group and at least one T1 group are condensed with each other, iv) a condensed cyclic group in which at least one T4 group and at least one T3 group are condensed with each other, or v) a condensed cyclic group in which at least one T4 group, at least one T1 group, and at least one T3 group are condensed with one another (for example, the $\pi$ electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the $\pi$ electron-rich $C_3$-$C_{60}$ cyclic group, or the π electron-deficient nitrogen-containing $C_1$-$C_{60}$ cyclic group" as used herein may refer to a monovalent group, a polyvalent group (for example, a divalent group, a trivalent group, a tetravalent group, etc.), and/or a group condensed to any cyclic group, according to the structure of a formula for which the corresponding term is used. For example, the "benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has 1 to 60 carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle and/or at the terminus of the $C_2$-$C_{60}$ alkyl group, and examples thereof may include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at the terminus of the $C_2$-$C_{60}$ alkyl group, and examples thereof may include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by $—OA_{101}$ (wherein $A_{101}$ is the $C_1$-$C_{60}$ alkyl group), and examples thereof may include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group of 1 to 10 carbon atoms, further including, in addition to carbon atoms, at least one heteroatom, as ring-forming atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group may include a 4,5-dihydro-1,2,3,4-oxatriazolylgroup, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system of 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. The term "$C_6$-$C_{60}$ arylene group" as used herein refers to a divalent group having the same structure as the $C_6$-$C_{60}$ aryl group. When the $C_6$-$C_{60}$ aryl group and the $C_6$-$C_{60}$ arylene group each independently include two or more rings, the respective rings may be condensed with each other.

The term "$C_1$-$C_{60}$ heteroaryl group" as used herein refers to a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein refers to a divalent group having the same structure as the $C_1$-$C_{60}$ heteroaryl group. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be condensed with each other.

The term "monovalent non-aromatic condensed polycyclic group" as used herein refers to a monovalent group having two or more rings condensed to each other, only carbon atoms as ring-forming atoms (for example, having 8 to 60 carbon atoms), and no aromaticity in its entire molecular structure. Examples of the monovalent non-aromatic condensed polycyclic group may include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, further including, in addition to carbon atoms (for example, 1 to 60 carbon atoms), at least one heteroatom, as ring-forming atoms, and having non-aromaticity in its entire molecular structure. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group.

The term "$C_6$-$C_{60}$ aryloxy group" as used herein refers to a group represented by —$OA_{102}$ (wherein $A_{102}$ is the $C_6$-$C_{60}$ aryl group), and the term "$C_6$-$C_{60}$ arylthio group" as used herein refers to a group represented by —$SA_{103}$ (wherein $A_{103}$ is the $C_6$-$C_{60}$ aryl group).

The term "$C_7$-$C_{60}$ arylalkyl group" as used herein refers to a group represented by -$A_{104}A_{105}$ (wherein $A_{104}$ is a $C_1$-$C_{54}$ alkylene group, and $A_{105}$ is a $C_6$-$C_{59}$ aryl group), and the term "$C_2$-$C_{60}$ heteroarylalkyl group" as used herein refers to a group represented by -$A_{106}A_{107}$ (wherein $A_{106}$ is a $C_1$-$C_{59}$ alkylene group, and $A_{107}$ is a $C_1$-$C_{59}$ heteroaryl group).

The term "$R_{10a}$" as used herein refers to:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each independently unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each independently unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ as used herein may each independently be: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, each independently unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom include O, S, N, P, Si, B, Ge, Se, and any combination thereof.

The term "third-row transition metal" used herein includes hafnium (Hf), tantalum (Ta), tungsten (W), rhenium (Re), osmium (Os), iridium (Ir), platinum (Pt), gold (Au), and the like.

The term "Ph" as used herein refers to a phenyl group, the term "Me" as used herein refers to a methyl group, the term "Et" as used herein refers to an ethyl group, the term "tert-Bu" or "But" as used herein refers to a tert-butyl group, the term "OMe" as used herein refers to a methoxy group, and "D" refers to deuterium.

The term "biphenyl group" as used herein may refer to "a phenyl group substituted with a phenyl group." For example, the "biphenyl group" may be a substituted phenyl group having a $C_6$-$C_{60}$ aryl group as a substituent.

The term "terphenyl group" as used herein may refer to "a phenyl group substituted with a biphenyl group". For example, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula or moiety.

Hereinafter, a light-emitting device according to embodiments will be described in more detail with reference to Examples.

EXAMPLES

Evaluation Example 1

According to the method in Table 1, the HOMO energy level, LUMO energy level, band gap and triplet ($T_1$) energy of each of Compounds D1 to D8, D11 to D16, and A10 were evaluated. Results thereof are shown in Table 2.

TABLE 1

| | |
|---|---|
| HOMO energy level evaluation method | By using cyclic voltammetry (CV) (electrolyte: 0.1M $Bu_4NPF_6$/solvent: dimethylforamide (DMF)/ electrode: 3-electrode system (working electrode: GC, reference electrode: Ag/AgCl, and auxiliary electrode: Pt)), the potential (V)-current (A) graph of each compound was obtained, and then, from the oxidation onset of the graph, the HOMO energy level of each compound was calculated. |
| LUMO energy level evaluation method | By using cyclic voltammetry (CV) (electrolyte: 0.1M $Bu_4NPF_6$/solvent: dimethylforamide (DMF)/ electrode: 3-electrode system (working electrode: GC, reference electrode: Ag/AgCl, and auxiliary electrode: Pt)), the potential (V)-current (A) graph of each compound was obtained, and then, from the reduction onset of the graph, the LUMO energy level of each compound was calculated. |
| Band gap evaluation method | The absolute value of the difference between HOMO energy level and LUMO energy level was calculated |
| Triplet ($T_1$) energy | A mixture of 2-methyl-THF(2-MeTHF) and each compound (each compound was dissolved to a concentration of 10 mM in 3 mL of 2-MeTHF) was put into a quartz cell, which was then placed in a cryostat containing liquid nitrogen (77 K) (Oxford, DN). Then, the phosphorescent spectrum thereof was measured using a luminescence measuring instrument (PTI, Quanta Master 400), and then the triplet energy level was measured from the peak wavelength of the phosphorescent spectrum. |

TABLE 2

| | HOMO (eV) | LUMO (eV) | Band gap (eV) | $T_1$ (eV) |
|---|---|---|---|---|
| D1 | −5.22 | −2.14 | 3.08 | 2.01 |
| D2 | −5.06 | −2.18 | 2.88 | 2.00 |
| D3 | −5.25 | −2.15 | 3.10 | 2.07 |
| D4 | −4.92 | −2.07 | 4.75 | 1.97 |
| D5 | −5.07 | −2.23 | 2.84 | 1.59 |
| D6 | −5.14 | −2.07 | 3.07 | 2.04 |
| D7 | −4.98 | −2.24 | 2.74 | 1.47 |
| D8 | −4.95 | −2.01 | 2.94 | 2.10 |
| D11 | −4.86 | −2.12 | 2.74 | 1.99 |
| D12 | −4.93 | −2.23 | 2.73 | 1.97 |
| D13 | −4.88 | −2.16 | 2.72 | 1.95 |
| D14 | −4.98 | −2.27 | 2.71 | 1.95 |
| D15 | −4.97 | −2.29 | 2.68 | 1.91 |
| D16 | −5.00 | −2.23 | 2.80 | 1.90 |
| A10 | −5.03 | −2.07 | 2.96 | 1.87 |

TABLE 2-continued

| | HOMO (eV) | LUMO (eV) | Band gap (eV) | $T_1$ (eV) |
|---|---|---|---|---|

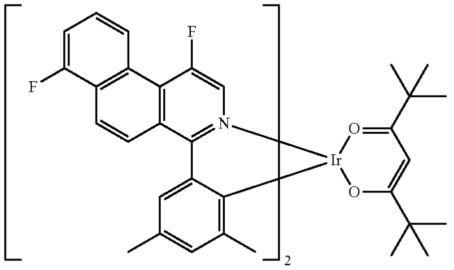

D1

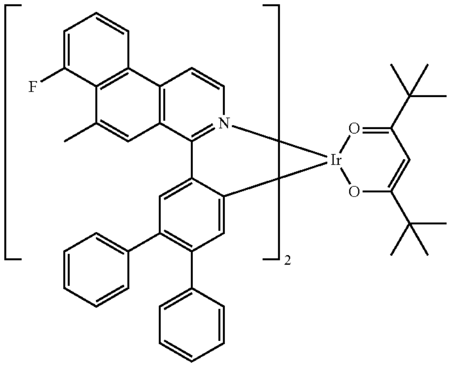

D2

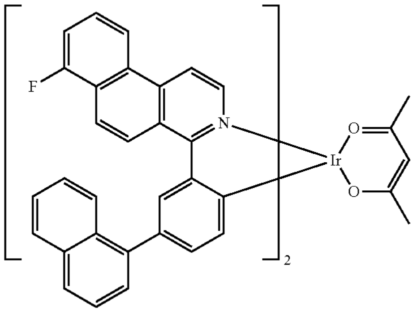

D3

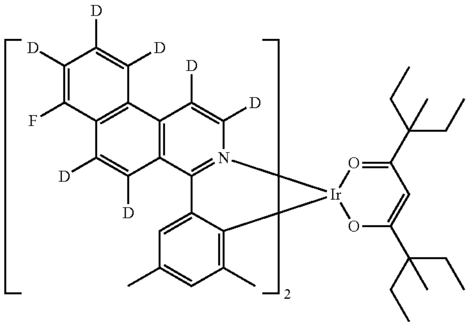

D4

TABLE 2-continued
| | HOMO (eV) | LUMO (eV) | Band gap (eV) | $T_1$ (eV) |
|---|---|---|---|---|
| 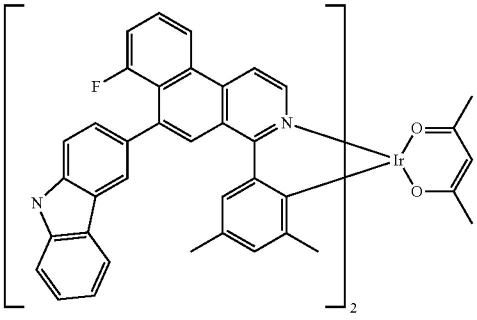 D5 | | | | |
| 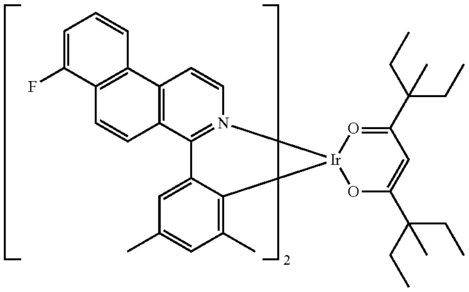 D6 | | | | |
| 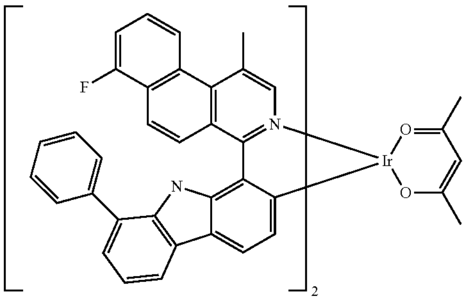 D7 | | | | |
| 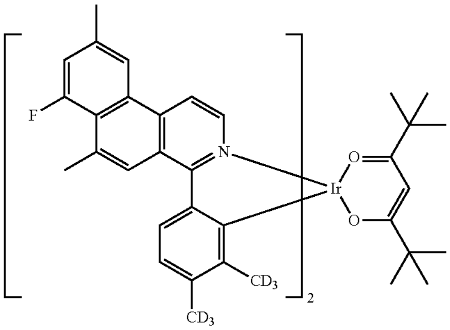 D8 | | | | |
TABLE 2-continued
| | HOMO (eV) | LUMO (eV) | Band gap (eV) | $T_1$ (eV) |
|---|---|---|---|---|
| 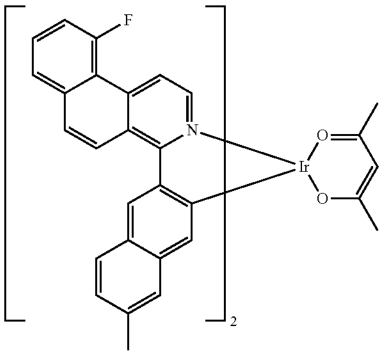 D11 | | | | |
| 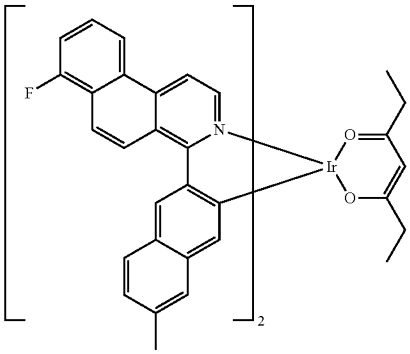 D12 | | | | |
| 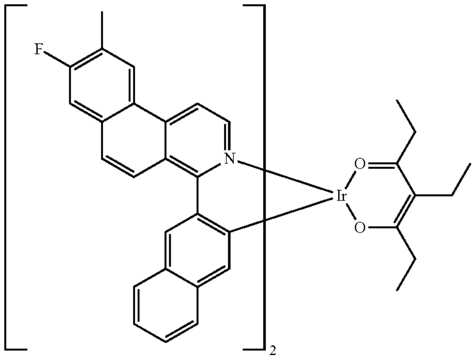 D13 | | | | |
| 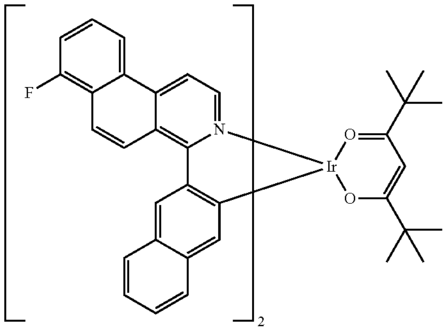 D14 | | | | |

TABLE 2-continued

| | HOMO (eV) | LUMO (eV) | Band gap (eV) | $T_1$ (eV) |
|---|---|---|---|---|

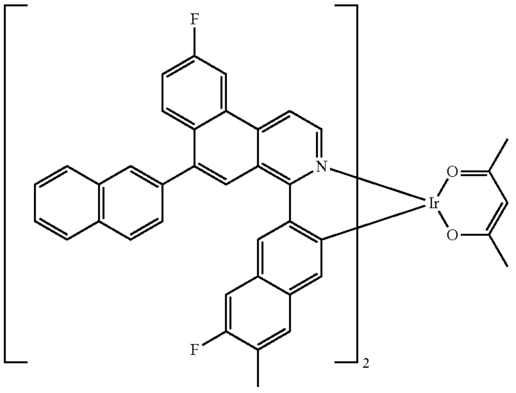

D15

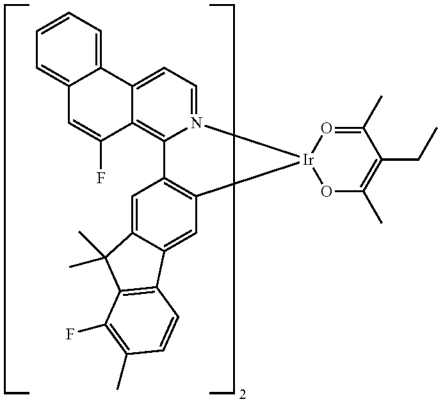

D16

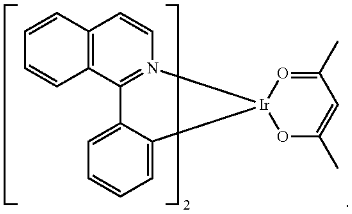

A10

Evaluation Example 2

After PMMA (poly(methyl methacrylate)) in $CH_2Cl_2$ solution and Compound D1 (4 wt % relative to PMMA) were mixed, the resultant obtained therefrom was coated on a quartz substrate by using a spin coater and then heat-treated in an oven at 80° C., followed by cooling to room temperature, thereby manufacturing Film D1 having a thickness of 40 nm. Subsequently, Films D2 to D6, D8, D11 to D16, and A10 were manufactured in substantially the same manner as used to manufacture Film D1, except that Compounds D2 to D6, D8, D11 to D16, and A10 were respectively used instead of Compound D1.

The emission spectrum of each of Films D1 to D6, D8, D11 to D16, and A10 was measured by using a Quantaurus-QY Absolute PL quantum yield spectrometer of Hamamatsu (equipped with a xenon light source, a monochromator, a photonic multichannel analyzer, and an integrating sphere, and using PLQY measurement software (Hamamatsu Photonics, Ltd., Shizuoka, Japan)). During measurement, the excitation wavelength was scanned from 320 nm to 380 nm at intervals of 10 nm, and the spectrum measured at the excitation wavelength of 340 nm was taken to obtain the maximum emission wavelength (emission peak wavelength) and FWHM of the compound included in each film. Results thereof are summarized in Table 3.

TABLE 3

| Film no. | Compound included in film (4 wt % in PMMA) | Maximum emission wavelength (nm) | FWHM (nm) |
|---|---|---|---|
| D1 | D1 | 605 | 47 |
| D2 | D2 | 614 | 79 |
| D3 | D3 | 606 | 79 |
| D4 | D4 | 623 | 59 |
| D5 | D5 | 626 | 59 |
| D6 | D6 | 623 | 59 |
| D8 | D8 | 615 | 33 |
| D11 | D11 | 617 | 73 |
| D12 | D12 | 629 | 75 |
| D13 | D13 | 636 | 79 |
| D14 | D14 | 640 | 79 |
| D15 | D15 | 646 | 79 |
| D16 | D16 | 638 | 49 |
| A10 | A10 | 614 | 104 |

From the results shown in Table 3, it can be seen that Compounds D1 to D6, D8, and D11 to D16 emit red light having a relatively small FWHM, compared to Compound A10.

Evaluation Example 3

Compound C1 was deposited on a glass substrate to prepare Film C1 having a thickness of 60 nm. Subsequently, for Film C1, the refractive index of Compound C1 with respect to light having a wavelength of 633 nm was measured according to the Cauchy Film Model by using an Ellipsometer M-2000 (JA Woollam) at a temperature of 25° C. and in relative humidity of 50%. Results thereof are summarized in Table 4. This experiment was repeatedly performed for each of Compounds C2 to C6, B01, and B11 to B23. Results thereof are summarized in Table 4.

TABLE 4

| Film no. | Compound included in film | Refractive index for light having wavelength of 633 nm |
|---|---|---|
| C1 | C1 | 1.759 |
| C2 | C2 | 1.707 |
| C3 | C3 | 1.771 |
| C4 | C4 | 1.801 |
| C5 | C5 | 1.782 |
| C6 | C6 | 1.756 |
| B01 | B01 | 1.645 |
| B11 | B11 | 1.748 |

TABLE 4-continued
| Film no. | Compound included in film | Refractive index for light having wavelength of 633 nm |
|---|---|---|
| B12 | B12 | 1.794 |
| B13 | B13 | 1.760 |
| B14 | B14 | 1.727 |
| B15 | B15 | 1.746 |
| B16 | B16 | 1.737 |
| B17 | B17 | 1.685 |
| B18 | B18 | 1.731 |
| B19 | B19 | 1.713 |
| B20 | B20 | 1.727 |
| B21 | B21 | 1.695 |
| B22 | B22 | 1.703 |
| B23 | B23 | 1.726 |
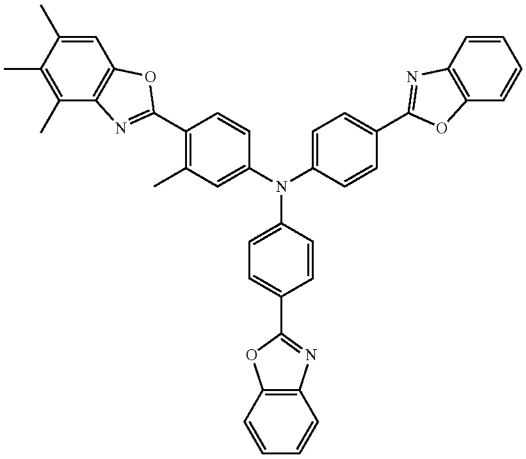
C1
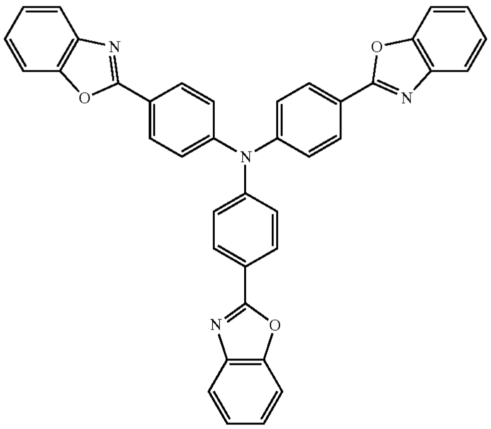
C2

TABLE 4-continued
| Film no. | Compound included in film | Refractive index for light having wavelength of 633 nm |
|---|---|---|
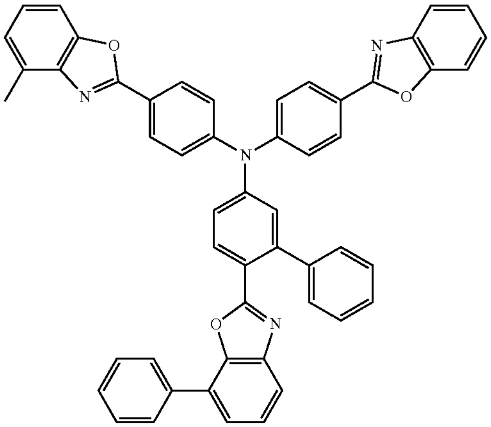
C3
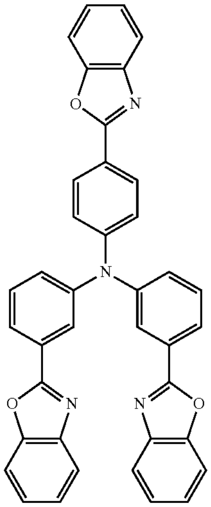
C4
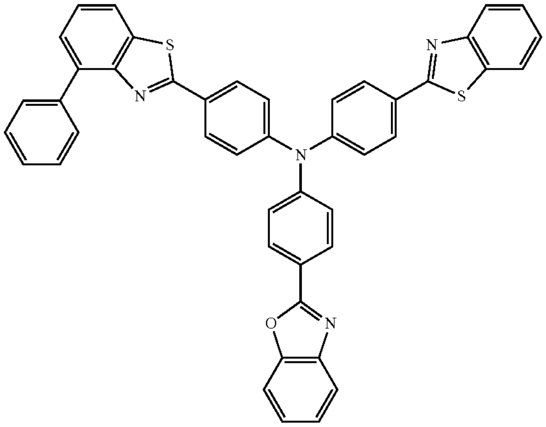
C5

TABLE 4-continued
| Film no. | Compound included in film | Refractive index for light having wavelength of 633 nm |
| --- | --- | --- |
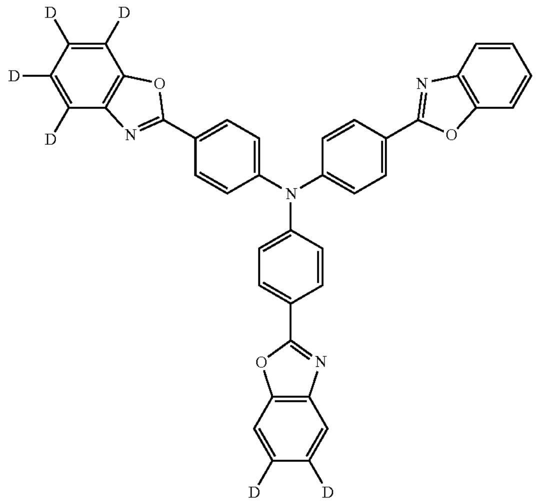
C6
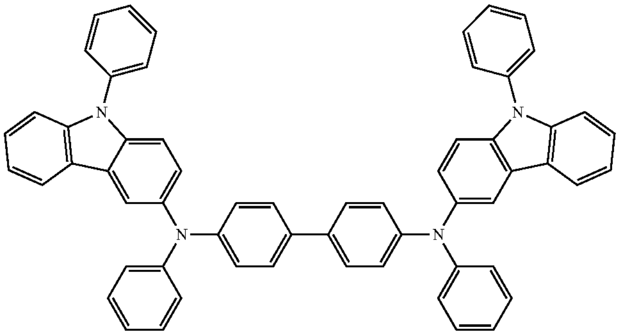
B01
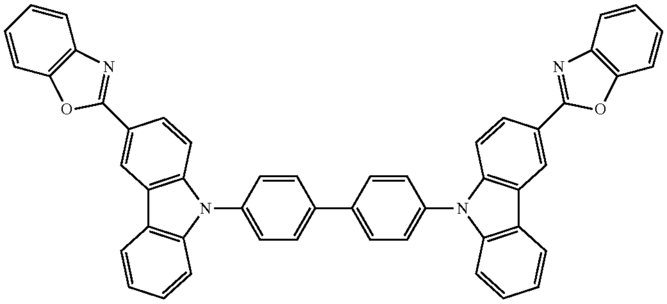
B11
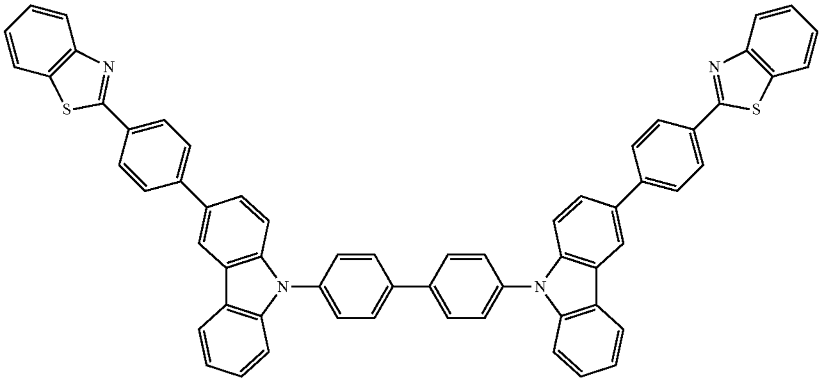
B12

TABLE 4-continued
| Film no. | Compound included in film | Refractive index for light having wavelength of 633 nm |
|---|---|---|
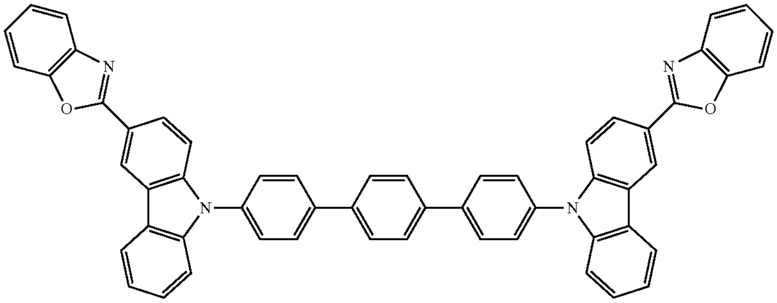
B13
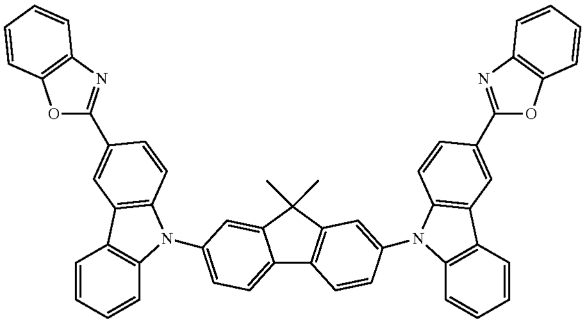
B14
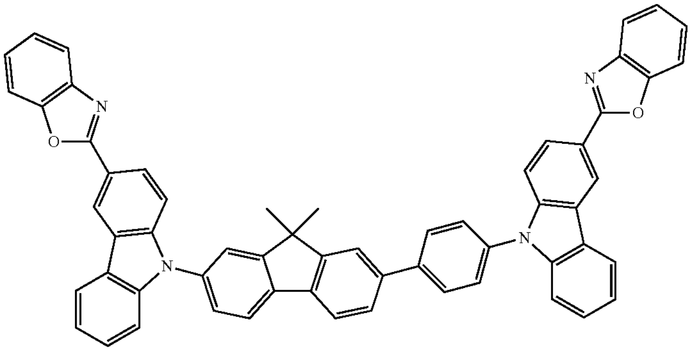
B15
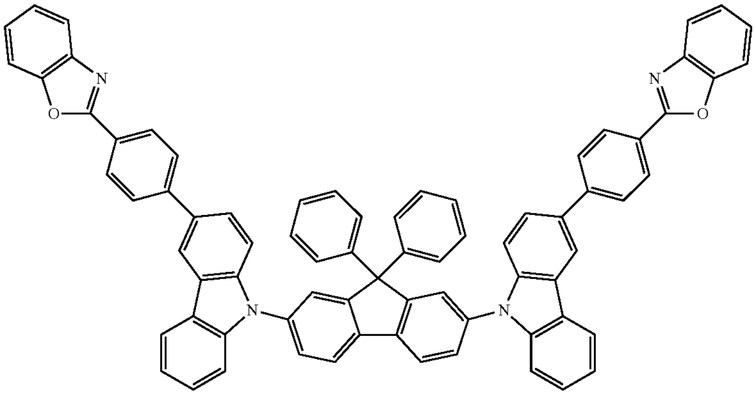
B16

TABLE 4-continued
| Film no. | Compound included in film | Refractive index for light having wavelength of 633 nm |
|---|---|---|
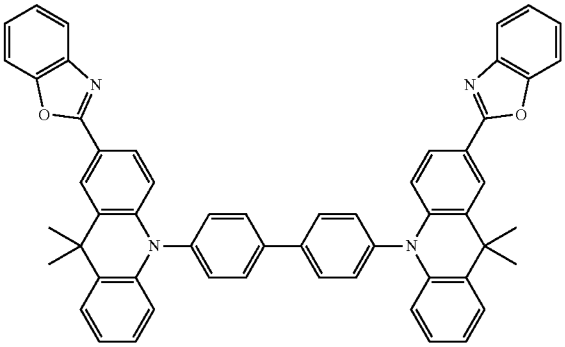
B17
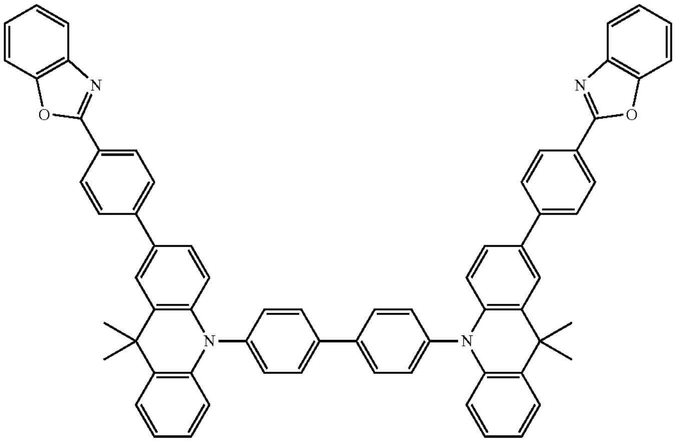
B18
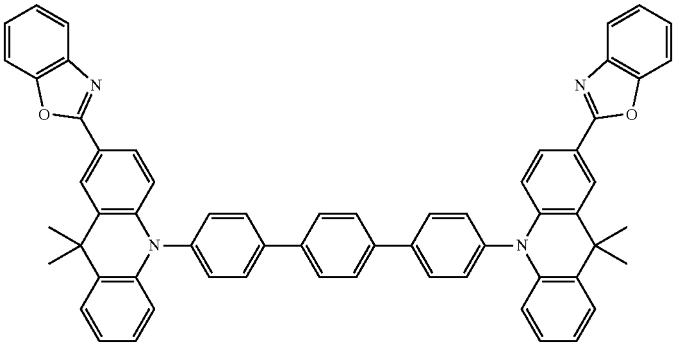
B19
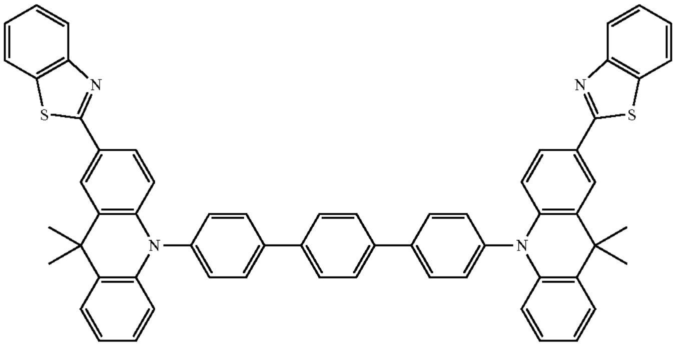
B20

TABLE 4-continued

| Film no. | Compound included in film | Refractive index for light having wavelength of 633 nm |
|---|---|---|
| | 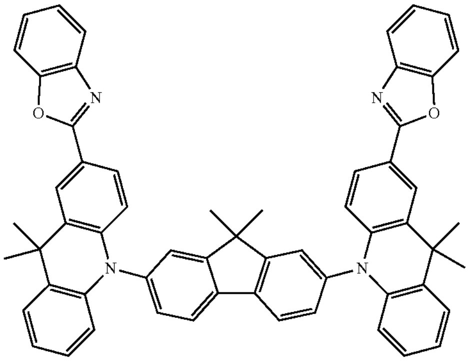 B21 | |
| | 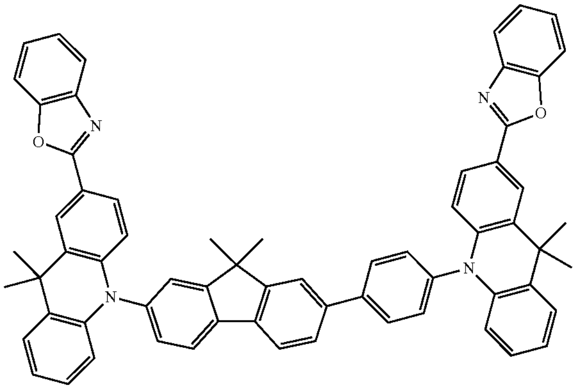 B22 | |
| | 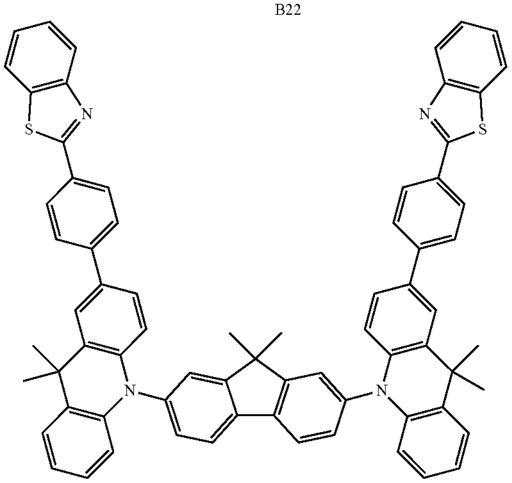 B23 | |

Example 1

As an anode, a glass substrate (product of Corning Inc.) with a 15 $\Omega/cm^2$ (1,200 Å) ITO formed thereon was cut to a size of 50 mm×50 mm×0.7 mm, sonicated using isopropyl alcohol and pure water each for 5 minutes, washed by irradiation of ultraviolet rays and exposure of ozone thereto for 30 minutes, and then mounted on a vacuum deposition apparatus.

HT3 was vacuum-deposited on the anode to form a hole transport layer having a thickness of 600 Å, and HT40 was vacuum-deposited on the hole transport layer to form an emission auxiliary layer having a thickness of 250 Å.

Compound H125, Compound H126, and Compound D4 (first emitter) were vacuum-deposited on the emission auxiliary layer at a weight ratio of 45:45:10 to form an emission layer having a thickness of 300 Å.

Compound ET37 was vacuum-deposited on the emission layer to form a buffer layer having a thickness of 50 Å, and ET46 and LiQ were vacuum-deposited on the buffer layer at a weight ratio of 5:5 to form an electron transport layer having a thickness of 310 Å. Subsequently, Yb was vacuum-deposited on the electron transport layer to form an electron injection layer having a thickness of 15 Å, and then, Ag and Mg were vacuum-deposited thereon to form a cathode having a thickness of 100 Å.
Subsequently, Compound C1 was vacuum-deposited on the cathode to form a capping layer having a thickness of 700 Å, thereby completing the manufacturing of an organic light-emitting device.
HT3
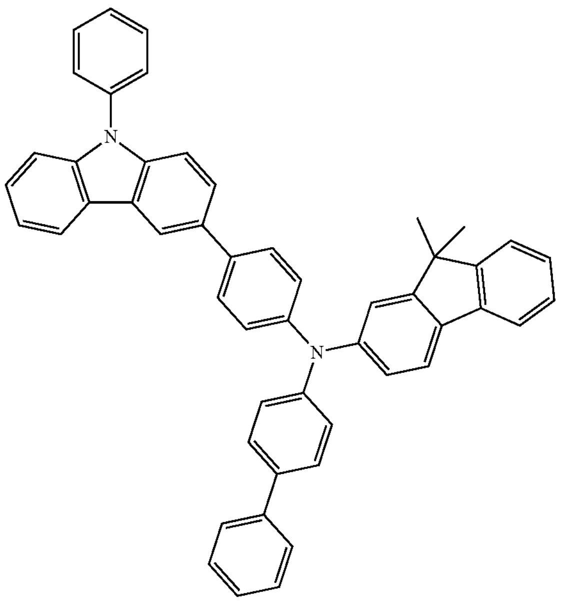
HT40
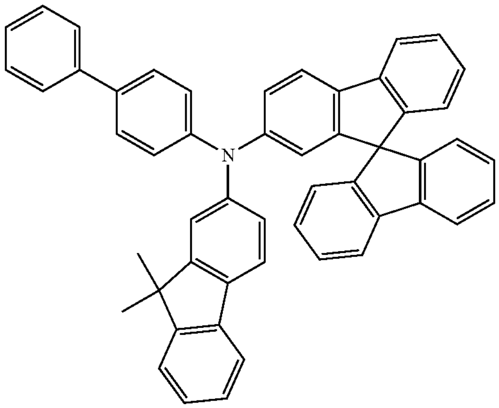
-continued
H125
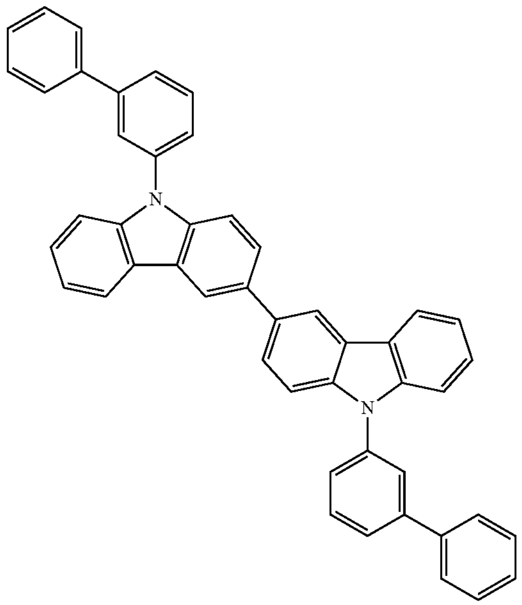
H126
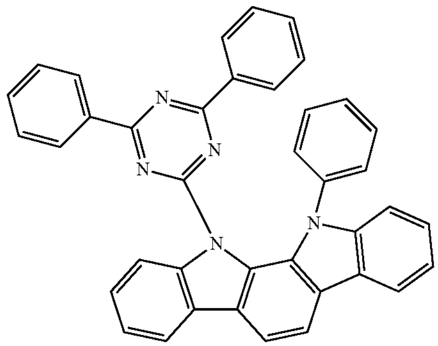
ET37
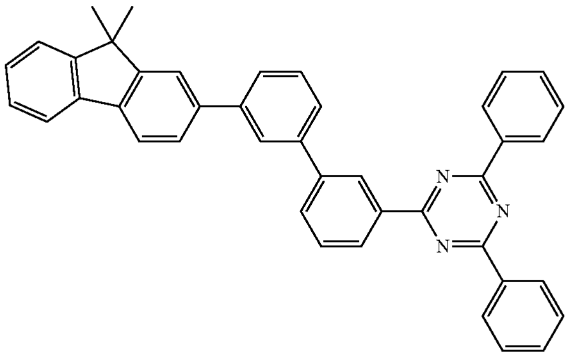

-continued

ET46

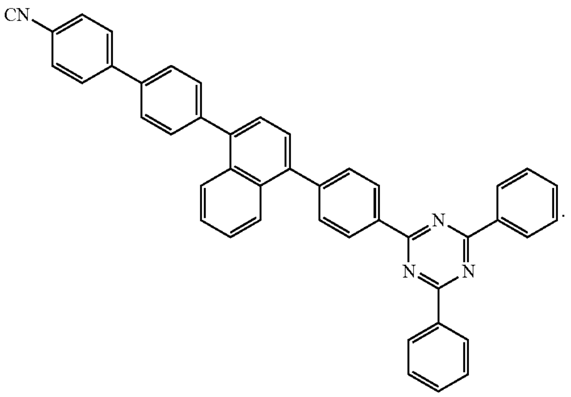

Examples 2 to 48 and Comparative Examples 1 to 20

Organic light-emitting devices were manufactured in substantially the same manner as in Example 1, except that the compounds shown in Table 5 were respectively used as a material for forming the first emitter in the emission layer or a material for forming the capping layer.

Evaluation Example 4

The color purity (CIEx and CIEy coordinates) at 1,000 cd/$m^2$, maximum emission wavelength, and FWHM derived from the main peak of the EL spectrum of the organic light-emitting devices manufactured according to Examples 1 to 48 and Comparative Examples 1 to 20 were evaluated by using a luminance meter (Konica Minolta CS-1000A). Results thereof are summarized in Tables 5 and 6. The RRF values calculated with reference to Table 4 are also summarized in Tables 5 and 6.

TABLE 5

| | First emitter | Material for capping layer | Refractive index of material for capping layer with respect to light having wavelength of 633 nm | Maximum emission wavelength (nm) | FWHM (nm) | RRF value |
|---|---|---|---|---|---|---|
| Example 1 | D4 | C1 | 1.776 | 623 | 59 | 3.01 |
| Example 2 | D4 | C2 | 1.793 | 623 | 59 | 3.04 |
| Example 3 | D4 | C3 | 1.735 | 623 | 59 | 2.94 |
| Example 4 | D4 | C4 | 1.708 | 623 | 59 | 2.89 |
| Example 5 | D4 | C5 | 1.795 | 623 | 59 | 3.04 |
| Example 6 | D4 | C6 | 1.792 | 623 | 59 | 3.04 |
| Example 7 | D5 | C1 | 1.776 | 626 | 59 | 3.01 |
| Example 8 | D5 | C2 | 1.793 | 626 | 59 | 3.04 |
| Example 9 | D5 | C3 | 1.735 | 626 | 59 | 2.94 |
| Example 10 | D5 | C4 | 1.708 | 626 | 59 | 2.89 |
| Example 11 | D5 | C5 | 1.795 | 626 | 59 | 3.04 |
| Example 12 | D5 | C6 | 1.792 | 626 | 59 | 3.04 |
| Example 13 | D6 | C1 | 1.776 | 623 | 59 | 3.01 |
| Example 14 | D6 | C2 | 1.793 | 623 | 59 | 3.04 |
| Example 15 | D6 | C3 | 1.735 | 623 | 59 | 2.94 |
| Example 16 | D6 | C4 | 1.708 | 623 | 59 | 2.89 |
| Example 17 | D6 | C5 | 1.795 | 623 | 59 | 3.04 |
| Example 18 | D6 | C6 | 1.792 | 623 | 59 | 3.04 |
| Example 19 | D12 | C1 | 1.776 | 629 | 75 | 2.37 |
| Example 20 | D12 | C2 | 1.793 | 629 | 75 | 2.39 |
| Example 21 | D12 | C3 | 1.735 | 629 | 75 | 2.31 |
| Example 22 | D12 | C4 | 1.708 | 629 | 75 | 2.28 |
| Example 23 | D12 | C5 | 1.795 | 629 | 75 | 2.39 |
| Example 24 | D12 | C6 | 1.792 | 629 | 75 | 2.39 |
| Example 25 | D13 | C1 | 1.776 | 636 | 79 | 2.25 |
| Example 26 | D13 | C2 | 1.793 | 636 | 79 | 2.27 |
| Example 27 | D13 | C3 | 1.735 | 636 | 79 | 2.20 |
| Example 28 | D13 | C4 | 1.708 | 636 | 79 | 2.16 |
| Example 29 | D13 | C5 | 1.795 | 636 | 79 | 2.27 |
| Example 30 | D13 | C6 | 1.792 | 636 | 79 | 2.27 |
| Example 31 | D14 | C1 | 1.776 | 640 | 79 | 2.25 |
| Example 32 | D14 | C2 | 1.793 | 640 | 79 | 2.27 |
| Example 33 | D14 | C3 | 1.735 | 640 | 79 | 2.20 |
| Example 34 | D14 | C4 | 1.708 | 640 | 79 | 2.16 |
| Example 35 | D14 | C5 | 1.795 | 640 | 79 | 2.27 |
| Example 36 | D14 | C6 | 1.792 | 640 | 79 | 2.27 |
| Example 37 | D15 | C1 | 1.776 | 646 | 79 | 2.25 |
| Example 38 | D15 | C2 | 1.793 | 646 | 79 | 2.27 |
| Example 39 | D15 | C3 | 1.735 | 646 | 79 | 2.20 |
| Example 40 | D15 | C4 | 1.708 | 646 | 79 | 2.16 |
| Example 41 | D15 | C5 | 1.795 | 646 | 79 | 2.27 |
| Example 42 | D15 | C6 | 1.792 | 646 | 79 | 2.27 |
| Example 43 | D16 | C1 | 1.776 | 638 | 49 | 3.63 |
| Example 44 | D16 | C2 | 1.793 | 638 | 49 | 3.66 |
| Example 45 | D16 | C3 | 1.735 | 638 | 49 | 3.54 |
| Example 46 | D16 | C4 | 1.708 | 638 | 49 | 3.49 |
| Example 47 | D16 | C5 | 1.795 | 638 | 49 | 3.66 |
| Example 48 | D16 | C6 | 1.792 | 638 | 49 | 3.66 |
| Comparative Example 1 | A10 | B01 | 1.645 | 614 | 104 | 1.58 |

TABLE 5-continued

| | First emitter | Material for capping layer | Refractive index of material for capping layer with respect to light having wavelength of 633 nm | Maximum emission wavelength (nm) | FWHM (nm) | RRF value |
|---|---|---|---|---|---|---|
| Comparative Example 2 | A10 | B11 | 1.748 | 614 | 104 | 1.68 |
| Comparative Example 3 | A10 | B12 | 1.794 | 614 | 104 | 1.73 |
| Comparative Example 4 | A10 | B13 | 1.760 | 614 | 104 | 1.69 |
| Comparative Example 5 | A10 | B14 | 1.727 | 614 | 104 | 1.66 |
| Comparative Example 6 | A10 | B15 | 1.746 | 614 | 104 | 1.68 |
| Comparative Example 7 | A10 | B16 | 1.737 | 614 | 104 | 1.67 |
| Comparative Example 8 | A10 | B17 | 1.685 | 614 | 104 | 1.62 |
| Comparative Example 9 | A10 | B18 | 1.731 | 614 | 104 | 1.66 |
| Comparative Example 10 | A10 | B19 | 1.713 | 614 | 104 | 1.65 |
| Comparative Example 11 | A10 | B20 | 1.727 | 614 | 104 | 1.66 |
| Comparative Example 12 | A10 | B21 | 1.695 | 614 | 104 | 1.63 |
| Comparative Example 13 | A10 | B22 | 1.703 | 614 | 104 | 1.64 |
| Comparative Example 14 | A10 | B23 | 1.726 | 614 | 104 | 1.66 |
| Comparative Example 15 | A10 | C1 | 1.759 | 614 | 104 | 1.69 |
| Comparative Example 16 | A10 | C2 | 1.707 | 614 | 104 | 1.64 |
| Comparative Example 17 | A10 | C3 | 1.771 | 614 | 104 | 1.70 |
| Comparative Example 18 | A10 | C4 | 1.801 | 614 | 104 | 1.73 |
| Comparative Example 19 | A10 | C5 | 1.782 | 614 | 104 | 1.71 |
| Comparative Example 20 | A10 | C6 | 1.756 | 614 | 104 | 1.69 |

TABLE 6

| | First emitter | Material for capping layer | RRF value | CIEx | CIEy |
|---|---|---|---|---|---|
| Example 1 | D4 | C1 | 3.01 | 0.67 | 0.33 |
| Example 2 | D4 | C2 | 3.04 | 0.67 | 0.33 |
| Example 3 | D4 | C3 | 2.94 | 0.67 | 0.33 |
| Example 4 | D4 | C4 | 2.89 | 0.67 | 0.33 |
| Example 5 | D4 | C5 | 3.04 | 0.67 | 0.33 |
| Example 6 | D4 | C6 | 3.04 | 0.67 | 0.33 |
| Example 7 | D5 | C1 | 3.01 | 0.68 | 0.32 |
| Example 8 | D5 | C2 | 3.04 | 0.68 | 0.32 |
| Example 9 | D5 | C3 | 2.94 | 0.68 | 0.32 |
| Example 10 | D5 | C4 | 2.89 | 0.67 | 0.32 |
| Example 11 | D5 | C5 | 3.04 | 0.68 | 0.32 |
| Example 12 | D5 | C6 | 3.04 | 0.68 | 0.32 |
| Example 13 | D6 | C1 | 3.01 | 0.67 | 0.33 |
| Example 14 | D6 | C2 | 3.04 | 0.67 | 0.33 |
| Example 15 | D6 | C3 | 2.94 | 0.67 | 0.33 |
| Example 16 | D6 | C4 | 2.89 | 0.67 | 0.33 |
| Example 17 | D6 | C5 | 3.04 | 0.67 | 0.33 |
| Example 18 | D6 | C6 | 3.04 | 0.67 | 0.33 |
| Example 19 | D12 | C1 | 2.37 | 0.66 | 0.34 |
| Example 20 | D12 | C2 | 2.39 | 0.66 | 0.34 |
| Example 21 | D12 | C3 | 2.31 | 0.66 | 0.34 |
| Example 22 | D12 | C4 | 2.28 | 0.66 | 0.34 |
| Example 23 | D12 | C5 | 2.39 | 0.66 | 0.34 |
| Example 24 | D12 | C6 | 2.39 | 0.66 | 0.34 |
| Example 25 | D13 | C1 | 2.25 | 0.67 | 0.33 |
| Example 26 | D13 | C2 | 2.27 | 0.67 | 0.33 |

TABLE 6-continued

| | First emitter | Material for capping layer | RRF value | CIEx | CIEy |
|---|---|---|---|---|---|
| Example 27 | D13 | C3 | 2.20 | 0.67 | 0.33 |
| Example 28 | D13 | C4 | 2.16 | 0.67 | 0.33 |
| Example 29 | D13 | C5 | 2.27 | 0.67 | 0.33 |
| Example 30 | D13 | C6 | 2.27 | 0.67 | 0.33 |
| Example 31 | D14 | C1 | 2.25 | 0.67 | 0.32 |
| Example 32 | D14 | C2 | 2.27 | 0.67 | 0.33 |
| Example 33 | D14 | C3 | 2.20 | 0.68 | 0.32 |
| Example 34 | D14 | C4 | 2.16 | 0.68 | 0.32 |
| Example 35 | D14 | C5 | 2.27 | 0.67 | 0.33 |
| Example 36 | D14 | C6 | 2.27 | 0.67 | 0.33 |
| Example 37 | D15 | C1 | 2.25 | 0.68 | 0.32 |
| Example 38 | D15 | C2 | 2.27 | 0.68 | 0.32 |
| Example 39 | D15 | C3 | 2.20 | 0.68 | 0.32 |
| Example 40 | D15 | C4 | 2.16 | 0.68 | 0.32 |
| Example 41 | D15 | C5 | 2.27 | 0.68 | 0.32 |
| Example 42 | D15 | C6 | 2.27 | 0.68 | 0.32 |
| Example 43 | D16 | C1 | 3.63 | 0.70 | 0.30 |
| Example 44 | D16 | C2 | 3.66 | 0.70 | 0.30 |
| Example 45 | D16 | C3 | 3.54 | 0.70 | 0.30 |
| Example 46 | D16 | C4 | 3.49 | 0.70 | 0.30 |
| Example 47 | D16 | C5 | 3.66 | 0.70 | 0.30 |
| Example 48 | D16 | C6 | 3.66 | 0.70 | 0.30 |
| Comparative Example 1 | A10 | B01 | 1.58 | 0.64 | 0.36 |
| Comparative Example 2 | A10 | B11 | 1.68 | 0.64 | 0.36 |
| Comparative Example 3 | A10 | B12 | 1.73 | 0.63 | 0.36 |
| Comparative Example 4 | A10 | B13 | 1.69 | 0.64 | 0.36 |
| Comparative Example 5 | A10 | B14 | 1.66 | 0.64 | 0.36 |
| Comparative Example 6 | A10 | B15 | 1.68 | 0.64 | 0.36 |
| Comparative Example 7 | A10 | B16 | 1.67 | 0.64 | 0.36 |
| Comparative Example 8 | A10 | B17 | 1.62 | 0.64 | 0.36 |
| Comparative Example 9 | A10 | B18 | 1.66 | 0.64 | 0.36 |
| Comparative Example 10 | A10 | B19 | 1.65 | 0.64 | 0.36 |
| Comparative Example 11 | A10 | B20 | 1.66 | 0.64 | 0.36 |
| Comparative Example 12 | A10 | B21 | 1.63 | 0.64 | 0.36 |
| Comparative Example 13 | A10 | B22 | 1.64 | 0.64 | 0.36 |
| Comparative Example 14 | A10 | B23 | 1.66 | 0.64 | 0.36 |
| Comparative Example 15 | A10 | C1 | 1.69 | 0.63 | 0.36 |
| Comparative Example 16 | A10 | C2 | 1.64 | 0.63 | 0.36 |
| Comparative Example 17 | A10 | C3 | 1.70 | 0.64 | 0.36 |
| Comparative Example 18 | A10 | C4 | 1.73 | 0.64 | 0.36 |
| Comparative Example 19 | A10 | C5 | 1.71 | 0.63 | 0.37 |
| Comparative Example 20 | A10 | C6 | 1.69 | 0.63 | 0.37 |

TABLE 6-continued
| | First emitter | Material for capping layer | RRF value | CIEx | CIEy |
|---|---|---|---|---|---|
| 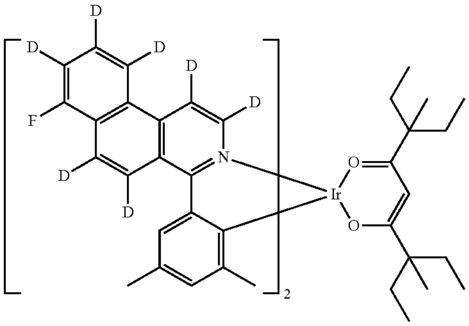 D4 | | | | | |
| 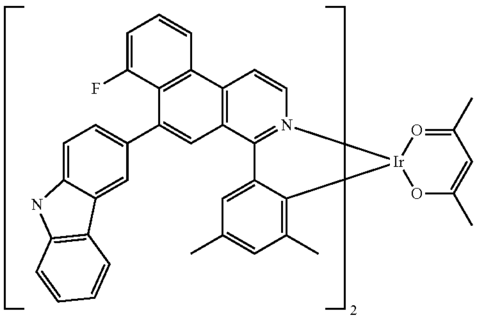 D5 | | | | | |
| 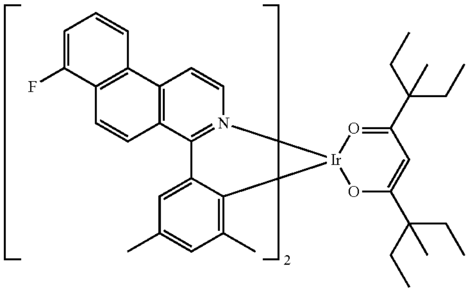 D6 | | | | | |
| 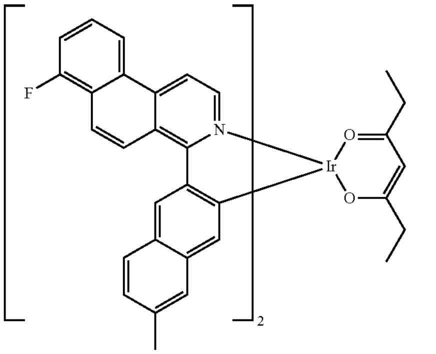 D12 | | | | | |

TABLE 6-continued
| | First emitter | Material for capping layer | RRF value | CIEx | CIEy |
|---|---|---|---|---|---|
| 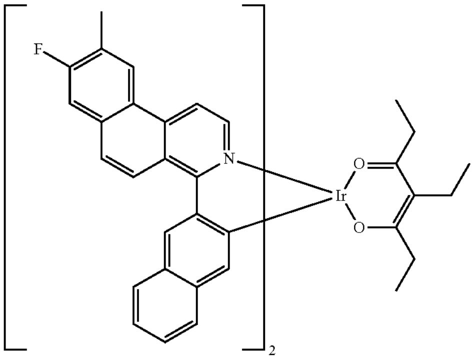 D13 | | | | | |
| 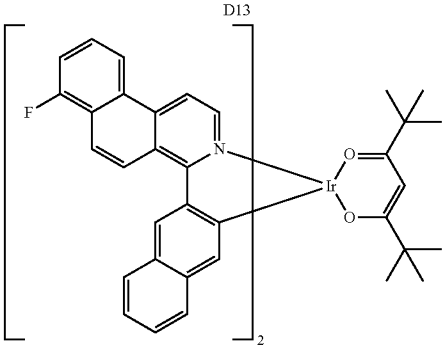 D14 | | | | | |
| 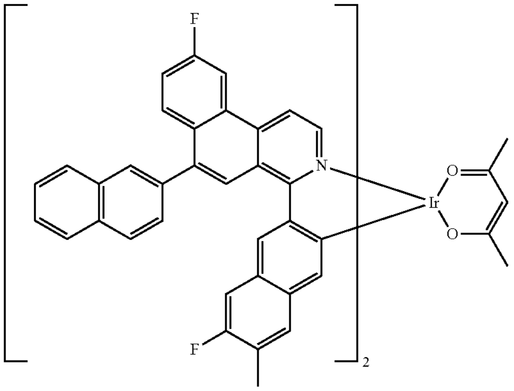 D15 | | | | | |
| 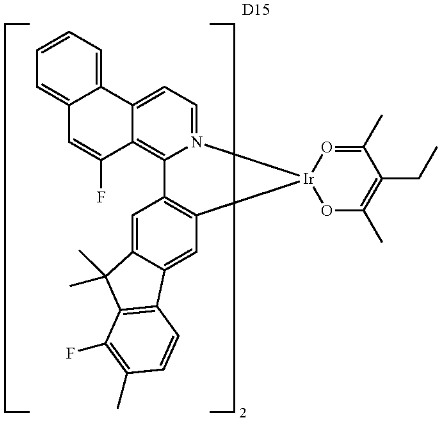 D16 | | | | | |

TABLE 6-continued
| | First emitter | Material for capping layer | RRF value | CIEx | CIEy |
|---|---|---|---|---|---|
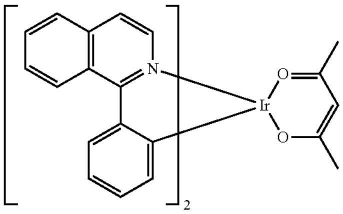
A10
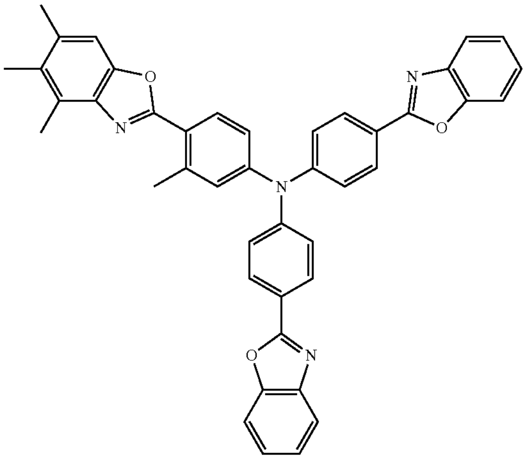
C1
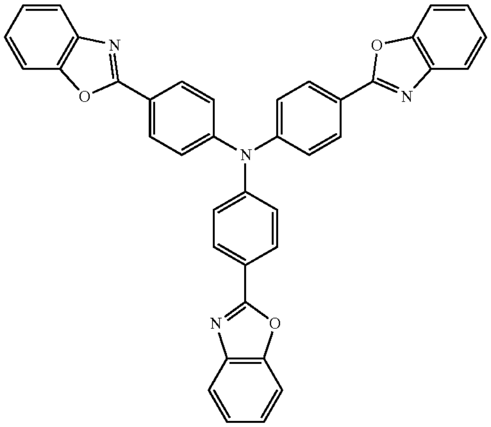
C2

TABLE 6-continued
| | First emitter | Material for capping layer | RRF value | CIEx | CIEy |
|---|---|---|---|---|---|
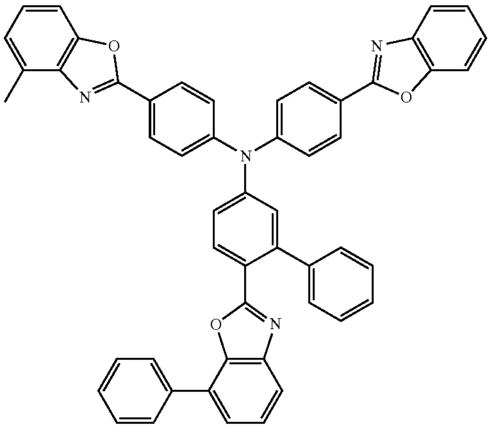
C3
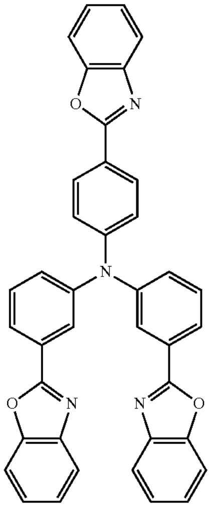
C4
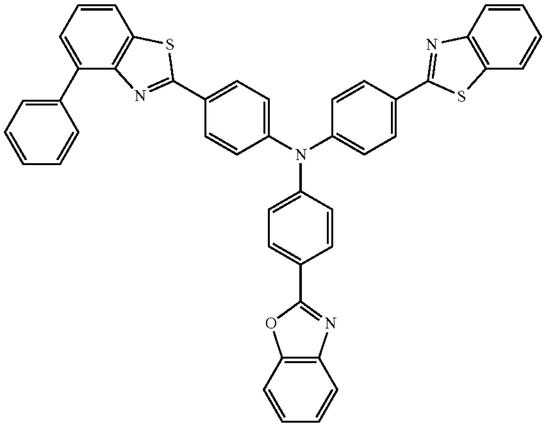
C5

TABLE 6-continued
| | First emitter | Material for capping layer | RRF value | CIEx | CIEy |
|---|---|---|---|---|---|
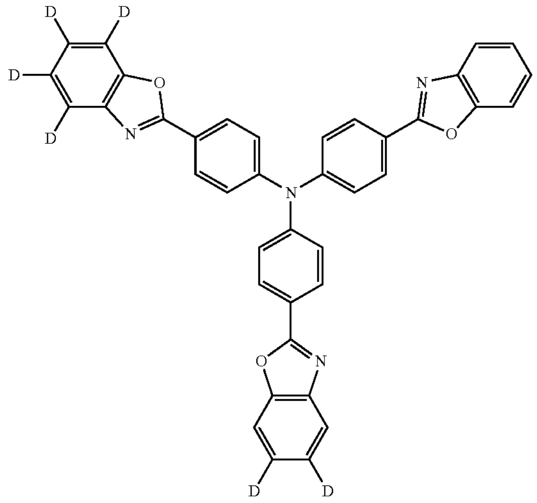
C6
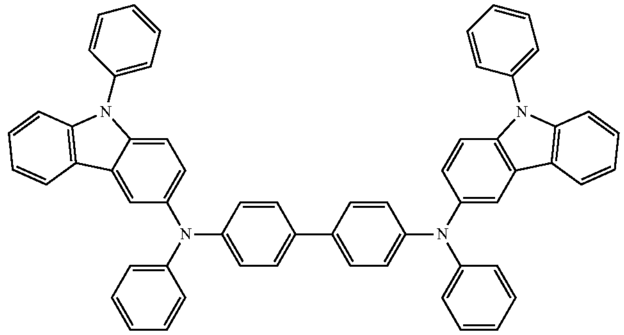
B01
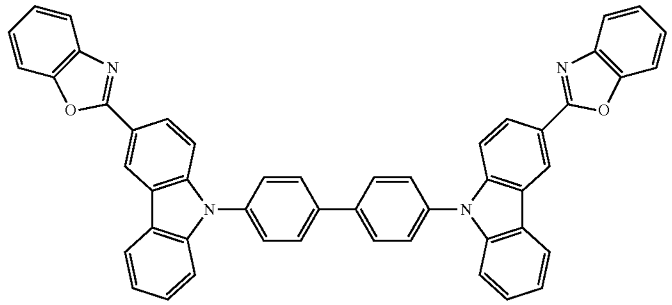
B11

TABLE 6-continued
| | First emitter | Material for capping layer | RRF value | CIEx | CIEy |
|---|---|---|---|---|---|
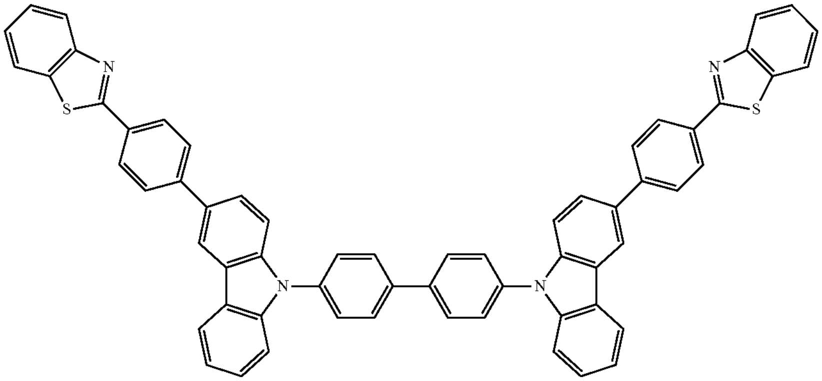
B12
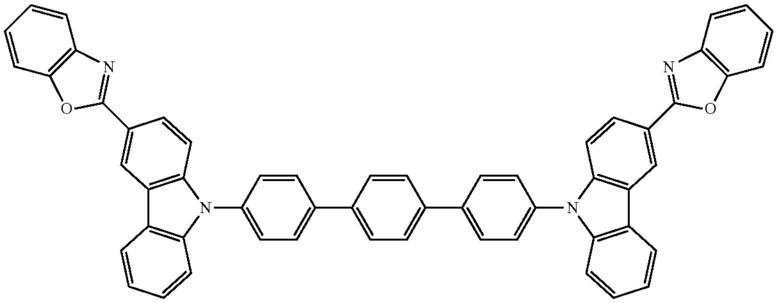
B13
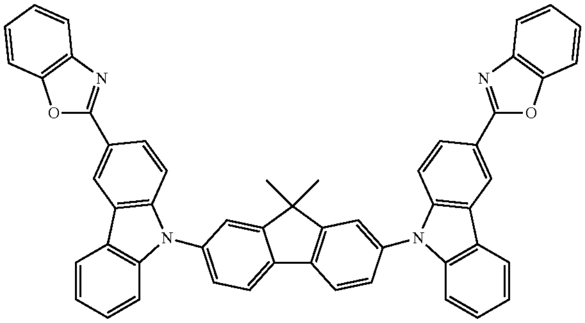
B14
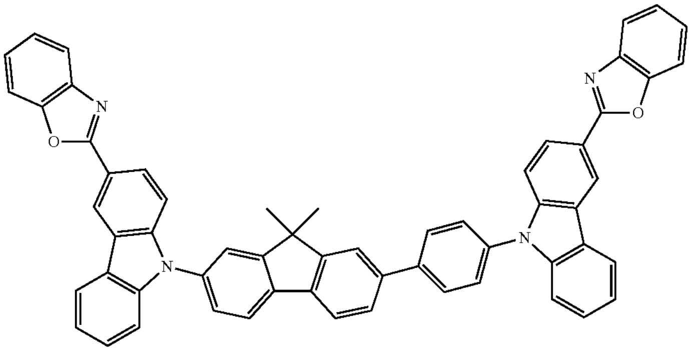
B15

TABLE 6-continued
| | First emitter | Material for capping layer | RRF value | CIEx | CIEy |
|---|---|---|---|---|---|
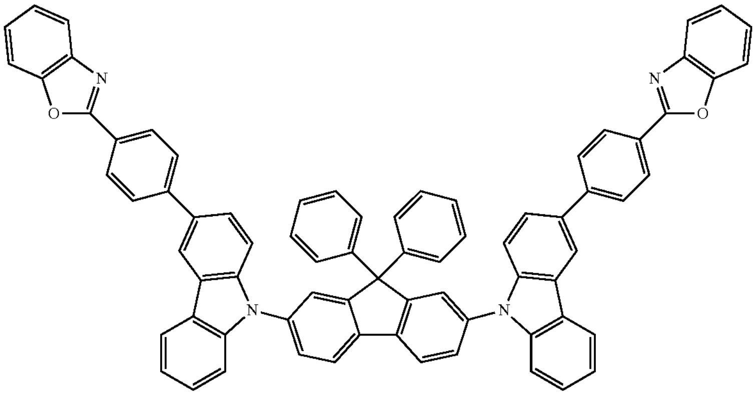
B16
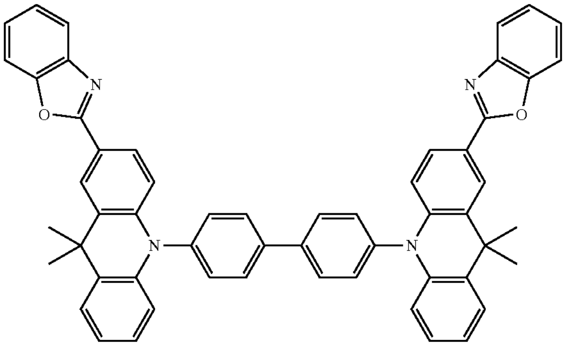
B17
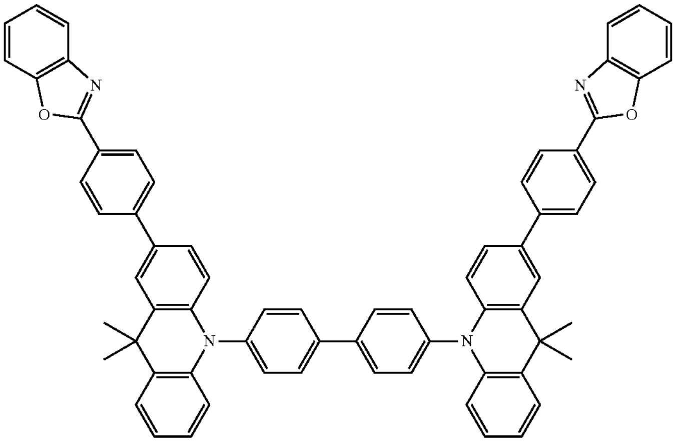
B18

TABLE 6-continued
| | First emitter | Material for capping layer | RRF value | CIEx | CIEy |
|---|---|---|---|---|---|
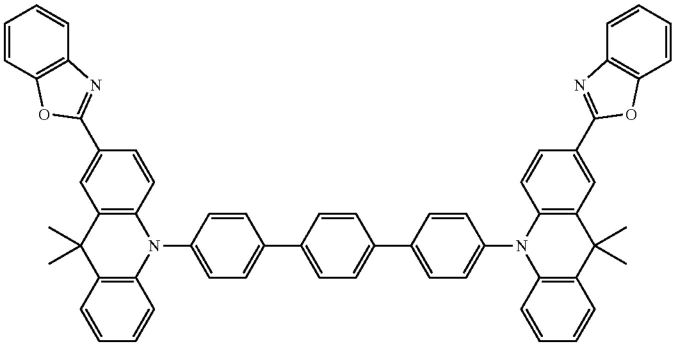
B19
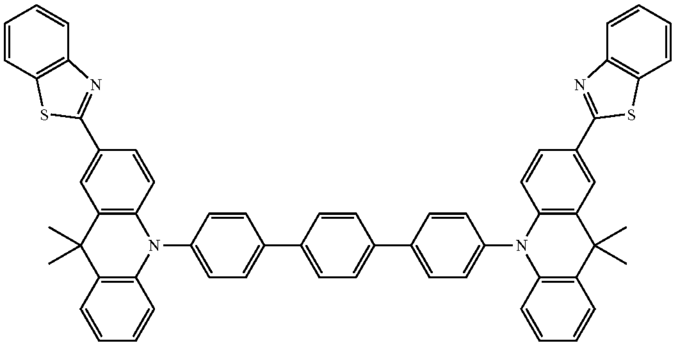
B20
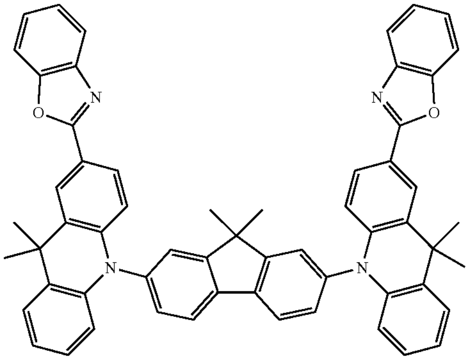
B21
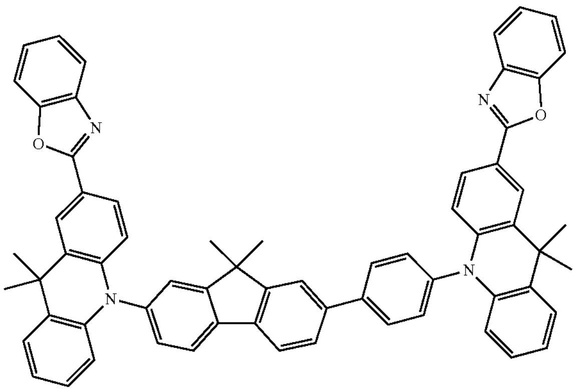
B22

TABLE 6-continued

| | First emitter | Material for capping layer | RRF value | CIEx | CIEy |
|---|---|---|---|---|---|

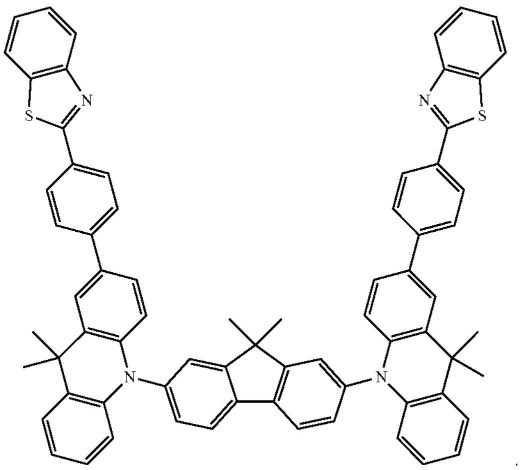

B23

From the results shown in Tables 5 and 6, it can be seen that the organic light-emitting devices of Examples 1 to 48 have relatively large CIEx values and relatively small CIEy values, compared to the organic light-emitting devices of Comparative Examples 1 to 20, and thus may emit red light having excellent or improved color purity.

Because the light-emitting device of the present embodiments has excellent color purity, a high-quality electronic apparatus and a high-quality electronic device may be manufactured using the light-emitting device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. A light-emitting device comprising:

a first electrode;

a second electrode facing the first electrode;

an interlayer between the first electrode and the second electrode, the interlayer comprising an emission layer; and a capping layer, wherein the emission layer comprises a first emitter, the first emitter is configured to emit first light having a first emission spectrum, the capping layer is in a path on which the first light is configured to travel, an emission peak wavelength of the first light is in a range of about 610 nm to about 720 nm, the first emitter comprises iridium, the capping layer comprises an amine-containing compound, a value of ratio of refractive index to full width at half maximum (FWHM) (RRF value) of the first light configured to be extracted to the outside through the capping layer is 2.0 or more, and the RRF value is calculated by Equation 1:

$$R(\text{cap})/\text{FWHM}(D)\times 100, \qquad \text{Equation 1}$$

wherein, in Equation 1,

R(cap) is a refractive index of the amine-containing compound with respect to second light having a wavelength of the emission peak wavelength of the first light ±33 nm, and FWHM(D) is an FWHM of a main peak in an electroluminescence (EL) spectrum of the first light configured to be extracted to the outside through the capping layer, and a unit of the FWHM(D) is nm.

2. The light-emitting device of claim 1, wherein the emission peak wavelength of the first light is in a range of about 610 nm to about 680 nm.

3. The light-emitting device of claim 1, wherein the first light configured to be extracted to the outside through the capping layer is red light.

4. The light-emitting device of claim 1, wherein the first emitter comprises a first ligand, a second ligand, and a third ligand that are each bonded to the iridium, the first ligand is a bidentate ligand comprising $Y_1$-containing ring $B_1$ and $Y_2$-containing ring $B_2$, the second ligand is a bidentate ligand bonded to the iridium through each of $Y_3$ and $Y_4$, the third ligand is a bidentate ligand comprising $Y_5$-containing ring $B_5$ and $Y_6$-containing ring $B_6$, $Y_1$ and $Y_5$ are each independently nitrogen (N), $Y_2$ and $Y_6$ are each independently carbon (C), $Y_3$ and $Y_4$ are each independently oxygen (O), and at least one of the $Y_1$-containing ring $B_1$ or the $Y_5$-containing ring $B_5$ is a polycyclic group in which three or more cyclic groups are condensed with each other.

5. The light-emitting device of claim 4, wherein at least one of the $Y_1$-containing ring $B_1$ or the $Y_5$-containing ring $B_5$ is a benzoquinoline group, a benzoisoquinoline group, a naphthoquinoline group, or a naphthoisoquinoline group.

6. The light-emitting device of claim 1, wherein the amine-containing compound comprised in the capping layer comprises a benzoxazole group, a benzthiazole group, a naphthooxazole group, a naphthothiazole group, or any combination thereof.

7. The light-emitting device of claim 1, wherein the RRF value of the first light configured to be extracted to the outside through the capping layer is in a range of about 2.1 to about 3.7.

8. The light-emitting device of claim 1, wherein the FWHM(D) is in a range of about 15 nm to about 90 nm.

9. The light-emitting device of claim 1, wherein the R(cap) is the refractive index of the amine-containing compound with respect to the second light having a wavelength of about 633 nm.

10. The light-emitting device of claim 1, wherein the R(cap) is in a range of about 1.6 to about 2.0.

11. A light-emitting device comprising:

a first electrode;

a second electrode facing the first electrode;

an interlayer between the first electrode and the second electrode, the interlayer comprising an emission layer; and a capping layer, wherein the emission layer comprises a first emitter, the first emitter is configured to emit first light having a first emission spectrum, the capping layer is in a path on which the first light is configured to travel, the first emitter comprises a first ligand, a second ligand, and a third ligand that are each bonded to iridium, the first ligand is a bidentate ligand comprising $Y_1$-containing ring $B_1$ and $Y_2$-containing ring $B_2$, the second ligand is a bidentate ligand bonded to the iridium through each of $Y_3$ and $Y_4$, the third ligand is a bidentate ligand comprising $Y_5$-containing ring $B_5$ and $Y_6$-containing ring $B_6$, $Y_1$ and $Y_5$ are each independently nitrogen (N), $Y_2$ and $Y_6$ are each independently carbon (C), $Y_3$ and $Y_4$ are each independently oxygen (O), at least one of the $Y_1$-containing ring $B_1$ or the $Y_5$-containing ring $B_5$ is a polycyclic group in which three or more cyclic groups are condensed with each other, the capping layer comprises an amine-containing compound, and the amine-containing compound comprises a benzoxazole group, a benzothiazole group, a naphthooxazole group, a naphthothiazole group, or any combination thereof.

12. The light-emitting device of claim 11, wherein the first ligand and the third ligand are identical to each other.

13. The light-emitting device of claim 11, wherein an emission peak wavelength of the first light is in a range of about 610 nm to about 720 nm.

14. The light-emitting device of claim 11, wherein a full width at half maximum (FWHM) of a main peak in an electroluminescence (EL) spectrum of the first light configured to be extracted to the outside through the capping layer is in a range of about 15 nm to about 90 nm.

15. The light-emitting device of claim 11, wherein the first light configured to be extracted to the outside through the capping layer is red light.

16. The light-emitting device of claim 11, wherein a refractive index of the amine-containing compound with respect to second light having a wavelength of the emission peak wavelength of the first light ±33 nm is in a range of about 1.6 to about 2.0.

17. An electronic apparatus comprising the light-emitting device of claim 1.

18. The electronic apparatus of claim 17, further comprising a color filter, a color conversion layer, a touch screen layer, a polarizing layer, or any combination thereof.

19. An electronic device comprising the light-emitting device of claim 1.

20. The electronic device of claim 19, wherein the electronic device is at least one of a flat panel display, a curved display, a computer monitor, a medical monitor, a television, a billboard, an indoor or outdoor lighting and/or signal light, a head-up display, a fully or partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a microdisplay, a three-dimensional (3D) display, a virtual or augmented reality display, a vehicle, a video wall comprising multiple displays tiled together, a theater or stadium screen, a phototherapy device, or a signboard.

* * * * *